(12) United States Patent
Faircloth

(10) Patent No.: US 12,283,421 B2
(45) Date of Patent: Apr. 22, 2025

(54) METHODS AND APPARATUSES FOR PRODUCING ULTRA-STRONG MAGNETIC FIELDS, AND PROPULSION SYSTEMS AND METHODS UTILIZING PLANETARY MAGNETIC FIELDS

(71) Applicant: Brian Faircloth, Evergreen, CO (US)

(72) Inventor: Brian Faircloth, Evergreen, CO (US)

( * ) Notice: Subject to any disclaimer, the term of this patent is extended or adjusted under 35 U.S.C. 154(b) by 0 days.

(21) Appl. No.: 17/695,507

(22) Filed: Mar. 15, 2022

(65) Prior Publication Data

US 2022/0310298 A1    Sep. 29, 2022
US 2023/0298795 A2    Sep. 21, 2023

Related U.S. Application Data

(60) Provisional application No. 63/197,749, filed on Jun. 7, 2021, provisional application No. 63/193,239, filed on May 26, 2021, provisional application No. 63/162,137, filed on Mar. 17, 2021.

(51) Int. Cl.
*H01F 7/20*       (2006.01)
*G01R 33/38*      (2006.01)
*G01R 33/3815*    (2006.01)

(52) U.S. Cl.
CPC ......... *H01F 7/202* (2013.01); *G01R 33/3802* (2013.01); *G01R 33/3815* (2013.01)

(58) Field of Classification Search
CPC ....................................................... H01F 7/202
See application file for complete search history.

(56) References Cited

U.S. PATENT DOCUMENTS

| | | |
|---|---|---|
| 3,210,643 A | 10/1965 | Else et al. |
| 3,662,554 A | 5/1972 | De Broqueville |
| 5,001,381 A | 3/1991 | Watanabe |
| 5,523,731 A | 6/1996 | Leupold |
| 6,116,257 A | 9/2000 | Yokota et al. |
| 6,885,267 B2 | 4/2005 | Kuriyama et al. |
| 8,860,539 B2 | 10/2014 | Sakellariou et al. |
| 10,006,446 B2 | 6/2018 | Purvis |
| 10,930,428 B2 | 2/2021 | Eberier et al. |

(Continued)

FOREIGN PATENT DOCUMENTS

| | | |
|---|---|---|
| CN | 110752767 A | 2/2020 |
| FR | 2500233 A1 | 2/1981 |

(Continued)

OTHER PUBLICATIONS

Bourzac, "Ceramics that won't shatter: a biomimetic ceramic that is strong and tough could be used to make lightweight vehicles," MIT Technology Review (Dec. 4, 2008).

(Continued)

*Primary Examiner* — Ramon M Barrera
(74) *Attorney, Agent, or Firm* — Sheppard, Mullin, Richter & Hampton LLP; Jaime D. Choi

(57) ABSTRACT

Some examples herein provide a method for generating a magnetic field. The method may include accumulating positive charges at a first electrode; accumulating negative charges at a second electrode; and rotating the first electrode relative to the second electrode so as to induce a relative angular velocity between the positive charges and the negative charges and thus generate a magnetic field. In some examples, the magnetic field may be used for propulsion.

34 Claims, 102 Drawing Sheets
(37 of 102 Drawing Sheet(s) Filed in Color)

(56) References Cited

U.S. PATENT DOCUMENTS

| | | | |
|---|---|---|---|
| 2007/0110208 | A1 | 5/2007 | Molina-Martinez |
| 2010/0194236 | A1 | 8/2010 | Verkoglyad et al. |
| 2015/0206635 | A1 | 7/2015 | Murase et al. |
| 2017/0170752 | A1 | 6/2017 | Wei |
| 2019/0107157 | A1 | 4/2019 | Schmitz et al. |

FOREIGN PATENT DOCUMENTS

| | | | |
|---|---|---|---|
| JP | 1992342494 | A | 11/1992 |
| RU | 2085016 | C1 | 7/1997 |
| WO | 2003064257 | A1 | 8/2003 |
| WO | 2012053921 | A2 | 4/2012 |
| WO | 2013/125865 | A1 | 8/2013 |

OTHER PUBLICATIONS

Bray et al., "On the thermal conductivity of diamond under changes to its isotopic character," Z. Phys. B. 84 (1): 51-57 (1991), DOI:10.1007/BF01453758.

Chapline et al., "Materials and Manufacturing," Wings In Orbit: Scientific and Engineering Legacies of the Space Shuttle (National Aeronautics and Space Administration, Ed. Wayne Hale): 200-225 (2011).

Christov, "General theory of electron emission from metals," Phys. Stat. Sol. 17(1): 11-17 (1966).

Cortes et al., "Novel materials with effective super dielectric constants for energy storage," J. Electron. Mater. 44: 1367-1376 (2015).

Cortes et al., "Tube-Super Dielectric Materials: Electrostatic Capacitors with Energy Density Greater than 200 J $cm^3$," Materials 8: 6208-6227 (2015).

Figgins et al., "Alternating current losses in superconductors," Nature 202: 890 (1964).

Fromille et al., "Super dielectric materials," Materials 7(12): 8197-8212 (2014).

Gab et al., "Metal-to-sapphire brazed and diffusion bonded windows for optics, ultra-high vacuum technics and electronics for maintenance at temperatures 77-800 K," Proc. Int. Conf. High Temperature Capillarity, Cracow, Poland, Ed. N. Eustathopoulos et al. (1997).

Güler et al., "A short review on mechanical properties of graphene reinforced metal matrix composites," Journal of Materials Research and Technology 9(3): 6808-6833 (2020).

Guo et al., "Adhesion at diamond/metal interfaces: a density functional theory study," University of South Carolina Scholar Commons, Faculty Publications, Department of Mechanical Engineering (2010).

Gurevich, "To Use or Not to Use Cool Superconductors?," Nature Mat. 10: 255-259 (2011).

Hidalgo-Manrique et al., "Copper/graphene composites: a review," Journal of Materials Science 54: 12236-12289 (2019), DOI: 10.1007/s10853-019-03703-5.

Ianu et al., "Power loss in grease lubricated ball bearings," IOP Conf. Ser.: Mater. Sci. Eng. 724: 012009 (2020).

Krucinska et al., "Direct measurement of the axial poisson's ratio of single carbon fibres," Composites Science and Technology 41(1): 1-12 (1991).

Kumar et al., "A new single/few-layered graphene oxide with a high dielectric constant of 106: contribution of defects and functional groups," RSC Advances 5: 14768-14779 (2015).

Kumar et al., "A new single/few-layered graphene oxide with a high dielectric constant of 106: contribution of defects and functional groups," RSC Advances 5: 14768-14779 Supplementary Information; 16 pages (2015).

Kumar et al., "Processing of graphene/CNT-metal powder," Powder Technology, Ed. Alberto Adriano Cavalheiro, IntechOpen, DOI: 10.5772/intechopen. 76897 (2017).

Larbalestier et al., "High-Tc Superconducting Materials for Electric Power Applications," Nature 414: 368-377 (2001).

Myatt et al., "Optical Contacting: Changing the interface of optics," Document #20060101, Precision Photonics, Inc., Boulder CO, Proc. of SPIE vol. 8600: 860021-12 (2013).

Nelias et al., "Power loss prediction in high-speed roller bearings," Tribology Series 27: 465-478 (1994).

Pasaribu, "Friction and Wear of Zirconia and Alumina Ceramics Doped with CuO," Ph.D. Thesis, University of Twente, Enschede, the Netherlands (Feb. 2005).

Phillips, Prof. Physics, "Superdielectric materials composed of NaCl, H2O, and porous alumina," Naval Postgraduate School, Monterey, CA 93950, 28 pages (2014).

Qiu et al., "Thermal conductivity of natural and synthetic diamonds with differing isotope contents," Thermochimica Acta 218: 257-268 (1993).

Rawal, "Materials and structures technology insertion into spacecraft systems: successes and challenges," Acta Astronautica 146: 151-160 (2018).

Rekha et al., "First report on high entropy alloy nanoparticle decorated graphene," Scientific Reports 8: 8737 (2018), DOI: 10.1038/s41598-018-27096-8 (2018).

Saadi et al., "Metal oxide nanostructures by a simple hot water treatment," Scientific Reports 7: Article No. 7158 (2017).

Shokrieh et al., "Prediction of Young's modulus of graphene sheets and carbon nanotubes using nanoscale continuum mechanics approach," Materials and Design 31(2): 790-795 (2010).

Sommerfeld, "Ein Beitrag zur hydrodynamischen Erkläerung der turbulenten Flüssigkeitsbewegüngen (A Contribution to Hydrodynamic Explanation of Turbulent Fluid Motions)," International Congress of Mathematicians 3: 116-124 (1908), Archived from the original (PDF) on Nov. 15, 2016.

Söndgen et al., "Power loss and axial load carrying capacity of radial cylindrical ball bearings," Power Transmission Engineering: 42-47 (Jun. 2013).

V. Steinberg, Introduction to Micro-fluidics, SMR1670-35, "Slip or no slip? Lecture 8," Summer School in Microfluidics, The Abdus Salam International Centre for Theoretical Physics, Trieste, Italy (Aug. 2005).

Voronov et al., "Boundary slip and wetting properties of interfaces: Correlation of the contact angle with the slip length," The Journal of Chemical Physics 124: 204701 (2006), doi: 10.1063/1.2194019.

Waits et al., "Gray-scale lithography for MEMS applications," Research rept., Army Research Lab Adelpi MD, Accession No. ADA447924 (2006).

White, Fluid Mechanics, New York City, NY, McGraw-Hill: pp. 477-485 (2011).

Wu et al., "Spin proximity effect in ultrathin superconducting Be—Au bilayers," Phys. Rev. Lett. 96: 127002 (2006).

Yan et al., "Investigating aluminum alloy reinforced by graphene nanoflakes," Materials Science and Engineering A 612: 440-444 (2014), DOI: 10.1016/j.msea.2014.06.077.

Yang et al., "Intrinsic toughening and stable crack propagation in hexagonal boron nitride," Nature 594: 57-61 (2021).

Yanigashita et al., "Highly ordered anodic porous oxides of transition metals fabricated by anodization combined with a pretexturing process," Electrochemistry Communications 123: 106916, 5 pages (2021).

Yoon et al., "Negative Thermal Expansion Coefficient of Graphene Measured by Raman Spectroscopy," Nano Letters 11 (8): 3227-3231 (2011).

Yoshizawa et al., "Atomic-layer Rashba-type superconductor protected by dynamic spin-momentum locking," Nature Communications 42: article No. 1462 (2021).

Yung et al., "An Analytic Solution for the Force Between Two Magnetic Dipoles," Magnetical and Electrical Separation 9: 39-52 (1998).

Zhang et al., "Bioinspired, graphene-enabled Ni composites with high strength and toughness," Science Advances 5(5): aav5577 (2019), DOI: 10.1126/sciadv.aav5577.

Zhang et al., "Effects of load on tribological properties of B4C and B4C—SiC ceramics sliding against SiC balls," Journal of Asian Ceramic Societies 8(3): 586-596 (2020).

Zhu et al., "Rate-Dependent Slip of Newtonian Liquid at Smooth Surfaces," Physical Review Letters 87(9): 096105 (2001).

(56) References Cited

OTHER PUBLICATIONS

International Search Report and Written Opinion for PCT/US2022/020411 dated Apr. 3, 2023; 25 pages.

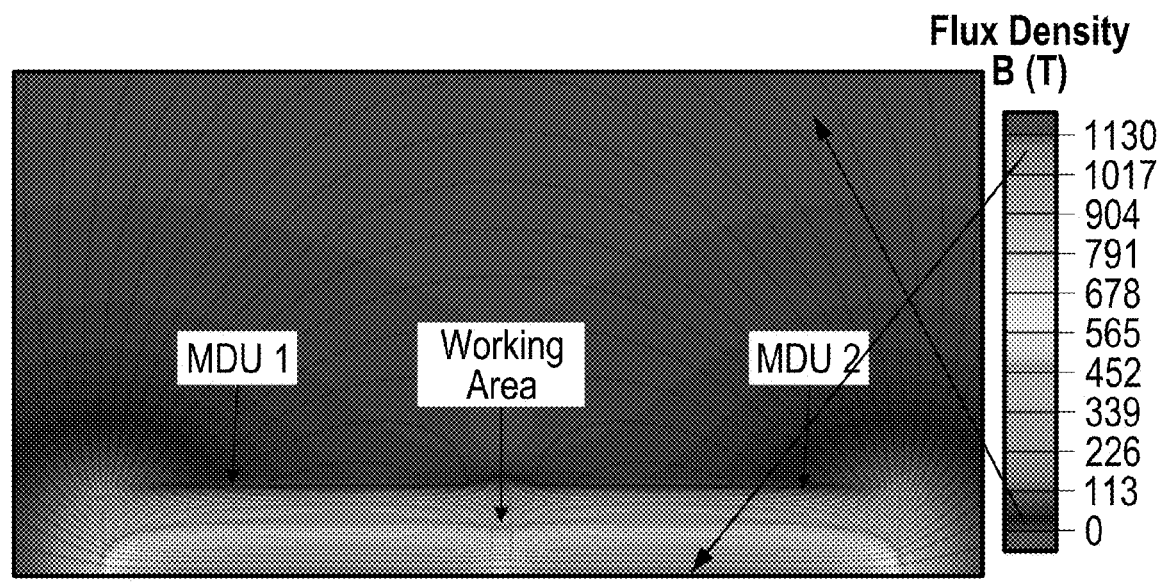
FIG. 24
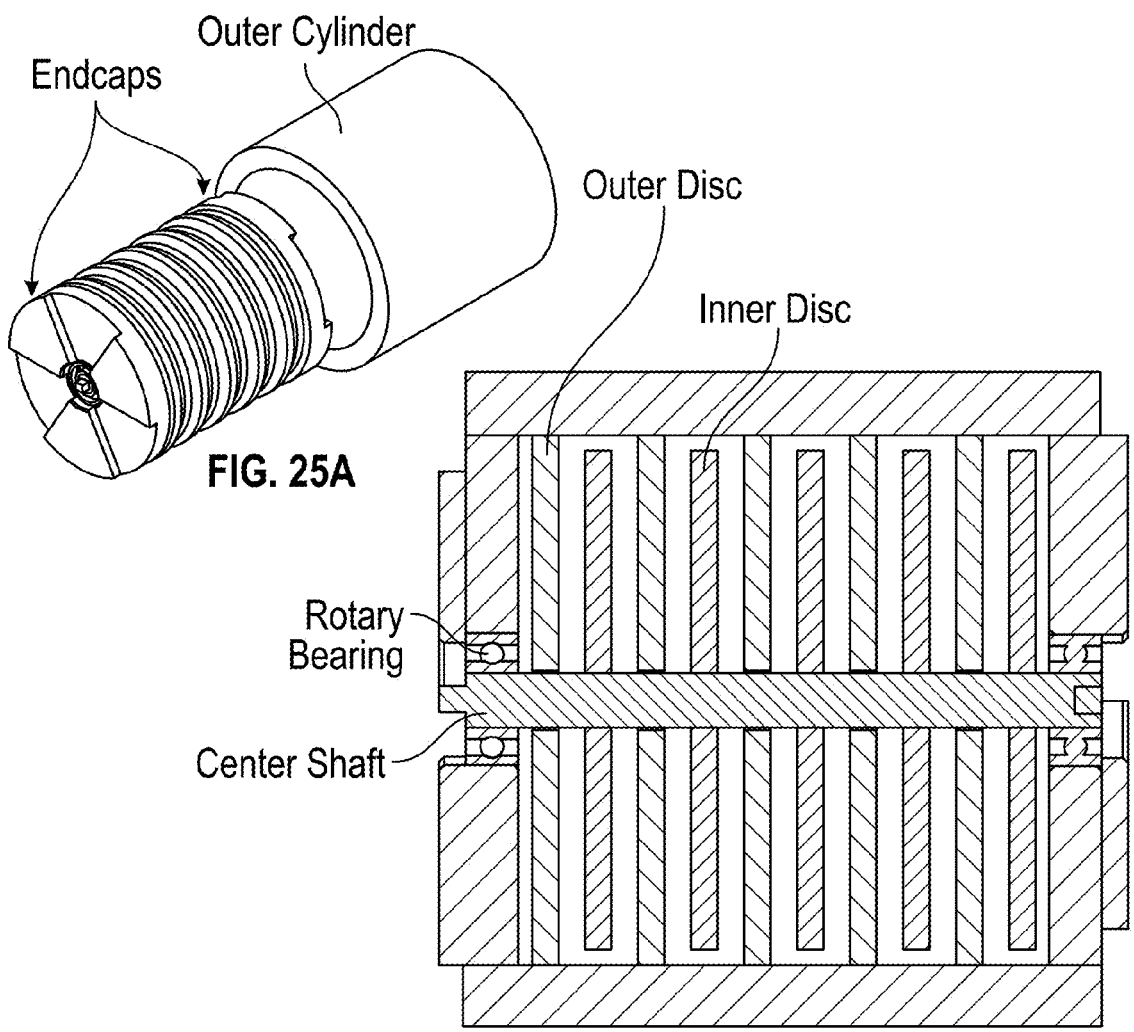
FIG. 25A
FIG. 25B

Equivalent Circuit

Table 13

| DISC RADIUS (M) / RPM | 0.1 | 0.5125 | 0.925 | 1.3375 | 1.75 | 2.1625 | 2.575 | 2.9875 | 3.4 | 3.8125 | 4.225 | 4.6375 | 5.05 | 5.4625 | 5.875 | 6.2875 | 6.7 | 7.1125 | 7.525 | 7.9375 | 8.35 | 8.7625 | 9.175 | 9.5875 | 10 |
|---|---|---|---|---|---|---|---|---|---|---|---|---|---|---|---|---|---|---|---|---|---|---|---|---|---|
| 100 | 0 | 1 | 5 | 15 | 31 | 57 | 94 | 145 | 211 | 294 | 397 | 522 | 671 | 845 | 1047 | 1279 | 1543 | 1841 | 2175 | 2547 | 2960 | 3415 | 3914 | 4459 | 5053 |
| 4062.5 | 1 | 25 | 114 | 314 | 668 | 1220 | 2015 | 3086 | 4508 | 6295 | 8500 | 11169 | 14345 | 18172 | 22394 | 27356 | 33002 | 39375 | 46521 | 54482 | 63303 | 73029 | 83703 | 95370 | 108073 |
| 8425 | 2 | 48 | 223 | 613 | 1304 | 2383 | 3935 | 6047 | 8805 | 12295 | 16603 | 21815 | 28019 | 35299 | 43741 | 53434 | 64461 | 76910 | 90866 | 106417 | 123647 | 142644 | 163493 | 182280 | 211093 |
| 12587.5 | 3 | 71 | 332 | 912 | 1941 | 3546 | 5856 | 8998 | 13102 | 18295 | 24706 | 32462 | 41693 | 52525 | 65089 | 79511 | 95920 | 114444 | 135212 | 158351 | 183991 | 212259 | 243282 | 277191 | 314112 |
| 16750 | 3 | 95 | 441 | 1212 | 2578 | 4709 | 7776 | 11950 | 17399 | 24295 | 32808 | 43109 | 55367 | 69752 | 86436 | 105588 | 127379 | 151978 | 179557 | 210286 | 243991 | 281873 | 323072 | 368101 | 417132 |
| 20912.5 | 4 | 118 | 550 | 1511 | 3214 | 5872 | 9697 | 14901 | 21696 | 30296 | 40911 | 53755 | 69041 | 86979 | 107783 | 131665 | 158838 | 189297 | 223803 | 262221 | 304678 | 351497 | 402681 | 458923 | 520182 |
| 25075 | 5 | 142 | 659 | 1810 | 3851 | 7035 | 11617 | 17852 | 26033 | 36296 | 49014 | 64402 | 82714 | 104206 | 129130 | 157742 | 190297 | 227047 | 268249 | 314155 | 365022 | 421102 | 482631 | 549923 | 623172 |
| 29237.5 | 6 | 165 | 767 | 2109 | 4487 | 8198 | 13538 | 20803 | 30290 | 42296 | 57117 | 75049 | 96388 | 121433 | 150478 | 183820 | 221756 | 264582 | 312594 | 366080 | 425385 | 490777 | 562441 | 640230 | 726192 |
| 33400 | 7 | 189 | 876 | 2408 | 5124 | 9361 | 15458 | 23754 | 34587 | 48296 | 65219 | 85696 | 110062 | 138659 | 171825 | 209897 | 253214 | 284673 | 356840 | 418025 | 485709 | 560331 | 642230 | 731744 | 829181 |
| 37562.5 | 8 | 212 | 985 | 2708 | 5761 | 10524 | 17379 | 26705 | 38894 | 54297 | 73322 | 96342 | 137410 | 155886 | 193172 | 235974 | 284673 | 338627 | 401285 | 469959 | 546396 | 628946 | 720120 | 822655 | 932291 |
| 41725 | 9 | 235 | 1094 | 3007 | 6397 | 11687 | 19299 | 29657 | 43192 | 60297 | 81425 | 106989 | 137410 | 173113 | 214519 | 262051 | 316132 | 377185 | 446631 | 521894 | 606356 | 698560 | 801809 | 913585 | 1035251 |
| 45887.5 | 9 | 259 | 1203 | 3306 | 7034 | 12850 | 21220 | 32608 | 47479 | 66297 | 89528 | 117635 | 151094 | 190340 | 235866 | 288129 | 347591 | 414719 | 489977 | 573829 | 666740 | 769175 | 881539 | 1004176 | 1138271 |
| 50050 | 10 | 282 | 1312 | 3606 | 7670 | 14013 | 23140 | 35559 | 51776 | 72297 | 97630 | 128282 | 164758 | 207367 | 257214 | 314236 | 379050 | 452253 | 534522 | 625763 | 727094 | 838799 | 961388 | 1095386 | 1241290 |
| 54212.5 | 11 | 305 | 1421 | 3905 | 8307 | 15176 | 25061 | 38510 | 56073 | 78297 | 105733 | 138928 | 178432 | 224793 | 278561 | 340283 | 410639 | 489768 | 579868 | 677698 | 787094 | 908404 | 1041173 | 1186297 | 1344310 |
| 58375 | 12 | 329 | 1529 | 4204 | 8944 | 16339 | 26981 | 41461 | 60370 | 84298 | 113836 | 149575 | 192106 | 242820 | 299988 | 366360 | 441988 | 527322 | 623013 | 729633 | 847771 | 978019 | 1120867 | 1277238 | 1447330 |
| 62537.5 | 13 | 352 | 1638 | 4503 | 9580 | 17502 | 28902 | 44413 | 64667 | 90298 | 121939 | 160222 | 205780 | 259247 | 321255 | 392438 | 473427 | 564857 | 687359 | 781567 | 908145 | 1047633 | 1200757 | 1368818 | 1550350 |
| 66700 | 14 | 375 | 1747 | 4802 | 10217 | 18665 | 30822 | 47364 | 68964 | 96298 | 130041 | 170868 | 219454 | 276474 | 342602 | 418515 | 504886 | 602391 | 711705 | 833582 | 968438 | 1117248 | 1289547 | 1459029 | 1653370 |
| 70862.5 | 14 | 399 | 1856 | 5102 | 10853 | 19828 | 32743 | 50315 | 73261 | 102298 | 138144 | 181515 | 233128 | 293701 | 363950 | 444592 | 536345 | 639925 | 756050 | 885437 | 1028802 | 1186863 | 1380338 | 1549939 | 1756389 |
| 75025 | 15 | 423 | 1965 | 5401 | 11490 | 20991 | 34664 | 53266 | 77558 | 108299 | 146247 | 192162 | 246802 | 310927 | 385297 | 470669 | 567804 | 677460 | 786396 | 937371 | 1089145 | 1256477 | 1460126 | 1648350 | 1859409 |
| 79187.5 | 16 | 446 | 2074 | 5700 | 12127 | 22154 | 36584 | 56217 | 81855 | 114299 | 154350 | 202808 | 260476 | 328154 | 406644 | 496746 | 599263 | 714984 | 823396 | 989586 | 1149489 | 1326092 | 1519815 | 1731761 | 1962429 |
| 83350 | 17 | 470 | 2183 | 5999 | 12763 | 23317 | 38505 | 59169 | 86152 | 120299 | 162452 | 213455 | 274150 | 345381 | 427991 | 522824 | 630722 | 752528 | 844741 | 1041241 | 1209829 | 1385706 | 1599785 | 1822671 | 2065449 |
| 87512.5 | 18 | 493 | 2291 | 6299 | 13400 | 24480 | 40425 | 62120 | 90449 | 126299 | 170555 | 224101 | 287824 | 362608 | 449338 | 548901 | 662181 | 790062 | 879087 | 1093175 | 1270176 | 1455321 | 1679494 | 1913582 | 2168469 |
| 91675 | 19 | 516 | 2400 | 6598 | 14036 | 25643 | 42346 | 65071 | 94747 | 132300 | 178658 | 234748 | 301498 | 379835 | 470686 | 574978 | 693640 | 827597 | 934533 | 1145110 | 1330520 | 1534936 | 1759264 | 2004492 | 2271488 |
| 95837.5 | 20 | 540 | 2509 | 6897 | 14673 | 26806 | 44266 | 68022 | 99044 | 138300 | 186761 | 245395 | 315172 | 397062 | 492033 | 601055 | 725098 | 865131 | 977778 | 1197045 | 1390864 | 1604550 | 1839073 | 2095403 | 2374508 |
| 100000 | 20 | 563 | 2618 | 7196 | 15310 | 27969 | 46187 | 70973 | 103341 | 144300 | 194863 | 256041 | 328846 | 414288 | 513380 | 627133 | 756557 | 902686 | 1022124 | 1248979 | 1451207 | 1674166 | 1918863 | 2186314 | 2475528 |

Table 14 (continued)

Table 14 (continued)

FIG. 94F

METHODS AND APPARATUSES FOR PRODUCING ULTRA-STRONG MAGNETIC FIELDS, AND PROPULSION SYSTEMS AND METHODS UTILIZING PLANETARY MAGNETIC FIELDS

CROSS-REFERENCE TO RELATED APPLICATIONS

This application claims priority to the following applications, the entire contents of each of which are incorporated by reference herein:

U.S. Provisional Patent Application No. 63/162,137, filed Mar. 17, 2021 and entitled "Methods and Apparatuses for Producing Ultra-strong Magnetic Fields;"

U.S. Provisional Patent Application No. 63/193,239, filed May 26, 2021 and entitled "Methods and Apparatuses for Producing Ultra-strong Magnetic Fields;" and U.S. Provisional Patent Application No. 63/197,749 filed Jun. 7, 2021 and entitled "Propulsion Systems and Methods Utilizing Planetary Magnetic Fields."

FIELD

This application relates to the generation and use of magnetic fields.

BACKGROUND

It is well known that current moving through a wire produces a magnetic field. The magnetic field can be concentrated or shaped by shaping the geometry of the wire. For instance, FIG. 1A schematically illustrates an example of a wire shaped into a coil which helps focus and concentrate a magnetic field inside.

Powerful resistive magnets are capable of producing fields in the 1 Tesla range, whereas a typical magnetic resonance imaging machine using superconducting super magnets may be capable of producing fields on the order of 5-10 Tesla. At the time of this application, the strongest magnet in the world (a magnet at the National High Magnetic Field Laboratory at Florida State University) boasts a field of 45.5 Tesla.

At the most fundamental level, moving charges produce magnetic fields. When an electric field is applied to a conducting wire, electrons move in that wire and those moving electrons produce a measurable magnetic field. What may be surprising to a layperson is the speed at which those electrons travel in the wire. The net velocity of the electrons in a wire are best measured in mm/min speeds. For instance, a wire with a cross sectional area of $3.0 \times 10^{-6}$ $m^2$ (~2 mm diameter) carrying 10 Amps of current has a net electron velocity of $2.5 \times 10^{-4}$ m/s. Most species of snails move at faster velocities (0.0028-0.013 m/s) than the aforementioned electrons.

Additionally, a number of technologies have been developed over the centuries in order for humankind to realize the dream of flight. Hot air balloons, based on Archimedes' principle, a physics law from over 2000 years ago, is one of the first realized technologies for manned flight. Later, propeller-based blimps, zeppelins, were developed based on both Archimedes' and Bernoulli's principles. With Bernoulli's principles, the physics moved into the $16^{th}$ century. Later in the $20^{th}$ century, jet airplanes and rockets were developed to help planes travel faster and to get humankind into Earth's orbit and ultimately onto the moon. However, the physics is still fundamentally that of Isaac Newton and resides in the $16^{th}$ century. In fact, the well-known rocket equations can be directly derived from Newton's equations. Fundamentally, all of the modern technologies believed to be in use at the time of this application to travel any useful distance from one point on the Earth to another point on the Earth or to achieve orbit around the Earth or escape Earth's gravitational well altogether involve the use of chemical reactions, be it combustion for airplanes or a controlled explosion for that of rockets.

By far the most expensive and difficult part of realizing space travel is getting from the surface of the Earth into orbit. A technology that allows one to easily and repeatably achieve orbit and return to the point of origin, or any other point on Earth, would be an enabling technology of unimaginable value. Large, livable, workable structures could be constructed in orbit. Once a spaceport in orbit were constructed, launching to other bodies within the solar system would be much easier and cost efficient. Being able to launch from orbit would enable much easier inter-planetary and intra-solar system travel. Low-cost and efficient space travel allows access to practically limitless resources within the solar system. To wit, an average sized asteroid holds resources in the trillions of U.S. dollars, with some asteroids estimated to hold resources in the many quadrillions of U.S. dollars. In fact, one asteroid has been identified as having the value of 70,000 times the current global economy. Besides the clear economic value, such a technology would be invaluable for allowing humans to explore and colonize the solar system, allowing humankind to achieve the long sought-after dream of becoming a spacefaring race.

SUMMARY

Methods and apparatuses for producing ultra-strong magnetic fields, and propulsion systems and methods utilizing planetary magnetic fields, are provided herein.

Some examples herein provide a method for generating a magnetic field. The method may include accumulating positive charges at a first electrode; accumulating negative charges at a second electrode; and rotating the first electrode relative to the second electrode so as to induce a relative angular velocity between the positive charges and the negative charges and thus generate a magnetic field.

In some examples, a dielectric material is disposed between the first and second electrodes. In some examples, the dielectric material has a dielectric constant greater than $10^5$. In some examples, the dielectric material includes a plurality of curved surfaces that contact the first electrode or the second electrode at respective points. In some examples, a lubricating fluid occupies dead spaces between the curved surfaces.

In some examples, the first and second electrodes include parallel plates.

In some examples, the first and second electrodes include concentric spheres.

In some examples, the first and second electrodes include concentric cylinders.

In some examples, the first electrode or the second electrode includes a conductive fluid. In some examples, the conductive fluid includes mercury.

Some examples herein provide a device. The device may include a first electrode; a second electrode; a dielectric material disposed between the first and second electrodes such that the first electrode can accumulate positive charge and the second electrode can accumulate negative charge; and a drive mechanism configured to rotate the first electrode relative to the second electrode so as to induce an angular velocity between the positive charges and the negative charges and thus generate a magnetic field.

In some examples, the dielectric material has a dielectric constant greater than $10^5$. In some examples, the dielectric material includes a plurality of curved surfaces that contact the first electrode or the second electrode at respective points. In some examples, the device further includes a lubricating fluid occupying dead spaces between the curved surfaces.

In some examples, the first and second electrodes include parallel plates.

In some examples, the first and second electrodes include concentric spheres.

In some examples, the first and second electrodes include concentric cylinders.

In some examples, the first electrode or the second electrode includes a conductive fluid. In some examples, the conductive fluid includes mercury.

Some examples herein provide a device for generating an ultra-high strength magnetic field. The device may include a cylindrical housing having an interior surface and a longitudinal axis, the cylindrical housing forming a first electrode. The device may include a first plurality of conductive plates that extend inward from, and are electrically coupled to, the interior surface, the first plurality of conductive plates spaced-apart along the longitudinal axis. The device may include a shaft concentrically disposed within the interior of the cylindrical housing, the shaft forming a second electrode. The device may include a second plurality of conductive plates extending from, and electrically coupled to, the shaft, respective ones of the second plurality of conductive plates interdigitated with respective adjacent conductive plates of the first plurality of conductive plates. The device may include a layer of dielectric material disposed on opposing faces of the first and second pluralities of conductive plates. The device may include a drive mechanism coupled to the shaft to rotate the second plurality of conductive plates relative to the first plurality of conductive plates to generate a magnetic field.

In some examples, the dielectric material has a dielectric constant greater than $10^5$.

In some examples, the device further includes a conductive fluid disposed within the interior and between opposing faces of the first and second pluralities of conductive plates. In some examples, the conductive fluid facilitates relative motion between the first and second pluralities of conductive plates. In some examples, the conductive fluid includes mercury.

Some examples herein provide a device for generating an ultra-high strength magnetic field. The device may include a spherical housing having an interior, an interior surface and an axis, the cylindrical housing forming a first electrode. The device may include a shaft disposed within the interior, and disposed along the axis, the shaft forming a second electrode. The device may include a second sphere having an exterior surface, the second sphere disposed concentrically within the interior, and electrically coupled to, the shaft. The device may include a layer of dielectric material disposed on interior surface of the first sphere and the exterior surface of the second sphere. The device may include a drive mechanism coupled to the shaft to rotate the second sphere relative to the first sphere to generate a magnetic field.

In some examples, the dielectric material has a dielectric constant greater than $10^5$.

In some examples, the device further includes a conductive fluid disposed between the interior surface and the exterior surface. In some examples, the conductive fluid facilitates relative motion between the second sphere and the first sphere. In some examples, the conductive fluid includes mercury.

Some examples herein provide a device for generating an ultra-high strength magnetic field. The device may include a housing including a first solid of revolution having an axis, an interior and an interior surface, the housing forming a first electrode. The device may include a shaft disposed through the interior and disposed along the axis, the shaft forming a second electrode. The device may include a rotor including a second solid of revolution having an exterior surface, the rotor disposed concentrically within the interior, and electrically coupled to, the shaft. The device may include a layer of dielectric material disposed on interior surface of the housing and the exterior surface of the rotor. The device may include a drive mechanism coupled to the shaft to rotate the rotor relative to the housing to generate a magnetic field.

In some examples, the dielectric material has a dielectric constant greater than $10^5$.

In some examples, the dielectric material includes a plurality of curved surfaces. In some examples, the device includes a lubricating fluid occupying dead spaces between the curved surfaces.

In some examples, the device includes a conductive fluid disposed between the interior surface and the exterior surface. In some examples, the conductive fluid facilitates relative motion between the rotor and the housing.

Some examples herein provide a device for generating a magnetic field. The device may include a first electrode including a first plurality of segments that are electrically insulated from each other, and a second electrode including a second plurality of segments that are electrically insulated from each other. The device further may include a dielectric material disposed between the first and second electrodes such that a first subset of the first plurality of segments are configured to accumulate positive charge, a second subset of the first plurality of segments are configured to accumulate negative charge, a first subset of the second plurality of segments are configured to accumulate negative charge, and a second subset of the second plurality of segments are configured to accumulate positive charge. The device further may include a drive configured to rotate the first electrode relative to the second electrode so as to induce an angular velocity between the positive charges and the negative charges and thus generate a current density profile. The device further may include a circuit configured to interrupt the current density profile produced by the first and second electrodes by changing respective polarities of the first and second pluralities of segments as the first electrode rotates relative to the second electrode.

In some examples, in any of the above methods or devices, the rotating first and second electrodes store electrical energy.

Some examples herein provide a method of extracting the stored electrical energy from the rotating first and second electrodes of such methods or devices. The method may include applying an electrical load between the electrodes; and using a voltage potential between the electrodes drive a current through the load.

Additionally, or alternatively, in some examples, in any of the above methods or devices, the rotating first and second electrodes store magnetic energy.

Some examples herein provide a method of extracting the stored magnetic energy from the rotating first and second electrodes of such methods or devices. The method may include moving a conducting coil or windings relative to the magnetic field to generate an electromotive force on terminals of the conducting coil or windings; and using the electromotive force to drive a current through an electrical load.

Some examples herein provide a propulsion system for use in an external magnetic field. The propulsion system may include a first electrode and a second electrode. The propulsion system may include a dielectric material disposed between the first and second electrodes such that the first electrode is configured to accumulate positive charge and the second electrode is configured to accumulate negative charge. The propulsion system may include a drive configured to rotate the first electrode relative to the second electrode so as to induce an angular velocity between the first electrode and the second electrode to generate a magnetic field. The propulsion system may include a magnetic shield configured to generate lift. The magnetic shield may be configured to enclose only a portion of each of the first and second electrodes so as to interrupt the external magnetic field between the first and second electrodes.

In some examples, the magnetic shield includes a superconductor.

In some examples, the magnetic shield is configured to enclose approximately half of each of the first and second electrodes.

In some examples, the external magnetic field extends in an x direction, the first and second electrodes lie in an x-y plane, and the lift is generated in a z direction.

In some examples, the external magnetic field is in an x direction, the first and second electrodes lie in a y-z plane, and the lift is generated in a z direction.

In some examples, the external magnetic field is in an x direction, the first and second electrodes lie in an x-y plane, and the lift is generated in a y direction.

In some examples, the magnetic shield is configured to move relative to the first and second electrodes to adjust a magnitude of the lift.

In some examples, the external magnetic field is substantially symmetrical.

In some examples, the first electrode or the second electrode includes a conductive fluid. In some examples, the conductive fluid includes mercury.

In some examples, the dielectric material includes a plurality of curved surfaces that contact the first electrode or the second electrode at respective points. In some examples, the propulsion system includes a lubricating fluid occupying dead spaces between the curved surfaces.

In some examples, the dielectric material includes a sufficient surface structure to define points that contact the first electrode or the second electrode and inhibit optical contacting with the first electrode or the second electrode.

Some examples herein provide a propulsion system for use in an external magnetic field. The propulsion system may include a first electrode including a first plurality of segments that are electrically insulated from each other. The propulsion system may include a second electrode including a second plurality of segments that are electrically insulated from each other. The propulsion system may include a dielectric material disposed between the first and second electrodes such that a first subset of the first plurality of segments are configured to accumulate positive charge, a second subset of the first plurality of segments are configured to accumulate negative charge, a first subset of the second plurality of segments are configured to accumulate negative charge, and a second subset of the second plurality of segments are configured to accumulate positive charge. The propulsion system may include a drive configured to rotate the first electrode relative to the second electrode so as to induce an angular velocity between the positive charges and the negative charges and thus generate a current density profile. The propulsion system may include a circuit configured to generate lift. The circuit may be configured to interrupt the current density profile produced by the first and second electrodes by changing respective polarities of the first and second pluralities of segments as the first electrode rotates relative to the second electrode.

In some examples, the propulsion system includes a conductive fluid disposed between the first and second electrodes and in electrical contact with at least one segment of the first plurality of segments and with at least one segment of the second plurality of segments. In some examples, the conductive fluid includes mercury. In some examples, the angular velocity between the positive charges and the negative charges generates a magnetic field through the mercury, and wherein the magnetic field and the flow of current through the mercury between at least one segment of the first plurality of segments and least one segment of the second plurality of segments induces a magnetohydrodynamic force.

In some examples, the external magnetic field is substantially symmetrical.

In some examples, the dielectric material includes a plurality of curved surfaces that contact the first electrode or the second electrode at respective points. In some examples, the propulsion system includes a lubricating fluid occupying dead spaces between the curved surfaces.

In some examples, the dielectric material includes a sufficient surface structure to define points that contact the first electrode or the second electrode and inhibit optical contacting with the first electrode or the second electrode.

It is to be understood that any respective features/examples of each of the aspects of the disclosure as described herein may be implemented together in any appropriate combination, and that any features/examples from any one or more of these aspects may be implemented together with any of the features of the other aspect(s) as described herein in any appropriate combination to achieve the benefits as described herein.

BRIEF DESCRIPTION OF THE DRAWINGS

The patent or application file includes at least one drawing executed in color. Copies of this patent or patent application publication with color drawing(s) will be provided by the Office upon request and payment of the necessary fee.

FIG. 10A: Length=20 cm, Diameter=10 cm, SD thickness=5 microns, electrode spacing=1.0 mm, RPM=100,000; FIG. 10B: Length=2 meters, Diameter=1 meter, SD thickness=5 microns, electrode spacings=1.0 cm, RPM=100,000. Both cases $k=1\times10^9$, Voltage=2 V.

FIG. 19A: Length=20 cm, Diameter=10 cm, SD thickness=5 microns, electrode spacing=1.0 mm, RPM=100,000; FIG. 19B: Length=2 meters, Diameter=1 meter, SD thickness=5 microns, electrode spacings=1.0 cm, RPM=100,000. Both cases $k=1\times10^9$, Voltage=2 V.

FIG. 24 illustrates the calculated flux density in an FEA model of example side by side MDUs with 10 cm separation; Lengths=2 meters, Diameters=1 meter, SD thickness=5 microns, electrode spacings=1.0 cm, RPM=100,000, $k=1\times10^9$, Voltage=2 V; axisymmetric model with the horizontal axis being the axis of symmetry.

FIGS. 25A and 25B schematically illustrate perspective and cross-sectional views of a micro ultra-magnet (MUM) core.

FIG. 28A: patterning/masking of the growth substrate; FIG. 28B: CVD grown diamond in the exposed areas.

FIG. 30A: setting the diameter and inner radius of the endcap (cross-sectional view);

FIG. 30B: use of secondary mask to grow clocking features (plan view); FIG. 30C: finished endcap (perspective view).

FIG. 33A: front perspective view of the MUM core; FIG. 33B: rear (180 deg rotated) perspective view of the MUM core; as can be seen, the front and rear central shaft and endcaps have complementary interlocking features allowing for the multiple MUMs to be axially linked.

FIG. 34A: perspective view; FIG. 34B: cross sectional view.

FIG. 42A: stress profile (Tresca) on discs; FIG. 42B: displacement from nominal profile, electrostatic pressure deformation only (FEA).

FIG. 44A: axial displacement; FIG. 44B: radial displacement; FIG. 44C: maximum principal component of the mechanical stress tensor.

FIG. 46A: axial displacement; FIG. 46B: radial displacement; FIG. 46B: maximum principal component of the mechanical stress tensor. QuickField™.

FIG. 47A: axial deformation; FIG. 47B: radial deformation.

FIG. 78A: default configuration, with a 180-degree exposure ($F_z$=113 lbs); FIG. 78B: 130-degree exposure ($F_z$=124 lbs); FIG. 78C: different geometry method of occluding the external field-produces similar optimum as FIG. 78B.

FIG. 88 illustrates the calculated dissipative power losses of a 1-cm MUM vs the average normal force per disc pair in the MUM device. There are approximately 200-disc interfaces in the MUM device described in the text.

Figure 89A:
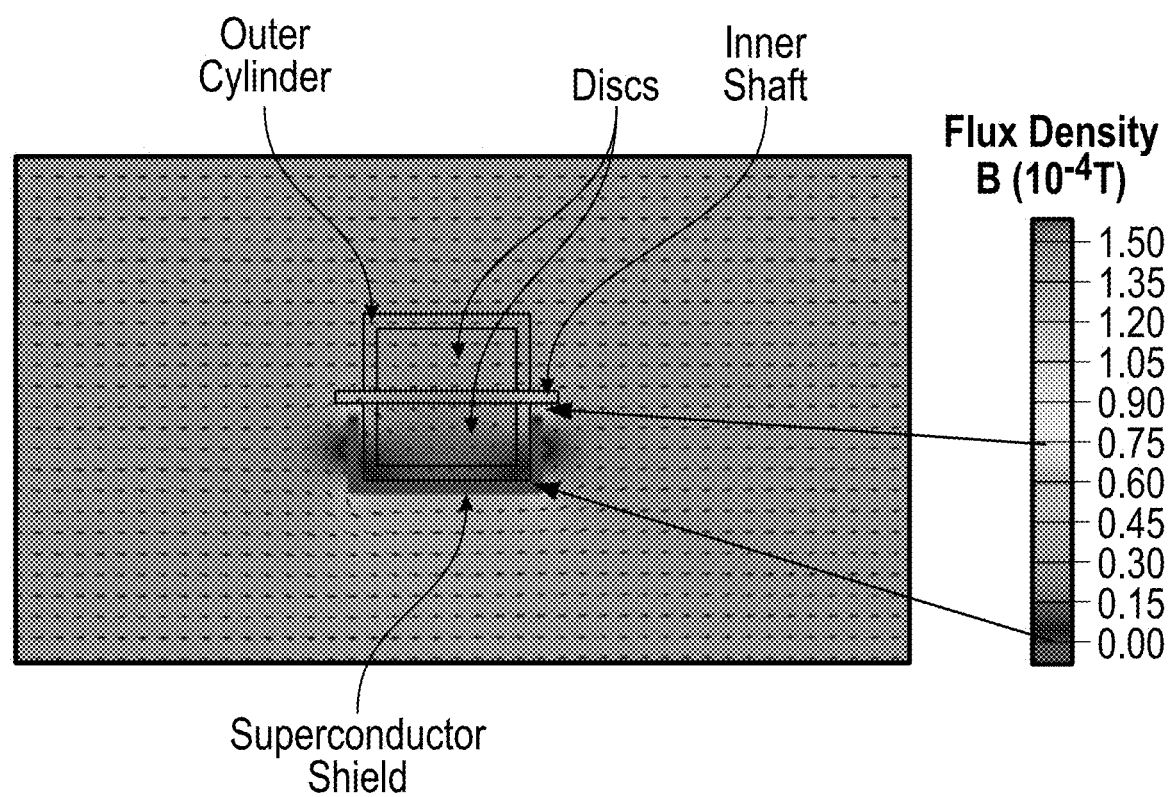
Figure 89B:
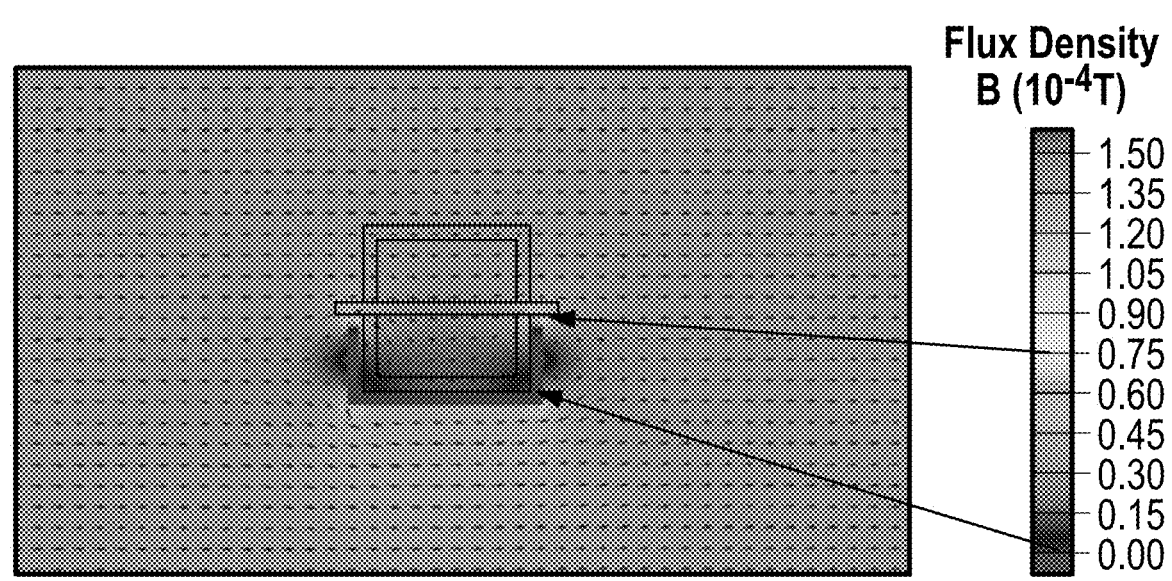

FIGS. 89A and 89B illustrate the calculated flux density in an FEA model of an example 1-cm MUM including a superconductor shield blocking an external magnetic field, here assumed to be Earth's magnetic field at the equator, ~30 uTesla; FIG. 89A: standard superconductor shield; FIG. 89B: superconductor shield in the Zero-Field Cooled (ZFC) condition.

Figure 90B:
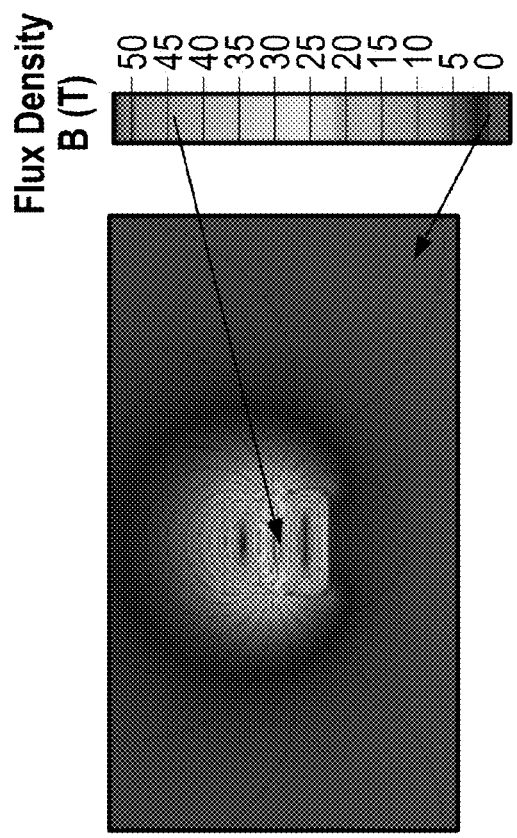
Figure 90A:
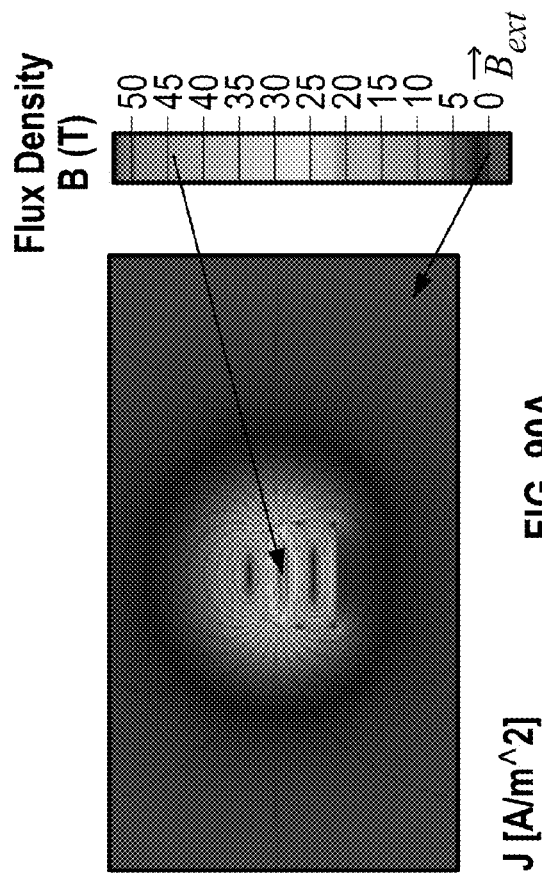

FIGS. 90A and 90B illustrate the calculated flux density in an FEA model of an example 1-cm MUM including a superconductor shield blocking an external magnetic field, here assumed to be Earth's magnetic field at the equator, ~30 uTesla; FIG. 90A: standard superconductor shield; FIG. 90B: superconductor shield in the Zero-Field Cooled (ZFC) condition.

Figure 91B:
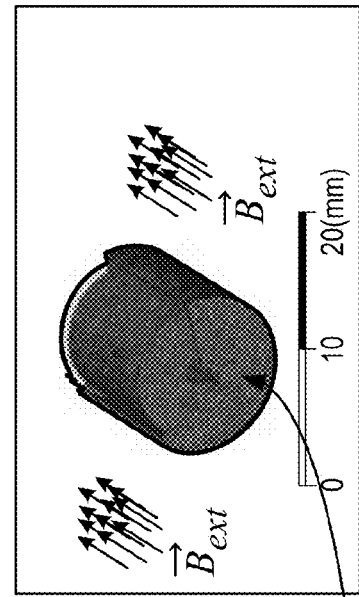
Figure 91A:
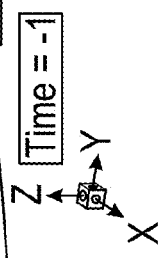

FIGS. 91A-91B illustrate an ANSYS Maxwell™ magneto-static simulation of the standard condition superconductor shield of FIG. 90A; FIG. 91A: the effective current density of the MUM device is shown; FIG. 91B: mesh on shield and discs is shown.

Figure 92:
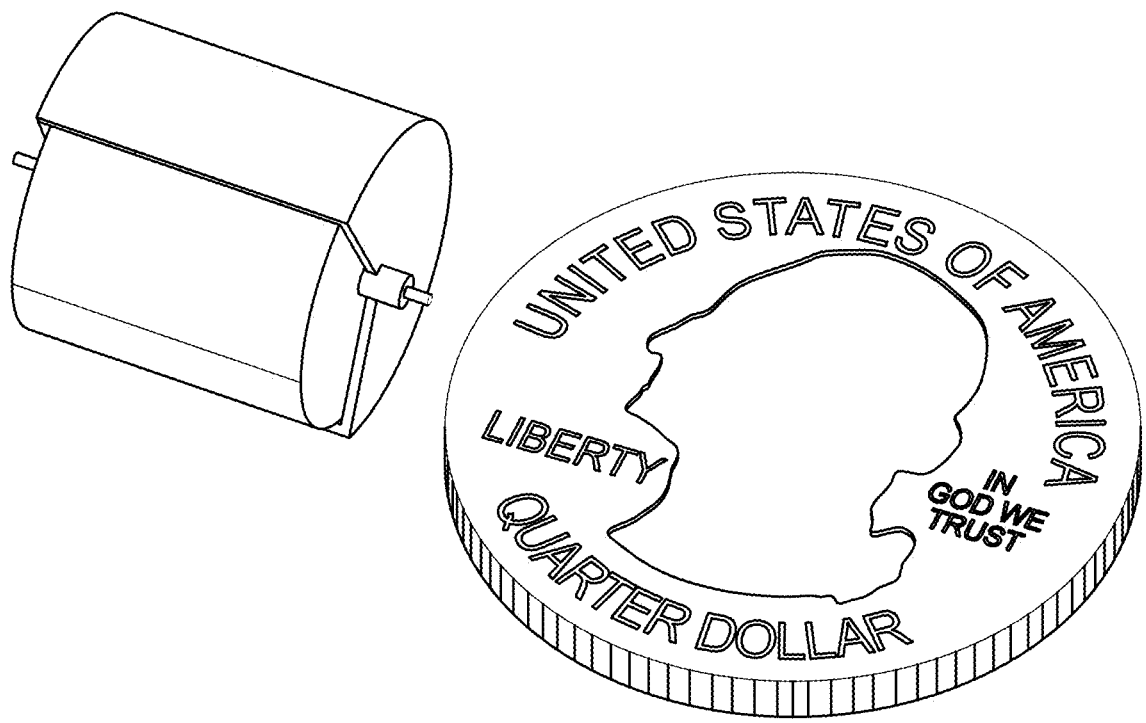

FIG. 92 schematically illustrates a size comparison between an example 1-cm MUM with a superconductor shield as compared to a United States quarter dollar coin.

FIG. 93 illustrates table 13 showing the calculated relationship between Lift (in lbs) versus Disc Radius and Rotation Speed (rotations per minute) for an example pair of counter-rotating oppositely charged discs; $k=1\times10^9$, V=2 volts, d=2 microns.

Figure 94A:
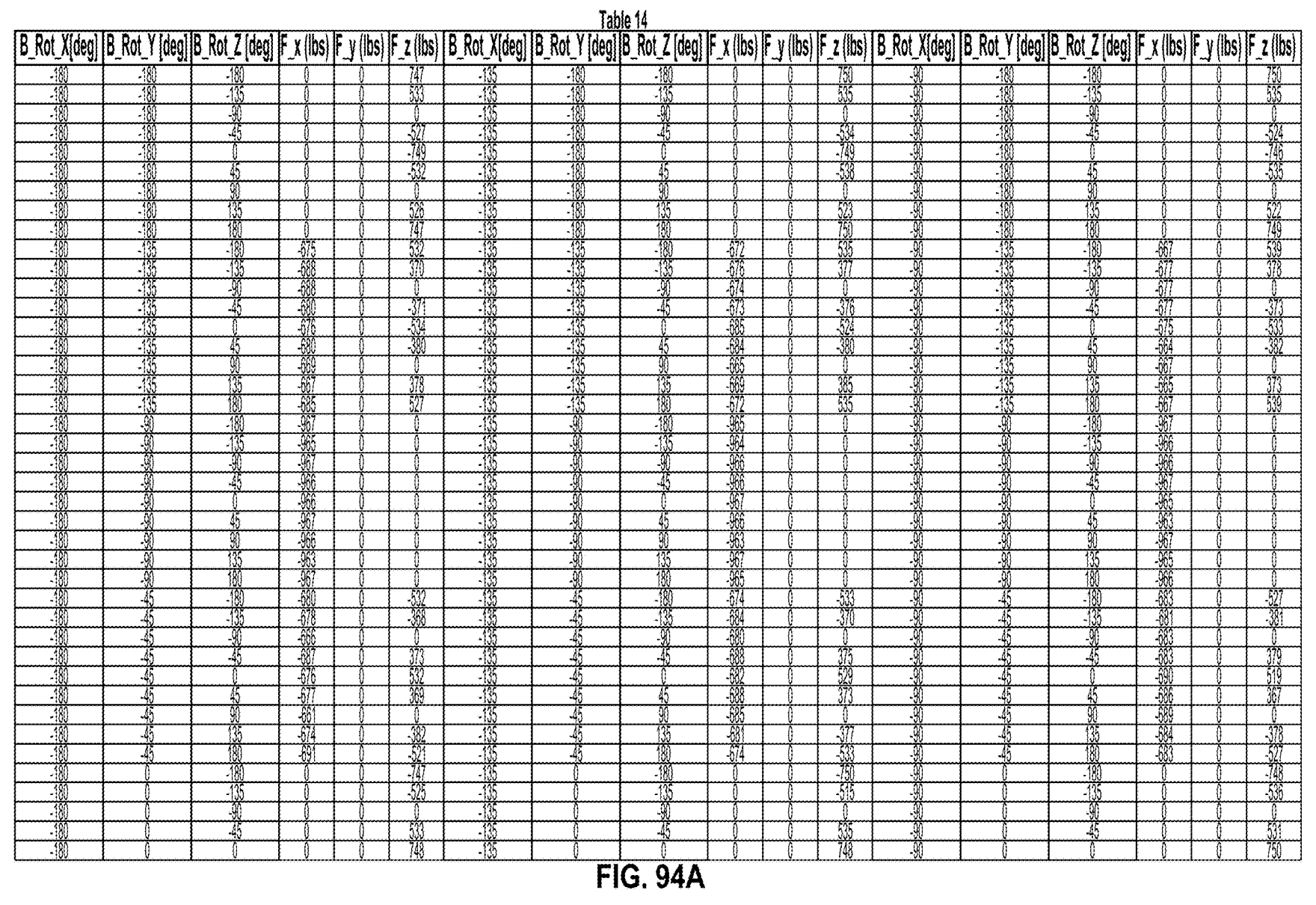
Figure 94B:
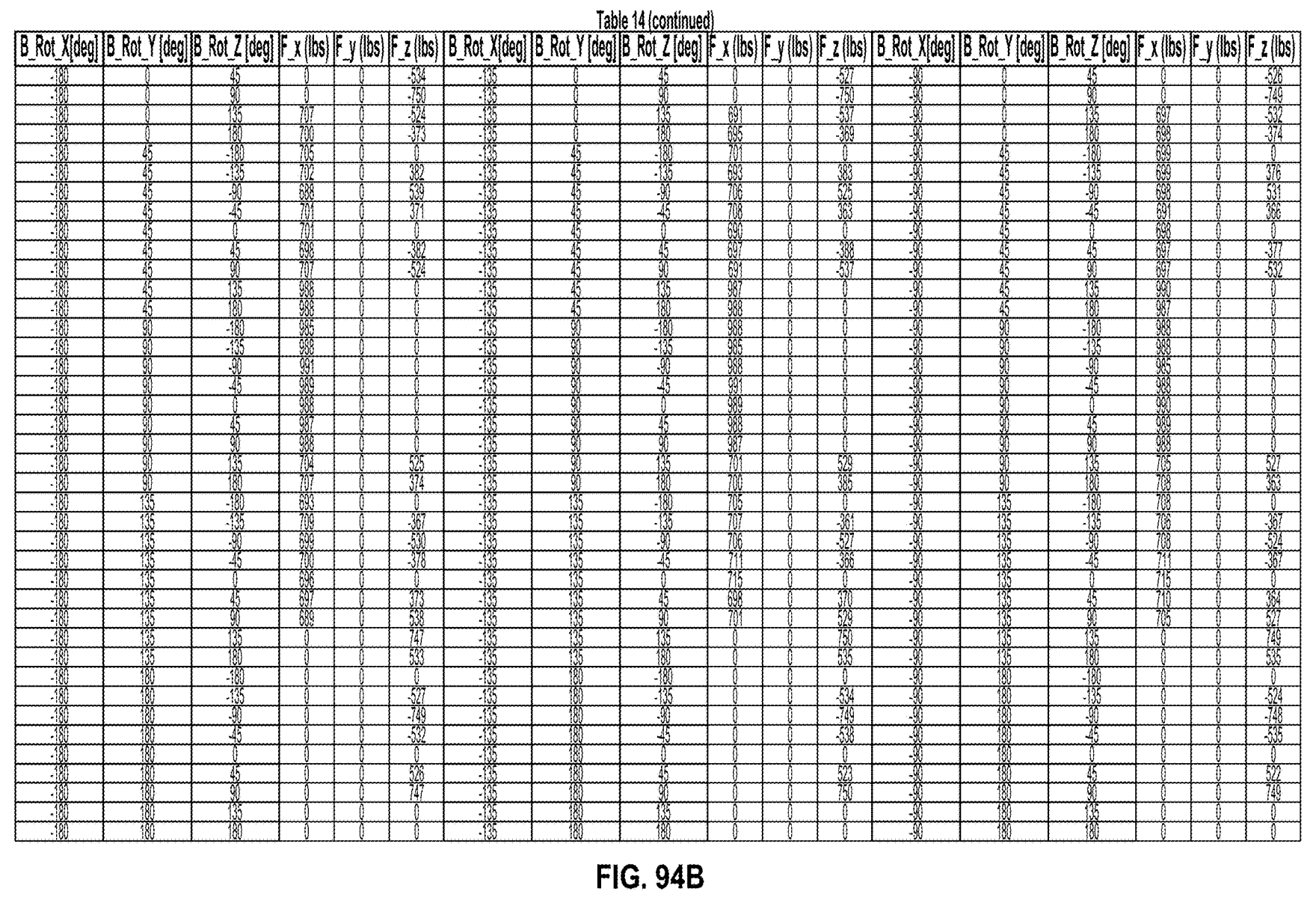
Figure 94C:
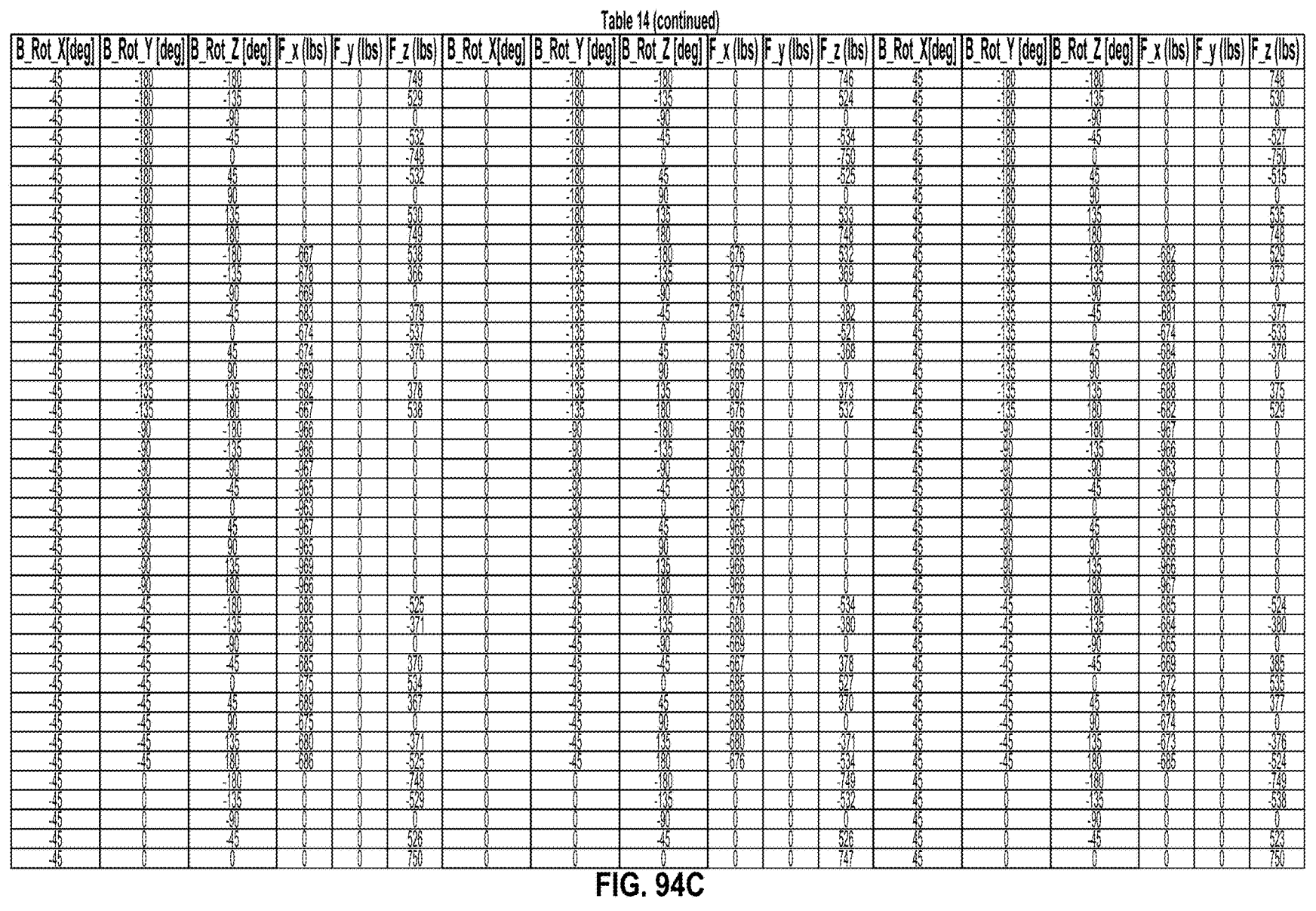
Figure 94D:
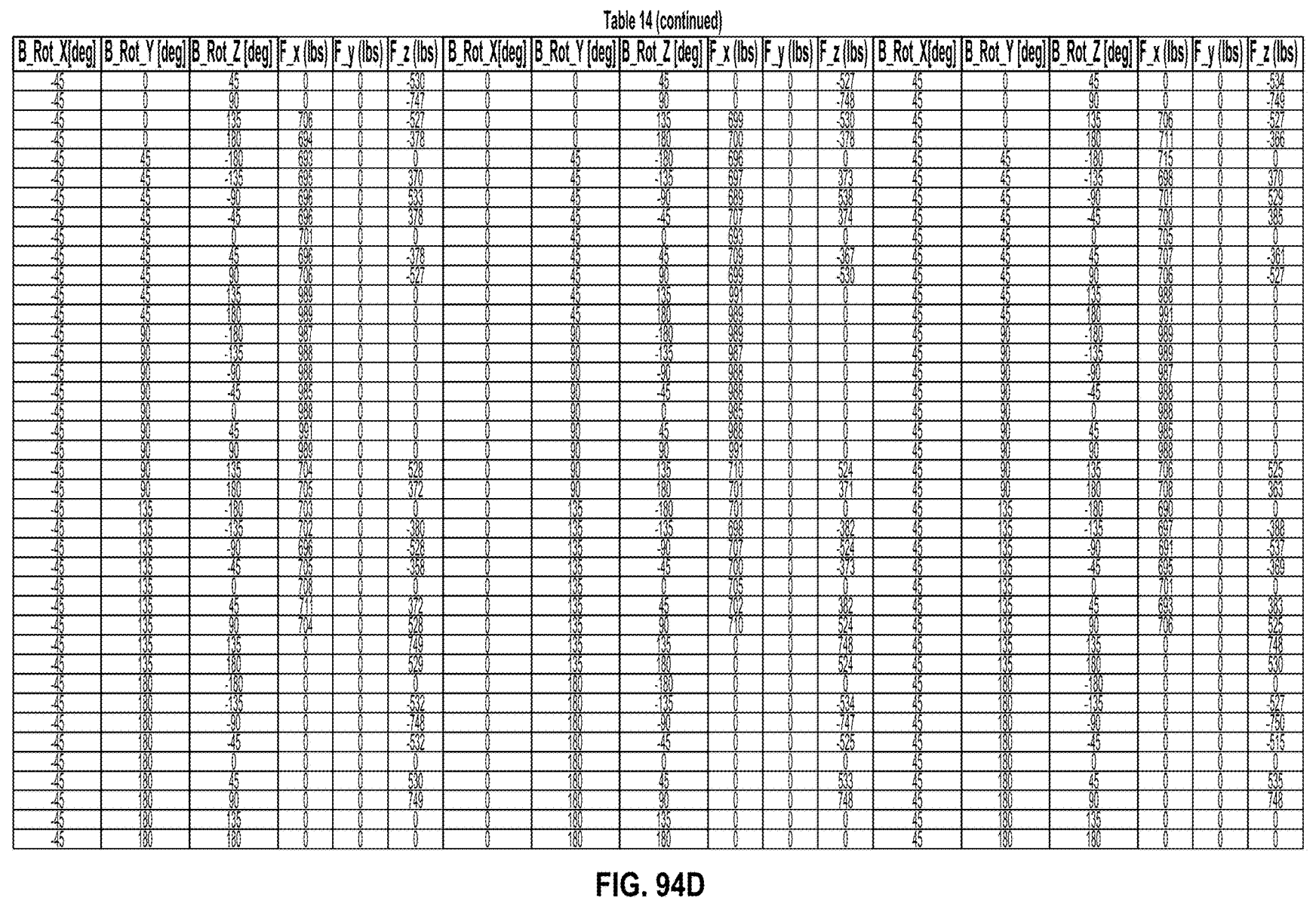
Figure 94E:
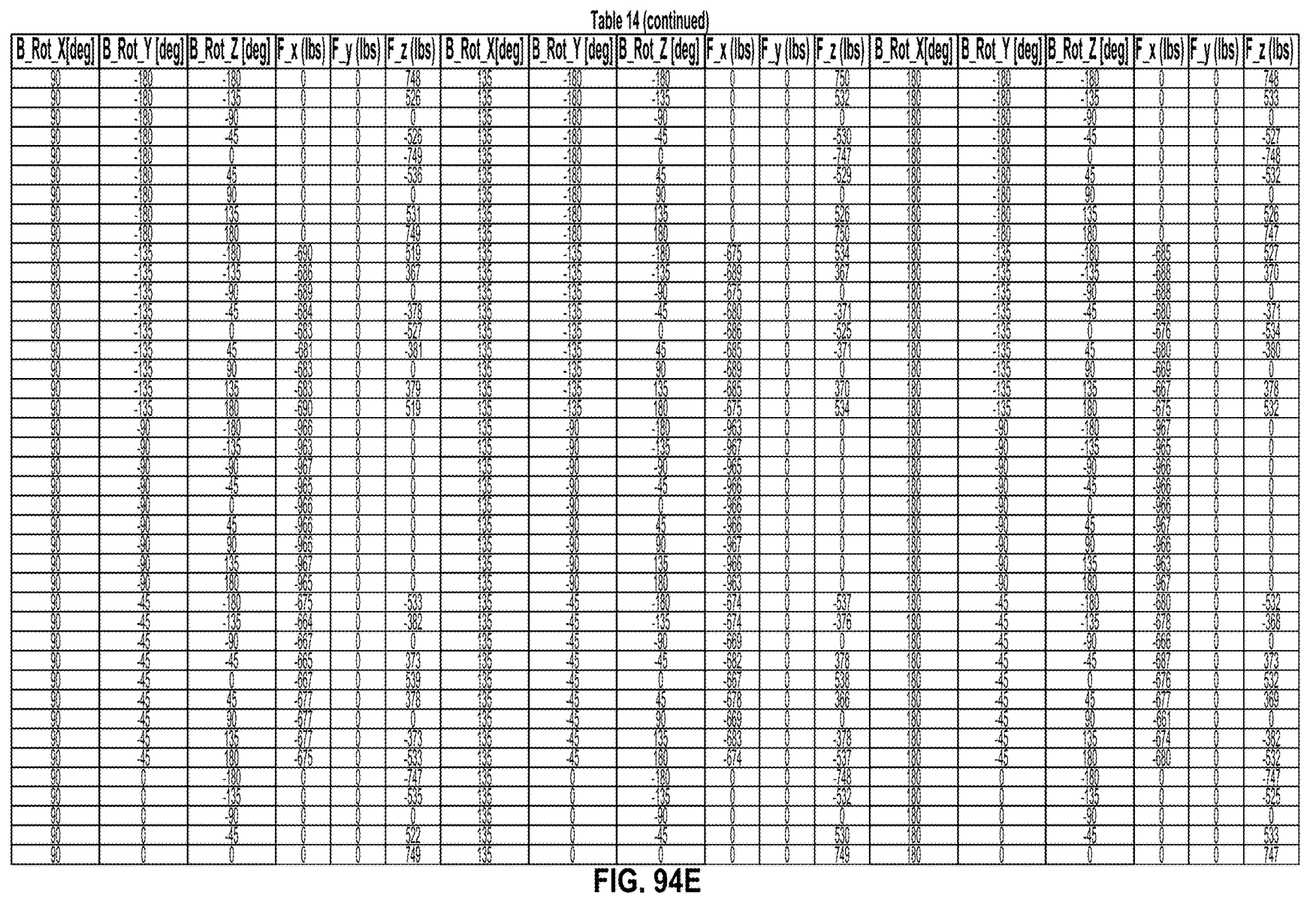
Figure 94F:
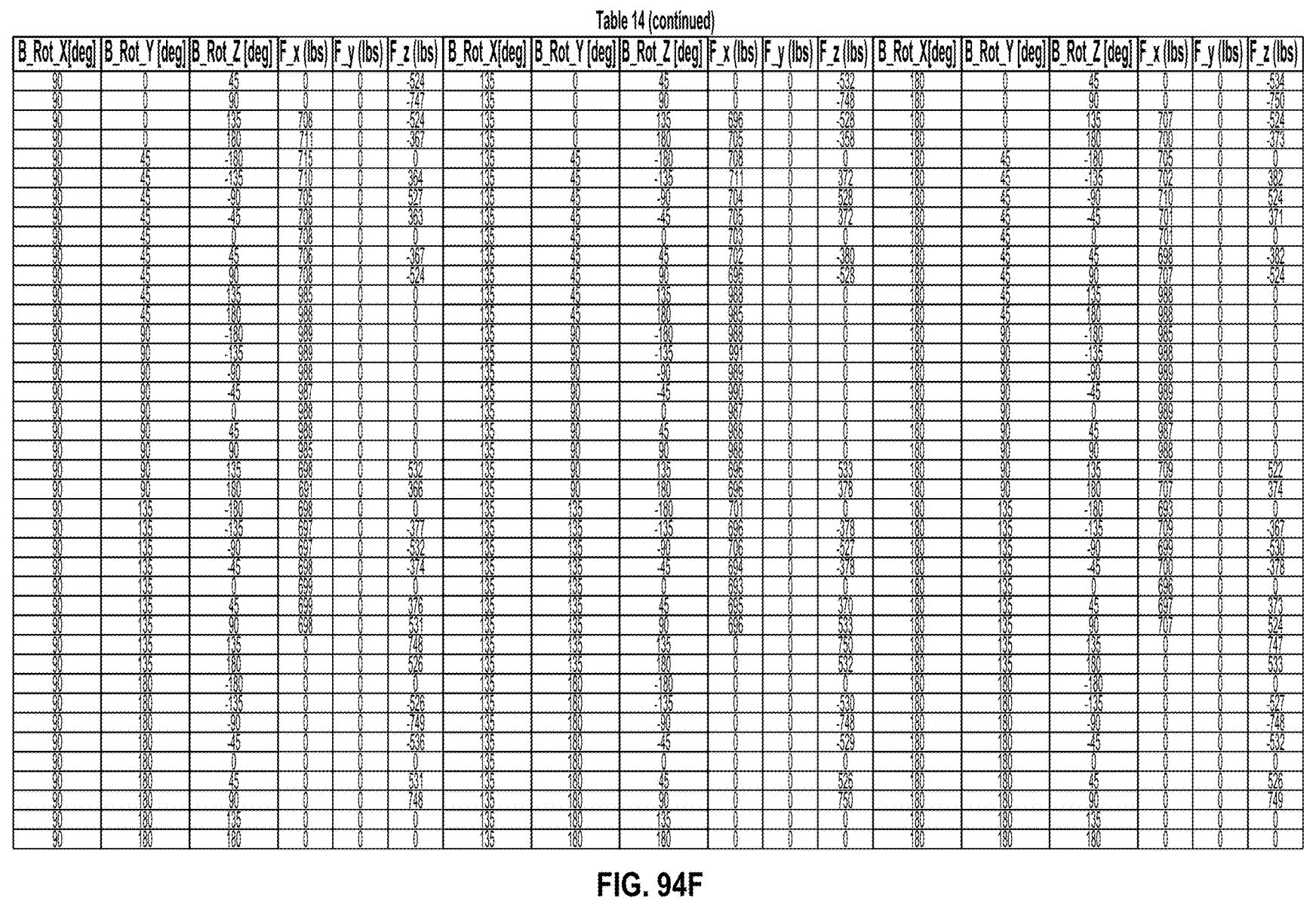
Figure 56A:
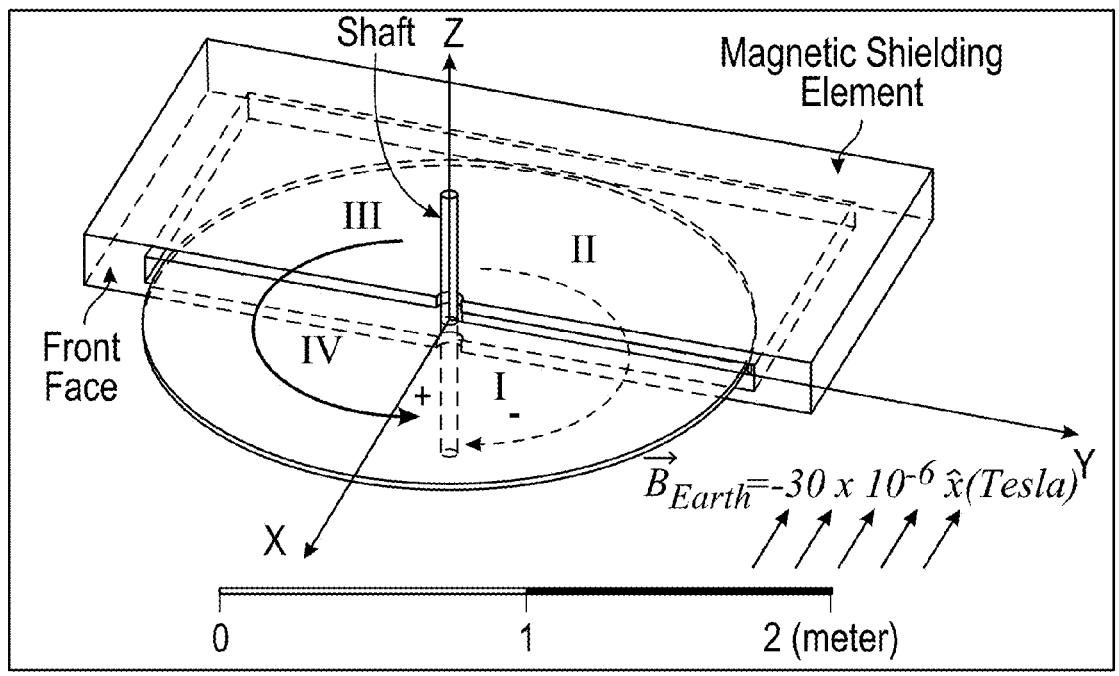
FIG. 56A illustrates a model of example oppositely charged counter-rotating discs with magnetic shielding element in which the shielding element blocks half of the disc from 'seeing' the external magnetic field (e.g., Earth's magnetic field at the equator~30×10$^{-6}$ Tesla); it is assumed that the positive charged disc is on top and rotates in the counterclockwise direction and the negatively charged disc is on the bottom and rotates in the clockwise direction, though the converse may be expected to work as well; the discs rotate, the shield remains stationary.

FIGS. 94A-94F are a table showing the simulated force vector vs orientation of the external magnetic field, referenced to a $\vec{B}=B_0\hat{x}$ magnetic field; force is for the example configuration shown in FIG. 56A.

Figure 95A:
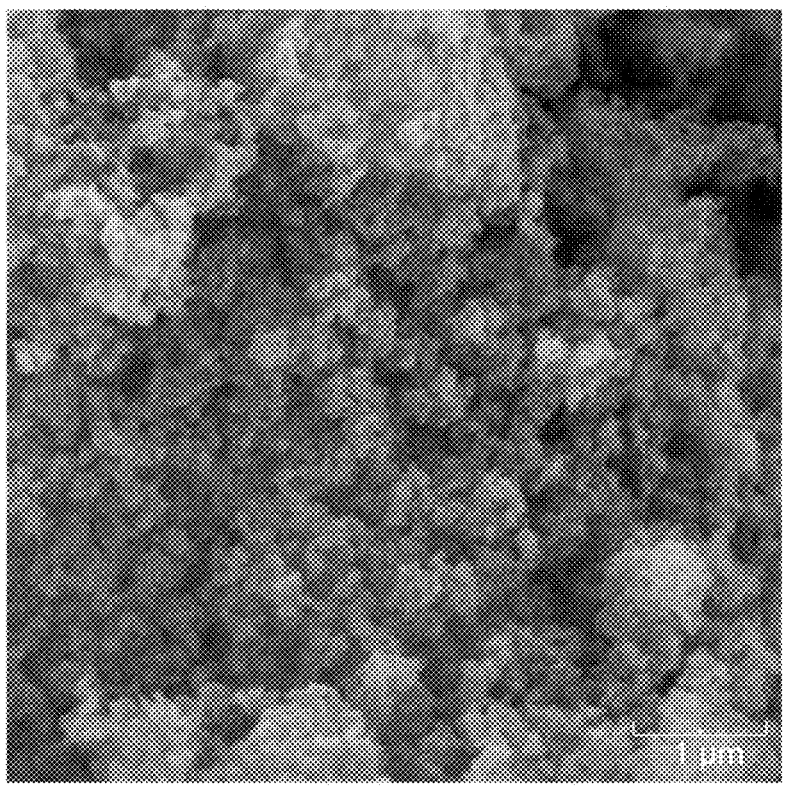
Figure 95B:
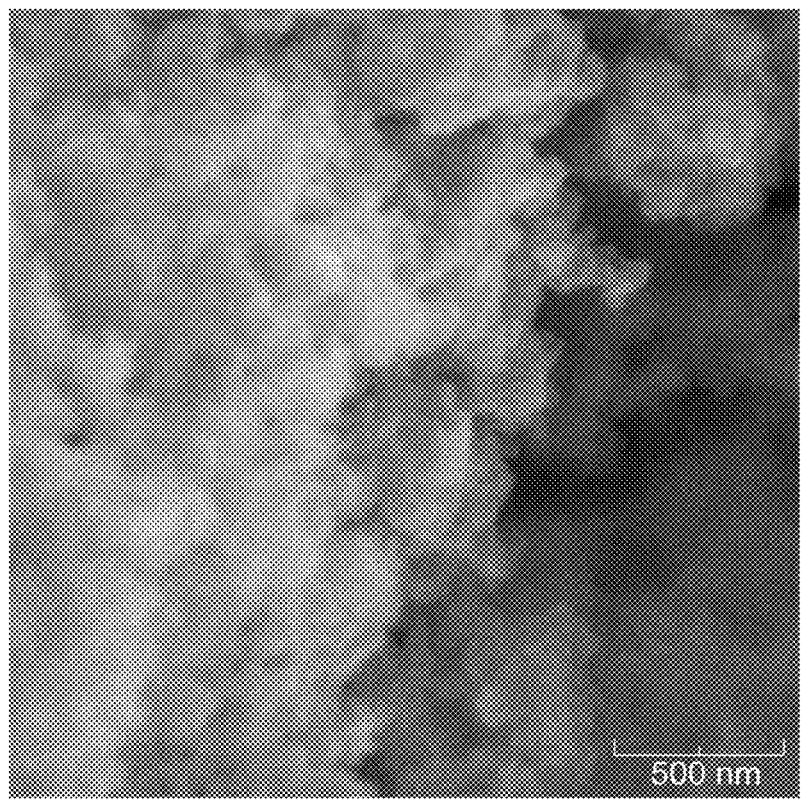

FIGS. 95A-95B are scanning electron microscopy (SEM) micrographs of a first example super-dielectric matrix (sample A).

Figure 96:
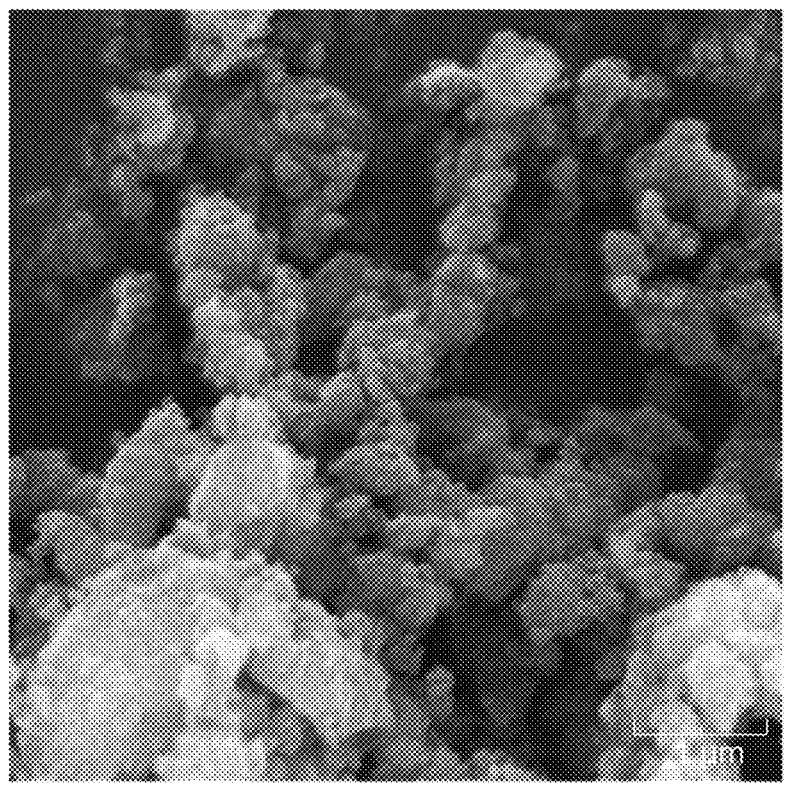

FIG. 96 is an SEM micrograph of a second example super-dielectric matrix (sample B).

Figure 97:
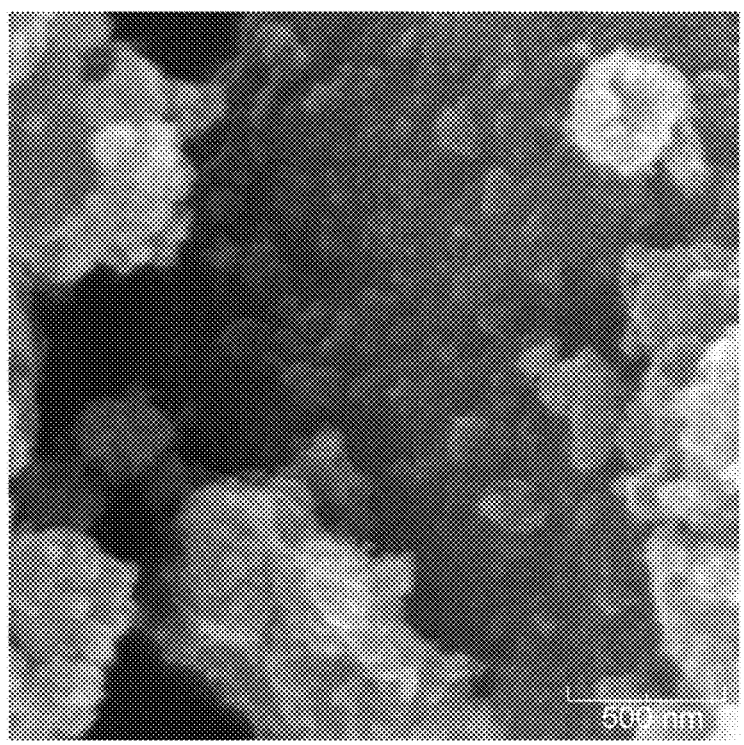

FIG. 97 is an SEM micrograph of a third example super-dielectric matrix (sample C).

Figure 98A:
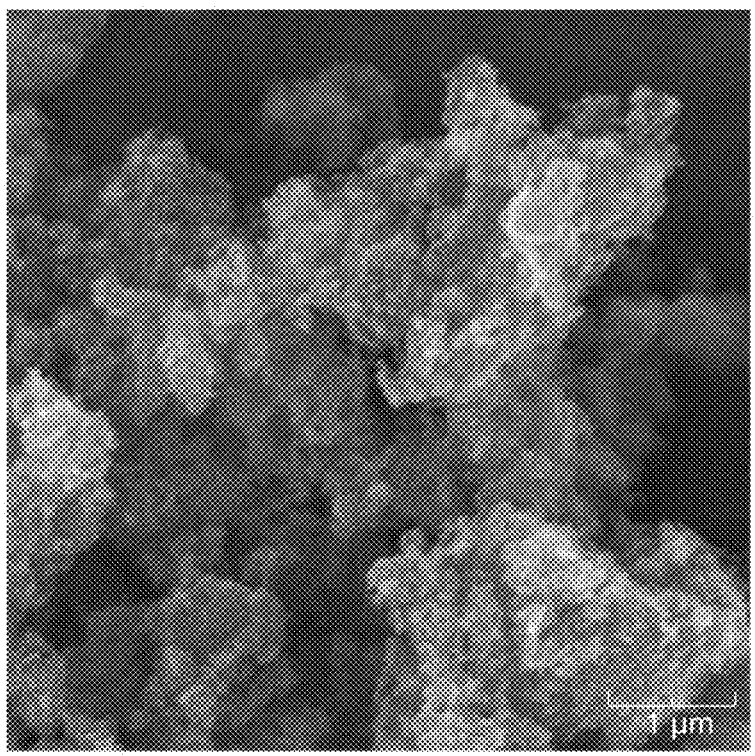
Figure 98B:
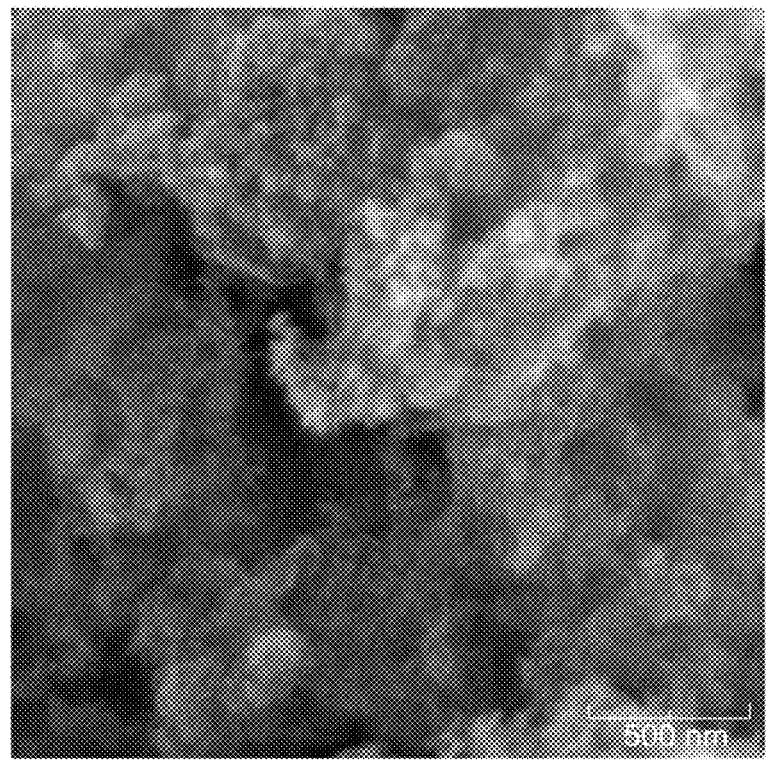

FIGS. 98A-98B are SEM micrographs of a fourth example super-dielectric matrix (sample D).

Figure 99A:
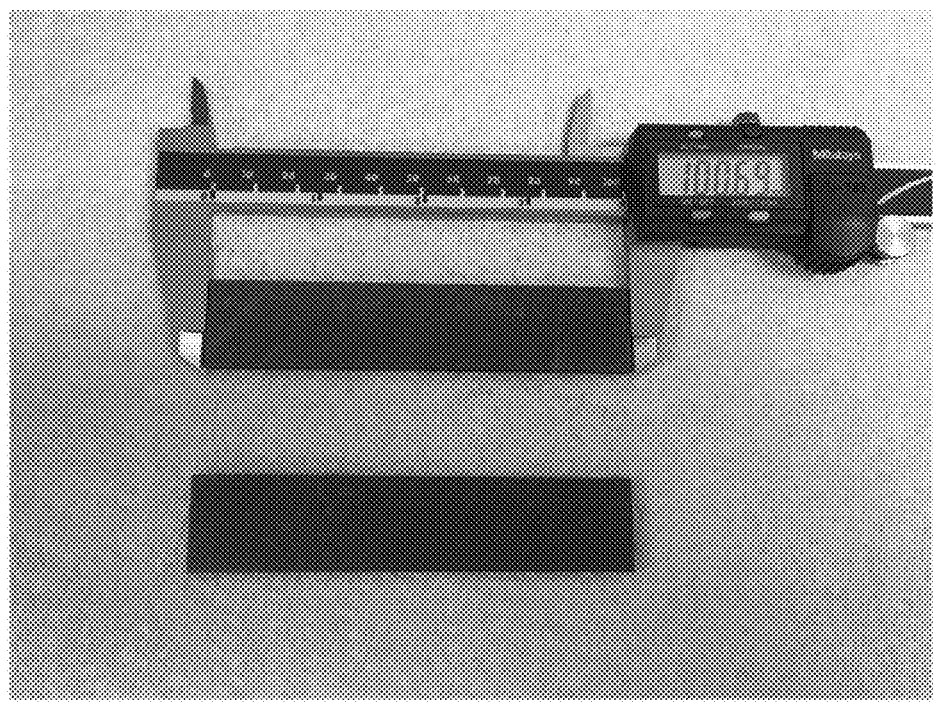

FIG. 99A is a photographic image of graphite electrodes used in an example supercapacitor (100.7 mm×21.0 mm×4.0 mm).

Figure 99B:
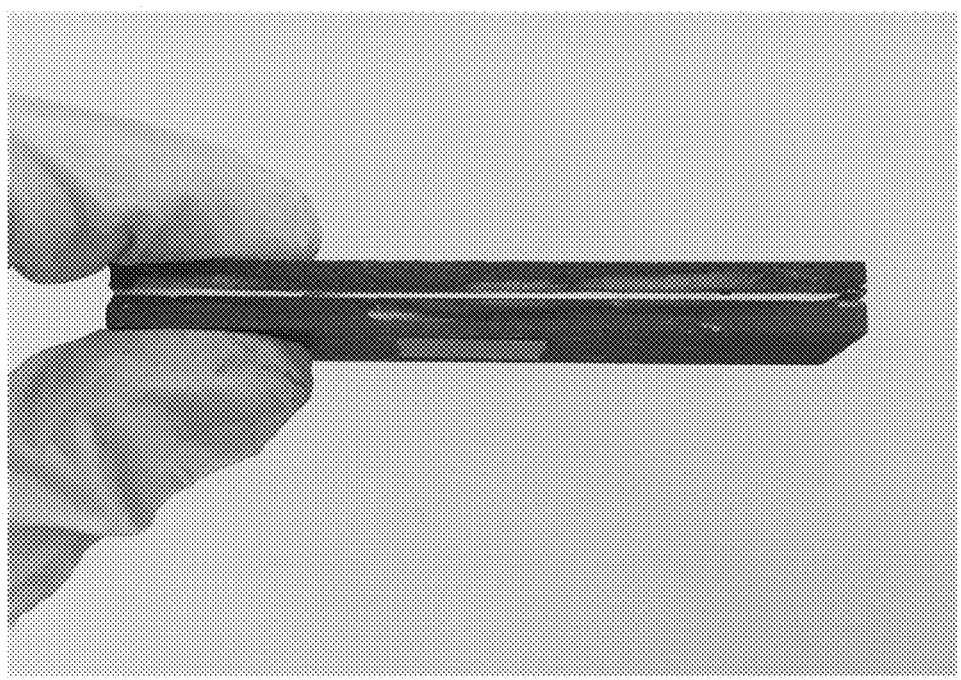

FIG. 99B is a photographic image of an example finished supercapacitor before encapsulation.

Figure 100A:
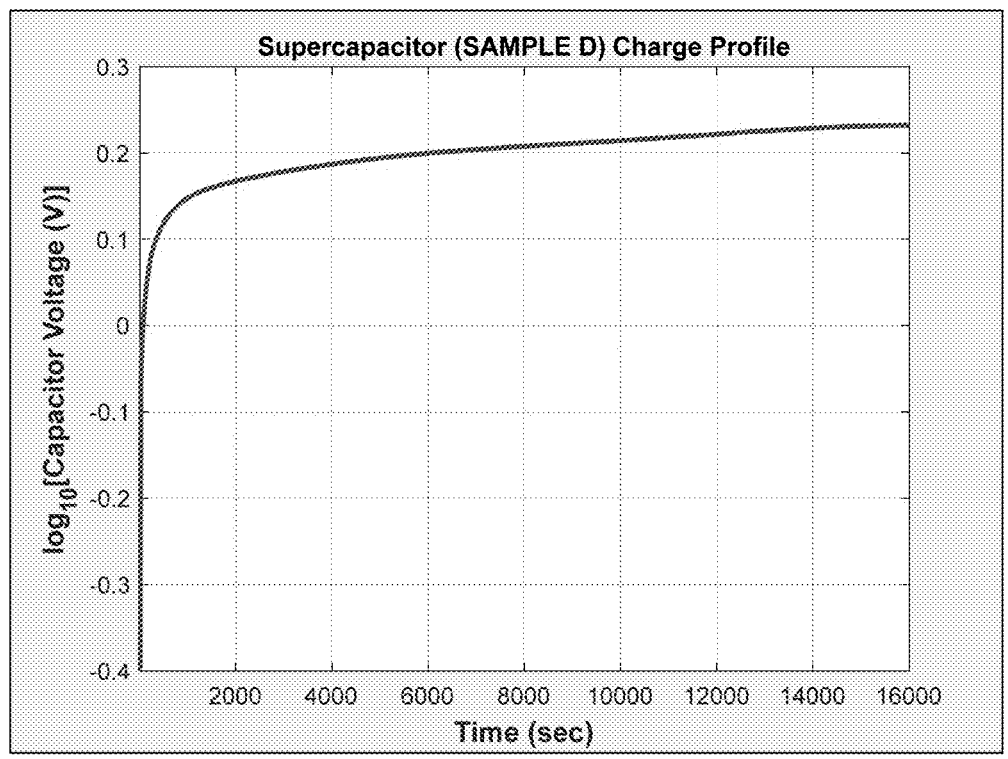
Figure 100B:
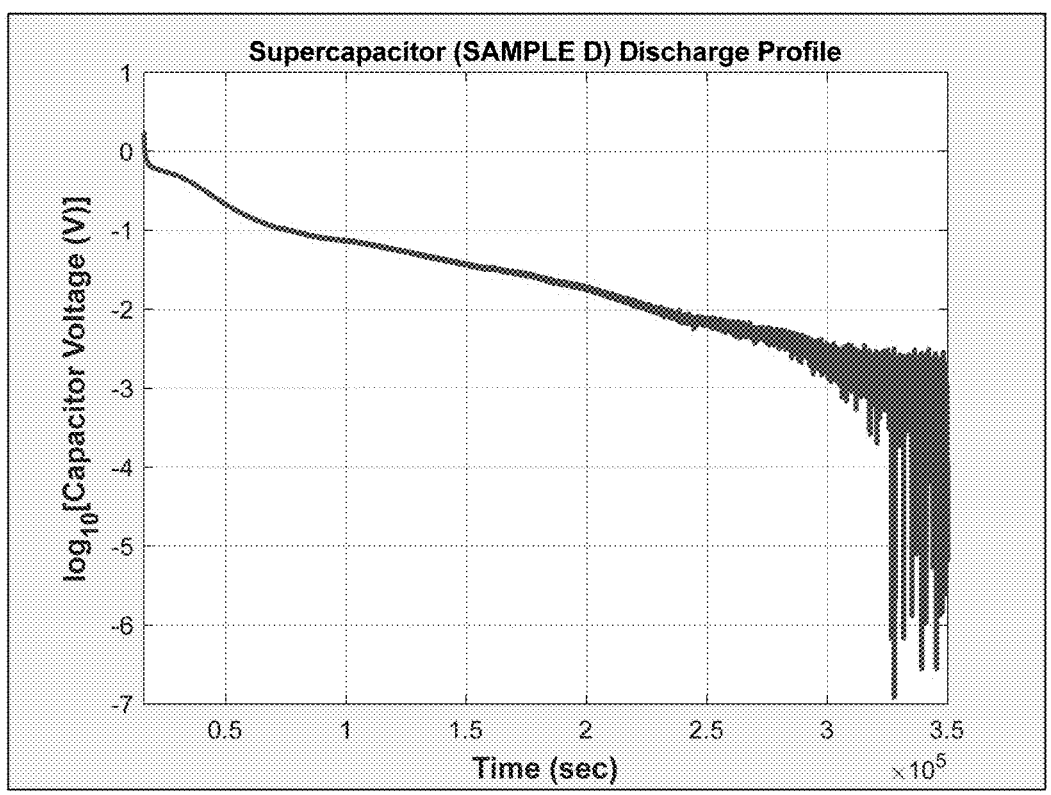

FIGS. 100A and 100B are plots respectively illustrating charge discharge profiles of an example supercapacitor using the fourth example super-dielectric matrix (sample D); charging voltage of 5.2 volt through a 1 k (2 resistance, and discharging through a 10 k (2 resistance.

Figure 101A:
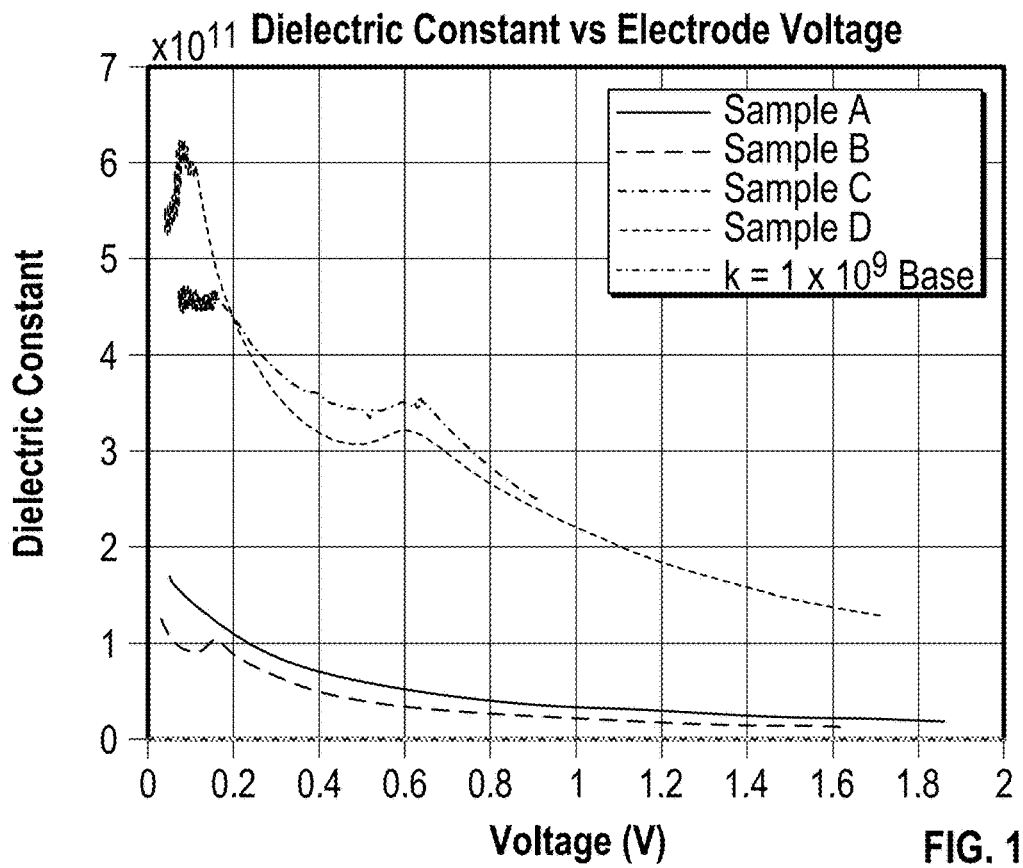
Figure 101B:
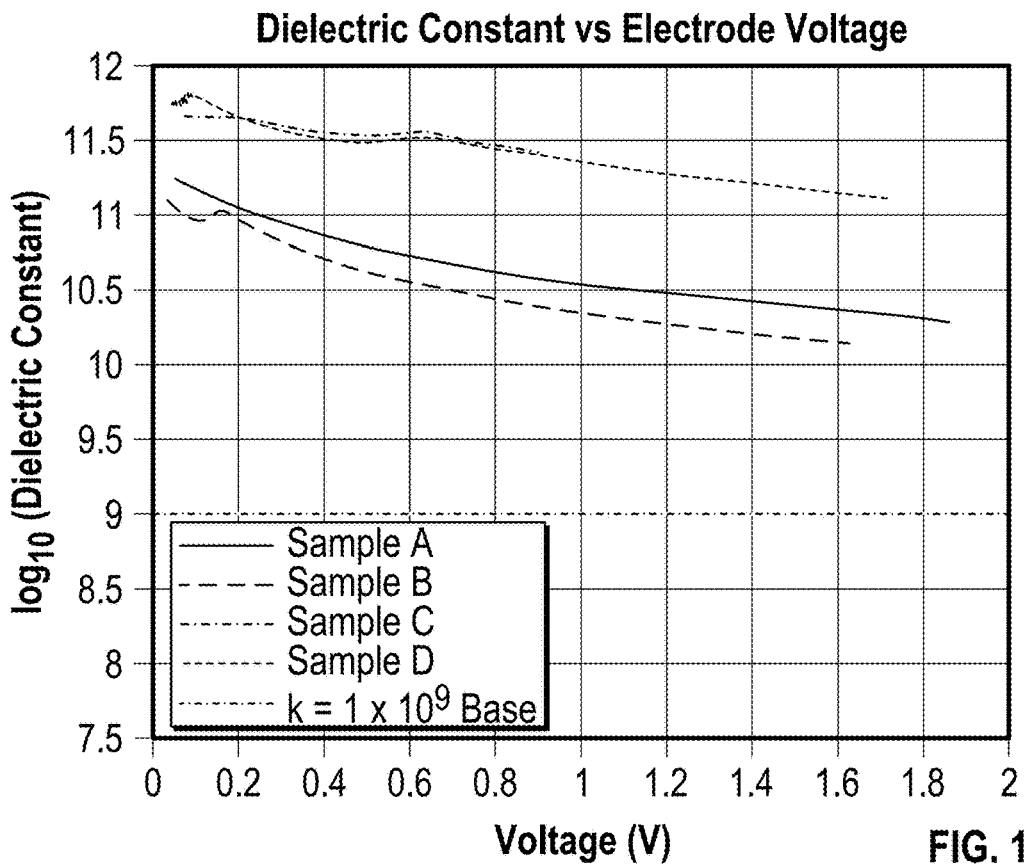

FIGS. 101A and 101B are plots of the measured dielectric constants of tested super-capacitors (samples A, B, C, and D); FIG. 101A: linear scale; FIG. 101B: log scale.

Figure 78C:
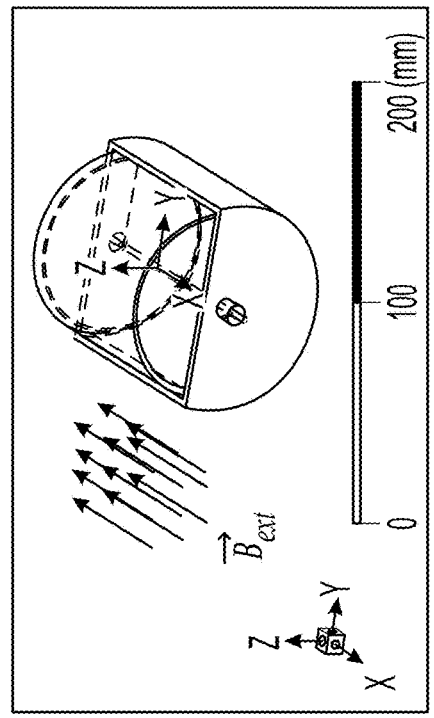
FIGS. 78A-78C schematically illustrate example superconductor shields for use with a modified MUM to balance between occluding the external magnetic field from reaching the −z region of the rotating discs and exposing the effective current to produce optimal lift from a modified MUM.
Figure 78A:
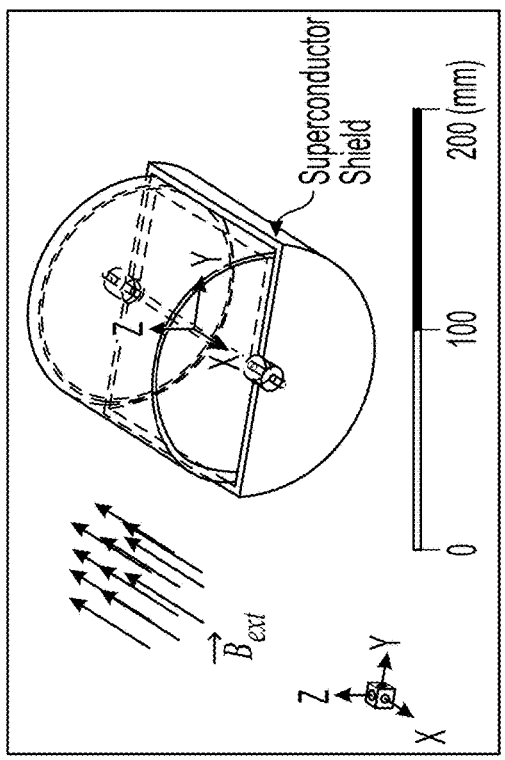
Figure 78B:
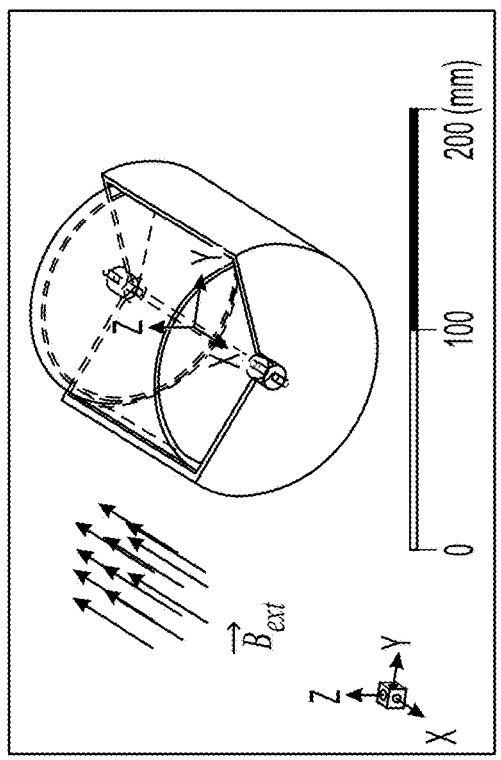
Figure 102A:
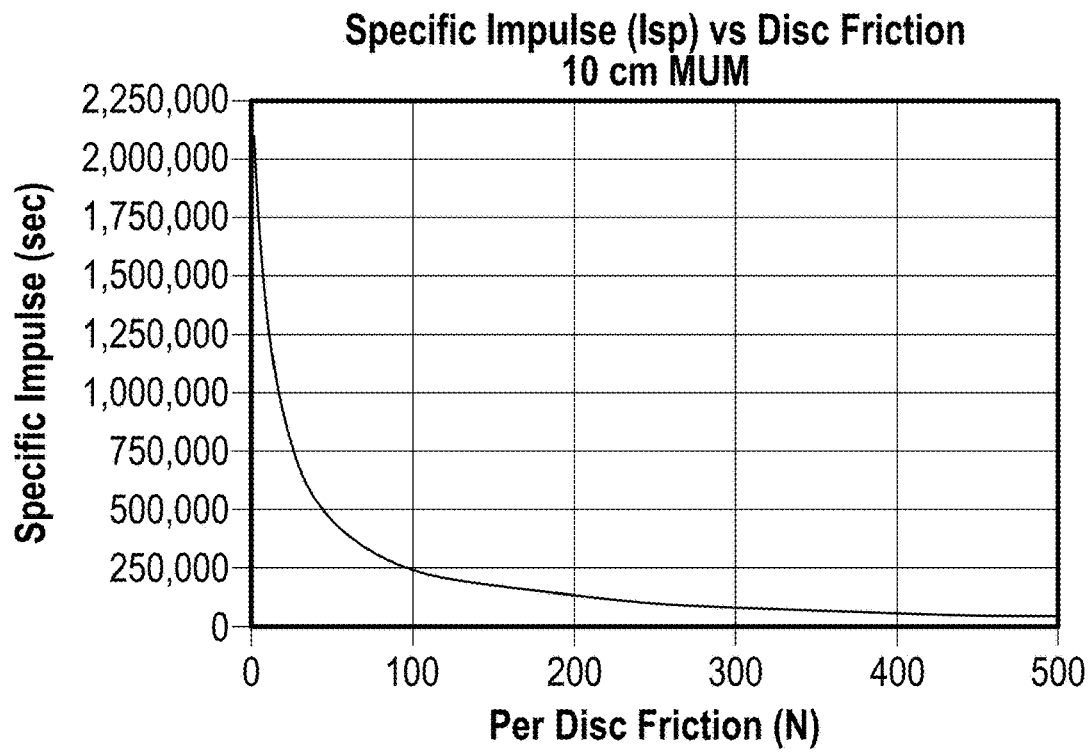

FIG. 102A illustrates the calculated Specific Impulse vs Friction per Disc for the 10 cm MUM of FIG. 78B.

Figure 102B:
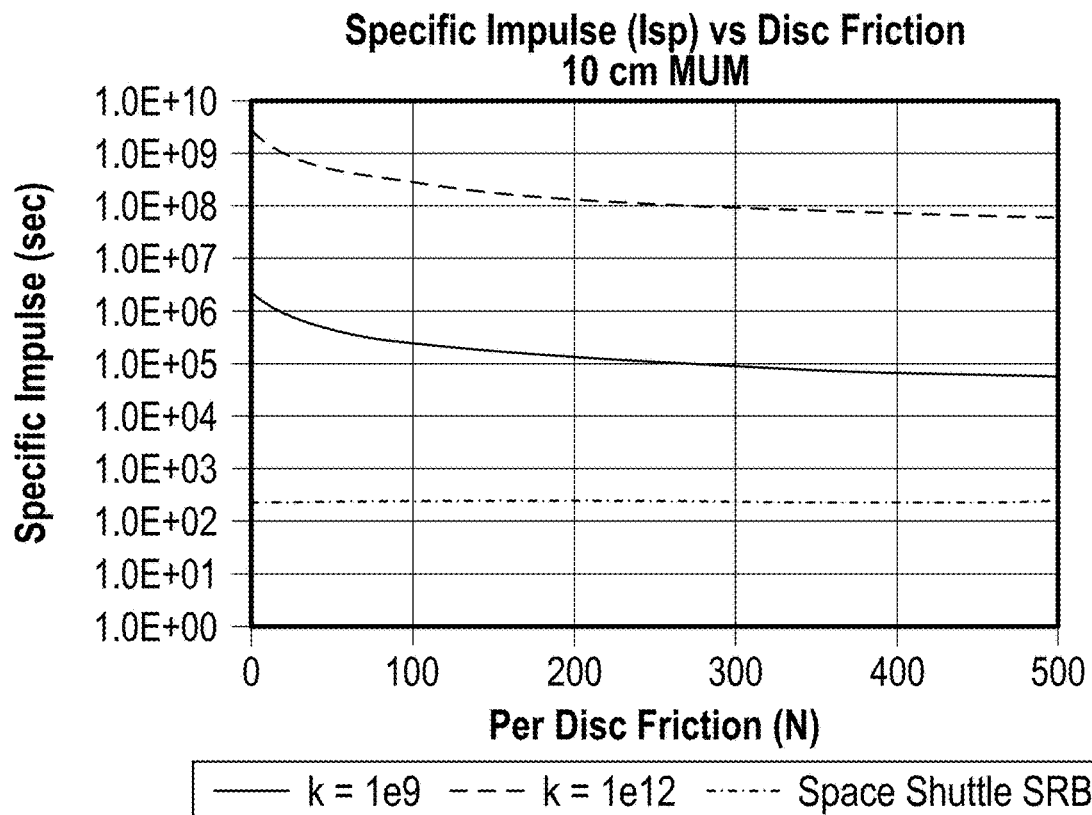

FIG. 102B shows the Specific Impulse values vs Friction per Disc for k=1×10$^9$, k=1×10$^{12}$, as well as for the space shuttle solid rocket booster for reference; log scale.

Figure 103:
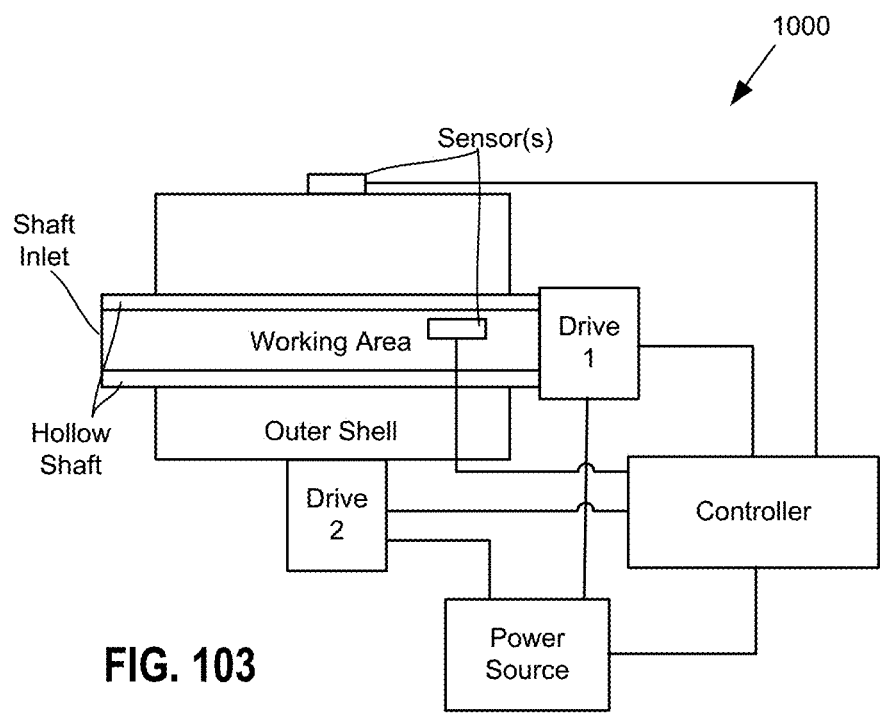

FIG. 103 schematically illustrates example components of a device for generating an ultrahigh magnetic field such as provided herein.

Figure 104:
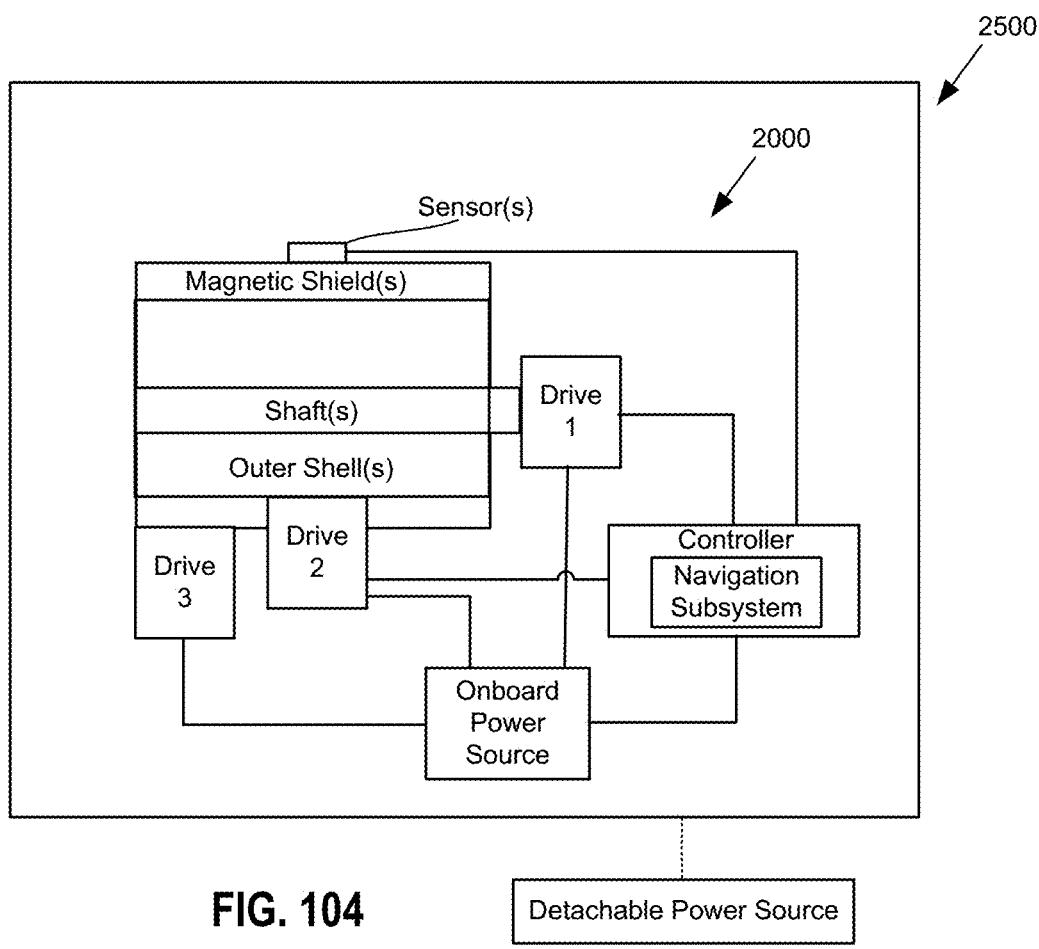

FIG. 104 schematically illustrates example components of a propulsion system such as provided herein.

DETAILED DESCRIPTION

The technology provided herein may produce magnetic fields stronger than the most powerful man-made magnets believed to be in existence at the time of this application without the use of superconductors. This is an important advancement as the need for cryogenic cooling of the superconductors presents a great number of challenges and limitations of conventional strong magnetic field generation. Such powerful magnetic fields will no doubt open new and unconceived branches of new science and engineering applications-such as for example nuclear fusion, exotic states of matter, atomic and molecular manipulations, plasma physics, propulsion, magnetic imaging, energy storage, energy production, and any number of other applications and fields.

For example, the present inventor has recognized that by maintaining very high charge densities, such as those found in a wire, and achieving much higher charge velocities, the effective currents and thus the effective magnetic fields may be increased by many orders of magnitude. The current application provides such techniques to achieve these ultra-strong magnetic fields without the use of superconductors.

Additionally, the systems and methods provided herein may be used for propulsion that dispenses with the chemical combustion paradigm and move propulsion and aeronautics and space travel into the realm of electromagnetics. An all-electric system based primarily on Maxwellian and Lorentzian physics and utilizing planetary magnetic fields is provided in which chemical combustion is not required. Additionally, no outwardly visible tails, wings, fins, ailerons, flaps, or airfoils of any type are required in order to achieve flight. In fact, air as a medium is not a requirement to realize lift or thrust. Therefore, craft built with the proposed propulsion systems presented herein may exit and enter the atmosphere without penalty. A craft with the proposed propulsion system would not require jets, propellers, or rockets or outwardly visible flight control features and yet would be highly maneuverable-including being able to hover in place at a fixed altitude and/or potentially reach hypersonic speeds.

On a related note, while propulsion within the atmosphere and in space are described as the example embodiment herein, propulsion can similarly be achieved on the surface of the ocean or underneath the surface of the ocean. For example, the Earth's magnetic field is nearly unperturbed by ocean waters. This allows the movement of surface and sub-surface craft (e.g., submarines) without propellers or visible means of propulsion or steering elements. Conceivably, a craft built with the disclosed propulsion technology could travel from underwater, through the atmosphere, and into outer space (or vice versa) in a single contiguous trip.

Force pounds (lbs) and Newtons are both used throughout to signify lift and thrust force. The conversion used is 1 N=0.2248 lbs. Units may occasionally be mixed such as using pounds and Pascals in the same chart.

Base Concept

In some examples, the present application provides rotationally symmetric, mechanically dynamic, super-capacitors which collect extreme charge amounts on their electrodes and then rotating those charged electrodes at high angular velocities. Three common rotationally symmetric geometries of a capacitor include parallel plate (FIG. 1B, which schematically illustrates a pair of parallel plates forming a capacitor with rotationally symmetric geometry), concentric spheres (FIG. 1C, which schematically illustrates a spherical capacitor), and concentric cylinder capacitors (FIG. 1D, which schematically illustrates a cylindrical capacitor).

Figure 1A:
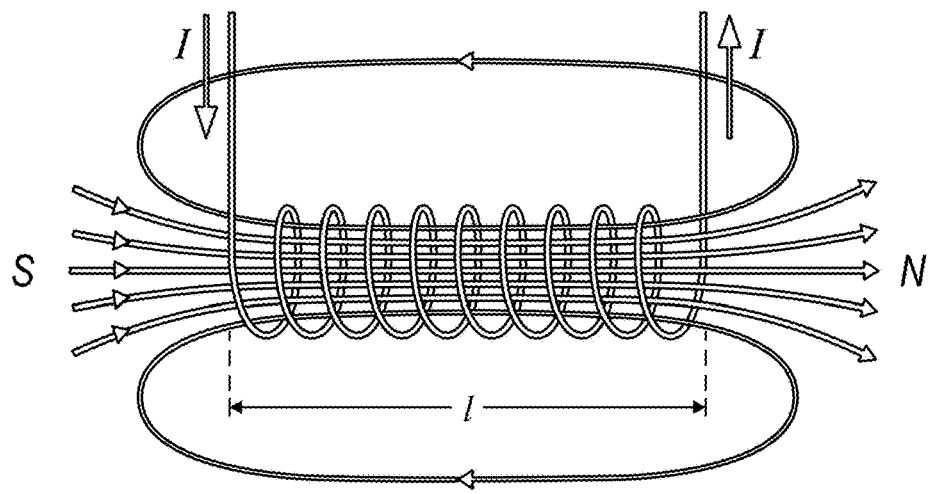
FIG. 1A schematically illustrates an example of a wire shaped into a coil which helps focus and concentrate a magnetic field inside.
Figure 1B:
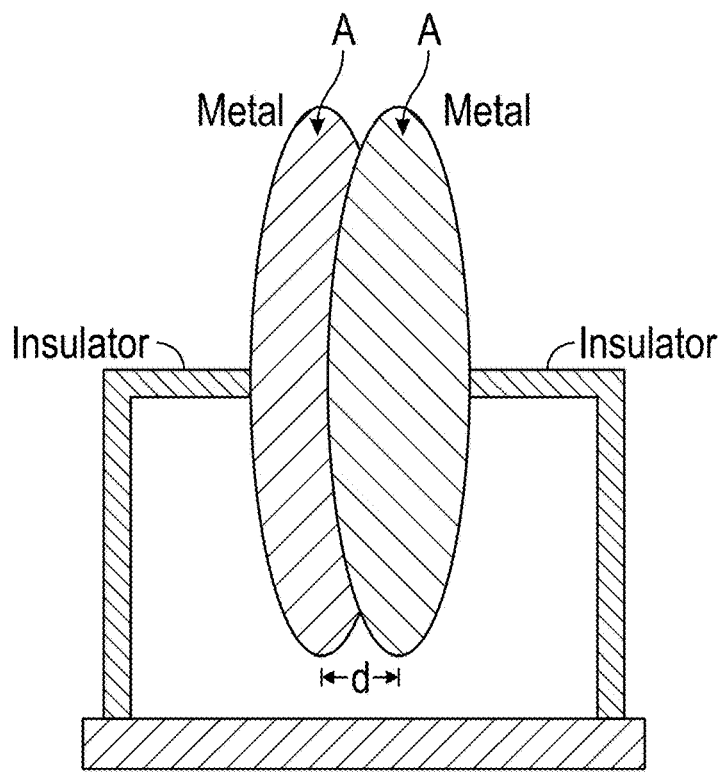
FIG. 1B schematically illustrates a pair of parallel plates forming a capacitor with rotationally symmetric geometry.
Figure 1C:
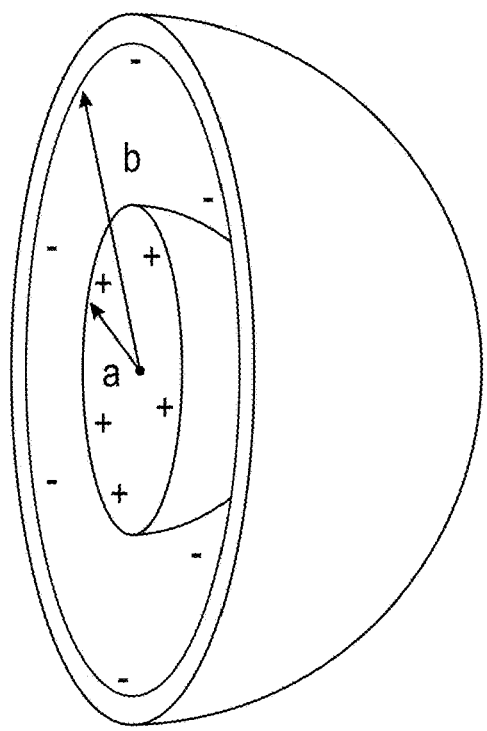
FIG. 1C schematically illustrates a spherical capacitor.
Figure 1D:
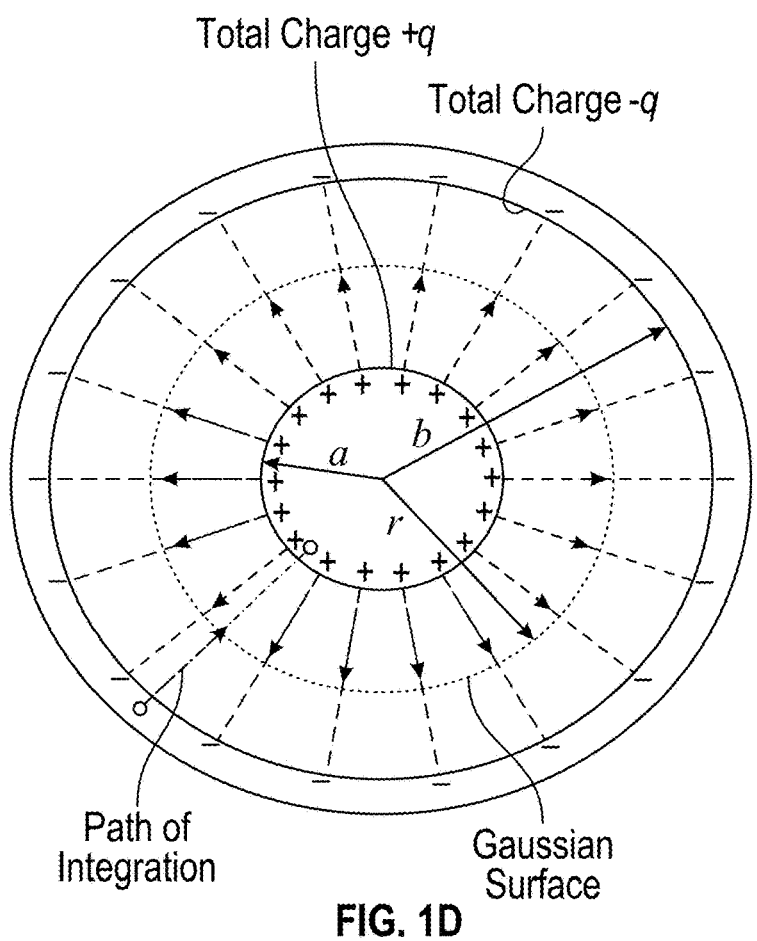
FIG. 1D schematically illustrates a cylindrical capacitor.

However, the capacitors shown in FIGS. 1B-1D do not have dielectrics between the plates as shown. Correspondingly, the permittivity of the material between the plates is $\varepsilon_0$—is the permittivity of free space. The capacitance C of the capacitor illustrated in FIG. 1B may be expressed as $$C = \frac{\varepsilon_0 A}{d},$$

where A is the area of the discs and d is the distance between the discs. In the case of a dielectric being inserted between the plates, co can be replaced by $k\varepsilon_0$, where k is the dielectric constant of the dielectric material in question. This means the capacitance will increase by a factor of k as can be seen from the capacitance equations by replacing co with $k\varepsilon_0$. Because the charge, Q, is given by Q=C*V, the amount of charge that can be collected on the plates is likewise increased by a factor of k. The present inventor has recognized that using a dielectric material with high dielectric constants (that is, a "super-dielectric") may greatly increase the amount of charge collected on the plates of a capacitor, and as such may greatly increase the magnitude of the magnetic field that is generated when those charges are set into motion in a manner such as described in greater detail below.

Super-Dielectrics

Super-dielectrics are a very active area of research as the race is on to develop super capacitors to store energy for intermittent power sources such as wind and solar farms and to replace batteries in electric vehicles with cheaper, safer, smaller, and faster charging technology.

A "super-dielectric" is defined as any material with a dielectric constant k greater than $10^5$ (dielectric constants being a unitless quantity). At the time of this application, graphene oxides, porous alumina with boric acid or salts, and electrolytic filled titanium dioxide nanotubes are known super-dielectrics described in the literature. For example, the present ultramagnets may include a super-dielectric matrix that is contacted with an ionic fluid. The super-dielectric matrix may include a ceramic or a metal compound. Nonlimiting examples of suitable ceramics include alumina (which optionally may be doped) and zirconia (which optionally may be doped). Nonlimiting examples of suitable metal compounds include metal oxides (some of which also may be ceramics, such as alumina and zirconia), metal halides (such as metal chlorides or metal fluorides), metal sulfides (such as tungsten disulfide), and metal nitrides. Nonlimiting examples of suitable metals for use in the ceramic or metal compound include aluminum, zirconium, titanium, nickel, copper, tungsten, chromium, cobalt, antimony, cerium, hafnium, lead, lithium, magnesium, manganese, tin, silver, and zinc, and combinations thereof. For further details regarding mechanical properties of doped alumina and doped zirconia, see Pasaribu, "Friction and Wear of Zirconia and Alumina Ceramics Doped with CuO," Ph.D. Thesis, University of Twente, Enschede, the Netherlands (February 2005), the entire contents of which are incorporated by reference herein.

The super-dielectric matrix may be in the form of a powder having pores therein, such that the ionic fluid may be localized within the pores of respective powder particles, such that the ionic fluid within a given pore of a given powder particle may be substantially isolated from the ionic fluid in other pores of that powder particle and may be substantially isolated form the ionic fluid in the pores of other powder particles. In this regard, the ionic fluid in the pore of a powder particle being "substantially isolated" from the ionic fluid in any other pores is intended to mean that there is substantially no additional ionic fluid (or other conductive material) in a location that provides an electrically conductive pathway to the ionic fluid in different pores, whether on the same or a different particle. Alternatively, the super-dielectric matrix may be in the form of a layer that includes apertures within which discrete amounts of the ionic fluid may be located, such that the ionic fluid within a given aperture may be substantially isolated from the ionic fluid within any other aperture. In this regard, the ionic fluid within a given aperture being "substantially isolated" from the ionic fluid in any other apertures is intended to mean that there is substantially no ionic fluid (or other conductive material) in a location that provides an electrically conductive pathway between the ionic fluid in the different apertures. As such, the mechanical structure traps the ionic fluid into pockets (e.g., pores for the powder, or apertures for the layer) and constrains the ions in the fluid so that the ions do not have mobility and are forced to become dipoles inside those pockets.

The terms "substantially," "approximately," and "about" used throughout this specification are used to describe and account for small fluctuations, such as due to variations in processing. For example, they may refer to less than or equal to +10%, such as less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

One manufacturing method that may be employed to produce the super-dielectric for the present devices and methods is to grow a ceramic or a metal compound (e.g., metal oxide, metal fluoride, metal chloride, metal sulfide, or metal nitride) on top of a conductor/metal to be used as an electrode. For example, metal oxide layers can be grown and controlled to precise thicknesses, typically 10's of nm, using chemical vapor deposition, thermal evaporation, hydrothermal growth, or laser ablation. More recently, metal oxide nanostructures on metal have been produced using hot water. For further details regarding formation of metal oxide layers, including using hot water, see Saadi et al., "Metal oxide nanostructures by a simple hot water treatment," Scientific Reports 7: Article number 7158 (2017), the entire contents of which are incorporated by reference herein.

Figure 6A:
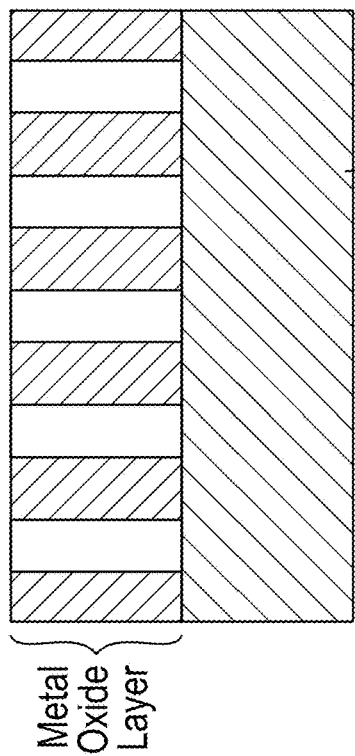
FIG. 6A schematically illustrates a cross-section of an example patterned metal oxide nano-layer which may be used in a super-dielectric coating.
Figure 6B:
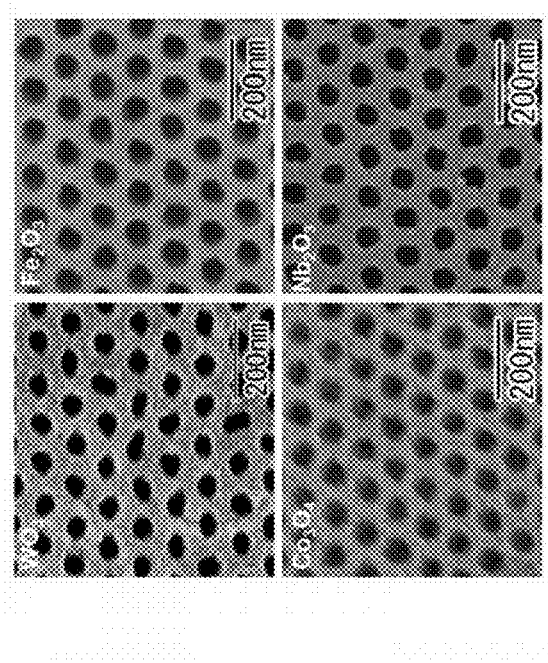
FIG. 6B is a micrograph image of an example patterned metal oxide nano-layer which may be used in a super-dielectric coating.

The super-dielectric matrix material (e.g., metal oxide or other material some examples of which are provided herein), is electrically and thermally insulating and typically chemically inert. Photolithography, electron beam lithography, or imprint lithography can be used to pattern the matrix material as desired, a honeycomb pattern for instance, and the pattern etched into the oxide to a desired depth using photolithographical etching, such as plasma etching (e.g., reactive ion etching, inductively coupled plasma etching) or chemical etching. For example, see FIG. 6A which schematically illustrates a cross-section of an example patterned metal oxide nano-layer which may be used in a super-dielectric coating. FIG. 6B is a micrograph image of an example patterned metal oxide nano-layer which may be used in a super-dielectric coating. For further details regarding the image shown in FIG. 6B, and methods of making porous oxides of transition metals using anodization combined with a retexturing process, see Yanigashita et al., "Highly ordered anodic porous oxides of transition metals fabricated by anodization combined with a pretexturing process," Electrochemistry Communications 123:106916, 5 pages (2021), the entire contents of which are incorporated by reference herein.

Aluminum oxide, also known as alumina, is an exemplary embodiment of a metal oxide that may be deposited or grown on the electrode. The alumina may, in some examples be about 1-10 microns thick (e.g., about 1-2 microns thick) and may be patterned with 50-500 nm sized pockets (apertures); the pockets can be vertical, horizontal, or any other orientation to enhance or optimize the super-dielectric properties of the super-dielectric matrix in a manner such as described elsewhere herein. In some examples, the pockets may be provided in the closest packing density possible with preferably only tens of nanometer walls between them. However, it will be appreciated that a matrix material having apertures therein may be formed in any suitable manner, e.g., using anodic oxidation of a metal film (illustratively, titanium) in a manner such as described in Cortes's Materials article cited elsewhere herein.

An ionic fluid may be applied to the super-dielectric matrix in a manner so as to fill the pores or apertures of the matrix. In examples in which the surface tension of the fluid may inhibit or prevent the fluid from entering the pores or apertures, applying a voltage to the electrode on which the matrix is disposed may cause the ions in the fluid to migrate in the direction of the applied electric field and thus apply pressure on the fluid to enter the pockets. In this way the fluid can be 'absorbed' by the super-dielectric matrix. Additionally, it has been observed that exceeding the breakdown voltage of the super-dielectric can further enhance the matrix's absorption of an aqueous ionic fluid and thus enhance the overall dielectric performance of the super-dielectric material. Without wishing to be bound by any theory, it is believed that this phenomenon may be caused by the creation of microbubbles of hydrogen and oxygen that disrupt the surface tension of the fluid and allow the liquid to enter the pockets in the matrix.

The pockets (pores or apertures) in the super-dielectric matrix substantially confine the ions of the ionic fluid, and substantially fix their separation distance. For example, in an applied electric field the positive ions will tend to move towards the negative electrode and the negative ions will tend to move towards the positive electrode. The pockets in the matrix physically limit how far the ions can move within that pocket before hitting an obstruction, i.e., how far the ions can separate. The ions are allowed to separate to an optimal distance, tens to hundreds of nanometers which is many orders of magnitude larger than can be achieved on a molecular scale. The controlled separation and confinement of the ions then form 'super-dipoles' and as such the matrix and ionic fluid together provide a super-dielectric material, because the dielectric constant is directly related to the strength of the dipoles in its volume. See working example later. While patterned metal compounds such as oxides have been discussed, porous anodic metal films may also provide the necessary topology to trap and contain the ions, as described, for the super-dielectric matrix used to create the super-dielectric. The patterning and etching of semiconductors, conductors, insulators, and oxides on the sub-micron scale is well known to anyone in the art of microchip fabrication or nanotechnology.

The apertures or pores of the super-dielectric matrix may be filled with any suitable ionic fluid. In some examples, the ionic fluid may include any suitable combination of salts, acids, bases, or other ionic or electrolytic solutions or materials to produce the super-dielectric in question. In some examples, the ionic fluid includes an aqueous solution including a salt, or acid. For example, Phillips (cited herein) describes super-dielectric materials formed using high surface aluminum oxide powder (Alfa Aesar, γ-phase, 99.97%, 3 micron APS powder, surface area 80-120 m$^2$/g, CAS 1344-28-1) and aqueous sodium chloride (1 g alumina: 1.1 mL water: 0.01 g, 0.1 g, or 0.3 g NaCl), in which alumina was gradually added to a solution including the salt dissolved in water, to form a paste. Or, for example, Fromille (cited herein) describes super-dielectric material which was formed similarly as in Phillips using an aqueous boric acid solution (1 g alumina: 1 mL water: 0.1 g boric acid. Or, for example, Cortes's Materials article (cited herein) describes a super-dielectric material which was formed using porous $TiO_2$ created on titanium metal using anodization, then filled with an aqueous saturated salt solution of sodium nitrate ($NaNO_3$). It is believed that a wide variety of ionic fluids may be used in a wide variety of materials to form super-dielectric materials, as also is stated in Fromille, Phillips, and the Cortes references. Other nonlimiting examples of ionic liquids may include aqueous MgCl and aqueous MgFl.

As such, it will be appreciated that the thickness, geometry, and composition, and therefore the performance of the super-dielectric layer can be precisely produced and controlled. The porous or patterned material which will host the ionic fluid may be referred to as the super-dielectric matrix material throughout this application. Once the ionic fluid has been suitably added to the matrix, the product may be referred to as the super-dielectric material as it now has a dielectric constant in the super-dielectric range ($>10^5$).

For still further details regarding presently known super-dielectric materials, including those using graphene oxide, porous metal oxide with aqueous salt solutions, and anodic titanium dioxide with aqueous acid solutions, see the following references, the entire contents of each of which are incorporated by reference herein: Kumar et al., "A new single/few-layered graphene oxide with a high dielectric constant of 10$^6$: contribution of defects and functional groups," RSC Advances 5:14768-14779 (2015); Fromille et al., "Super dielectric materials," Materials 7 (12): 8197-8212 (2014); Phillips, Prof. Physics, "Superdielectric materials composed of NaCl, $H_2O$, and porous alumina," Naval Postgraduate School, Monterey, CA 93950, 28 pages (2014), available for download at URL arxiv.org/ftp/arxiv/papers/1404/1404.7537.pdf; Cortes et al., "Novel materials with effective super dielectric constants for energy storage," J. Electron. Mater. 44 (5): 1367-1376 (2015); and Cortes et al., "Tube-Super Dielectric Materials: Electrostatic Capacitors with Energy Density Greater than 200 J cm$^3$," Materials 8:6208-6227 (2015). Moreover, at the time of this application, dielectric constants on the order of $1\times10^9$ with a 2 V degradation voltage are achievable, as described in Fromille, Phillips, and the two Cortes references cited above. The degradation voltage V is important as the charge (Q) a capacitor will accumulate is proportional to both the capacitance (C), which is directly proportional to the dielectric constant, and the voltage (1) via Q=C*V. While the aforementioned k and V values (k=$1\times10^9$ and V=2 V) will be used as representative values in calculations that follow, these values may be improved further in the future as the super capacitor race produces even better super-dielectric materials with improved breakdown voltages and higher dielectric constants.

In still other examples, the super-dielectric material may include a super-dielectric liquid, such as a liquid that contains ionic liquid-filled nano-spheroids. The ions inside those spheroids, being physically constrained to be inside those spheroids, may form super-dipoles and therefore the liquid itself may be a super-dielectric material without the need for use of a separate super-dielectric matrix as may be used with an ionic fluid.

It will be appreciated that the present methods and ultra-magnets do not necessarily require the use of a super-dielectric material, and that any suitable dielectric material may be used. Accordingly, examples herein that specifically discuss the use of a super-dielectric material (or components thereof) may be used with a dielectric material. By "dielectric material" it is meant a material inserted between two or more electrodes which increases the charge capacity, and hence the energy stored, in the electric field between the two or more capacitors. A nonlimiting example of a dielectric material which is not a super-dielectric material and suitably may be used in the present methods and ultramagnets is $SrTiO_3$, which has a dielectric constant of about 10,000 at DC.

Analytic Derivation of Magnetic Field Strength

Physics using Ampere's law will show that the approximate magnetic field (B) at the center of a solenoid (FIG. 1A) is given by $$B = \mu_0 n I \quad (1)$$

where $\mu_0$ is the permeability of free space, n is the number of coils per unit length, and I is the electrical current. Electrical current is defined as the amount of charge passing a point or area per unit time, I=dQ/dt (Coulombs/second in SI units).

As recognized by the present inventor, a cylindrical shaped supercapacitor with rotating charged plates is in some regards analogous to the aforementioned solenoid. In this case, n=1, since there is only a single distributed coil (i.e., the cylindrical shell plate of the capacitor). The electrical current can be defined as $$I = Q*RPS \quad (2)$$

where RPS is the rotations per second of the plates of the rotating cylindrical capacitor, one plate having a charge of +Q and the other plate a charge of −Q. Equation 2 is for a single plate rotating and one plate remaining stationary. If both plates where counter-rotating, a factor of 2 would appear out front.

The equation for the capacitance of a static cylindrical capacitor is well known to be $$C = 2\pi k \varepsilon_0 \frac{L}{\ln\frac{b}{a}} \quad (3)$$

where L is the length of the cylindrical capacitor, a is the inner radius (i.e., inner plate location), and b is the outer radius (i.e., outer plate location). With Q=C*V, equation 3 becomes $$Q = 2\pi k \varepsilon_0 \frac{L*V}{\ln\frac{b}{a}} \quad (4)$$

The present inventor recognized that by putting equation 4 into equation 2, and then substituting equation 2 into equation 1, the magnitude of the magnetic field for a cylindrical shaped supercapacitor can be expressed as:

$$B = 2\pi k \varepsilon_0 \mu_0 \frac{L * V * RPS}{\ln \frac{b}{a}} \quad (5)$$

As one nonlimiting example, using $k=1\times 10^9$, $V=2$ volts, and a geometry of a 10 cm diameter cylindrical capacitor that is 1 meter long and has a dielectric spacing of 10 um between the plates, a magnetic field strength (B) of 2.30 Tesla is calculated using equation (5).

Figure 2:
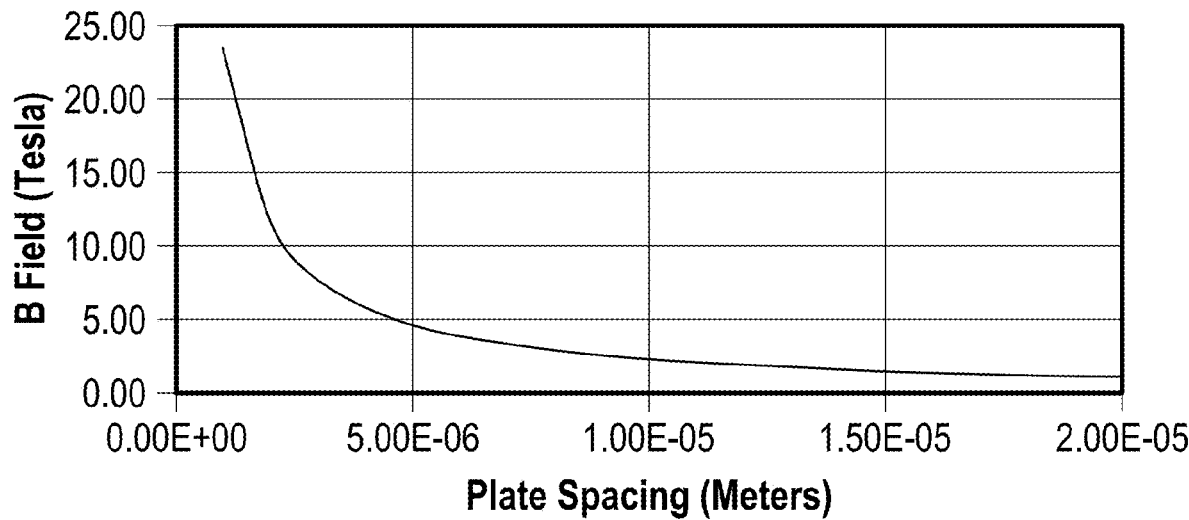
FIG. 2 is a plot illustrating magnetic field strength as a function of dielectric gap thickness for an example supercylinder.

FIG. 2 is a plot illustrating magnetic field strength as a function of dielectric gap thickness for an example supercylinder (cylinder shaped supercapacitor which is rotated as described with reference to equation 2). FIG. 2 shows how the magnetic field strength varies as a function of the spacing between the plates, i.e., the dielectric gap thickness. An example rotational speed of 100,000 rotations per minute (RPM) is used as the angular speed of the rotating cylinder for reference. Turbo-molecular vacuum pumps regularly achieve rotational speeds of this order of magnitude, so this angular speed is not unreasonable from an angular velocity standpoint. As can be seen from equation 5, increasing or decreasing the rotational speed will proportionally increase or decrease the strength of the magnetic field.

The cylinder example was worked out analytically because the field strength at the center of a solenoid is a well-known example that is, as the present inventor has recognized, in some regards analogous to the rotating cylindrical supercapacitor.

Technically, the Biot-Savart law could be used to calculate the magnetic field for any geometry (Biot-Savart Law) (5a)

$$\vec{B}(r) = \frac{\mu_0}{4\pi} \int \int \int_v \frac{(\vec{J} dV) \times \vec{r'}}{|r'|^3}$$

Where J is the current density, dV is the volume element, and r' is the distance vector from dV to the point of observation (i.e., the point at which the magnetic field, B, is to be calculated) at observational point r. However, as the geometries involved become complex the calculations can become intractable. Therefore, finite element analysis (FEA) may be used to provide example results discussed herein.

Figure 3:
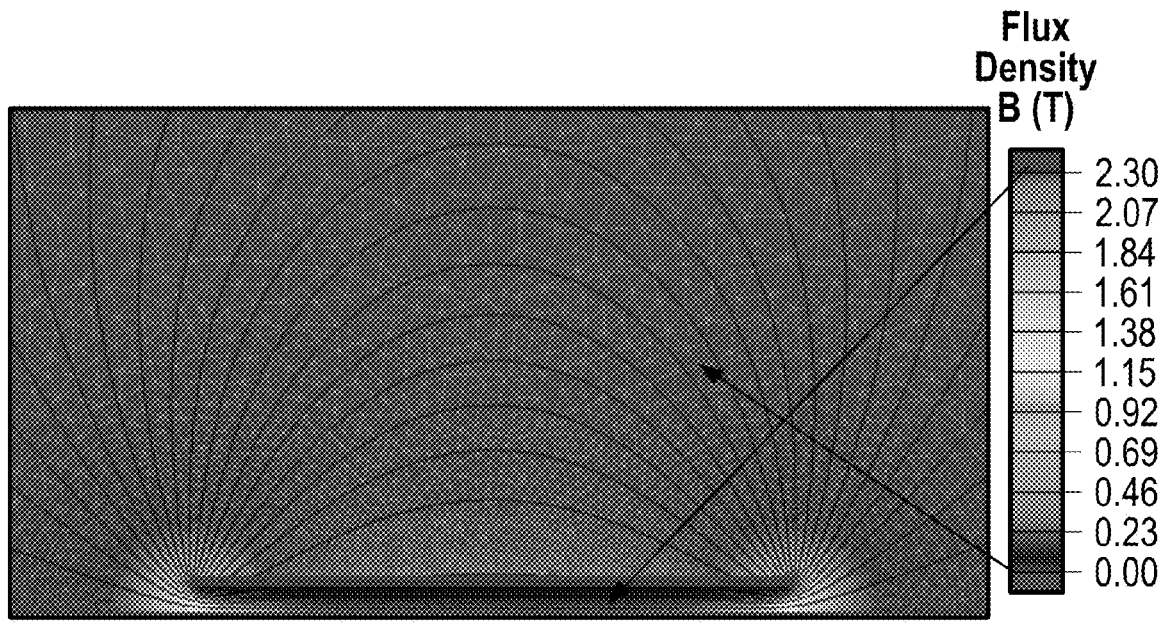
FIG. 3 illustrates the calculated flux density in a finite element analysis (FEA) model of an example 100 cm long by 10 cm diameter supercylinder (10 micron dielectric gap, 2 V potential, $k=1\times10^9$, RPM=100,000). In figures illustrating simulations and calculations, such as FIG. 3, arrows are added as a guide to show approximately the values to which the different greyscale values correspond.

FIG. 3 illustrates the calculated flux density in a finite element analysis (FEA) model of an example 100 cm long by 10 cm diameter supercylinder (10 micron dielectric gap, 2 V potential, $k=1\times 10^9$, RPM=100,000). More specifically, FIG. 3 shows the results of the aforementioned supercylinder field problem analyzed using QuickField™ FEA software package. As can be seen, the magnetic field results inside the solenoid (cylinder) agree well with the analytical calculations, showing a 2.30 Tesla field at the center of the rotating cylinder, in agreement with the analytical solution.

In the preceding calculations and simulation results, it was assumed only one electrode plate of the cylinder is rotating. In some examples, it may be desirable to have both plates rotating in a counter-rotating fashion. If the magnet were attached to a structure that were not affixed to a rigid object (e.g., a ship on the ocean or a spacecraft in flight), this may be expected to help balance and control any reactionary torque the structure would experience. Additionally, because one plate is positively charged and the other plate negatively charged, counter rotating the plates may double the amount of effective current used to produce the magnetic field.

In some examples, the mechanically bearing and rotational assemblies should be non-magnetic (i.e., non-ferrous), and in some examples non-conductive. For instance, bearings, races, shafts, struts, etc. may be or may include polymers, glasses, crystals, non-conductive composites, or ceramics with permeabilities as close to unity as practicable. This may reduce unintended forces/flexures due to the strong magnetic fields produced as well as protect against potential eddy currents induced by stray or varying magnetic fields. Example materials are discussed in other parts of the present disclosure.

Dielectric Gap

It is well known that to maximize the charge a capacitor holds, the dielectric gap between the plates should be minimized. As recognized by the present inventor, a higher rotating charge density naturally results in a stronger magnetic field, which is highly desirable in producing an ultra-strong magnetic field, thus the dielectric gap should be as small as possible.

It may be difficult to maintain micron or sub-micron width gaps in capacitors that are large and undergoing rotational forces; for examples, trying to hold a one-micron gap between two one-meter diameter plates that are spinning may be difficult. Some examples of the present devices and methods solve this problem by allowing one of the plates of the capacitor to be non-rigid, for example, a conductive fluid. Other examples are described elsewhere herein.

Interface

Figure 4:
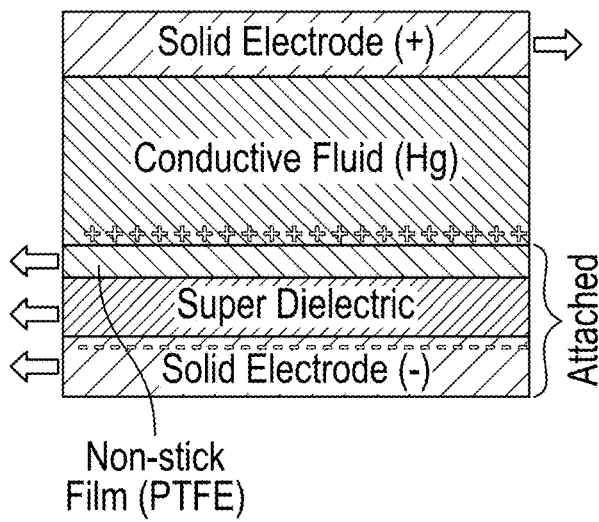
FIG. 4 schematically illustrates an example interface geometry, in which the slip joint is one of the electrodes.

In some examples, the solution to the aforementioned problem involves applying the super-dielectric in the desired thickness to a rigid electrode as shown in FIG. 4. FIG. 4 schematically illustrates an example interface geometry, in which the slip joint is one of the electrodes. The super-dielectric is then coated with a thin film of a non-stick insulating substance. The second plate/electrode of the capacitor is then composed of an amount of a liquid conductor which may be capped by a second rigid conductor. The terms electrode and plate may be used interchangeably throughout the present disclosure.

In fluid mechanics, it is a common practice to assume that the fluid is stationary at the contact point between the fluid and a solid surface. In the nonlimiting example illustrated in FIG. 4, the conductive fluid would be assumed to be stationary at the contact point between the non-stick film shown in FIG. 4 and the conductive fluid. In such a case, the charge that accumulates on the conductive fluid surface interface may be dragged along with the moving/rotating surface. Having both the positive and negative charges moving in the same direction, i.e. having the same rotational velocity vector, will diminish the effective current, and thus, the strength of the magnetic field. To mitigate this, the present inventor has recognized that it is important that the charged fluid surface 'slip' and does not stick to the rotating assembly (e.g., solid electrode, super-dielectric, and optional non-stick film).

An illustrative example of the materials involved may be platinum (or a platinum coated material) for the conductors. Mercury (an example of the conductive fluid) is reactive and is known to react/form amalgams with a large number of metals; so, it is important to choose a conductor that is in contact with the mercury that is non-reactive with the mercury, such as platinum though other metals or conductors may be possible. A further illustrative example may include electrolyte or salt filled nanotubes (apertures) for the super-dielectric matrix (since the length of the nanotubes can be precisely controlled) and polytetrafluoroethylene (PTFE) for the non-stick layer (since PTFE is a common sputter target and can be deposited in very thin (10's to 100's of nm) and precise thicknesses using sputtering or vapor deposition). Finally, liquid mercury is used as the conductive fluid to form the slip joint. Liquid mercury has high surface tension (i.e. cohesion) which substantially does not adhere to the PTFE or other materials. Liquid mercury also has low viscosity which can reduce or minimize drag while the plate(s) are in motion. Additionally, mercury is a metal with relatively good conductivity and charge density limits. And, mercury is liquid at room temperature. It should be noted that while this is an example embodiment, there are other materials and combinations of materials that may render similar results and are encompassed within the present methods and devices. For instance, any metal or conductive alloy can be heated to its melting point and form a conductive fluid. Additionally, liquids with high conductivities that are not metallic may be used. Doped mercury should not be excluded as a possibility as mercury's physical or electrical properties may be enhanced with dopants or additives; however, pure mercury will be used as a nonlimiting example in the present disclosure. Mercury is a cheap, convenient, readily available material with desirable properties, and thus is discussed in relation to selected examples described herein.

While the shown embodiment includes a non-stick thin film, it should be understood that in the present devices and methods, the absence of a non-stick film also may be used. This is especially the case when the matrix material of the super-dielectric is a low adhesion material itself, such as is the case with a number of ceramics (e.g., doped alumina, doped zirconia, tungsten Disulfide), and most metal oxides, metal chlorides, metal fluorides, metal sulphides, and metal nitrides. This list should not be considered exhaustive as there are a wide choice of low adhesion/stick materials which are suitable for the matrix material of the super-dielectric as well as the non-stick film. To wit, Tungsten Disulfide has a coefficient of friction of 0.03-0.09 while polytetrafluoroethylene (PTFE), the de facto standard of low adhesion materials, has a coefficient of friction of 0.05-0.10. There are a great number of other materials and formulations within the families mentioned that possess similar or better low-adhesion properties. For further details regarding mechanical properties of doped alumina and doped zirconia, see Pasaribu, "Friction and Wear of Zirconia and Alumina Ceramics Doped with CuO," Ph.D. Thesis, University of Twente, Enschede, the Netherlands (February 2005), the entire contents of which are incorporated by reference herein. Mechanical properties of tungsten disulfide and PTFE are publicly known, and readily may be found online.

Figure 5A:
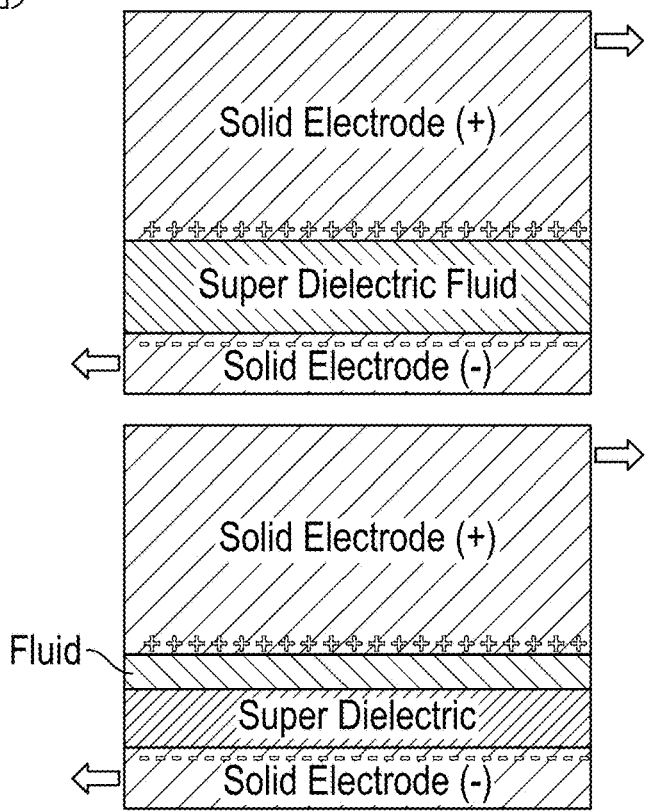
FIG. 5A schematically illustrates another example interface geometry, in which the slip joint is a fluid between electrodes.

Another alternative for producing the rotating slip joint is to have the fluid between the plates (electrodes) as shown in FIG. 5A, which schematically illustrates another example interface geometry, in which the slip joint is a fluid between electrodes. In some examples, a super-dielectric liquid may be the fluid. Alternatively, a layer of fluid (e.g., a super-dielectric fluid or ionic fluid) may be inserted into the gaps between the plates/electrodes in addition to a solid or semi-solid super-dielectric material or super-dielectric material that includes a super-dielectric matrix including pores or apertures in which an ionic liquid is disposed in a manner such as described elsewhere herein. Use of a super-dielectric fluid or dielectric fluid may provide the advantage that the moving charges are affixed to the solid plates (electrodes), thus, there is no or reduced concern the charges will be dragged along with the conducting fluid as aforementioned. The charges in the ionic fluid or super-dielectric fluid itself are composed of electric dipoles which have net zero electric charge and do not contribute on the macroscale to the magnetic field. For this method, it may be desirable to have the gap between the plates (electrodes) to be as small as possible, to get the highest capacitance and hence charge density possible. Very small gaps may present tolerancing problems during manufacture as well as challenges with flexing and distortion of the system under dynamic motion/rotation, especially when the system in question may be large (i.e. d<<<D where d is the gap between electrodes and D is the order of the size of the electrodes such as radius of the cylinders in a cylindrical supercapacitor or the radius of the plates in a circular parallel plate supercapacitor or the radius of the spheres in a spherical supercapacitor). A small amount of flexure/strain potentially could damage the dielectric layer by causing the plates (electrodes) to come into contact while in motion or exert destructive forces on the interface layer assembly. These are some of the reasons for introduction of the conductive slip joint fluid previously mentioned, i.e., mercury. However, the fluid concepts of FIG. 5A should not be ruled out and are included as part of the scope of the present devices and methods. It is possible to meet these kinds of tolerancing numbers, especially when the devices in question may be smaller.

If the thin fluid layer between the super-dielectric material and the electrode is not a super-dielectric fluid, the fluid may be chosen to reduce or minimize friction as much as possible while being electrically and chemically inert. Perfluoropolyether fluids (PFPE Oils) and silicone oils are good choices due to their lubricating and non-reactive properties; however, any number of fluids with desirable lubrication and inertness properties may be possible for use in various embodiments of the present disclosure.

Figure 5B:
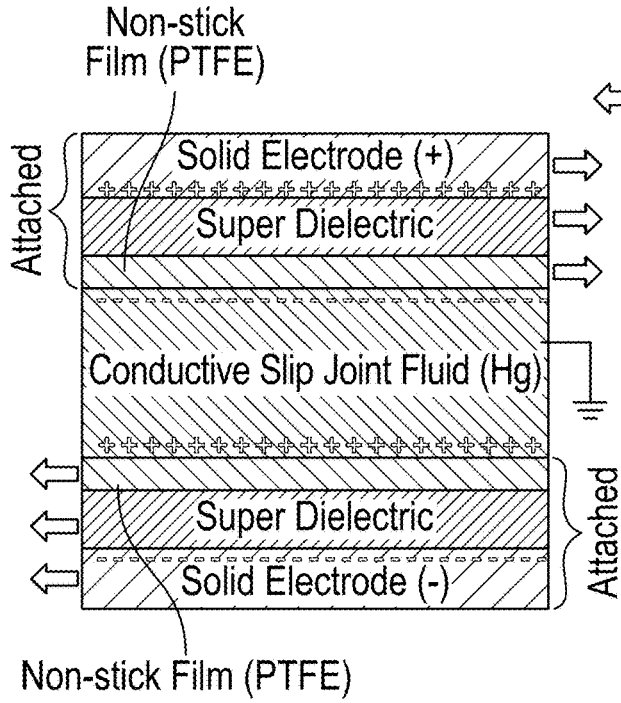
FIG. 5B schematically illustrates another example interface geometry including individual electrode super-dielectric layers and in which both positive and negative electrodes include a super-dielectric coating.

In some examples, each electrode may have individual super-dielectric layers as shown in FIG. 5B, which schematically illustrates another example interface geometry including individual electrode super-dielectric layers and in which both positive and negative electrodes include a super-dielectric coating. As shown, both the positive electrode and the negative electrode receive a super-dielectric layer that is in contact with a grounded conductive slip joint fluid. In the single super-dielectric electrode case, the maximum voltage that can be applied between the electrodes is assumed to be two volts (corresponding to currently achievable degradation voltage V as described above) in the current example. With both electrodes coated with super-dielectric, the voltage potential between the two electrodes is essentially doubled, e.g., 2 V between the positive electrode and the grounded conductive slip-joint fluid, and 2 V between the negative electrode and the grounded slip-joint fluid—thus a 4 V potential between the two oppositely polarized electrode plates. It will be appreciated that for materials with higher degradation voltages, even greater potentials between oppositely polarized electrode plates may be achieved.

Referring to the design in FIG. 4, in one example, the charge that builds up in the slip-joint fluid side of the electrode is stationary and does not contribute to the magnetic field. In this single electrode super-dielectric layer situation, only the charges on one of the electrodes contributes to the magnetic field even if the electrodes are counter-rotating. In the dual electrode super-dielectric layer design shown in FIG. 5B, both solid moving electrodes hold charge, one being positive and one being negative, and contribute equally to the magnetic field, essentially doubling the magnetic field strength compared to the single electrode super-dielectric case from FIG. 4. It is also worth noting, there is little packing density penalty for adding the second super-dielectric layer as the super-dielectric layer is only microns thick and is negligible compared to the thickness of the electrode itself in most cases.

Additionally, the shear forces created in the counter-rotating charged electrodes also produce opposing shear momentums in the fluid, thus helping further mitigate charge movement in the conductive fluid at the super-dielectric conductive slip-joint fluid interface.

It should be noted that the use of a thin non-super-dielectric fluid layer or non-stick film is shown in FIGS. 5A and 5B. These inclusions may have a detrimental effect on the charge capacity of the electrodes even when these layers are very thin. Therefore, one example would be to produce the super-dielectric matrix material out of a low adhesion, low stick material as previously discussed to which many ceramics and materials mentioned previously naturally possess, and to forgo the use of the fluid and/or non-stick layers except under extreme circumstances such as extending the life of the device under high rotational speeds. While FIGS. 4, 5A, and 5B show these fluid (non-super-dielectric fluid case) and non-slip layers, they are merely optional layers and not required.

Super-Dielectric (SD)

While the present application does not specifically require a specific super-dielectric (SD) to be utilized, it will be appreciated that the SD can be useful for creating ultra-strong magnetic fields. For example, sufficiently high dielectric materials are in existence at the time of this application, e.g., as described elsewhere herein and/or in the Kumar, Fromille, Phillips, and the two Cortes references cited above; however, it is expected that great strides will continue to be made in this area as the race to high energy density storage devices continues. While selected examples herein correspond to the super-dielectric material described in Cortes "Tube-super dielectric materials," cited further above, alternatives may be used that do not appear in the current literature such as described in greater detail elsewhere herein.

Multi-Electrode Cylindrical Ultra-Magnet (MCU)

FIGS. 2 and 3 show example results for a super-cylinder magnet with a single contributing electrode. In order to achieve very large magnetic fields, more than a single cylinder (electrode) may be employed. Shown in FIG. 7 is a schematically illustration of an example multi-electrode cylindrical ultra-magnet via which this may be accomplished.

Figure 7:
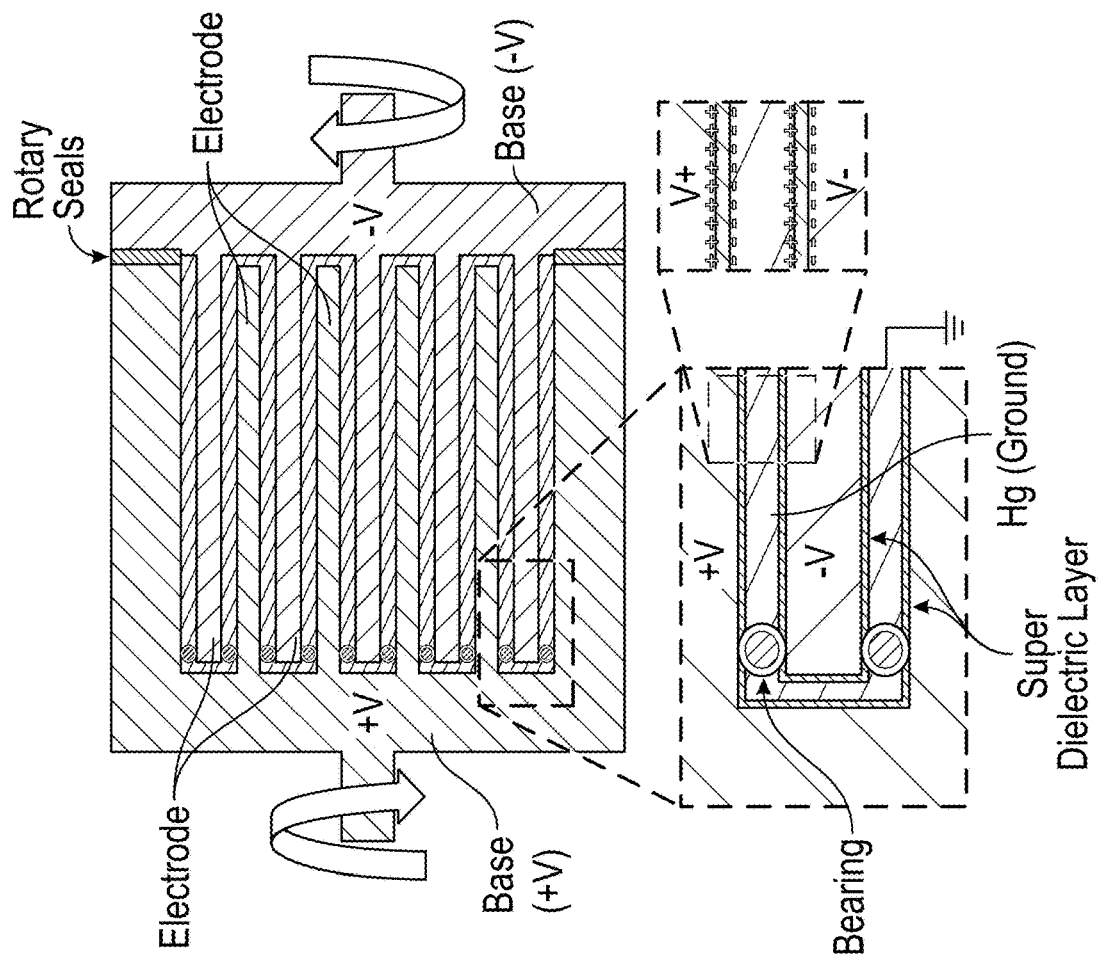
FIG. 7 schematically illustrates an example multi-electrode cylindrical ultra-magnet.

In the example illustrated in FIG. 7, one electrode includes a series of concentric cylindrical shells connected at a common base. The other electrode is of similar design, but is the complement of the first electrode, with some space redacted to accommodate a conducting fluid for the slip joint (mercury being shown here as the conducting fluid) between the two multi-cylindrical shell electrodes and the super-dielectric layer. A positive voltage is applied to one electrode and a negative voltage is applied to the complementary electrode. The conducting fluid between them is held at an intermediate potential, here ground or 0 Volts.

The cylindrical shells of both electrodes are constructed with a thin super-dielectric layer as previously discussed. This allows for a large negative charge to build on the negative electrode and a large positive charge to build on the positive electrode. The electrodes are then counter spun relative to one another at a high rotational speed. The moving charge creates an analogous effective current which in turn produces a powerful magnetic field.

The shells can be manufactured of sufficient thickness and tolerancing to be rigid under rotation, not requiring bearings or spacers. However, if it is desired to have a dense design of shells (i.e. large number of electrode shells per radial distance and thus large volumetric charge), the electrode cylindrical shells may become thin and flex or break due to the centrifugal force of rotation. In this case, elements that ensure spacing is maintained between the oppositely charged electrode shells can be incorporated, such as radial bearings at the end of the negative cylindrical shells as shown. Additional bearings or spacers can be incorporated along the length if loading on the bearings or spacers is a concern or if deformation or sagging would otherwise be an issue along the length of the electrode shell. Rotary seals are shown to keep the mercury contained in the inner cavity; however, these seals are optional if the electrodes assembly is kept inside a static mercury volume itself and the electrodes insulated from the mercury.

Thicker shells can be incorporated periodically or as needed to provide structural support in the cylindrical shell assembly when spacers or bearings are used. FIG. 7 shows these thicker shells as the outside shells of the positive electrode and the other shells as uniform in thickness. However, the structural support shells (thicker shells) can be incorporated anywhere and as often as is needed to provide structural support-densely packed thin shells, thick structural shell, densely packed thin shells, thick structural shell, and so on. Additionally, the cylindrical shells do not need to be of uniform thickness throughout the radius. The centrifugal force is weaker the closer to the axis of rotation one gets and stronger the farther away from the axis of rotation one gets—the shells may be thinner, and therefore more densely packed, towards the center and thicker the farther one gets from the center of rotation. To state it a different way, the cylindrical shells require less structural support closer to the axis of rotation and more structural support the farther one goes from the center of rotation due to the centrifugal forces involved, $F_{cent}=m\omega^2 r$, where m is a mass at distance from center, r, rotating at an angular velocity of $\omega$.

As shown in the inset of FIG. 7, if bearings are included, the bearings are in contact with the super-dielectric. However, this may cause wear of the thin super-dielectric material. As an alternative, the bearing contact surfaces can be made of a hard non-conductive material such as composites or ceramics. For example, FIG. 8, which schematically illustrates another example of a multi-electrode cylindrical ultra-magnet which is configured similarly as described with reference to FIG. 7 but which also includes a ceramic bearing contact surface as shown in the inset to FIG. 8.

As a further alternative (whether in combination with the option shown in FIG. 8 or not), for strength and weight considerations, the electrodes themselves can be made of strong, lightweight, non-conductive materials, such as composites, glass, plastics, crystals, or ceramics, with Silicon Carbide (SiC) ceramic being an example. For example, FIG. 9 schematically illustrates another example of a multi-electrode cylindrical ultra-magnet in which a thin metal film is deposited on the electrodes as shown in the inset to FIG. 9. In FIG. 9, the inset is of a different portion than in FIG. 7 and the insulator is shown there. In some examples, a thin metal film can be deposited on SiC (or other ceramic) electrodes through a number of means, such as sputter coating or thermal or e-beam evaporation for example. The dielectric and metal coating can then be removed in the area of interest through a number of selective etching processes, such as photolithography and acid etching, though any number of other processes are possible. Alternatively, the ceramic can be masked during the metal and dielectric deposition process such that no metal or super-dielectric is deposited in those areas during construction.

The further inset to FIG. 9 shows an example thin film configuration including a metal layer deposited onto a SiC electrode substrate. The metal layer can be as thin as 10's of nanometers or hundreds of microns thick, depending on the amount of charge density and electrical conductivity that is desired. The super-dielectric (SD) is then deposited or grown (as a metal oxide) on top of the metal layer as previously discussed. A non-stick layer can be deposited on top of the super-dielectric (SD) layer if needed or desired. An insulating material (insulator), such as polyacrylate or polycarbonate, may be applied with a syringe, or masking and depositing, or silkscreening, to the interface between the multilayer film and the area of the SiC that has been exposed. The insulating material inhibits or prevents shorting of the charged metal to the conducting slip joint fluid, in this case mercury (Hg). It should also be noted that because the metal layer is substantially isolated from the mercury and chemical or metallurgical reactions with the mercury are not a concern, any metal or conductor can be used, such as gold, silver, or copper, for better conductivity and charge density potential. As advances in graphene and high temperature super-conductors are proceeding rapidly, these should not be ruled out as alternatives to metals in this situation.

It should also be noted, while it is possible to manufacture the positive and negative electrode assemblies as monolithic pieces, it is more convenient to manufacture and process the electrodes as separate cylindrical shells that are then attached to the base. This allows easier processing (e.g. masking, coating, etching, etc.) than would be allowed with a monolithic electrode with blind pockets.

Also, exposing the ceramic as a hard bearing surface may be particularly useful if there are bearings or spacers present. If the electrodes are designed and manufactured such that sufficient tolerancing exists for manufacturing, alignment, and flexure during operation, the mercury can take up these tolerances. In this case, no bearings or spacers are needed, therefore, the electrodes can be substantially or fully encapsulated in the multilayer film (metal, SD, optional non-stick film). Again, the inclusion of a non-stick film may not be required but is included for completeness.

Multi-Electrode Cylinder Ultra-Magnet (MCU) Performance

With the dynamic cylinder super-capacitor geometry discussed, massive charges can build within the device. When these charges are set into motion, they can produce extremely strong magnetic fields.

Figure 8:
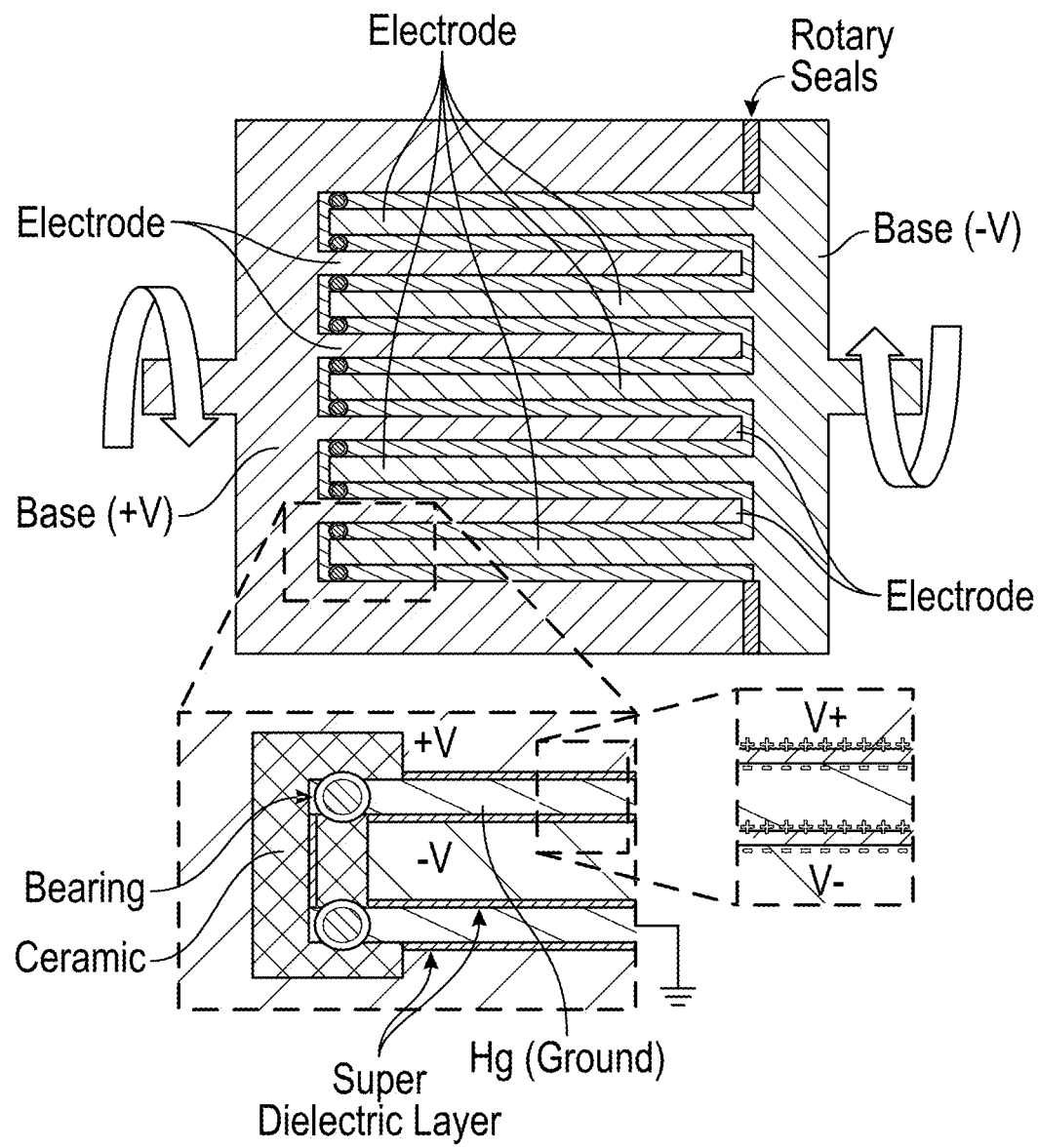
FIG. 8 schematically illustrates another example of a multi-electrode cylindrical ultra-magnet.
Figure 9:
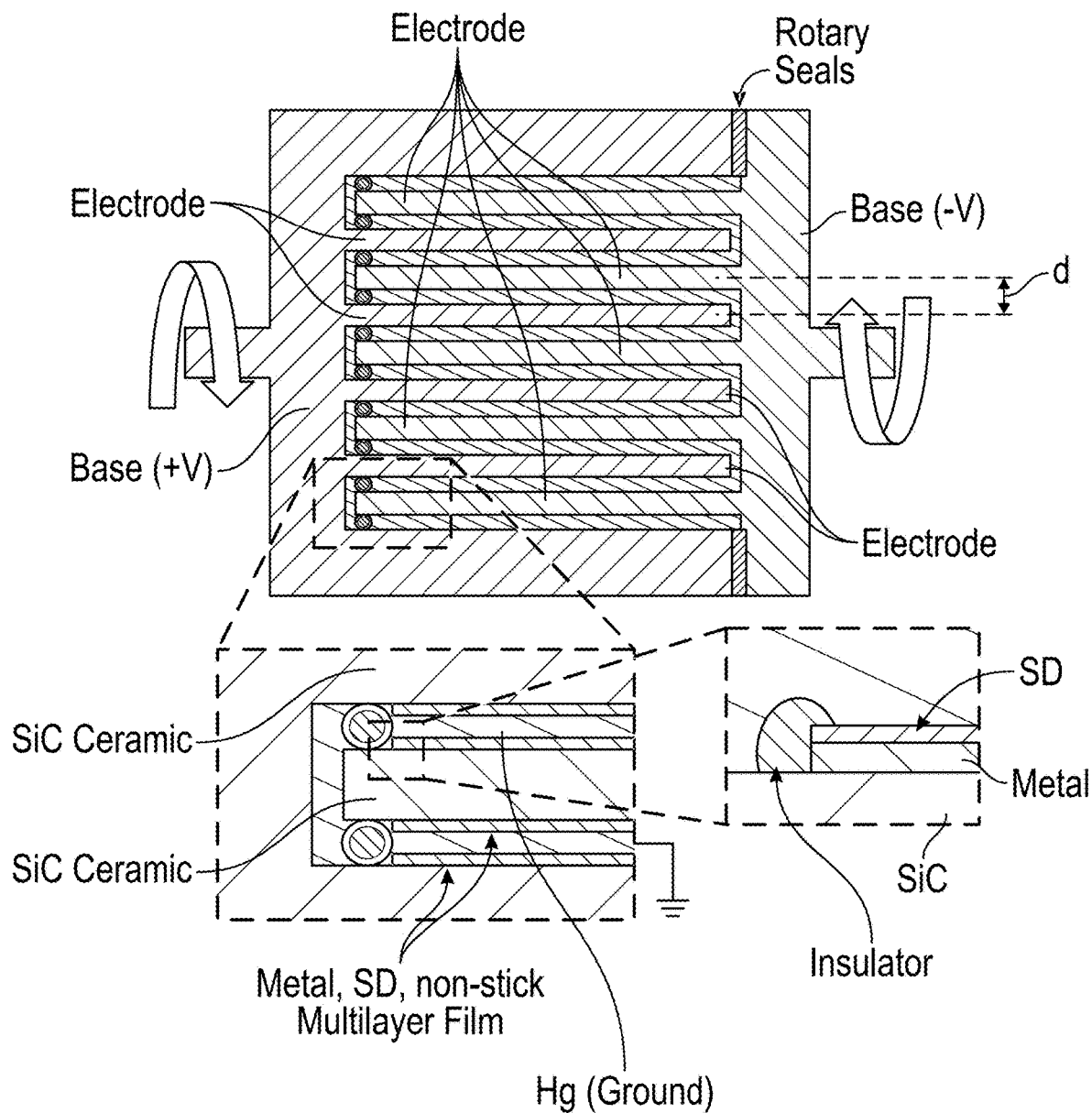
FIG. 9 schematically illustrates another example of a multi-electrode cylindrical ultra-magnet.

Finite Element Analysis with QuickField™ was used to simulate the strength of the magnetic fields of the described Multi-electrode Cylindrical Ultra-Magnet from FIGS. 7-9, hereafter known as the MCU, design for a number of design configurations.

Figure 10A:
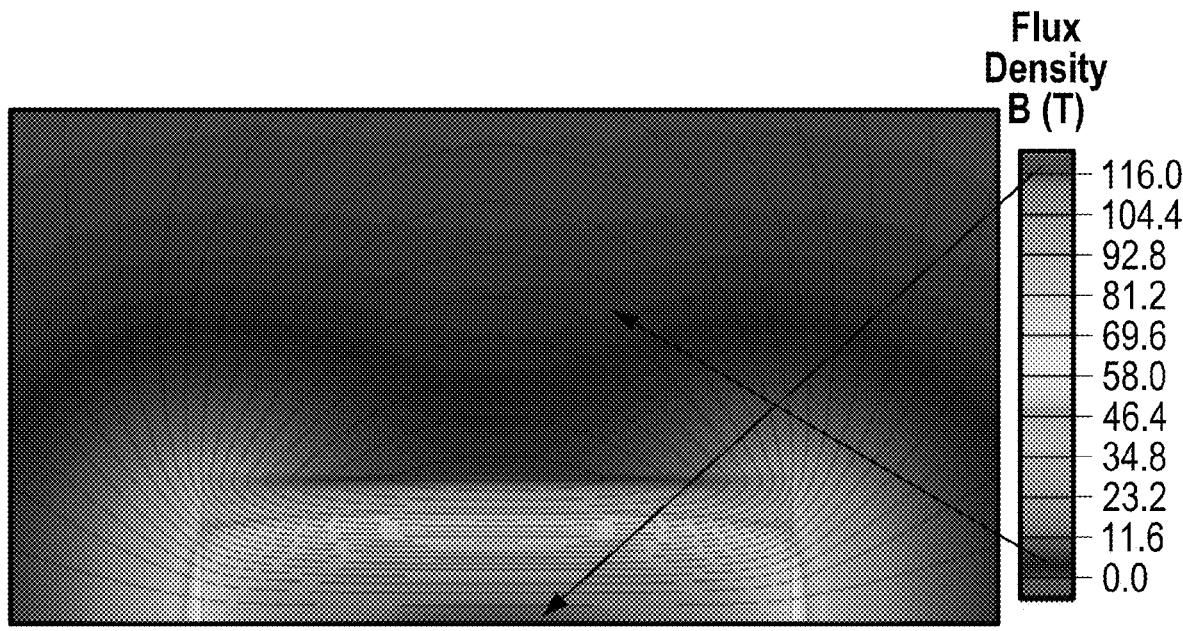
FIGS. 10A and 10B illustrate the calculated flux density in an FEA model of an example multi-electrode cylindrical ultra-magnet (MCU)
Figure 10B:
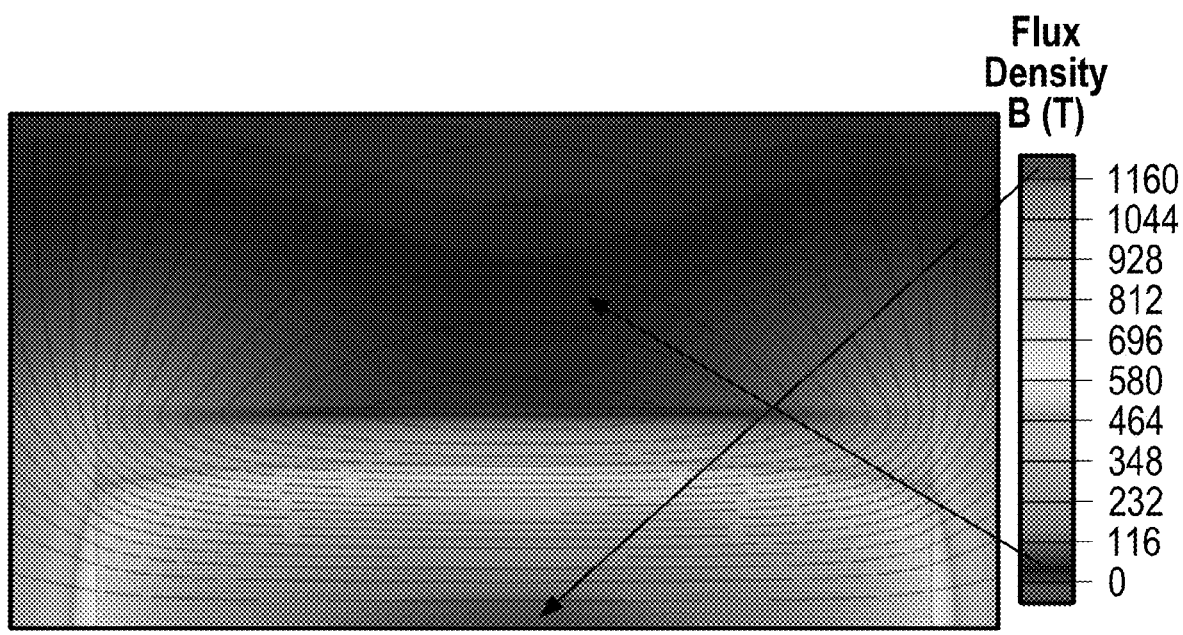

FIGS. 10A and 10B illustrate the calculated flux density in an FEA model of an example multi-electrode cylindrical ultra-magnet (MCU); FIG. 10A: Length=20 cm, Diameter=10 cm, SD thickness=5 microns, electrode spacing=1.0 mm, RPM=100,000; FIG. 10B: Length=2 meters, Diameter=1 meter, SD thickness=5 microns, electrode spacings=1.0 cm, RPM=100,000. Both cases $k=1\times10^9$, Voltage=2 V. FIG. 10A shows results for the smaller version, 20 cm long, 10 cm in diameter, with electrode spacings of 1.0 mm, where electrode spacing is defined as the distance from the center of one charge polarity electrode to the center of the next oppositely charge polarized electrode (labeled 'd' in FIG. 9). The SD thickness is 5 microns, and the rotation velocity is 100,000 RPM. As may be understood from FIG. 10A, this version of the MCU can produce magnetic fields of more than 110 Tesla. The second configuration consists of a larger MCU that is two meters long and one meter in diameter with 1.0 cm electrode spacings, and 5 microns thick super-dielectric layers, counter-spinning at 100,000 rotations per minute. As may be understood from FIG. 10B, this configuration can produce a magnetic field in excess of 1100 Tesla at this rotation rate.

As can be seen from equation 5, performance can be improved by improving on a number of factors. A higher dielectric constant will enhance the performance, however, in these analyses, super-dielectric constants that can be produced at the time of this application will be used, to with $k=1\times10^9$. The thickness of the dielectric layer can be reduced to improve performance, and the rotation speed of the electrodes can be increased to improve performance. Moreover, the voltage on the electrodes can be increased to hold more charge, and thus improve performance. However, the super-dielectrics in currently available examples are expected have a maximum voltage potential of two volts before the super-dielectric experiences a degradation in performance, as described above; therefore, V=2 volts is used throughout. Another performance improvement is to increase the number of electrodes in a given space, e.g., to pack as many electrodes as is practical into a given space, to maximize the volumetric charge. This means small spacings between the electrodes in the radial direction is desirable.

Figure 11A:
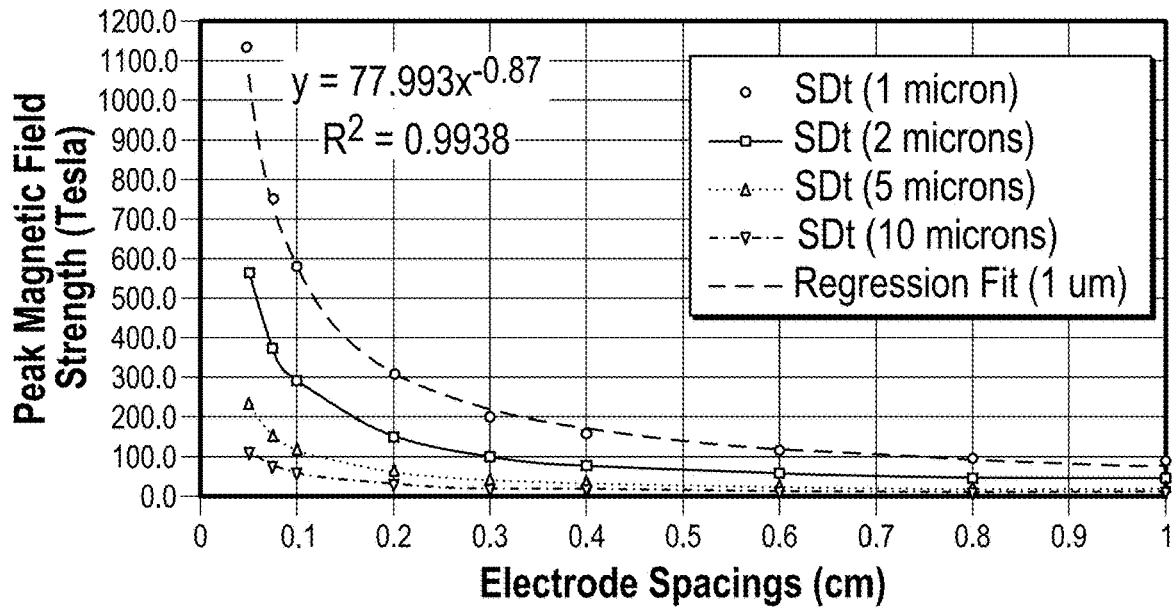
FIG. 11A is a plot of the calculated peak magnetic field strength as a function of electrode spacing in an FEA model of an example 20 cm×1 cm MCU.

FIG. 11A is a plot of the calculated peak magnetic field strength as a function of electrode spacing in an FEA model of an example 20 cm×1 cm MCU. More specifically, FIG. 11A shows the performance of a small MCU, 20 cm long by 10 cm in diameter, with a number of different electrode spacings and dielectric thicknesses simulated. Here the effect of these two parameters on the peak magnetic field achievable can be seen, where the peak occurs at the center point of the device (i.e., at the origin). Table 1 lists the corresponding values for reference (20 cm×10 cm MCU peak magnetic fields in Tesla. QuickField™ simulation results. (SDt=super-dielectric layer thickness)). A power series provides an excellent fit to the data as can be seen in the one-micron dielectric thickness case in FIG. 11A. Accordingly, it may be understood that even such a small MCU unit possesses the potential to produce peak magnetic fields on the order of tens or hundreds of Tesla.

TABLE 1

| Electrode Spacing (cm) | SDt (1 micron) | SDt (2 microns) | SDt (5 microns) | SDt (10 microns) |
| --- | --- | --- | --- | --- |
| 1 | 89.6 | 44.8 | 17.9 | 9.0 |
| 0.8 | 96.6 | 48.3 | 19.3 | 9.7 |
| 0.6 | 117.4 | 58.7 | 23.5 | 11.7 |

TABLE 1-continued

| Electrode Spacing (cm) | SDt (1 micron) | SDt (2 microns) | SDt (5 microns) | SDt (10 microns) |
|---|---|---|---|---|
| 0.4 | 159.2 | 79.6 | 31.8 | 15.9 |
| 0.3 | 201.4 | 100.7 | 40.3 | 20.1 |
| 0.2 | 307.6 | 153.8 | 61.5 | 30.8 |
| 0.1 | 582.4 | 291.2 | 116.5 | 58.2 |
| 0.075 | 751.5 | 375.8 | 150.3 | 75.1 |
| 0.05 | 1132.3 | 566.1 | 226.4 | 113.2 |

Figure 11B:
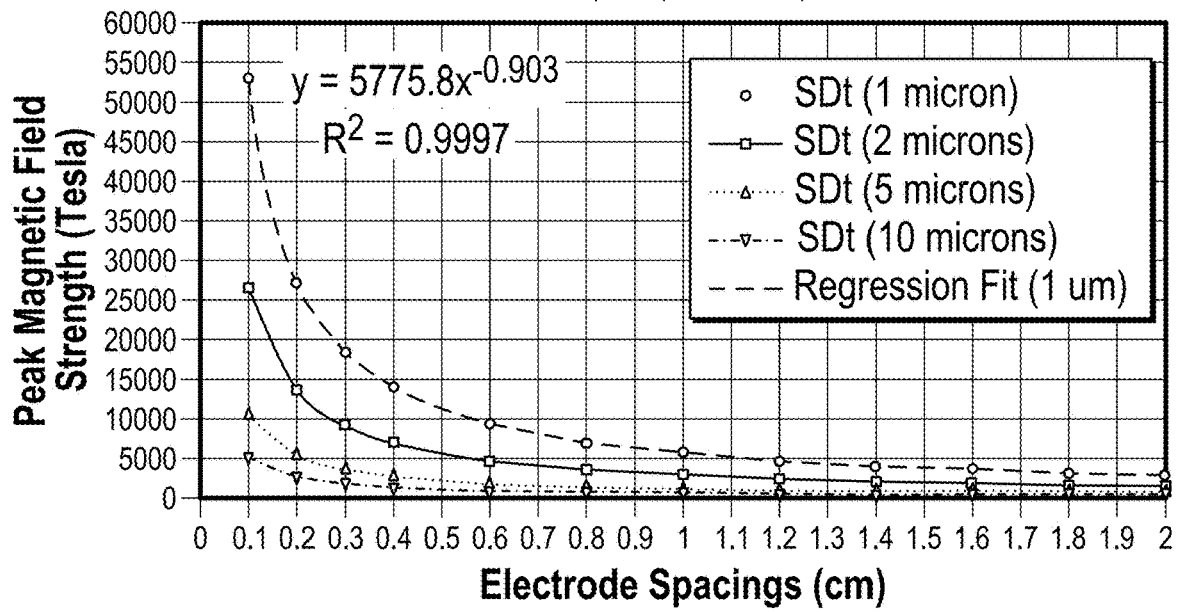
FIG. 11B is a plot of the calculated peak magnetic field strength as a function of electrode spacing in an FEA model of an example 2 meter×1 meter MCU.

FIG. 11B is a plot of the calculated peak magnetic field strength as a function of electrode spacing in an FEA model of an example 2 meter×1 meter MCU, which is larger than described with reference to FIG. 11A—2.0 meters in length by 1.0 meter in diameter. Table 2 lists the corresponding values for reference (2 meter×1 meter MCU peak magnetic fields in Tesla. QuickField™ simulation results. (SDt=super-dielectric layer thickness). In this example, the 2.0 meter× 1.0 meter MCU with a super-dielectric layer thickness of one micron and a 1.0 mm electrode spacing reaches a peak magnetic field strength in excess of 50,000 Tesla; this magnetic field is roughly one billion times stronger than that of the Earth's (~30×10$^6$ Tesla close to the equator, ~50×10$^6$ Tesla at the poles). While such an example may benefit from highly meticulous engineering to construct and may be complicated to build, it does demonstrate the incredible potential of the technology.

TABLE 2

| Electrode Spacing (cm) | SDt (1 micron) | SDt (2 microns) | SDt (5 microns) | SDt (10 microns) |
|---|---|---|---|---|
| 2 | 3076 | 1538 | 615 | 308 |
| 1.8 | 3213 | 1606 | 643 | 321 |
| 1.6 | 3708 | 1854 | 742 | 371 |
| 1.4 | 4100 | 2050 | 820 | 410 |
| 1.2 | 4765 | 2383 | 953 | 477 |
| 1 | 5824 | 2912 | 1165 | 582 |
| 0.8 | 7092 | 3546 | 1418 | 709 |
| 0.6 | 9419 | 4710 | 1884 | 942 |
| 0.4 | 14073 | 7037 | 2815 | 1407 |
| 0.3 | 18517 | 9259 | 3703 | 1852 |
| 0.2 | 27210 | 13608 | 5442 | 2720 |
| 0.1 | 53041 | 26520 | 10605 | 5306 |

MCU Construction

In order to make construction of long MCU's easier, in some examples a long MCU can be assembled from modular, shorter MCUs which can be placed side by side individually or attached and driven by a common driveshaft.

Figure 12:
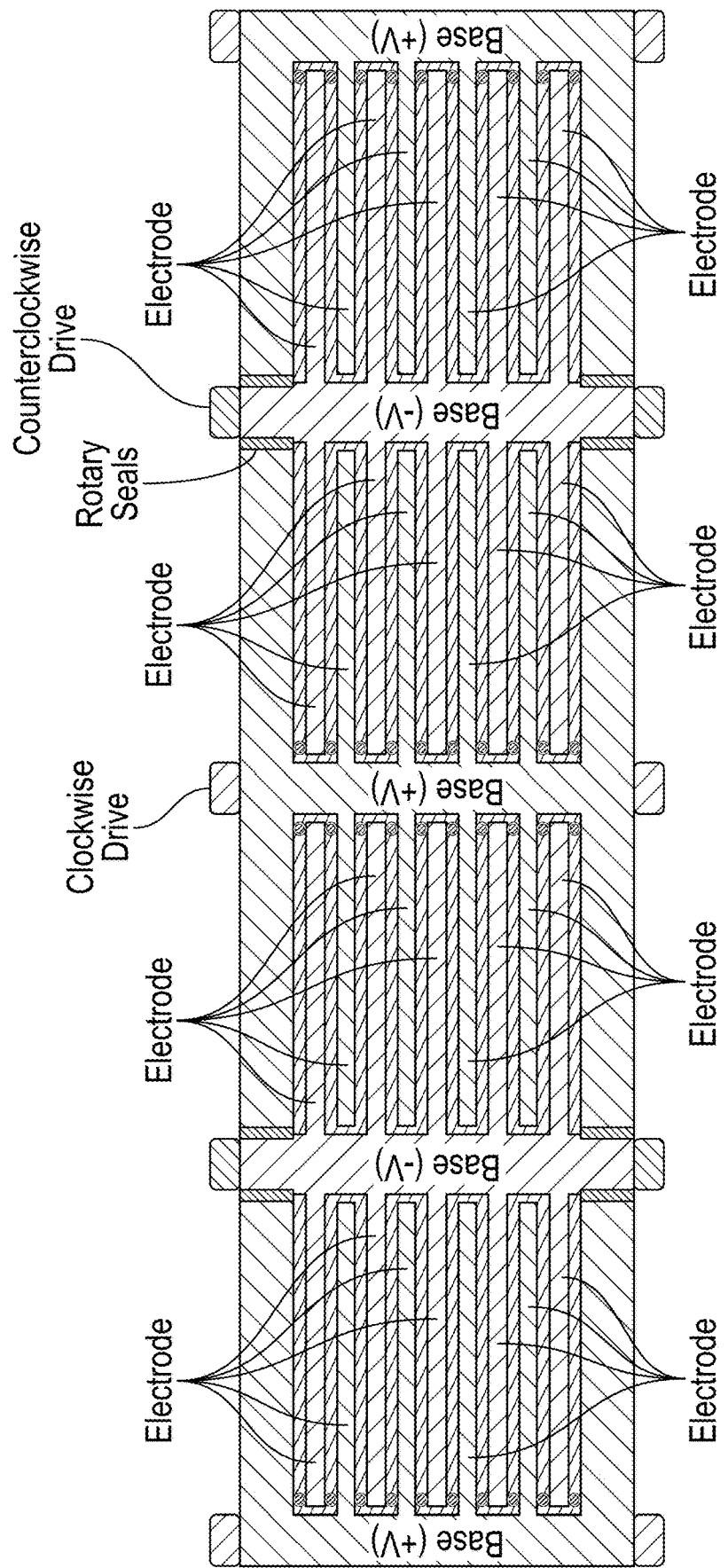
FIG. 12 schematically illustrates a segment of an example side-by-side design of an MCU.

FIG. 12 schematically illustrates a segment of an example side-by-side design of an MCU. In this case, the negative and positive electrodes are counter-rotated by an external mechanism instead of a central driveshaft, such as any number of toothed or grooved gears or frictional rollers interfacing to the clockwise drive and counterclockwise drive shown in FIG. 12, which themselves can be grooved or toothed elements or rigid smooth or semi-smooth surfaces in the case of a frictional roller mechanism.

It should be noted that it is not technically essential for both charges of electrodes (positive and negative) to rotate. One charged electrode (or set of electrodes) can be held stationery as the oppositely charged electrode (or set of electrodes) rotate. The advantage to counter-rotating both electrodes of the two charges is that the magnetic field may be essentially doubled in strength as described further above. Additionally, opposite torque moments may be canceled out as described further above. Furthermore, the counter rotation may keep opposing shear forces in the slip-joint fluid that helps prevent the conductive slip-joint fluid from sticking to the walls of the SD layered electrodes.

See MUMs designs described herein for more on connecting devices in series.

Circular Electrode Ultra-Magnets

Cylindrical electrodes may present some challenges in the construction of an ultra-magnet. Some processes, such as lithography, material deposition, etching, etc. can be more difficult on a curved surface. And, as a general rule, tighter tolerances can be maintained on a flat surface; flatness, wedge, thickness, surface quality, etc.

Figure 13:
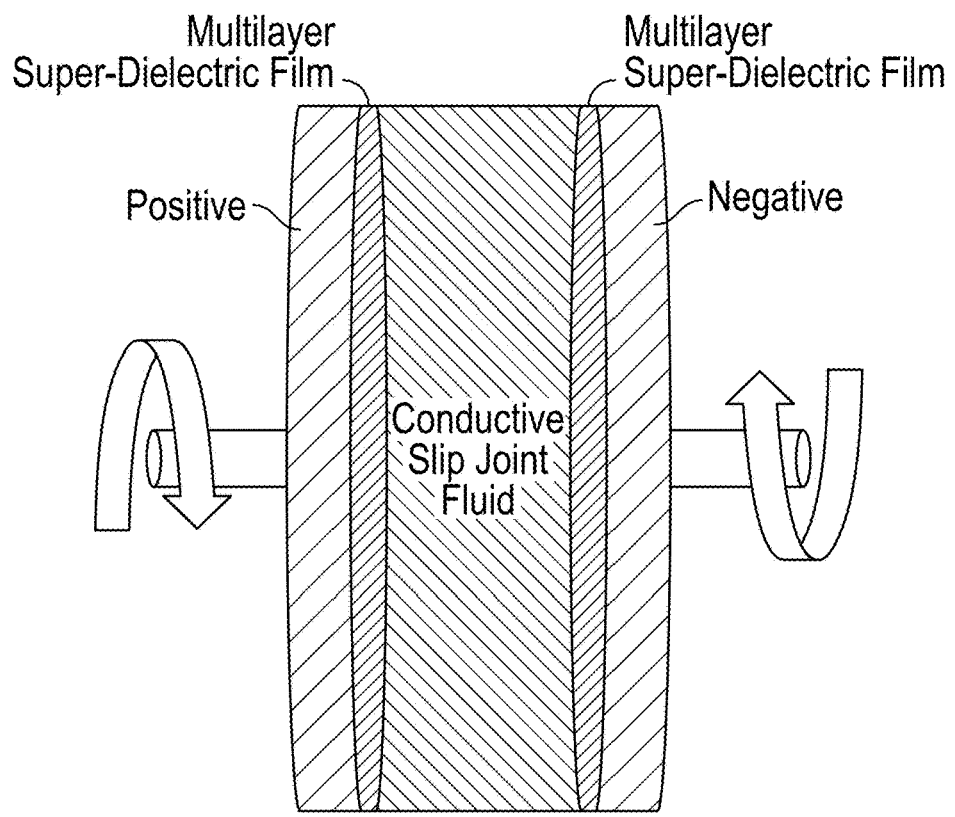
FIG. 13 schematically illustrates an example circular electrode ultra-magnet.

To this end, in some examples flat, circular electrodes (as opposed to cylindrical shell electrodes as previously described) may be used, see FIG. 13 which schematically illustrates an example circular electrode ultra-magnet. The basic design incorporates similar elements of the MCU. Counter-rotating electrodes are employed with a super-dielectric film as outlined herein. The electrodes can include or be made of metal, composites, or ceramics as covered elsewhere herein with respect to the MCU and all of the design elements covered under the MCU are equally applicable here.

It is well known that the capacitance between two closely spaced, static circular discs is approximately $$C = \frac{k\varepsilon_0 A}{d},$$

where k is the dielectric constant of the material between the two discs, $\varepsilon_0$ is the permittivity of free space, $A=\pi R^2$ is the area of a disc, and d is the separation between the two discs. The charge contained on each disc is simply Q=CV, where Q is the total charge, C is the capacitance, and V is the voltage between the two discs. In this way, the surface charge density, $\sigma$, is easily computed, $\sigma=Q/A$.

Figure 14:
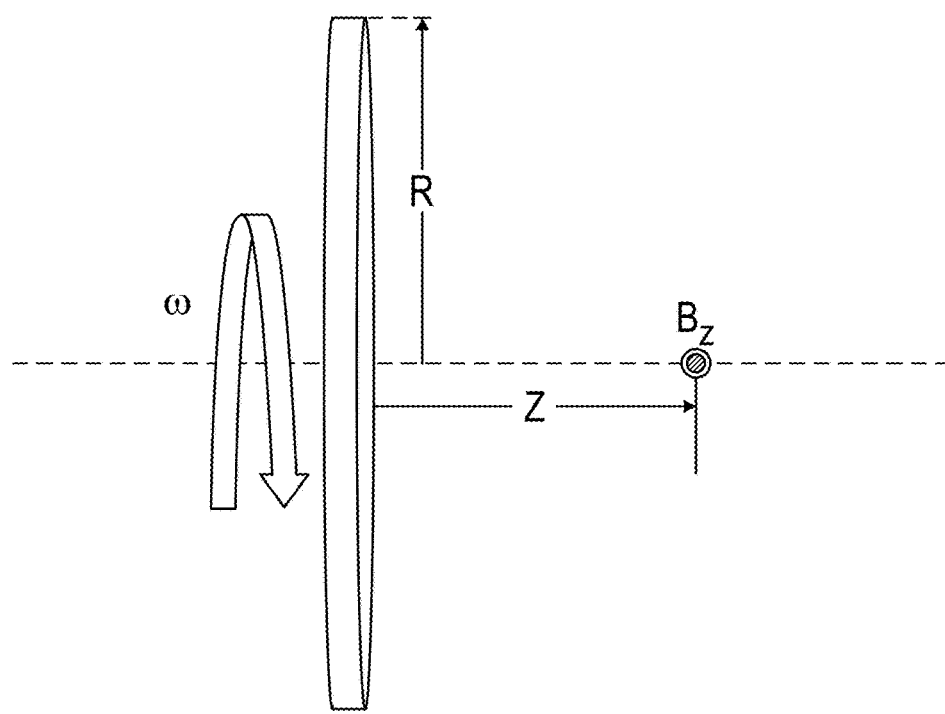
FIG. 14 schematically illustrates an example rotating charged disc.

Using the Biot-Savart Law (also see equation 5a for the integral form), $$d\vec{B} = \frac{d\vec{J} \times \hat{r}}{4\pi\mu r^2}, \quad (6)$$

where $d\vec{J}$ is an infinitesimal current volume element, $\hat{r}$ is the unit vector pointing from the current element to the point of evaluation of the field, $\mu$ is the permeability of the material the field exists in, and $r^2$ is the distance from the current element to the point of evaluation. Understanding that charges in motion represent current, the magnetic field, $\vec{B}$, can be calculated at any point in space. It can be shown that the magnetic field along the axis of rotation at a distance of z from a rotating uniformly charged disc, FIG. 14, is $$Bz(z) = \frac{\mu\sigma\omega}{2}\left(\frac{R^2 + 2z^2}{\sqrt{R^2 + z^2}} - 2z\right), \quad (7)$$

where $B_z$ is the magnetic field component along the axis of rotation, and $\omega$ is the angular velocity of the disc in radians per second.

Figure 15:
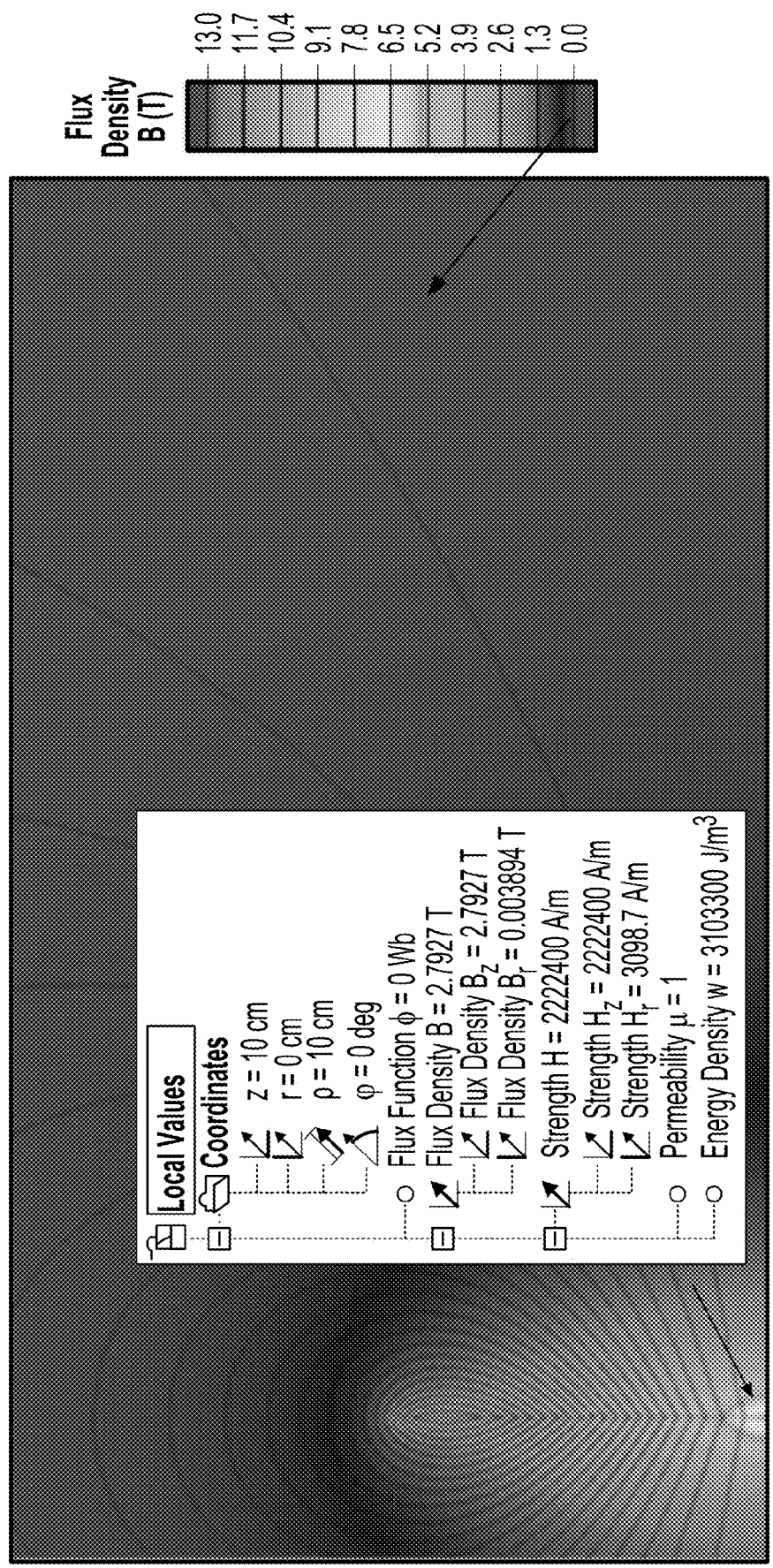
FIG. 15 illustrates the calculated flux density in an FEA model of an example rotating charged disc; Charge=1000 Coulombs; RPM=100,000; Diameter=1-meter.

Using equation 7, calculating the B field at z=10 cm from an example 1-meter diameter disc rotating at 100,000 rpm, holding a charge of 1000 Coulombs, and assuming free space as the medium, a B field of 2.76 Tesla is calculated. FIG. 15 illustrates the calculated flux density in an FEA model of an example rotating charged disc; Charge=1000 Coulombs; RPM=100,000; Diameter=1-meter. From FIG. 15 it may be understood that this axisymmetric finite element model of the charged disc set up, again with the rotational axis of symmetry being the horizontal axis, produces a result of B (z=10 cm) of 2.79 Tesla, in reasonable agreement with the analytical calculation.

While analytical calculations are feasible for simple geometries, analytical calculations for complex geometries become intractable and computer simulation is required. As with the MCU, Finite Element Analysis (FEA or FEM) may be used herein for the spinning disc geometries discussed.

Multi-Disc Ultra-Magnets

As with the cylindrical ultra-magnets, the rotating disc ultra-magnet can be greatly enhanced by increasing the number of rotating discs in an assembly. All the electrode/super-dielectric interface methods and geometries described previously apply to the rotating disc electrode geometries as well and equally may be used here. For example, some configurations of a multi-disc ultra-magnet include the dual super-dielectric interface layer, i.e., each charge of electrode possessing its own super-dielectric layer on both sides of the disc electrode, multi-layer film implied if the design calls for it. As with the MCUs, the electrodes/discs may be constructed from a number of materials including metal or one of the strong, lightweight, materials stated earlier; composites, glass, plastics, crystals, ceramics, etc. Multi-disc Ultra-magnets may be referenced herein as MDUs.

Figure 16:
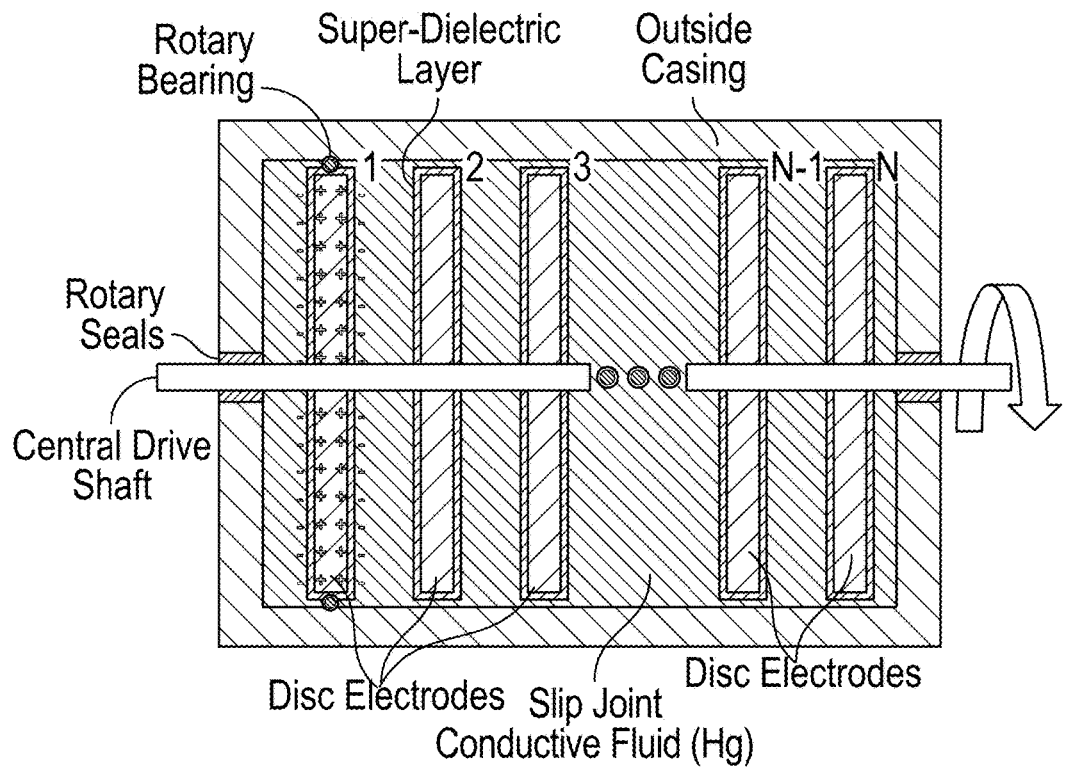
FIG. 16 schematically illustrates an example multi-disc ultra-magnet (MDU) having a single central shaft and a single charge rotation design; charge is only shown on first disc for simplicity; rotary bearing is only shown on first electrode for simplicity as well; choice of charge polarity is arbitrary (depends on direction of rotation and desired polarity of magnet).

FIG. 16 schematically illustrates an example multi-disc ultra-magnet (MDU) having a single central shaft and a single charge rotation design; charge is only shown on first disc for simplicity; rotary bearing is only shown on first electrode for simplicity as well; choice of charge polarity is arbitrary (depends on direction of rotation and desired polarity of magnet). In this example, N disc electrodes are encapsulated in the slip-joint conductive fluid. A central driveshaft connects all of the discs and provides the rotational drive to the discs. The discs are held at one potential and the conductive slip-joint fluid is held at another potential, thus, allowing the needed charge to build on the surface of the discs. The voltage can be easily supplied to the discs through the central driveshaft. The discs themselves are coated with a super-dielectric layer or multi-layer as the case may be, see discussion regarding MCU's and Interface. This allows charge to build-up on both sides of the disc. If the discs have sufficient thickness and it is desired, the edges of the discs may likewise be coated with super-dielectric to further enhance the magnetic field strength. Note, in the simulations that follow, this edge charge is not considered, only the charges on the top and bottom surfaces of the discs are considered. The outside casing is only structural and does not contribute to the magnetic field in this embodiment. Rotary bearings are shown; however, in rotation, only a tensile stress is experienced along the plane of the disc due to the centrifugal forces of rotation. The discs are unlikely to strain in the radial direction sufficiently to cause issue; there is no off-axis flexure moment due to centrifugal forces unlike the MCU case. The rotary bearings may be needed if the apparatus is not in a vertical position, i.e., driveshaft not aligned to gravity, and the driveshaft experiences some flexure due to gravity, though in general the rotary bearings may not be required.

Nonlimiting examples of advantages to designs such as illustrated in FIG. 16 include: 1. a single rotary driveshaft is simpler to construct, using fewer rotary seals or bearings that can also be smaller in diameter around the shaft; 2. the discs can be very tightly packed into the assembly. In some examples, due to there only being one torque moment in the system, the slip joint fluid may experience a shear stress torque that may eventually build an amount of angular momentum in the slip joint fluid. The angular momentum may be such that the charge in the fluid close to the electrode will experience some angular velocity in the same direction as the charged electrode, thus, diminishing the magnetic field somewhat. This effect can be mitigated by counter-rotating the outside casing and providing a counter-acting torque. Having two electrodes of opposite charge in close proximity counter-rotating to one another may be used in some embodiments.

As with the MCU, the rotary seals are not required, for example if it is not a requirement to contain the mercury inside the device, such as device submersion in mercury or recirculating the mercury back into the device as it leaks out.

Figure 17:
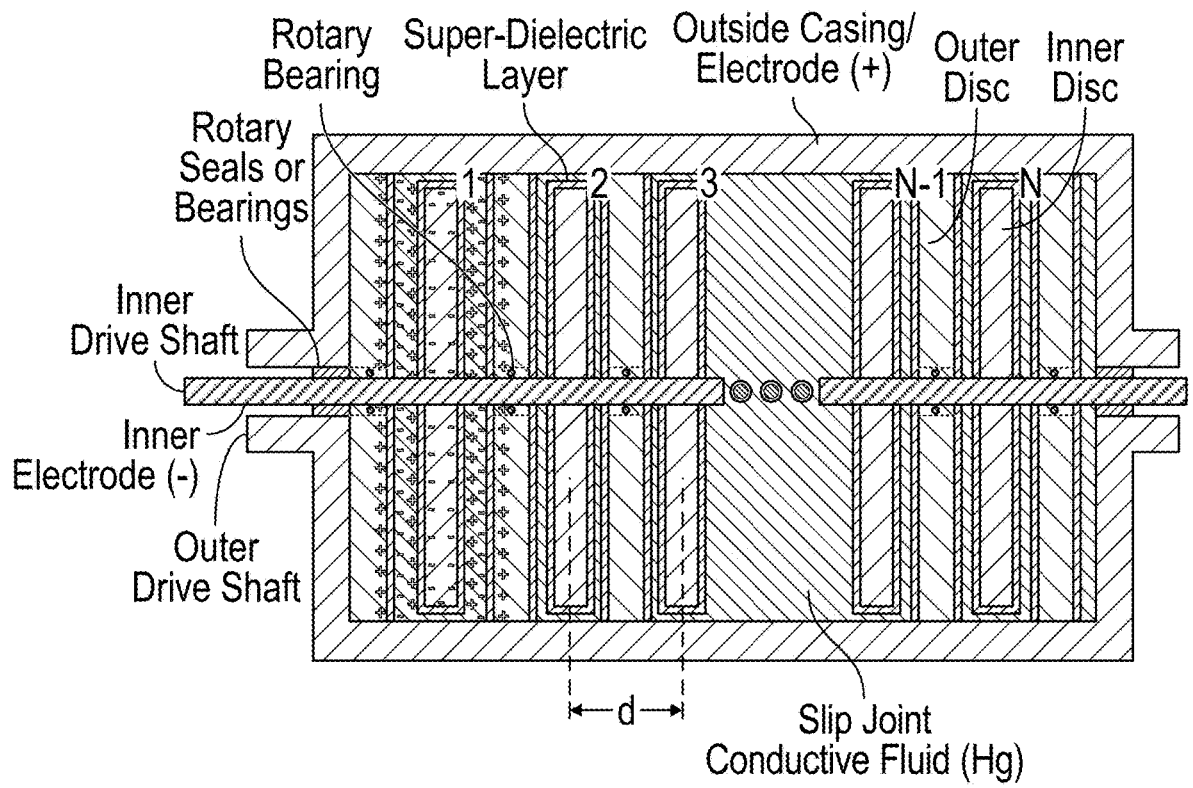
FIG. 17 schematically illustrates an example MDU having inner and outer counter-rotating shafts and a doubly charged rotation design; charge is only shown on first disc pair for simplicity; choice of charge polarity is arbitrary (depends on direction of rotations and desired polarity of magnet).
Figure 18:
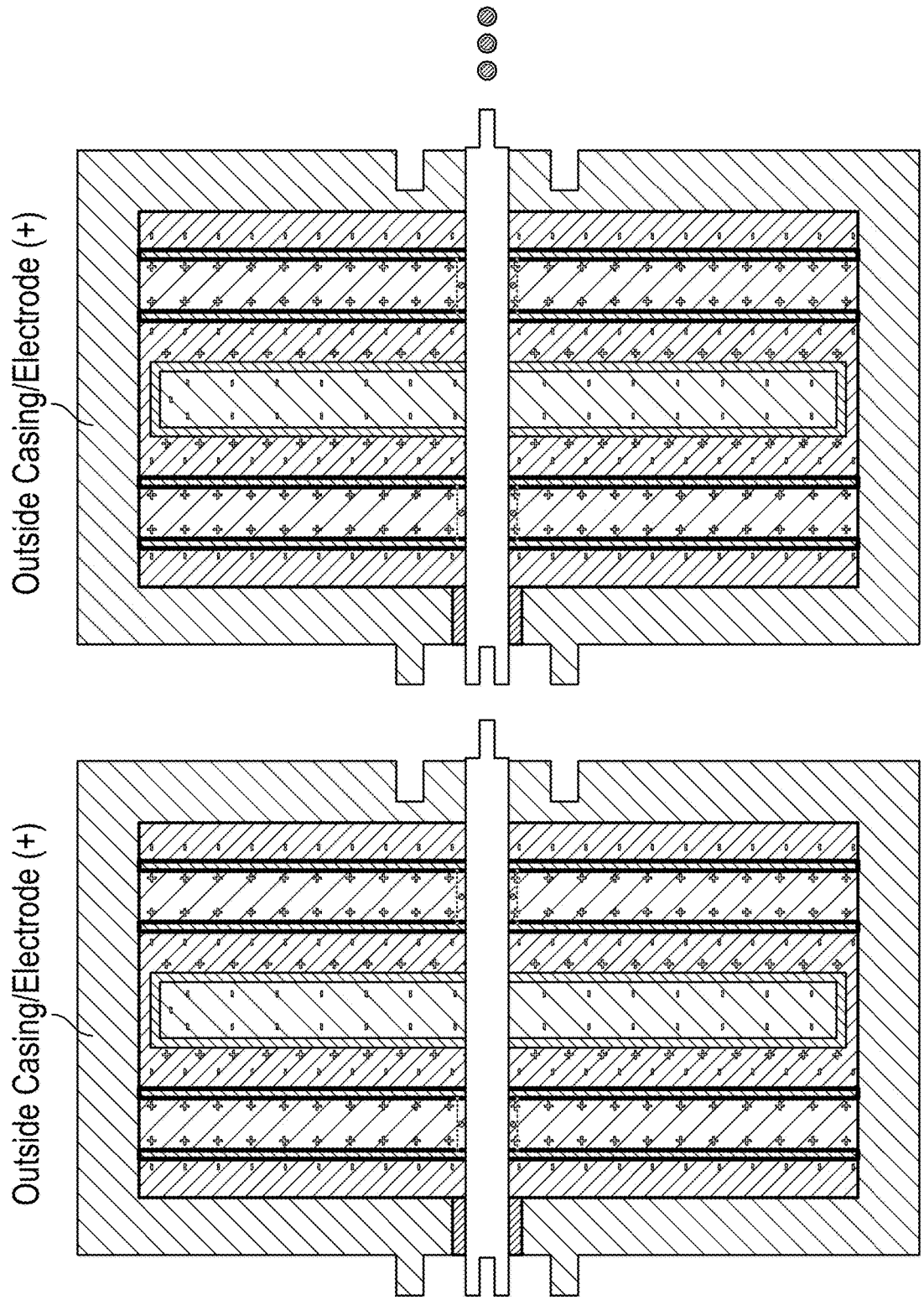
FIG. 18 schematically illustrates an example modular approach to building long MDUs.

FIG. 17 schematically illustrates an example MDU having inner and outer counter-rotating shafts, the outer shaft being attached to or including the outside casing, and a doubly charged rotation design; charge is only shown on first disc pair for simplicity; choice of charge polarity is arbitrary (depends on direction of rotations and desired polarity of magnet). More specifically, FIG. 17 shows a schematic diagram of dual polarity counter-rotating MDU design with N sets of rotating discs. A series of discs is attached to the inner drive shaft which also serves as the electrode to provide voltage potential and charge to those discs. The discs are coated with the super-dielectric layer as described herein. These discs are referred to as the inner discs.

The other polarity discs are attached to a cylindrical body, the outside casing, that also serves as the supply electrode for those discs; to deliver voltage potential and charge. These discs are referred to as the outer discs. These outer discs also may be coated with super-dielectric layer as described herein. The cylindrical body is attached to an outer driveshaft. The outer driveshaft is hollow to allow the inner driveshaft to pass through and rotationally drive the inner discs independently of the outer discs. The outer discs each have a hole in the center to allow the inner drive shaft to pass through.

In some examples, a conductive slip joint fluid, for example, mercury (Hg), encapsulates both inner and outer discs. In some examples, one electrode is powered to ±2 V and the other electrode is powered to −2 V (assuming a 2 V degradation voltage such as described elsewhere herein), and the mercury is held at an intermediate potential, for example, zero volts or ground. This allows charge to build on the inner and outer discs. In FIG. 17, the outer discs are at positive potential and the inner discs are at negative potential, though this choice is arbitrary. The inner and outer discs are then spun at high angular velocity in opposite directions.

If rotary bearings are used, the rotary bearings can be placed between the inner shaft and one or more of the outer discs and/or the outer drive shaft (as shown in FIG. 17). If outer discs are used, these support discs can be modified such as being thicker to provide structural support. Smaller diameter rotary bearings and rotary seals have the advantage of being more conducive to higher rotation speeds, and thus more powerful magnetic fields; as the strength of the magnetic field is directly proportional to the rotation speed of the discs.

Additionally, the outside casing/electrode may be insulated from the mercury slip-joint fluid as to not electrically short the casing to the slip-joint fluid. This can be done by either depositing a film insulator on the inner diameter of the outside casing, masked where the outer discs attach to the casing; or using a non-conductive, strong, lightweight material (as discussed herein) for the outside casing and selectively applying metal coatings to the areas that need conduction paths, masking those areas that are wetted by the mercury; or metal coating the inside of a non-conductive casing and etching the metal away in the areas that would be wetted by the mercury. It should be noted that, while not shown in the figure, the inner walls of the outside casing electrode can likewise be coated by the super-dielectric layer to act as the separation barrier between the electrode and the slip-joint fluid. This may build up a relatively strong charge on the cylindrical inner diameter (ID) part of the outside electrode which is a rotating member, further enhancing the magnetic field when the apparatus is in rotational motion. Similar insulating processing could be taken with the inner electrode/shaft, although due to its small radius, only a small additional advantage would be gained by coating it with a super-dielectric layer. In the simulation results that follow, it is assumed that neither the ID of the outer cylinder nor the inner drive shaft are charged.

Locally, the mercury holds an equal and opposite charge to the electrodes near to the super-dielectric layer. However, due to the mercury having high surface tension, the super-dielectric matrix being constructed of a low adhesive material and optionally being capped with a non-stick thin film, combined with the two electrodes being counter-rotated which creates opposite, cancelling, shear torques in the fluid, those parasitic charge motions are greatly mitigated. The thinner the mercury fluid (i.e., the closer the inner and outer counter-rotating electrode plates are to one another) the greater the mitigation effect will be. In addition to mitigating parasitic charge motion, having high electrode densities also equates to higher amps/unit volume which result in stronger magnetic fields; a win-win situation.

While FIG. 17 shows the shafts extending from both sides of the apparatus, note that it is possible to have a single shaft drive the inner discs from one side as well as have a single outer shaft drive the outside casing, and thus the outer discs, from the same side and have the opposite side of the apparatus closed, being driven from one side exclusively. For example, if driving from the right the inner shaft may extend only to the inner disc labeled #1 and end there. The rotary seals/bearings on the left side may be omitted, and the left end may be flat on the outside (e.g., no raised portion for the outer shaft).

Decades of manufacturing experience teaches that producing large numbers of a single item results in better quality, tolerancing, and yield; quality engineering tools like statistical process control (SPC) and process optimization can be utilized. To this end, the MDU inner and outer shafts as well as the outside casing can be designed such that the shafts attach in series in a lock and key or interlocking castellations geometry, though any number of mechanical joints can be used. This allows for building a base MDU and then attaching those base MDUs in series to produce a much longer, larger ultra-magnet. This allows focus on providing a simpler, smaller base design that may be used to achieve the overall desired magnetic field strength MDU in the desired length. See the Micro-Ultra Magnet (MUM) discussed herein for more detail on a similar design.

Multi-Electrode Disc Ultra-Magnet (MDU) Performance

The MDUs produce similar performance to the MCUs as can be seen by comparing the magnets in FIGS. 10A and 10B with FIGS. 19A and 19B, described below.

Certain advantages to using discs over cylinders include the manufacturability of the disc magnets. It is not unusual to manufacture flats (disc shape) with optical flatness of $\lambda/10$ where $\lambda$ is usually referenced to a He—Ne laser wavelength; 632.8 nm. It is also easier to pattern, coat, and selectively etch flat surfaces as opposed to curved surfaces. Additionally, as was pointed out previously, during rotation, the discs do not experience off-axis rotational moments as all centrifugal forces are directed in the plane of the discs themselves.

Figure 19A:
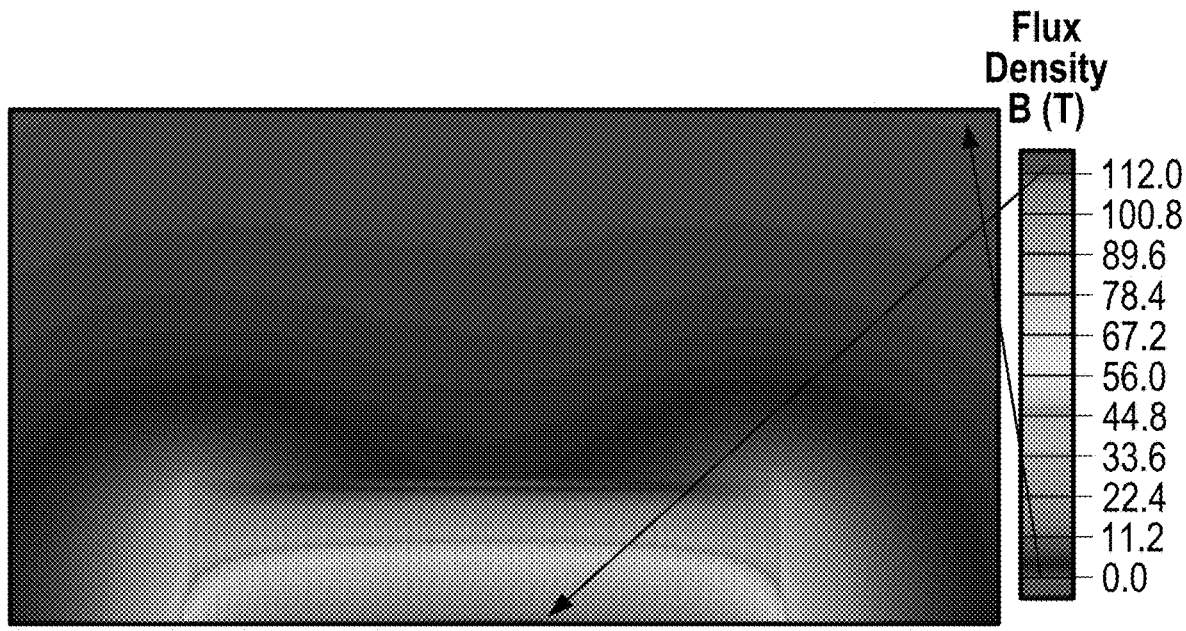
FIGS. 19A and 19B illustrate the calculated flux density in an FEA model of example MDUs.
Figure 19B:
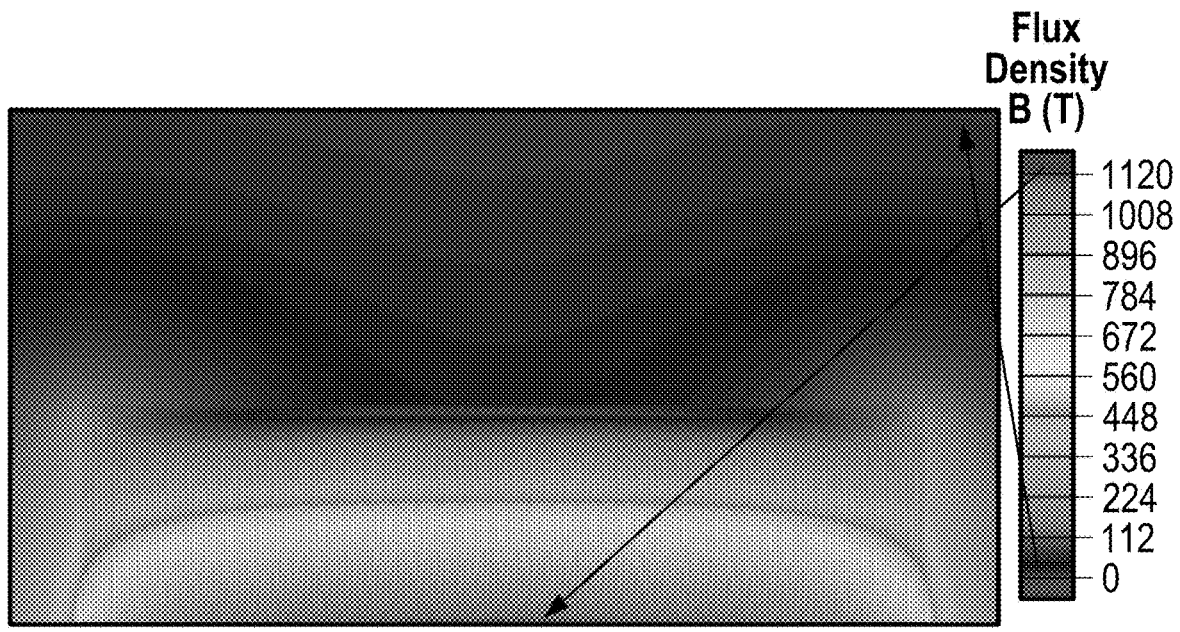

FIGS. 19A and 19B illustrate the calculated flux density in an FEA model of example MDUs; FIG. 19A: Length=20 cm, Diameter=10 cm, SD thickness=5 microns, electrode spacing=1.0 mm, RPM=100,000; FIG. 19B: Length=2 meters, Diameter=1 meter, SD thickness=5 microns, electrode spacings=1.0 cm, RPM=100,000. Both cases $k=1\times10^9$, Voltage=2 V. FIG. 19A shows a smaller version, 20 cm long, 10 cm in diameter, with electrode spacings of 1.0 mm, where electrode spacing is defined as the distance from the center of one charge polarity electrode to the center of the next same polarity electrode (labeled 'd' in FIG. 17). The SD thickness is 5 microns, and the rotation velocity is 100,000 RPM. As may be understood from FIG. 19A, this version of the MDU can produce magnetic fields of more than 110 Tesla.

FIG. 19B shows a second configuration including a MDU that is two meters long and one meter in diameter with 1.0 cm electrode spacings, and 5 microns thick super-dielectric layers, spinning at 100,000 rotations per minute. As may be understood from FIG. 19B, this configuration has the potential to produce a magnetic field in excess of 1100 Tesla.

Performance of the MDU can be improved by improving on a number of factors. A higher dielectric constant will enhance the performance for reasons such as discussed above. However, in the present analyses, super-dielectric constants that can be produced at the time of this application (e.g., as described in the above-cited references) are used.

The thickness of the dielectric layer can be reduced to improve performance, and the rotation speed of the electrodes can be increased to improve performance. Moreover, the voltage on the electrodes can be increased to hold more charge, and thus, improve performance. However, the super-dielectrics in the example embodiments have a maximum voltage potential of two volts before the super-dielectric experiences a degradation in performance-therefore, 2 Volts is used here. Another performance improvement is to increase the number of electrodes in a given space, e.g., to pack as many electrodes as is practical into a given space. This means small spacings between the disc electrodes in the axial direction is desirable.

Figure 20:
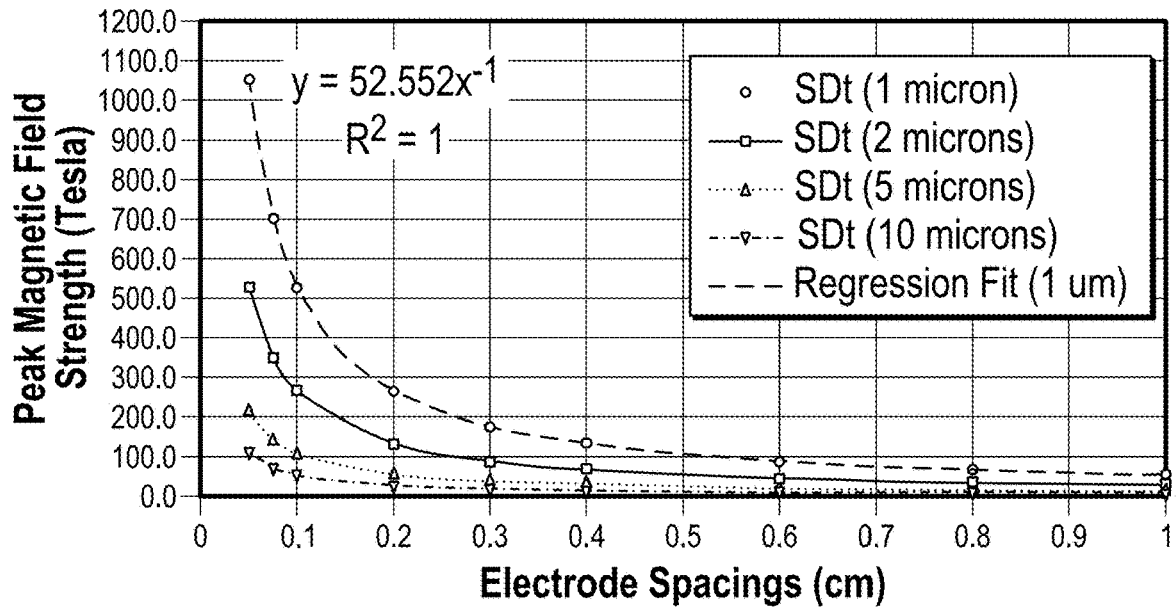
FIG. 20 is a plot of the calculated peak magnetic field strength as a function of electrode spacing in an FEA model of an example 20 cm×1 cm MDU.

FIG. 20 is a plot of the calculated peak magnetic field strength as a function of electrode spacing in an FEA model of an example 20 cm×1 cm MDU. FIG. 20 shows a small MCU, 20 cm long by 10 cm in diameter, with a number of different electrode spacings and dielectric thicknesses simulated. Here, it can be seen the effect of these two parameters on the peak magnetic field achievable, where the peak occurs at the center point of the device (i.e., at the origin). Table 3 lists the corresponding values for reference (20 cm×10 cm MDU peak magnetic fields in Tesla (Quick-Field™ simulation results)). As expected, a power series provides an excellent fit to the data as can be seen in the one-micron dielectric thickness case in FIG. 20. From these results, it may be understood that even such a small MCU unit possesses the potential to produce peak magnetic fields on the order of tens or hundreds of Tesla.

TABLE 3

| Electrode Spacing (cm) | SDt (1 micron) | SDt (2 microns) | SDt (5 microns) | SDt (10 microns) |
|---|---|---|---|---|
| 1 | 52.6 | 26.3 | 10.5 | 5.3 |
| 0.8 | 65.7 | 32.8 | 13.1 | 6.6 |
| 0.6 | 87.6 | 43.8 | 17.5 | 8.8 |
| 0.4 | 131.4 | 65.7 | 26.3 | 13.1 |
| 0.3 | 175.2 | 87.6 | 35.0 | 17.5 |
| 0.2 | 262.8 | 131.4 | 52.6 | 26.3 |
| 0.1 | 525.5 | 262.8 | 105.1 | 52.6 |
| 0.075 | 700.7 | 350.3 | 140.1 | 70.1 |
| 0.05 | 1051.0 | 525.5 | 210.2 | 105.1 |

Figure 21:
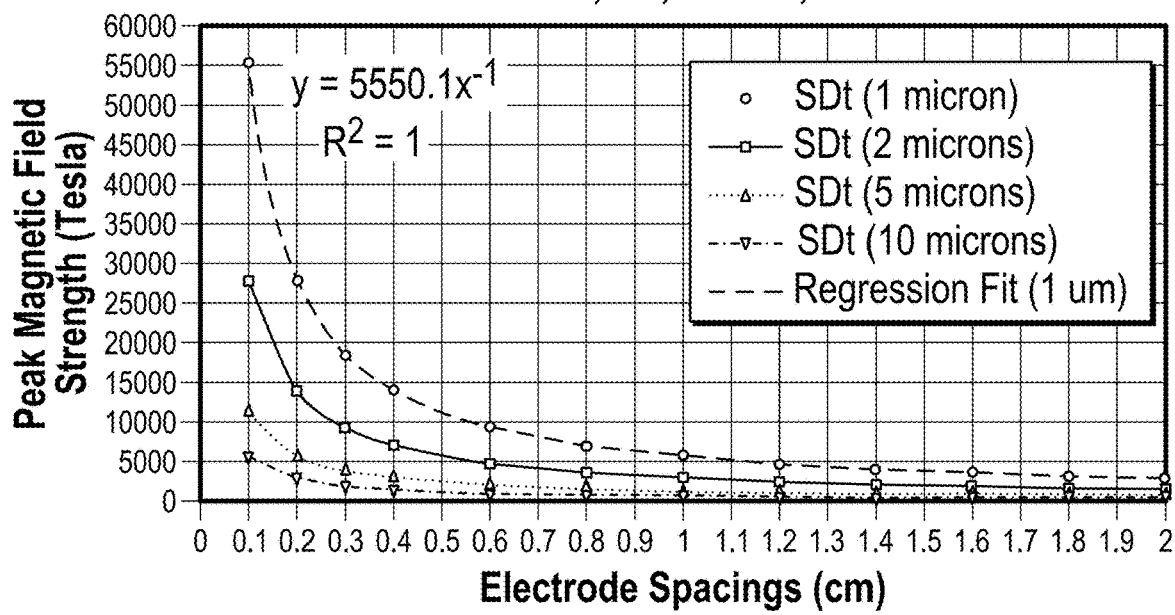
FIG. 21 is a plot of the calculated peak magnetic field strength as a function of electrode spacing in an FEA model of an example 2 meter×1 meter MDU.

FIG. 21 is a plot of the calculated peak magnetic field strength as a function of electrode spacing in an FEA model of an example 2 meter×1 meter MDU which is larger than that of FIGS. 20—2.0 meters in length by 1.0 meter in diameter. The modeled MDU had a super-dielectric layer thickness of one micron and a 1.0 mm electrode spacing. Table 4 lists the corresponding values for reference (2 meter×1 meter MDU peak magnetic fields in Tesla (Quick-Field™ simulation results)). Here, it can be seen that the peak magnetic field strength is in excess of 50,000 Tesla. Such an example would involve a number of engineering challenges, but it demonstrates the potential of the technology discussed herein.

TABLE 4

| Electrode Spacing (cm) | SDt (1 micron) | SDt (2 microns) | SDt (5 microns) | SDt (10 microns) |
|---|---|---|---|---|
| 2 | 2775 | 1388 | 555 | 278 |
| 1.8 | 3083 | 1542 | 617 | 308 |
| 1.6 | 3469 | 1734 | 694 | 347 |
| 1.4 | 3964 | 1982 | 793 | 396 |
| 1.2 | 4625 | 2313 | 925 | 463 |
| 1 | 5550 | 2775 | 1110 | 555 |
| 0.8 | 6938 | 3469 | 1388 | 694 |
| 0.6 | 9250 | 4625 | 1850 | 925 |
| 0.4 | 13875 | 6938 | 2775 | 1388 |
| 0.3 | 18500 | 9250 | 3700 | 1850 |
| 0.2 | 27750 | 13875 | 5550 | 2775 |
| 0.1 | 55501 | 27750 | 11100 | 5550 |

Multi-Electrode Spherical Ultra-Magnet (MSU)

Figure 22A:
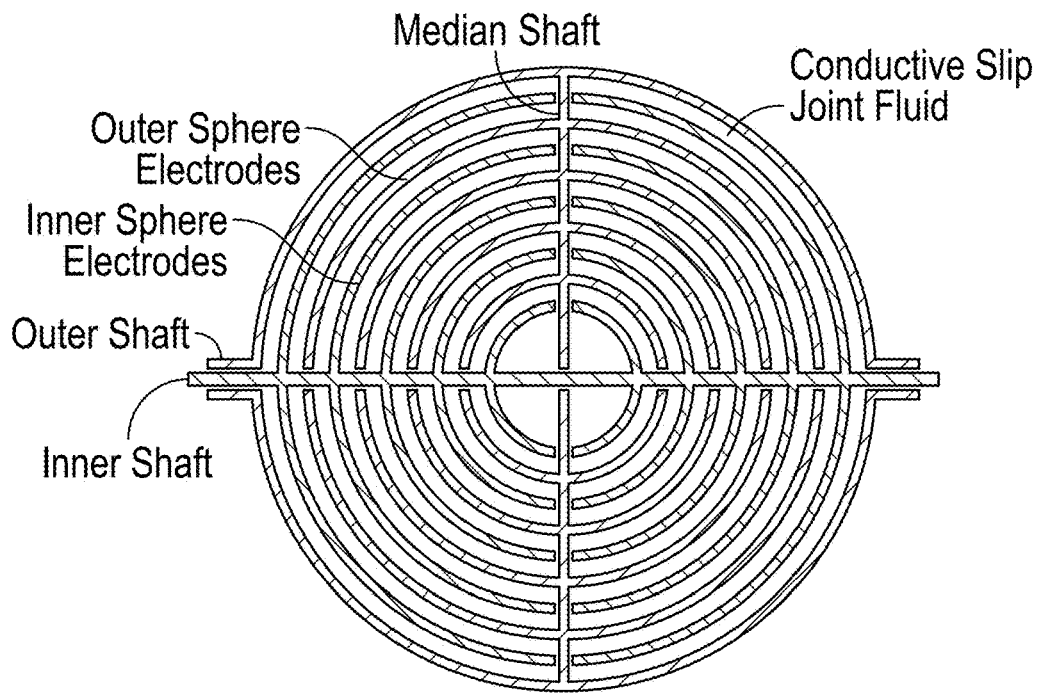
FIGS. 22A-22B schematically illustrate components of a multi-electrode spherical ultra-magnet (MSU).
Figure 22B:
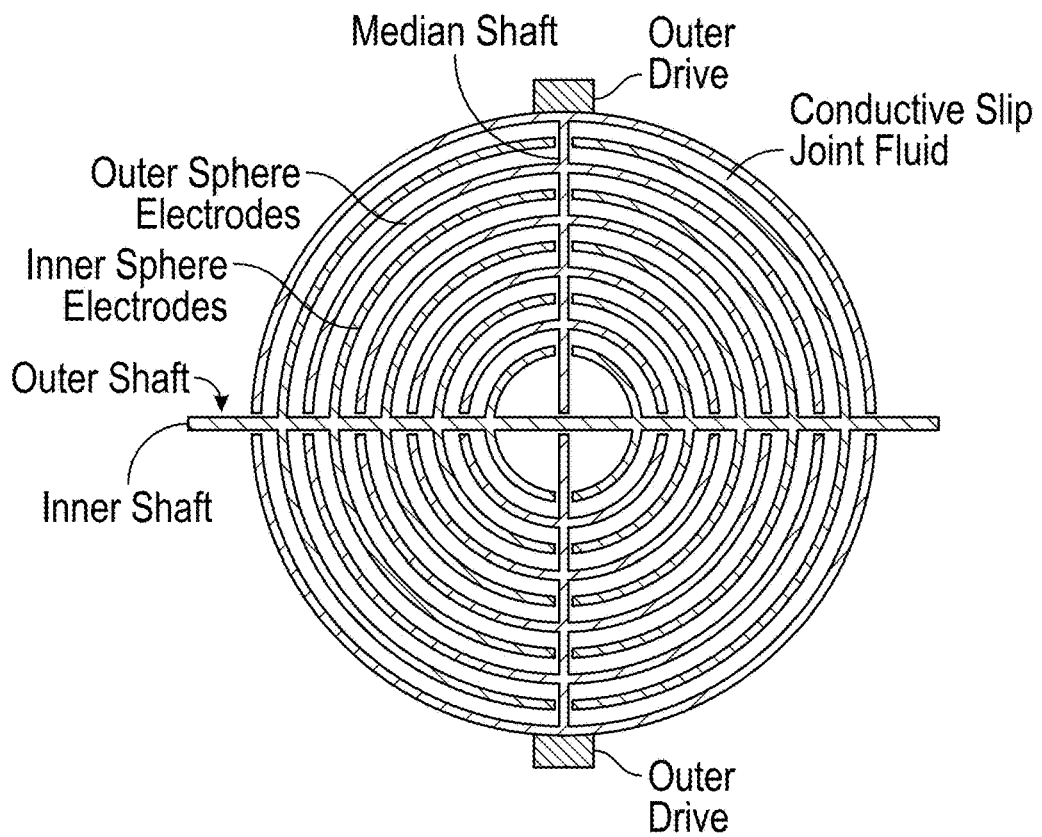

It should be clear that a multi-electrode spherical ultra-magnet (MSU) can be similarly constructed to the MCUs and MDUs. FIGS. 22A-22B schematically illustrate components of example multi-electrode spherical ultra-magnets (MSUs). FIG. 22A shows one example embodiment in which a central shaft is attached to inner spherical electrodes. These inner spherical electrodes may include complementary mirrored hemi-spheres with spacing sufficient to allow the median shaft to rotate without interference. The inner spherical electrodes are attached to the inner shaft. The outer shaft is attached to the outermost sphere which is further attached to the median shaft. The median shaft may include a circular plane with a small hole in its center as substantially to not interfere with the rotation of the inner shaft. Furthermore, the outer spherical electrodes likewise have a small hole to allow passage of the inner shaft without interference of its rotation. The outer spherical electrodes are attached to the median shaft. Thus, when the inner shaft is rotated clockwise, all the inner spherical electrodes will rotate similarly in a clockwise fashion, independent of the motion of the outer spherical electrodes. When the outer shaft is rotated counterclockwise the outer spherical electrodes will likewise rotate counterclockwise, independent of the motion of the inner spherical electrodes. In this way the inner and outer spherical electrodes can be driven independent of one another, such as one set of electrodes rotating clockwise and the other set of electrodes rotating counter-clockwise. As described earlier a conductive slip joint fluid fills the spacings between the spherical electrodes and the electrodes contain a super-dielectric coating as described previously. Similarly, FIG. 22B shows the outer spherical electrodes being driven by an external mechanism such as described previously, e.g., gear drive or frictional rotational drive.

Figure 22C:
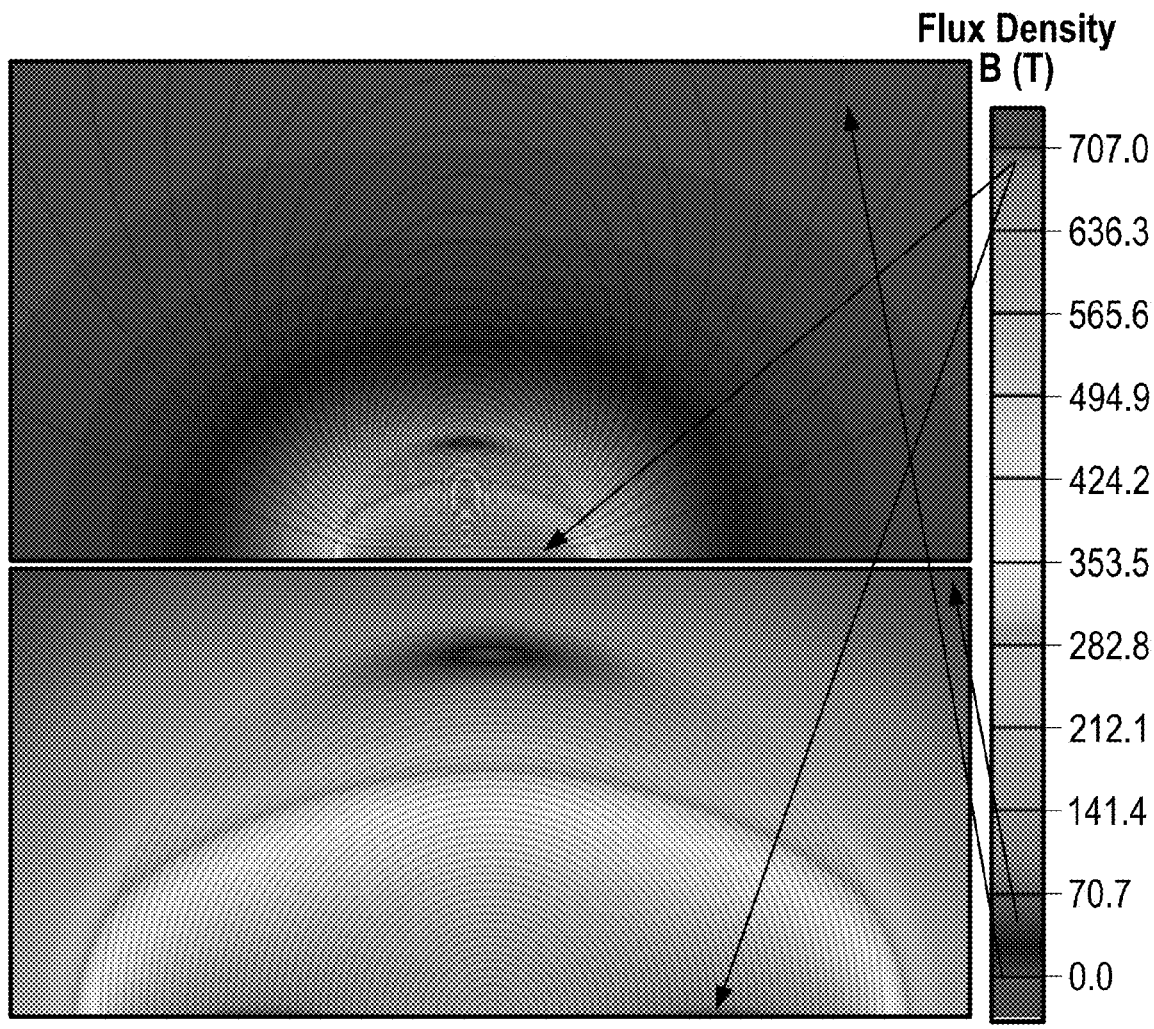
FIG. 22C illustrates the calculated flux density in an FEA model of an example MSU; Diameter=1 meter, electrode spacings=1 cm, $k=1\times10^9$, super-dielectric thickness=5 microns, rotation=100,000 RPM.

FIG. 22C illustrates the calculated flux density in an FEA model of an example multi-electrode spherical ultra-magnet (MSU) of one meter in diameter with electrode spacings of 1 cm, with 5 um super-dielectric layer thickness, and rotation rate of 100,000 rpm. From FIG. 22C it may be understood that the MSU performs similarly to the MCU and MDU units; however, from a practical standpoint it may be more difficult to construct. The MSU is included in the spirit of the current subject matter. The magnetic field shape does have a different distribution than the MCU and MDU which could be advantageous in some applications.

Working Area

The magnetic field strengths of the nonlimiting examples described so far have been at the center of the ultra-magnet, with the ultra-magnet being a solid unit. In such examples the maximum strength magnetic field, which otherwise could act on one or more desired material(s), is buried within the magnet. In alternative configurations, one or more of the ultramagnet components (e.g., the inner shaft) is hollow so as to provide a working area having a high magnetic field strength which may be used, e.g., applied to one or more materials. For example, in the case of an MCU, the inner cylindrical electrode may be made hollow, and the hollow area used as a working area. As another example, in the case of an MSU, the inner spherical electrode may be made hollow, and the hollow area used as a working area. Similarly, for an MDU the inner shaft may be a hollow tube and the area inside it may be used as a working area. In other examples, an area relatively close to the magnet may be used as a working area. For example, FIGS. 24 and 35B described below show a working area between two magnets, rather than inside of a magnet. Any desired material e.g., any material it is desired to have the magnet act upon, may be used in any suitable working area. It will be appreciated that such material may be application specific.

Figure 23A:
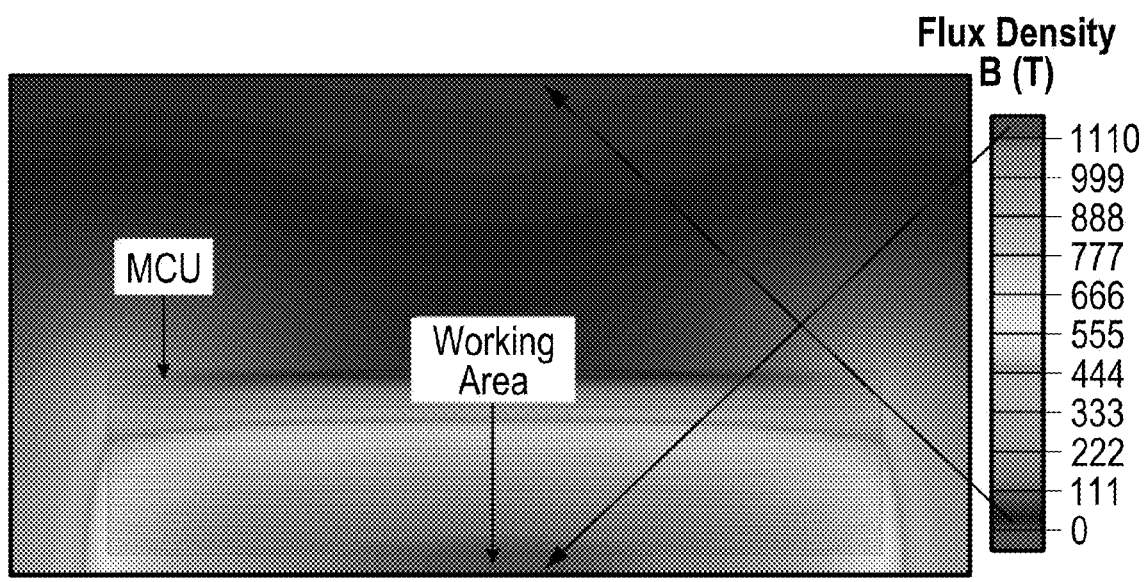
FIG. 23A illustrates the calculated flux density in an FEA model of an example MCU with 10 cm hollow center; Length=2 meters, Diameter=1 meter, SD thickness=5 microns, electrode spacings=1.0 cm, RPM=100,000, $k=1\times10^9$, Voltage=2 V; axisymmetric model with the horizontal axis being the axis of symmetry.
Figure 23B:
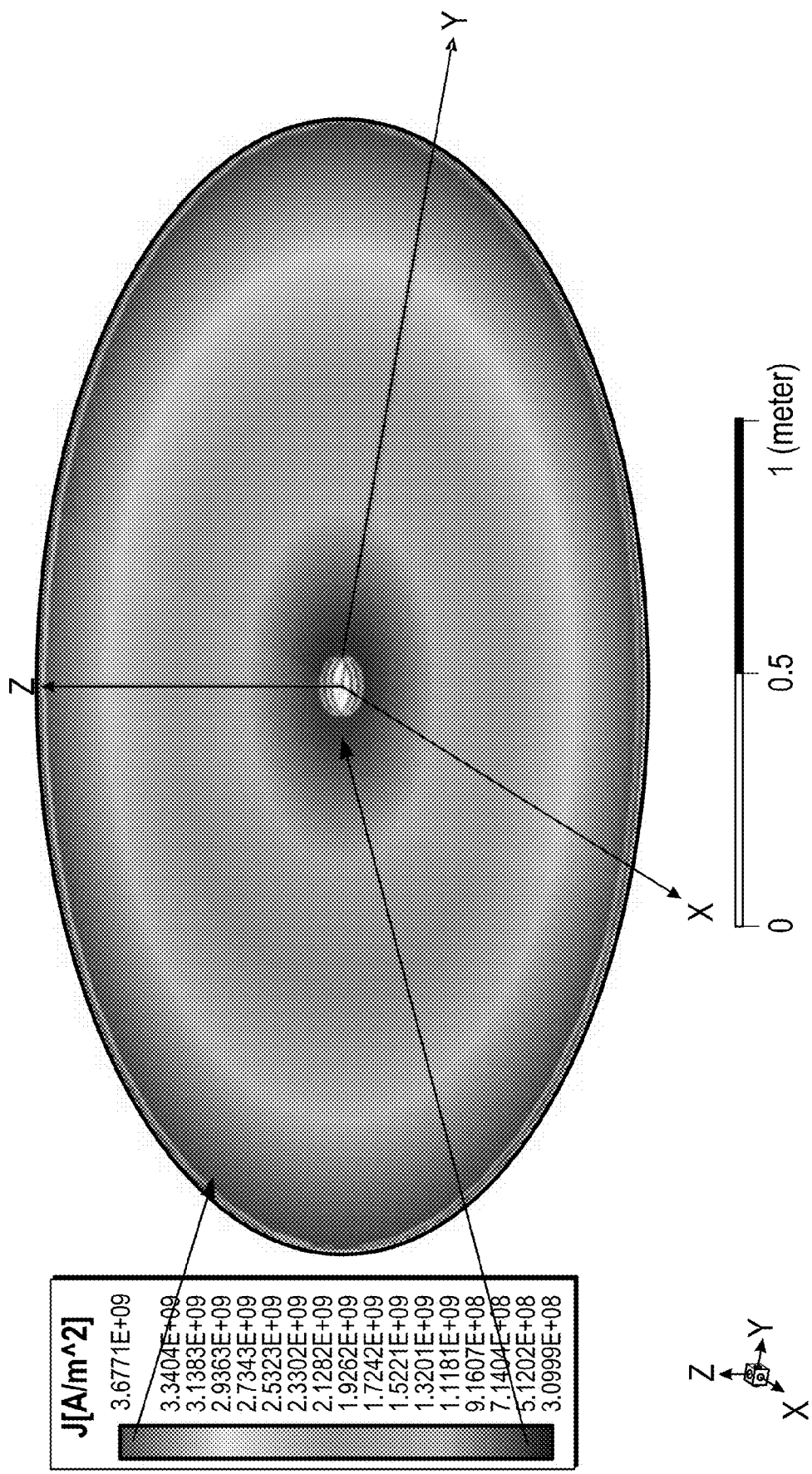
FIG. 23B illustrates the calculated effective current distribution in an FEA model of an example 2-meter diameter disc with counter-rotating electrodes; d=2 microns; $k=1\times10^9$; RPM=100,000; V=2 volts; thickness=2 cm.

FIG. 23A shows a 2 meter×1 meter MCU with the center 10 cm being hollow. The hollow area can be an area for acting on any desired materials by the magnetic field where the field is at maximum strength. Table 5 lists the corresponding values for reference (2 meter×1 meter hollow MCU magnetic field strength at center in Tesla (QuickField™ simulation results)). From FIG. 23A, it may be understood that the field strength at the center of the magnetic hollow remains in excess of 1100 Tesla. As can be seen in Table 5, the field strength is only slightly diminished from the non-hollow MCU performances. The MDU produces nearly identical results where the inner shaft now has a hollow area at its center as the working area. This result follows from the fact that the charges on the plates have their highest velocity on the outer edges resulting in the highest effective current as one goes out in radius. For example, FIG. 23B illustrates the calculated effective current distribution in an FEA model of an example 2-meter diameter disc with counter-rotating electrodes; d=2 microns; k=1×10$^9$; RPM=100,000; V=2 volts; thickness=2 cm. From FIG. 23B, it may be understood that the inner parts of the disc do not contribute strongly to the production of the magnetic field and can be excluded without much penalty.

TABLE 5

| Electrode Spacing (cm) | SDt (1 micron) | SDt (2 microns) | SDt (5 microns) | SDt (10 microns) |
|---|---|---|---|---|
| 2 | 2724 | 1362 | 545 | 272 |
| 1.8 | 3131 | 1565 | 626 | 313 |
| 1.6 | 3482 | 1741 | 696 | 348 |
| 1.4 | 3965 | 1982 | 793 | 396 |
| 1.2 | 4538 | 2269 | 908 | 454 |
| 1 | 5550 | 2775 | 1110 | 555 |
| 0.8 | 6858 | 3429 | 1372 | 686 |
| 0.6 | 9178 | 4589 | 1836 | 918 |
| 0.4 | 13609 | 6805 | 2722 | 1361 |
| 0.3 | 18249 | 9124 | 3650 | 1825 |
| 0.2 | 25933 | 13608 | 5445 | 2720 |
| 0.1 | 50515 | 27065 | 10825 | 5410 |

Additionally, ultra-magnets can be placed in close proximity with a gap between them; where the field will bridge the gap and create a working space outside the magnets. For example, FIG. 24 illustrates the calculated flux density in an FEA model of example side by side MDUs with 10 cm separation; Lengths=2 meters, Diameters=1 meter, SD thickness=5 microns, electrode spacings=1.0 cm, RPM=100,000, k=1×10$^9$, Voltage=2 V; axisymmetric model with the horizontal axis being the axis of symmetry. Shown in FIG. 24 are two MDUs side by side with a 10 cm gap between them. The resulting magnetic field strengths, at the origin between the two magnets, are shown in Table 6 (2 meter×1 meter side by side MDUs magnetic field strength at center between MDUs in Tesla (QuickField™ simulation results)).

TABLE 6

| Electrode Spacing (cm) | SDt (1 micron) | SDt (2 microns) | SDt (5 microns) | SDt (10 microns) |
| --- | --- | --- | --- | --- |
| 2 | 2014 | 1007 | 403 | 201 |
| 1.8 | 2237 | 1119 | 447 | 224 |
| 1.6 | 2517 | 1259 | 503 | 252 |
| 1.4 | 2877 | 1438 | 575 | 288 |
| 1.2 | 3356 | 1678 | 671 | 336 |
| 1 | 4027 | 2014 | 805 | 403 |
| 0.8 | 5034 | 2517 | 1007 | 503 |
| 0.6 | 6712 | 3356 | 1342 | 671 |
| 0.4 | 10068 | 5034 | 2014 | 1007 |
| 0.3 | 13425 | 6712 | 2685 | 1342 |
| 0.2 | 20137 | 10068 | 4027 | 2014 |
| 0.1 | 40274 | 20137 | 8055 | 4027 |

While only two geometries have been modeled here, it will be appreciated that any number of geometries and configurations can be used, as may be appropriate for the application and desired orientation of the magnetic field.

Micro Ultra-Magnet (MUM)

Strong magnetic field miniature ultra-magnets can be manufactured. The basic construction is similar to that of the MDUs, but on a much smaller, more compact scale. All of the design considerations aforementioned with MDUs should be included and referenced with the MUMs as well and vice versa. FIGS. 25A and 25B schematically illustrate perspective and cross-sectional views of a micro ultra-magnet (MUM) core.

Figure 26:
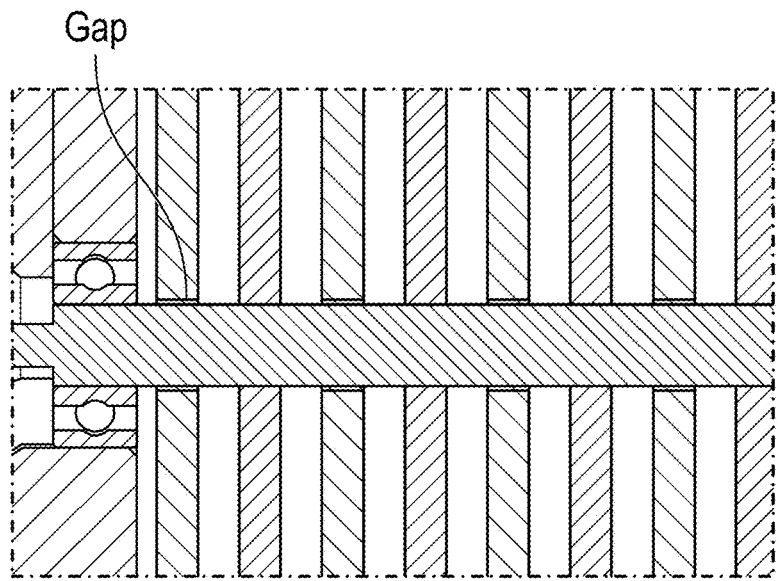
FIG. 26 schematically illustrates further details of a cross-sectional view of the MUM core of FIGS. 25A-25B, showing the radial gap between the outer discs and the central shaft.

The design includes a series of inner plates (inner discs) attached to a central shaft and a series of interspaced (between the inner plates) outer plates (inner discs) attached to the outer cylinder, also known as the outer casing. The central shaft is attached to the ID (inner race) of a rotary bearing and the outer cylinder is mated to the OD (outer race) of the same rotary bearing. Note the visible gap between the inner discs and the outer cylinder. FIG. 26 schematically illustrates further details of a cross-sectional view of the MUM core of FIGS. 25A-25B, showing the radial gap between the outer discs and the central shaft. In the zoomed in perspective in FIG. 26, it can be seen that there is a small gap between the outer plates and the inner shaft. The central shaft and inner plates are intended to rotate in one rotational direction, and the outer cylinder, endcaps, and outer plates are intended to rotate in the opposite rotational direction, thus the outer plates should not contact the central shaft. It should be understood that some configurations may have only one of the inner or outer sub-assemblies rotate and still produce large magnetic fields, however, as pointed out previously there are advantages to having both sub-assemblies counter-rotate.

FIGS. 25A and 25B show an example embodiment of a MUMs core, wherein the outer discs are 10 mm in diameter as is the inner diameter (ID) of the outer cylinder. The drawing is not to scale as, in reality, the inner discs would be only a hundred microns or less in diameter than the outer disc diameters, and the axial spacing between the inner and outer discs would be tens of microns or less to achieve maximum packing density of the charge carrying discs. The details would not otherwise be discernable in the drawing; therefore, those drawing dimensions are distorted here (and similarly in other drawings) for clarity.

The rotary bearing is somewhat notional, though a commercially available rotary ball bearing is used in the illustrated example. It should be understood that rotational bearing elements is an established field of engineering and any number of rotational bearing members can be used here. The small size of the MUM allows for very large rotational speeds, from a rotary bearing speed limitation perspective. Ceramic ultra-high-speed rotational rotary bearings with a dmn rating of 2.6 million are available at the time of this application from NTN Corporation, (Osaka, Japan). The commercially available bearing shown here has an ID of 1 mm and an OD of 2.5 mm, and this translates into a rotational speed limitation of approximately 150,000 rpm based on bearing limitations.

MUM Core Construction

The manufacturing techniques used to prepare the MUM core suitably may be selected based on the size of the components. For example, if larger thicker discs are to be used, the discs, central shaft, and endcaps can be conventionally machined from metal, ceramics, glass, or other materials. Alternatively, to achieve relatively high packing densities of the discs, and thus, higher charge densities, and correspondingly higher magnetic field strengths, special construction techniques of the MUM core may be used. For example, because of the centrifugal forces generated by the relatively high rotational speeds combined with the thinness of the discs needed to get high packing densities further combined with very strong electromagnetic stresses generated within the device itself, extremely strong materials should be used. Nonlimiting examples of such speeds, discs, packing densities, and materials are provided throughout the present disclosure, and it should be understood that the various embodiments described herein may include any of such features unless indicated otherwise.

In addition to their strength, the choice of materials is based upon their thermal expansion coefficients. Table 7 lists the CTE's of the materials listed above as well as a few other candidate materials. In general, it is preferable to have CTE differences of 4 ppm/deg K or more for construction of a MUMs device, though other CTE differences are possible.

TABLE 7

| Material: | Thermal Expansion (10e-6/deg K) |
| --- | --- |
| Diamond | 0.7 |
| Sapphire | 6.66 |
| Fused Silica | 0.55 |
| Silicon Carbide | 7.9 |

TABLE 7-continued

| Material: | Thermal Expansion (10e-6/deg K) |
|---|---|
| Silicon Nitride | 3.3 |
| Super Invar | 0.63 |
| Zerodur ™ | 0.0+/−0.007 |
| Graphene | −3.76 |

As one example embodiment, the outer cylinder includes or is constructed of sapphire, the outer discs include or are constructed of diamond, the inner discs include or are constructed of sapphire, and the central shaft includes or is constructed of diamond or fused silica or quartz. The endcaps can also include or be made of diamond. Silicon carbide (SiC) may be substituted for sapphire and fused silica may be substituted for diamond if structural stresses allow for a particular application. For example, these are strong materials with CTE values that are close to those of sapphire and diamond.

In some examples, the MUM core is assembled may be assembled at a temperature at which one or more components expand differentially relatively to one or more other components in a manner in which the components may be moved and slip-fit to one another; the temperature then is reduced to a temperature at which the slip-fit components contract differentially to one another in a manner in which the components are substantially immovable to one another. Illustratively, the outer diameter of the central shaft and the inner diameter of the inner discs may be relatively close to the same size at room temperature, the inner shaft being a few microns or more larger than inner diameter (hole) of the inner discs. When assembled at high temperature, the inner discs differentially expand relative to the central shaft, such that the inner shaft is able to fit through the inner radius of the inner discs; for example, see FIGS. 27B-27C described in greater detail below. Upon cooling, the inner discs differentially shrink more than the fused silica, and therefore the inner discs clamp down tightly on the central shaft. Optionally, the central shaft and inner discs can be coated with a thin layer of malleable metal such as gold or indium which will cold weld the parts together through the radial contact pressure generated by the CTE mismatch. Note that metals are sufficiently malleable that they either elastically or plastically deform to match the strain on the base part induced by the CTE mismatch. Soft metals like gold or indium do this easily. Oxides such as may be used in the super-dielectric matrix may be grown or deposited onto the disc electrodes at several hundred degrees C. prior to assembly of the MUM, and as such may have relatively low stress at temperatures such as may be used to assemble the MUM. The effect of any CTE mismatch between the super-dielectric matrix and the disc material may be reduced, for example, by adding one or more intermediate layers between the super-dielectric matrix and the electrode. For example, layer(s) closer to the super-dielectric matrix may have CTE(s) relatively close to that of the matrix, while layer(s) closer to the electrode may have CTE(s) relatively close to that of the electrode material, with monotonically changing intermediate values in between. This may reduce the CTE gradient and effectively smooth the stress out over many layers instead of a single CTE mismatched interface.

The outer discs may be similarly attached to the outer cylinder, e.g., heating causes differential expansion of the outer cylinder relative to the outer discs which are inserted into the outer cylinder. Cooling then causes the outer cylinder to shrink down onto the outer diameter of the outer discs. The joint optionally may be cold welded by providing a metal coated ID of the outer cylinder and/or metal coated OD of the outer discs. The endcaps may be attached to the outer cylinder in a similar fashion as the outer discs to the outer cylinder. Note that the endcaps are in many regards similar to the outer discs, but are located at the ends and may include features that lock them to the next MUM. The rotary bearings can be press fit into the endcaps after the fact or brazed into place. It should also be noted that this process can be reversed by inverting the materials' differential CTEs and assembling the assembly cold rather than hot. On returning to room temperature the parts would differentially grow and tightly fit together. In this way, if the assembly were to heat up during operation the components would become more tightly bound.

In one nonlimiting example, a fused silica central shaft is able to fit through the inner radius of sapphire inner discs; upon cooling, the sapphire will shrink much more than the fused silica, and therefore the inner discs clamp down tightly on the central shaft and optionally may be cold welded there using a metal. Diamond outer discs are similarly attached to a sapphire outer cylinder, e.g., the outer cylinder shrinks down onto the outer diameter of the outer discs and is optionally cold welded to the metal coated ID of the outer cylinder and/or the metal coated OD of the outer discs. The diamond endcaps are attached in a similar fashion as the outer discs to the outer cylinder. The rotary bearings can be press fit into the endcaps after the fact or brazed into place.

In some examples, sacrificial spacers can be placed between the discs to provide precise spacing between the discs during assembly. The discs and endcaps can be placed onto the central shaft using a flip-chip die bonder. Modern die bonders can allow for sub-micron placement as well as heating the element while they are placing the element. Once the discs and endcaps are on the central shaft, the outer cylinder (e.g., sapphire) can be heated and slid over the outside of the discs and endcap assembly and allowed to cool.

While graphene is not used in the current embodiment, graphene is a rapidly advancing material that has a great number of useful properties. While believed not to be at a stage to be useful as a base material at the time of this application due to size and thickness limitations, workable graphene is likely to become available in the future and is included here for completeness. The listed materials (see Table 7) are expected to be good choices for the present devices; however, this list is in no way comprehensive as a large number of high strength materials of suitable thermal expansion coefficients exists; these are examples of suitable materials to demonstrate the concept.

To recap a nonlimiting example of an assembly process in more detail:

1. The MUM is assembled vertically to allow gravity to stack the parts.

2. The bottom radial bearing is placed in the bottom endcap, and the central shaft is inserted into the ID of the bearing.

3. The endcap and central shaft are then brazed or laser welded to the bearing.

4. A sacrificial spacer is placed on top of the bottom endcap.

5. Inner and outer discs, with the super-dielectric matrix already applied to the discs, are alternately placed on the central shaft. The inner discs are heated to fit over the non-heated central shaft. The outer discs have a larger central hole and do not require heating. Sacrificial spacers are placed between each disc placement to precisely control the spacing between discs.

6. Step 4 is repeated until the MUM disc stack is of the desired height on the central shaft.

7. A sacrificial spacer is placed on the top disc.

8. The top endcap is then placed on the central shaft.

9. The outer cylinder is then heated and slid over the un-heated disc-endcap assembly. Upon cooling, the outer cylinder will clamp the outer discs and endcaps into their proper radial position as well as bond them into place on the outer cylinder. Care should be taken that the clocking features of the upper and bottom endcaps are placed so that they align correctly as they are keyed to one another (this can be accomplished with a jig or assembly fixture).

10. The sacrificial spacers are then selectively dissolved and removed with a chemical process—selective in that the spacers are dissolved and the other components are unaffected.

11. The inner cavity (the cavity containing the discs) is then cleaned with a solvent flush and vacuum dried to remove any liquid remnants from the spacer removal and solvent flush.

12 The inner cavity is then filled with an ionic fluid while under agitation, e.g., ultrasonic agitation. This causes the ionic fluid to enter the super-dielectric matrix and create the super-dielectric material (including the super-dielectric matrix and ionic fluid combined). This process may be enhanced if the inner cavity is under vacuum at the time of the ionic fluid introduction, which may enhance pulling of the ionic fluid into the super-dielectric matrix and to reduce or minimize the potential for trapped air pockets. In some examples, the ionic fluid may be introduced as a vapor. In some examples, the ionic fluid is introduced as a liquid, and low frequency agitation (e.g., 1-20 Hz) may be used to distribute the liquid substantially evenly throughout the device's volume. Additionally, or alternatively, the ohmic resistance between electrodes may be monitored to determine when sufficient ionic fluid has been applied; for example, the resistance will start to drop as a conduction path is created through the ionic fluid.

13. Excess ionic fluid is then drained from the inner cavity. Due to the capillary effect, the ionic fluid will strongly remain in the pores or apertures of the super-dielectric matrix while the bulk fluid will drain away.

14. Mercury is injected into the empty space in the inner cavity, filling the cavity.

15. The top radial bearing is inserted into the top endcap and brazed or laser welded into place.

The mercury can be under pressure to reduce or minimize any air pockets that may be left behind, though this is not necessary if care is taken to remove air pockets and empty spaces during the mercury filling process, as described. The mercury holds the super-dielectric fluid in place in the super-dielectric matrix and inhibits or prevents it from escaping or drying out, effectively providing a seal. As noted herein, the ionic fluid may include an acid, a base, an aqueous salt, or other suitable electrolyte. Mercury substantially does not react with most acids, does not react with alkali bases, and is immiscible with aqueous solutions; thus, mercury can be in contact with the ionic fluid without detrimental effects, and thus, provides a good choice for the conductive slip joint fluid in nonlimiting example.

Note that a wide variety of materials may be used in the sacrificial spacers and may be removed using a wide variety of methods. As one nonlimiting example, the sacrificial spacer may include a polymer, such as PMMA, which may be dissolved using a solvent such as acetone which would not be expected to have any effect on any of the materials described in the assembly of the MUMs device. As another nonlimiting example, the sacrificial material may include aluminum which may be dissolved using hydrochloric acid which would not be expected to have any effect on any gold, diamond, sapphire, or alumina in the MUMs device. Other suitable materials and solvents may include those used in 'lift-off' operations such as used in semi-conductor manufacturing.

MUM Component Construction

In order to achieve the dimensions and tolerances needed for the high-density electrode MUM devices with the high strength materials described, special considerations may be taken in the construction of the components.

Diamond and Sapphire are common chemical vapor deposition (CVD) and wafer growth materials. Single crystalline diamond can be obtained in large diameters, i.e. >5 cm, with thicknesses in excess of 2 mm, e.g., as commercially available from II-VI Incorporated (Saxonburg, PA) as well as from Applied Diamond, Inc (Wilmington, DE). Sapphire can be obtained in much larger dimensions, indeed sapphire optics over 50 centimeters in diameter of more than 10 cm thick are available commercially, for example HEM™ sapphire from GT Advanced Technologies (Salem, Massachusetts). Likewise, these materials can be deposited in very thin layers as low as tens of nanometers. Fused silica is a very common material used in fiber optics and optical components in general and can be made in nearly any desired shape and size.

In nonlimiting embodiments such as described further above, the central shaft may be made of fused silica having any suitable diameter, e.g., about 50 microns to about 2000 microns in diameter, illustratively about 1.0 mm in diameter which is a common core size for fused silica fiber optics and can be readily obtained commercially. To note, if additional strength is needed of the central shaft, diamond can be used, though fused silica will suffice in most cases. In some examples, the outer cylinder has an inner diameter (ID) of about 1.0 mm to about 100 mm with a wall thickness from about 0.5 mm to about 10 mm. In one nonlimiting example, the outer cylinder is simply a tube of sapphire with an ID of 10.0 mm and a wall thickness of 2.0 mm. The outer cylinder can be obtained, with very exact tolerances, by any number of optical component vendors who specialize in sapphire optical components.

The discs and endcap present more of a challenge as they possess some features that must be produced during the manufacturing process, e.g., center holes on the discs and endcap and the raised rotational interlocking castellation features of the endcap, as discussed herein. Also, the discs preferably are sufficiently flat and of a sufficiently exact thickness and diameter (inner diameter for the inner discs and outer diameter for the outer discs). For example, the discs may be flat to about 50 nm or better, although other degrees of flatness suitably may be used. In some examples, thickness may be controlled to about 1 micron or better, although other thickness tolerances suitably may be used. The diameters preferably are sufficiently accurate as to allow assembly through the CTE process described, which is temperature specific, though as a rule of thumb diameters that are accurate to within 1-3 microns are preferable.

Figure 27A:
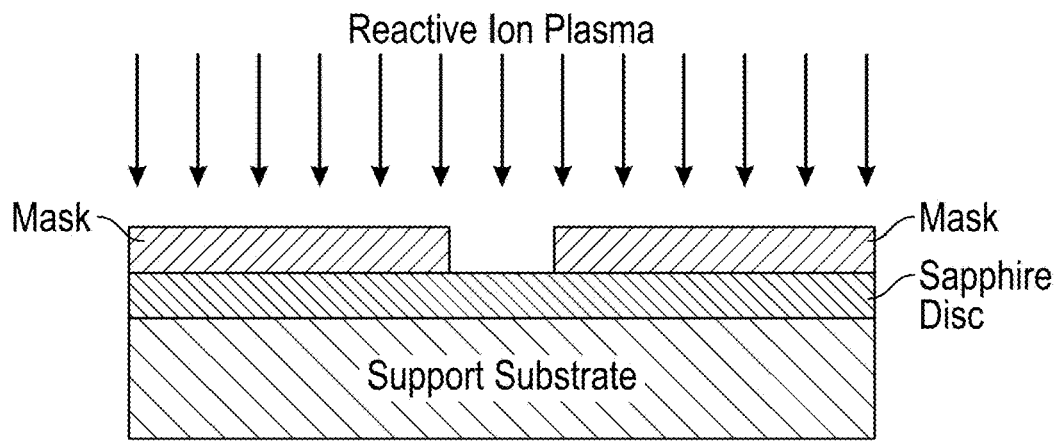
FIG. 27A schematically illustrates an example operation for reactive ion etch (RIE) of a center hole for a sapphire inner disc.

The inner discs of sapphire are not difficult to realize as appropriate sized sapphire substrates can be commercially purchased. With the appropriate substrate, the center hole can either be machined, ground, and polished to exact tolerances or if the disc is thin enough, reactive ion etching (RIE) or similar anisotropic plasma etching process can be employed with the remainder of the disc masked off to produce the center hole. For example, FIG. 27A schematically illustrates an example operation for reactive ion etch (RIE) of a center hole for a sapphire inner disc. As may be seen in FIG. 27A, the sapphire disc optionally may be disposed upon a support substrate. A suitable mask is disposed on the sapphire disc and patterned to define a central aperture corresponding to the center hole. The sapphire then is exposed to a reactive ion plasma, or other suitable reactants(s), which remove sapphire exposed by the central aperture. Since the mask is typically patterned with photolithography, the hole diameter can be controlled much better than sub-micron tolerances. A variety of etch processes may be used to generate a hole for a sapphire disc, such as using an inductively coupled plasma (ICP) etch system which is commercially available from SAMCO Inc. (Santa Clara, CA).

Figure 27B:
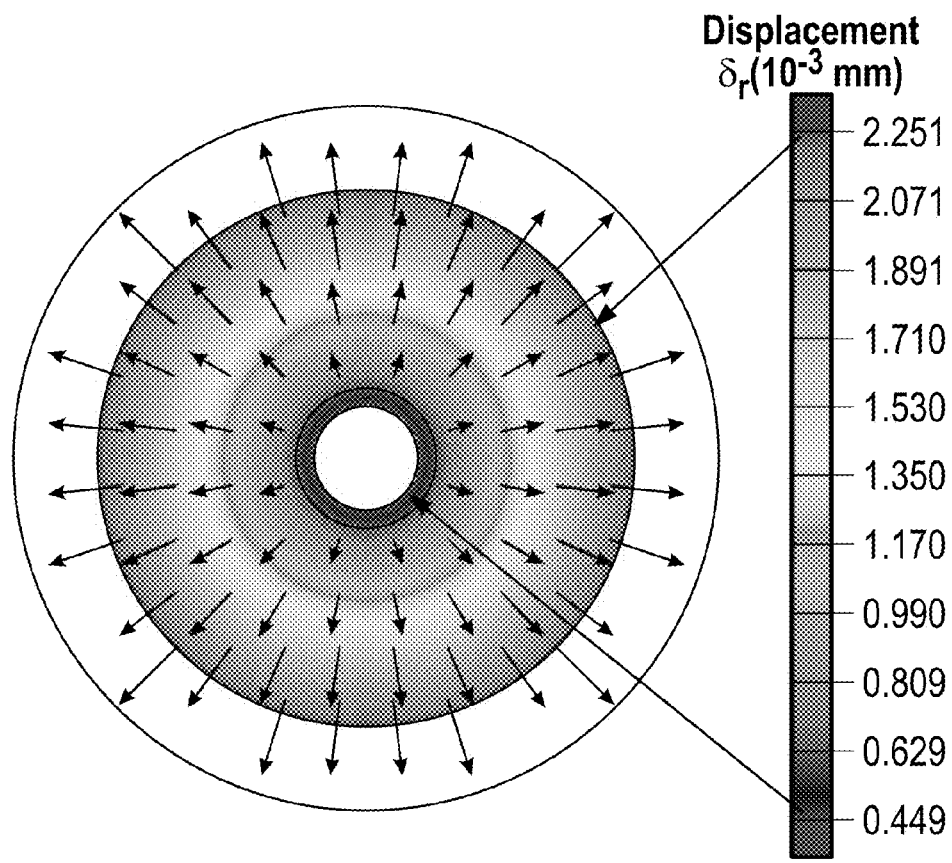
FIG. 27B illustrates simulated expansion of a sapphire disc of a MUM responsive to heating by 100K.
Figure 27C:
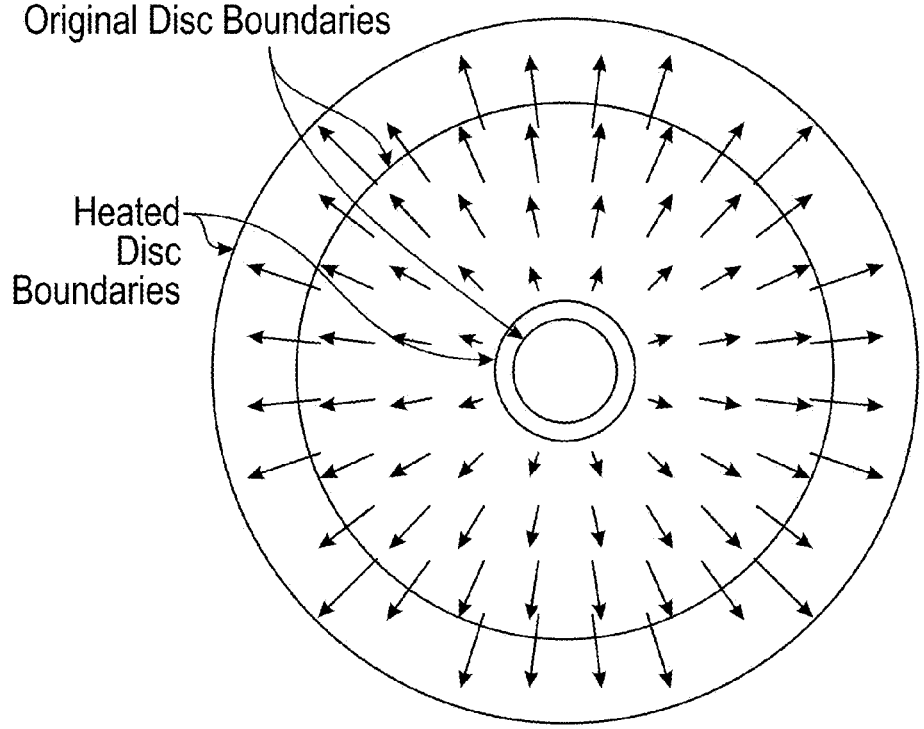
FIG. 27C illustrates the change in disc boundaries responsive to the expansion simulated in FIG. 27B.

FIG. 27B illustrates simulated expansion of a sapphire disc of a MUM responsive to heating by 100K. FIG. 27C illustrates the change in disc boundaries responsive to the expansion simulated in FIG. 27B. It may be understood from FIGS. 27B and 27C that the center hole gets larger with temperature, although not as much as the outer disc boundary. Accordingly, it is expected that the sapphire disc may be used in a CTE mismatch based assembly process such as described further above.

Figure 28A:
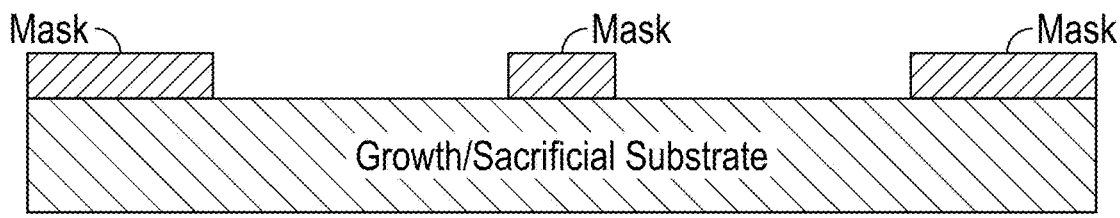
FIGS. 28A and 28B schematically illustrate example operations for making an outer diamond disc.
Figure 28B:
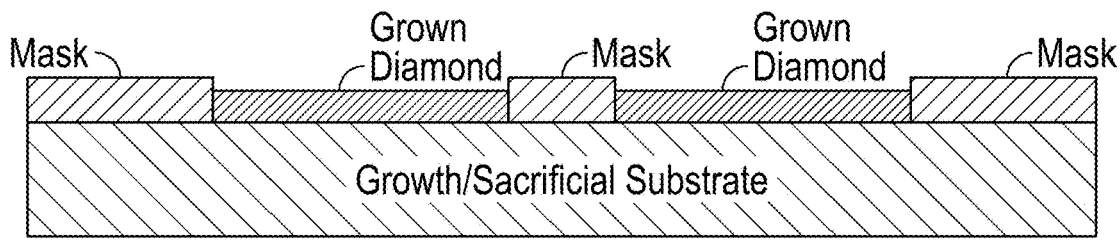

In the case of the diamond outer discs, a substrate used for CVD diamond growth can be patterned beforehand using very typical integrated circuit patterning technology, e.g., photolithography patterning with metal vapor deposition to mask the areas where growth is not required or desired. For example, FIGS. 28A and 28B schematically illustrate example operations for making an outer diamond disc. FIG. 28A illustrates patterning/masking of the growth substrate. For example, a patterned mask is formed on a growth/sacrificial substrate to define areas at which diamond is to be grown using CVD. Again, since the patterns can be made to much better than sub-micron tolerances due to the nature of the micro-chip fabrication technology used. If even better precision were to be required, e-beam or imprint lithography can likewise be used. The diamond is then grown on the exposed substrate. FIG. 28B illustrates CVD grown diamond in the exposed areas. The thickness of the diamond can also be precisely controlled to much better than sub-micron tolerances during the CVD process. The mask material and sacrificial substrate can then be etched away leaving only a diamond disc of exact dimensions behind. If the diamond disc is thin enough, a monolithic disc of exact thickness can be grown and the hole and diameter can be produced to exact dimensions using masking and plasma etching as was discussed with the sapphire discs. As noted above, single crystalline diamond can be obtained in large diameters, i.e. >5 cm, with thicknesses in excess of 2 mm, e.g., as commercially available from II-VI Incorporated (Saxonburg, PA) as well as from Applied Diamond, Inc (Wilmington, DE). Patterning, masking, etching, and material deposition on wafers and substrates is well known to anyone in the art of micro-chip fabrication and nanotechnology.

The inner and outer discs can then be coated with metal through vapor deposition, such as sputtering, to make them conductive. Electroplating optionally can then be used to make the metal thicker if desired, such as in the cold weld joint assembly areas for example (i.e., where the inner discs come into contact with the central shaft and the outer discs come into contact with the outer cylinder). A metal oxide, or one of the other super-dielectric matric materials discussed herein, can then be grown and patterned to produce the super-dielectric nano-structures needed for the super-dielectric layer. In one example, the thickness of the super-dielectric matrix pattern would be 1-2 microns in thickness, though other thicknesses are certainly possible. For example, elsewhere herein it is shown that the thinner the dielectric layer, the more charge the discs can hold. It is desirable for this number to be as small as practicable, however, below 1 um it may become more difficult to produce. For example, dielectrics in currently available commercial capacitors have a thickness of about 1 um.

In this way, the thickness of the discs can be made very thin allowing for high packing densities in the MUM. In an example embodiment, the thickness of the discs would be tens of microns up to a hundred microns, though other thicknesses being possible from sub-micron to millimeters or more.

Figure 29:
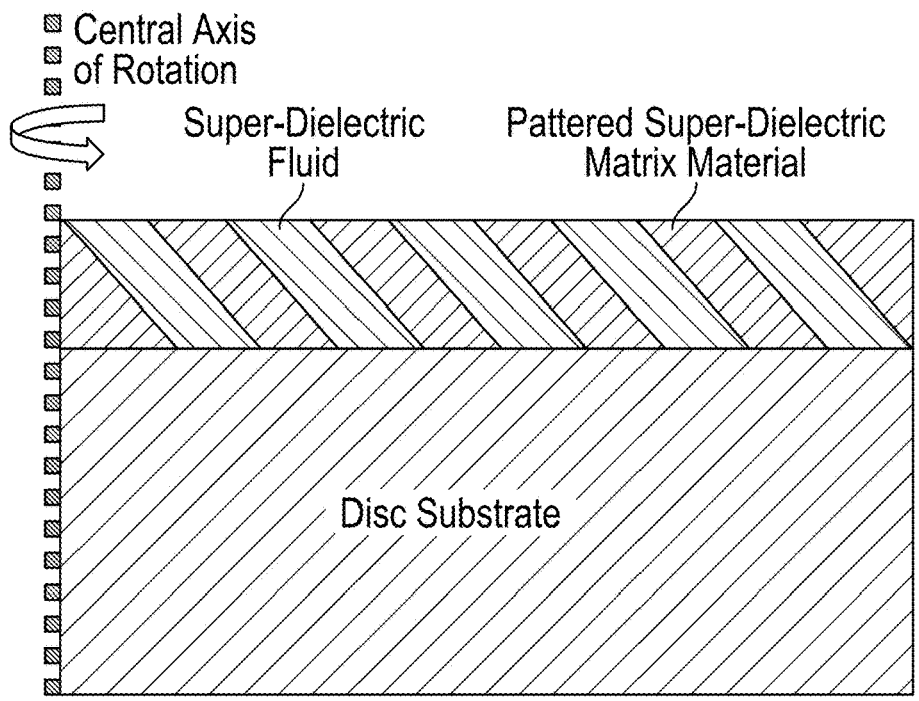
FIG. 29 schematically illustrates an example super-dielectric matrix material patterned and then etched at an angle such that a super-dielectric fluid is held in place during high-speed rotations.

As an additional note, in examples where the super-dielectric matrix material is patterned and etched to make the nano-structures, the etching can be done such that the nano-structure 'pockets' are at an angle with their tops leaning in towards the central axis and their bottoms away from the central axis. This will help insure the super-dielectric fluid stays in place under the centrifugal forces the fluid may experience under high rotation velocities. FIG. 29 schematically illustrates an example super-dielectric matrix material patterned and then etched at an angle such that a super-dielectric fluid is held in place during high-speed rotations. This can be done by simply tilting the substrate relative to the anisotropic ion etching stream. A nonlimiting example of the super-dielectric matrix material is alumina, which is expected to be etchable at different angles in a manner such as illustrated in FIG. 29.

These concepts can also apply to the construction of the MDU components as well.

Figure 30A:
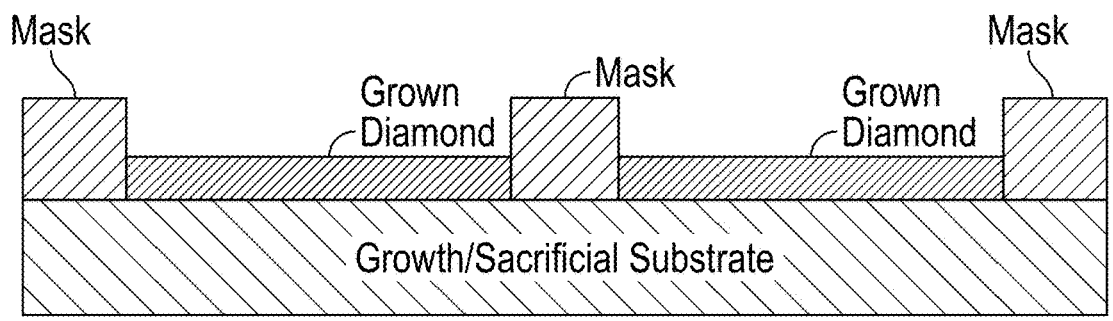
FIGS. 30A-30C schematically illustrate example operations for manufacturing diamond endcaps.
Figure 30B:
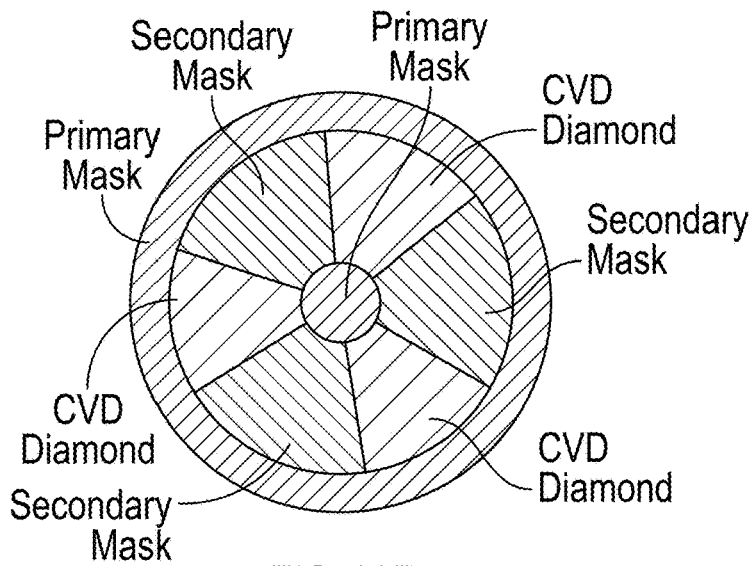
Figure 30C:
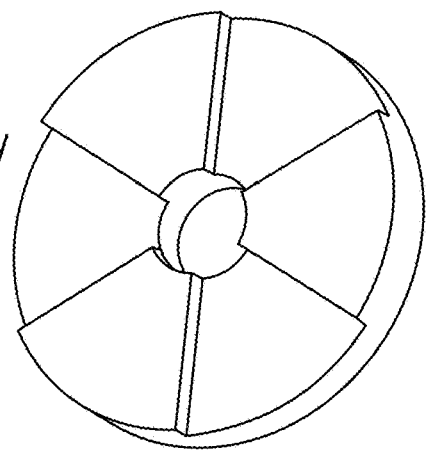

If the endcaps are made of fused silica, they can simply be machined using freeform optics machining capabilities, by companies such as Optimax Systems, Inc. (Ontario, New York). If the endcaps are made of diamond, they may be made using a process similar to that of the discs, but with more process steps. For example, FIGS. 30A-30C schematically illustrate example operations for manufacturing diamond endcaps. FIG. 30A: setting the diameter and inner radius of the endcap (cross-sectional view); the substrate is first masked to provide the appropriate outer diameter and center hole diameter. FIG. 30B: use of secondary mask to grow clocking features (plan view); The diamond is then grown to the desired thickness on the exposed substrate, in the embodiment shown in FIGS. 25A and 25B, this is 1.0 mm. The growth is halted and a secondary mask is added to pattern the clocking/gear features. The diamond growth is continued, thus raising the clocking features on the endcap, in the current embodiment an additional 1.0 mm. The masks and substrate are removed, leaving only the finished diamond endcap. FIG. 30C: finished endcap (perspective view).

MUM Performance

Figure 31:
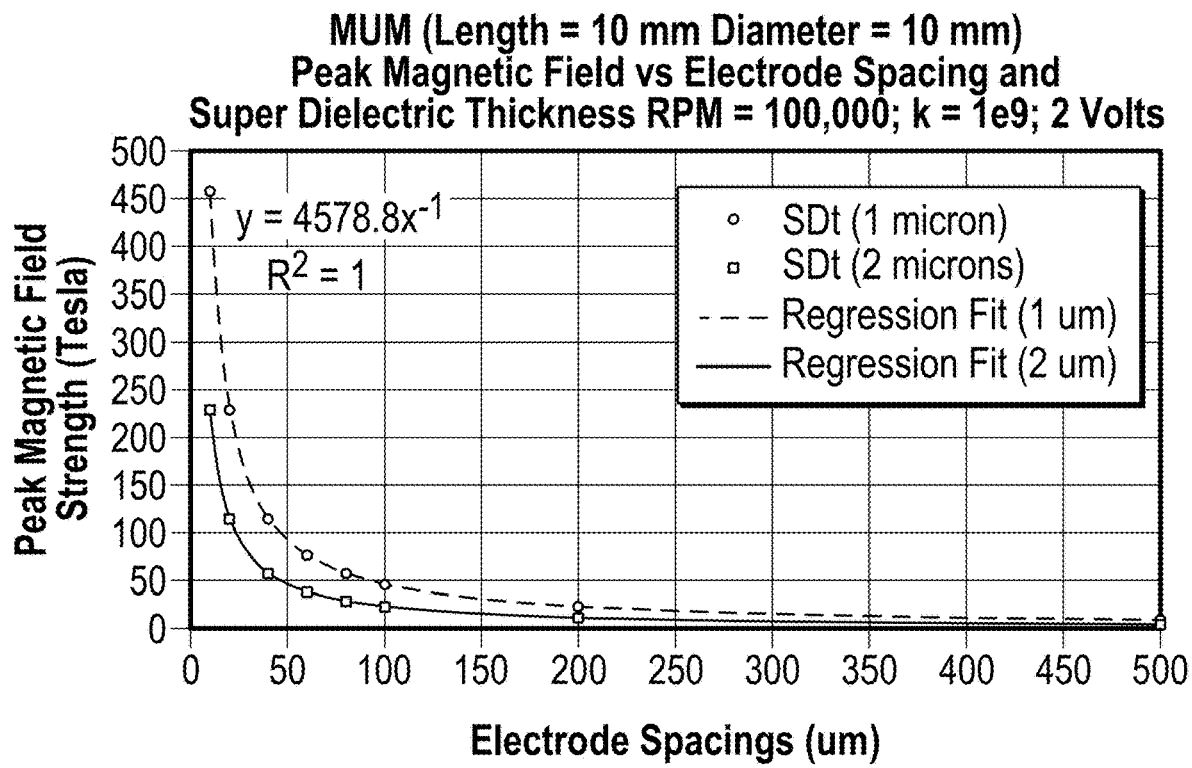
FIG. 31 is a plot of the calculated peak magnetic field strength as a function of electrode spacing in an FEA model of an example 12 mm×12 mm MUM.

FIG. 31 is a plot of the calculated peak magnetic field strength as a function of electrode spacing in an FEA model of an example 12 mm×12 mm MUM. More specifically, FIG. 31 and Table 8 show the simulated performance of a 10 mm long×10 mm diameter MUM core unit. The total size including outer cylinder and endcaps is 12 mm long×12 mm diameter, not including the clocking teeth on the endcaps since they are buried when the MUMs are interconnected, see further discussion presented herein. Including the clocking teeth increases the length to 14 mm. Table 8 shows 12 mm×12 mm MUM peak magnetic fields in Tesla (Quick-Field™ simulation results; SDt=super-dielectric layer thickness).

TABLE 8

| Electrode Spacing (um) | SDt (1 micron) | SDt (2 microns) |
|---|---|---|
| 500 | 9.2 | 4.6 |
| 200 | 22.9 | 11.4 |
| 100 | 45.8 | 22.9 |
| 80 | 57.2 | 28.6 |
| 60 | 76.3 | 38.2 |
| 40 | 114.5 | 57.2 |
| 20 | 228.9 | 114.5 |
| 10 | 457.9 | 228.9 |

Figure 32:
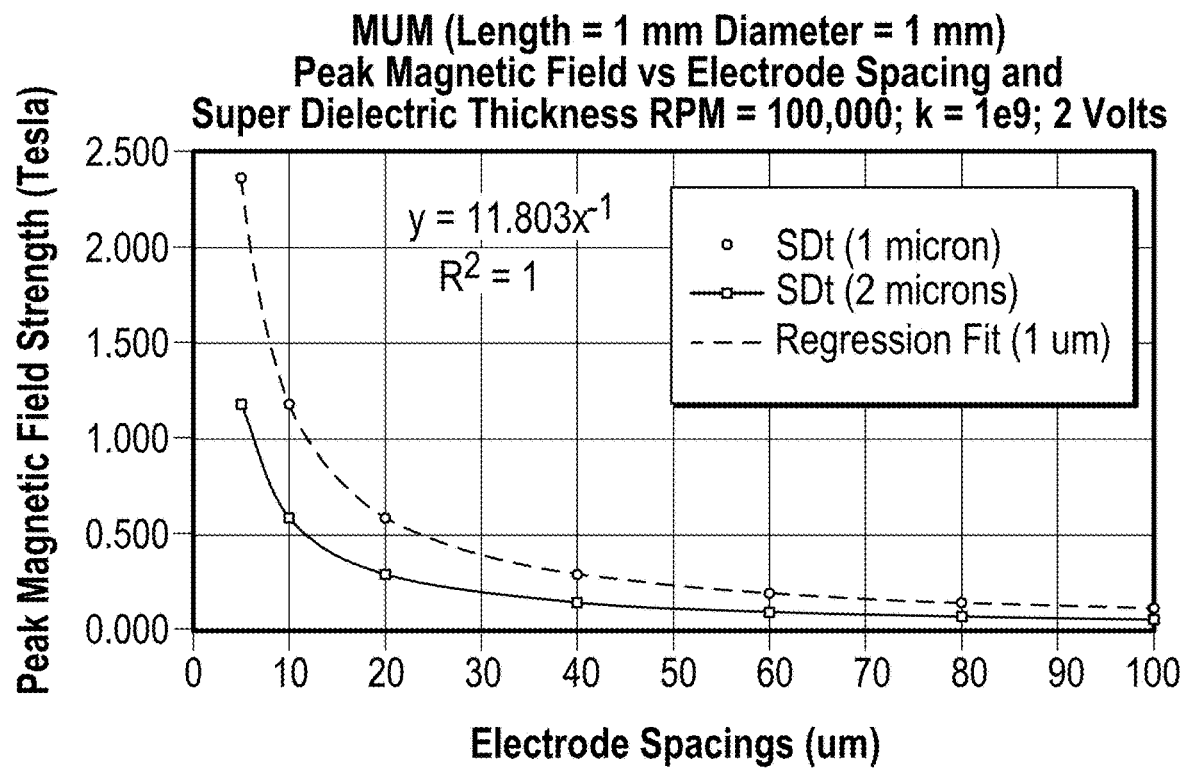
FIG. 32 is a plot of the calculated peak magnetic field strength as a function of electrode spacing in an FEA model of an example 1 mm×1 mm MUM.

Other sized MUMs can be produced as well. FIG. 32 is a plot of the calculated peak magnetic field strength as a function of electrode spacing in an FEA model of an example 1 mm×1 mm MUM. More specifically, FIG. 32 and Table 9 show the simulated performance of a 1.0 mm×1.0 mm core unit constructed in the same fashion as the 10 mm×10 mm unit.

TABLE 9

| Electrode Spacing (um) | SDt (1 micron) | SDt (2 microns) |
|---|---|---|
| 100 | 0.118 | 0.059 |
| 80 | 0.148 | 0.074 |
| 60 | 0.197 | 0.098 |
| 40 | 0.295 | 0.148 |
| 20 | 0.590 | 0.295 |
| 10 | 1.180 | 0.590 |
| 5 | 2.361 | 1.180 |

MUM Assemblies

Figure 33A:
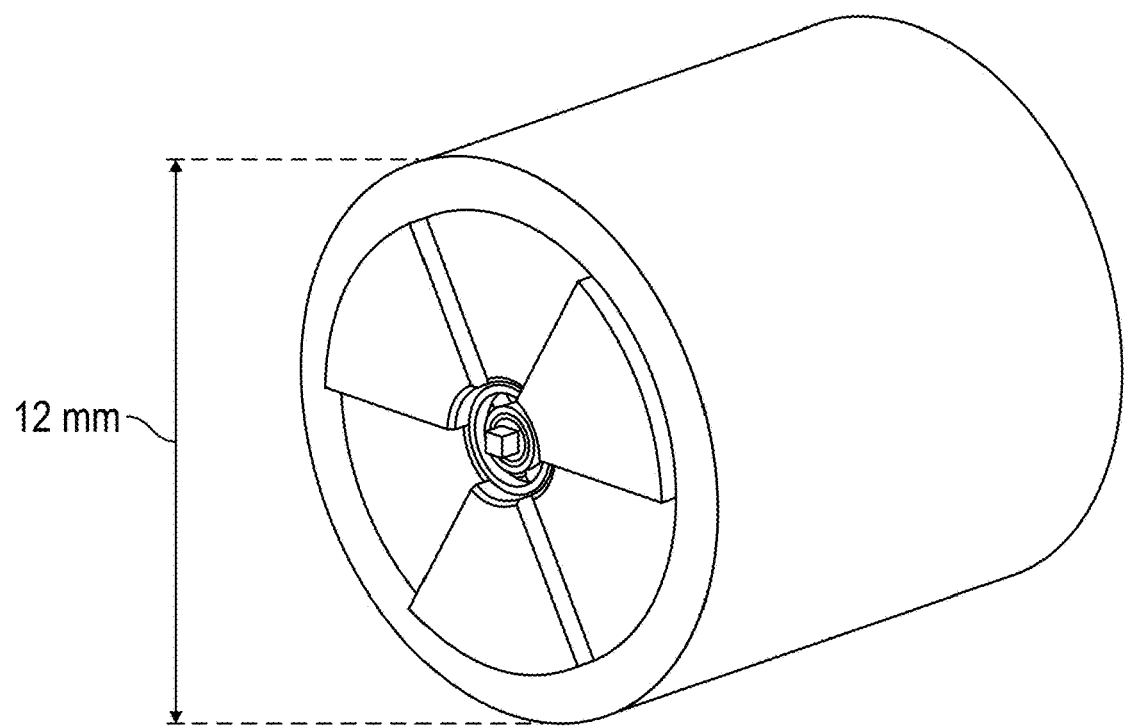
FIGS. 33A and 33B schematically illustrate an example MUM core.
Figure 33B:
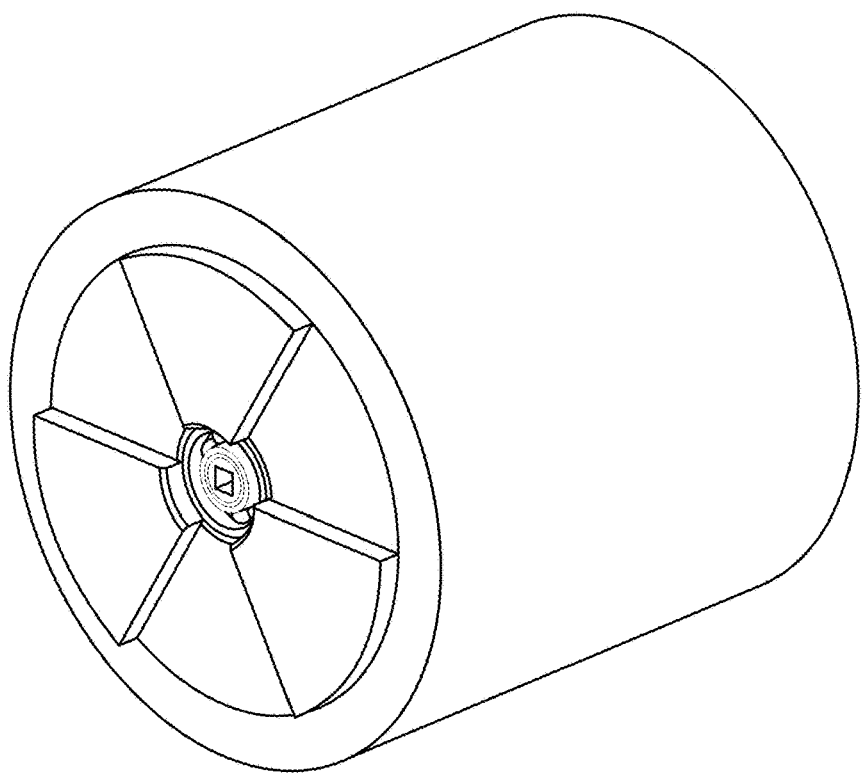

FIGS. 33A and 33B schematically illustrate an example MUM core; FIG. 33A: front perspective view of the MUM core; FIG. 33B: rear (180 deg rotated) perspective view of the MUM core; as can be seen, the front and rear central shaft and endcaps have complementary interlocking features allowing for the multiple MUMs to be axially linked. As can be seen in FIGS. 33A and 33B, the central shaft and endcaps have complimentary interlocking features at each axial end such that the MUMs may be interlocked along the lengthwise (axial) axis. This allows for multiple MUMs to be linked together and rotated by a single source, or two sources as the case may be since the central shaft and outer cylinder counter-rotate in one example. Optionally, if desired, the central shafts can be permanently attached using a sodium silicate solution, for fused silica, or 'spliced' together using a carbon dioxide laser.

Figure 34B:
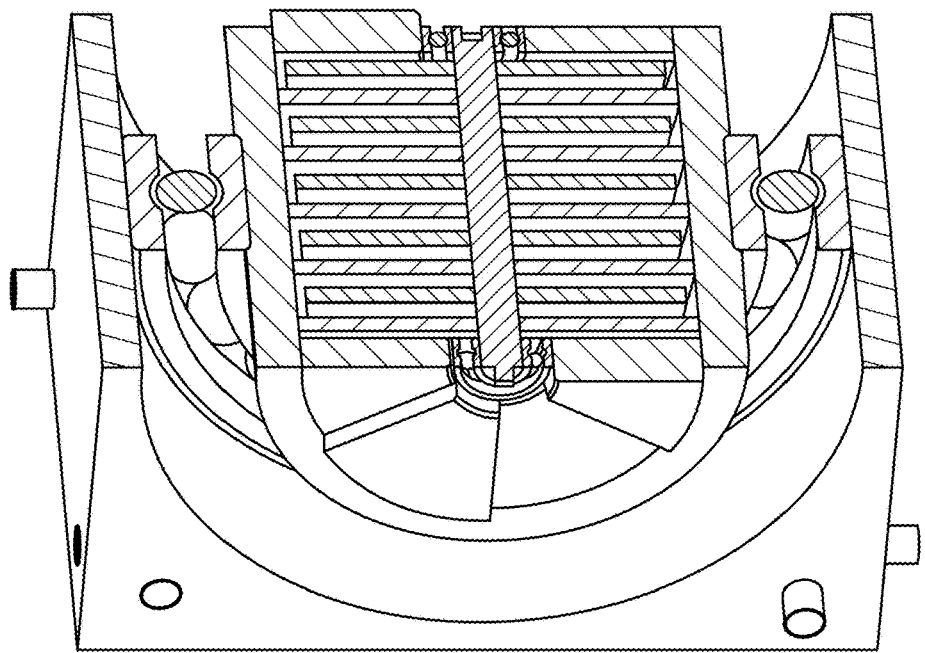
FIGS. 34A and 34B schematically illustrate a full example MUM including core and exostructure, which allows for large three-dimensional stacking of MUMs to create large three-dimensional magnetic structures.
Figure 34A:
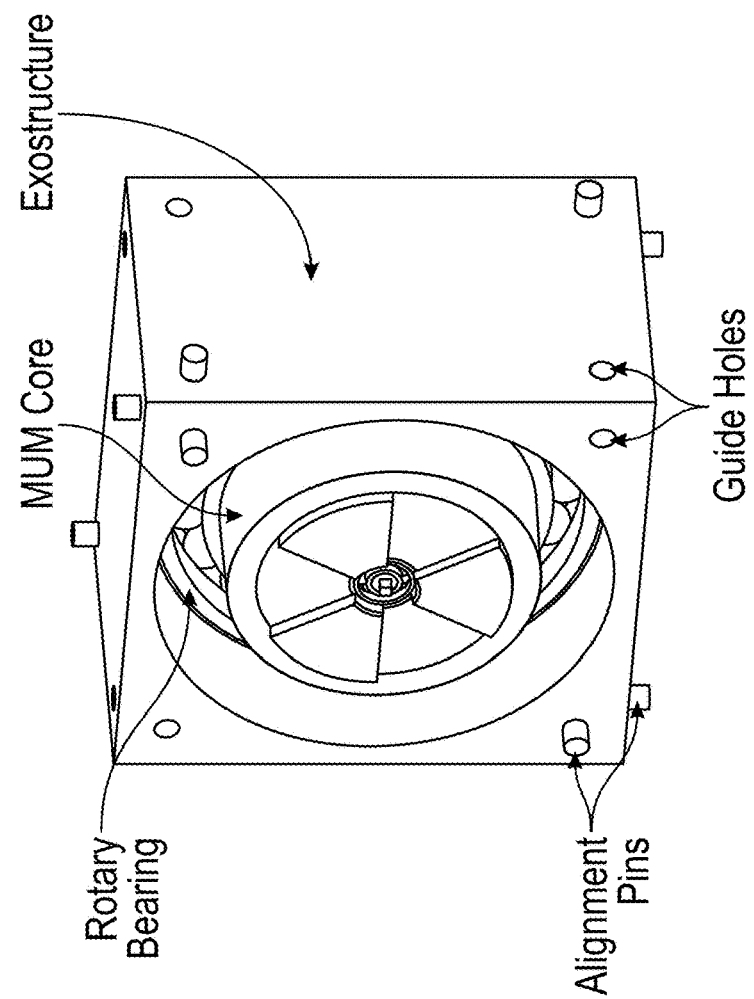

The MUMs can be put into axial compression, for stiffness, and lines of MUMs can be placed side by side in close proximity to produce three dimensional magnetic structures. If large structures are needed or more structural support is beneficial, a linkable exostructure can be placed around the MUM core. For example, FIGS. 34A and 34B schematically illustrate a full example MUM including core and exostructure, which allows for large three-dimensional stacking of MUMs to create large three-dimensional magnetic structures; FIG. 34A: perspective view; FIG. 34B: cross sectional view. As shown in FIGS. 34A and 34B, alignment pins and guide holes may be used to link and stack MUMs into three dimensional structures. The body can be made of nearly any desired material, though for avoidance of magnetic stresses and stray eddy currents, ferromagnetic and conductive materials should be avoided in some examples. A rotary bearing provides support between the exostructure and the rotating outer cylinder of the MUM core. If only the central shaft is rotated, the exostructure rotary bearing is not required as the outer cylinder does not rotate. In this case, only a clamp would suffice.

Figure 35A:
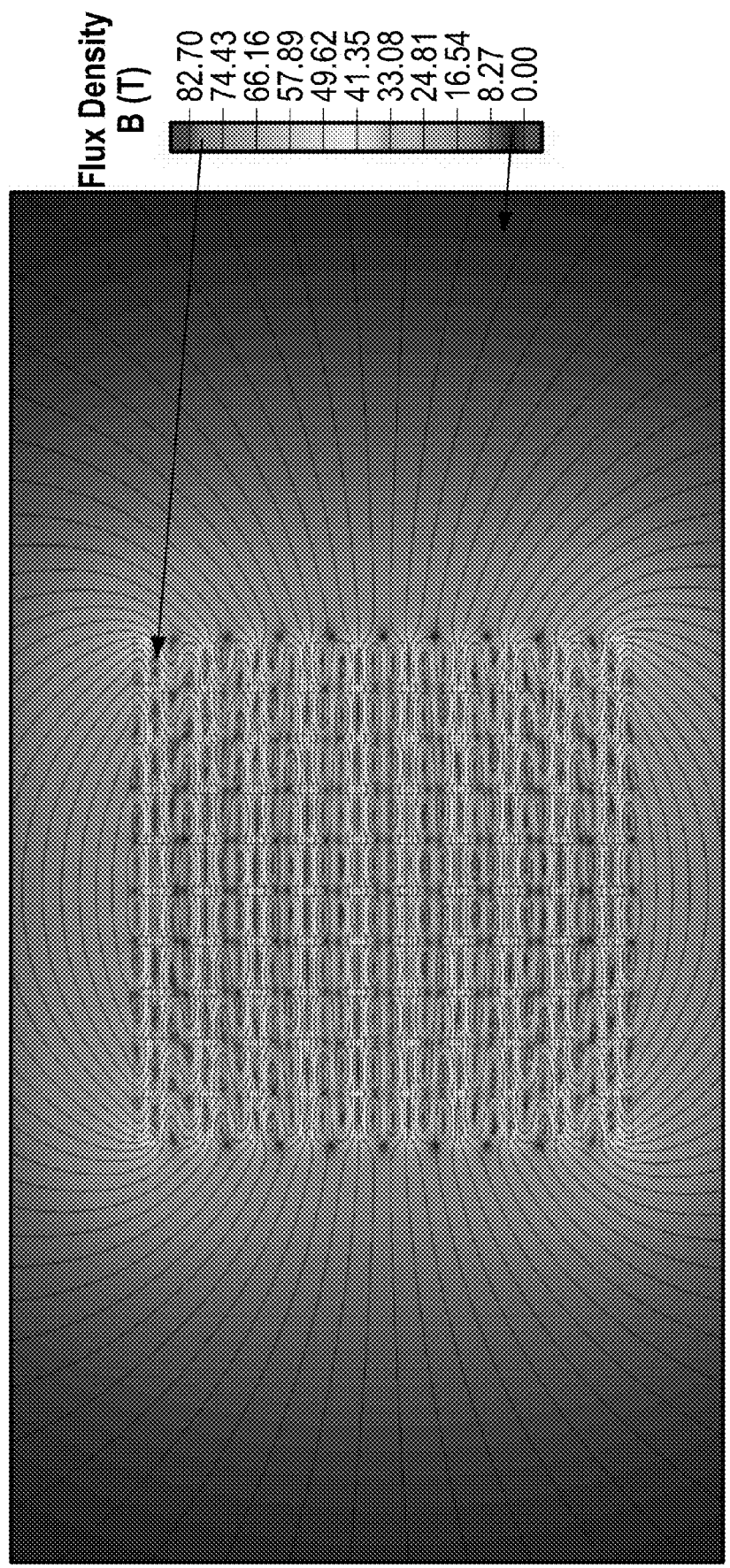
FIG. 35A illustrates the calculated flux density in an FEA model of example MUM stack including a 10×10×10 stack of MUMs; individual MUM units include 10 mm×10 mm core with 50-micron disc spacing, 1-micron super-dielectric layer thickness (SDt), k=1×10$^9$, RPM=100,000.
Figure 35B:
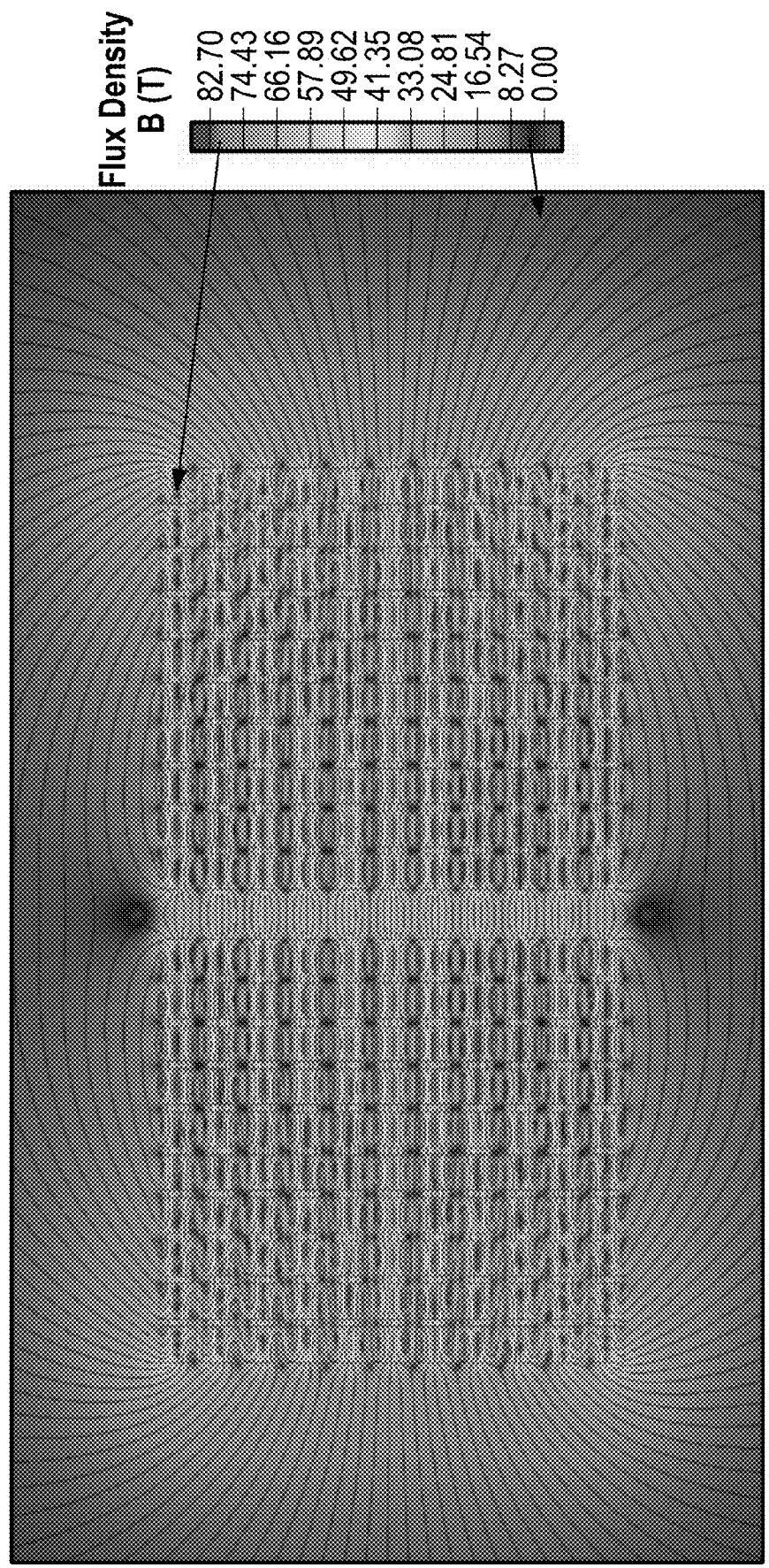
FIG. 35B illustrates the calculated flux density in an FEA model of an example MUM stack including two side by side 10×10×10 MUM cubes with a 12 mm spacing between them; individual MUM units are same as in FIG. 35A.

FIG. 35A illustrates the calculated flux density in an FEA model of example MUM stack including a 10×10×10 stack of MUMs; individual MUM units include 10 mm×10 mm core with 50-micron disc spacing, 1-micron super-dielectric layer thickness (SDt), k=1×10$^9$, RPM=100,000. More specifically, FIG. 35A shows the results for a 10×10×10 MUM array stack without the exostructure. This results in an approximately 12 cm×12 cm×12 cm magnetic cube. The maximum magnetic field strength is not increased, being similar to that of an individual MUM; however, the stackable MUMs do allow for increased flexibility of the field shape and increased energy storage as discussed herein. FIG. 35B illustrates the calculated flux density in an FEA model of an example MUM stack including two side by side 10×10×10 MUM cubes with a 12 mm spacing between them; individual MUM units are same as in FIG. 35A.

Mercury as the Slip Joint Fluid

It is a central tenet of fluid mechanics that the fluid in contact with the wall is at the same velocity as the wall, known as the no-slip condition. In examples including a conductive fluid, the charge in the conductive fluid may have a similar velocity vector as the opposite charge on the electrodes which may result in a reduced net current and consequently a greatly reduced magnetic field.

As the field of micro-fluidics has grown, deeper research into the no-slip boundary condition has been undertaken. Research has shown that under certain conditions, the no-slip assumption is invalid. In fact, the drag from the fluid has been shown to be two to four orders of magnitude less than predicted by the Navier Stokes Dirichlet Boundary Condition (the no-slip boundary condition). The conditions under which the fluid does not obey the no-slip boundary condition are: 1) the fluid does not wet the wall material, 2) the wall surface is smooth, and 3) there is a high shear rate. For further details, see the following references, the entire contents of which are incorporated by reference herein: V. Steinberg, Introduction to Micro-fluidics, SMR1670-35, "Slip or no-slip? Lecture 8," Summer School in Microfluidics, The Abdus Salam International Centre for Theoretical Physics, Trieste, Italy (August 2005); Voronov et al., "Boundary slip and wetting properties of interfaces: Correlation of the contact angle with the slip length," The Journal of Chemical Physics 124:204701 (2006), doi: 10.1063/1.2194019; and Zhu et al., "Rate-Dependent Slip of Newtonian Liquid at Smooth Surfaces," Physical Review Letters 87 (9): 096105 (2001).

In some examples of the present methods and devices, mercury is used as the conductive fluid. If the cohesive force of the fluid is greater than the adhesive force between the fluid and the wall material, then the fluid is non-wettable with respect to the wall. The surface tension of the fluid is proportional to the cohesive forces of the fluid and is an indicator of the liquid's wettability on surfaces; higher surface tension therefore corresponds to less wettability. Mercury has one of the highest surface tensions of any known liquid; 500 mN/m for mercury, compared to water at 72 mN/m. Mercury has an extremely low wettability factor and wets very few surfaces. Additionally, the super-dielectric matrix material can be made of a material that has low adhesion, such as metal oxides, metal fluorides, metal chlorides, metal sulfides, and so on, thus further reducing the wettability between the mercury and the moving electrodes.

Because mercury has the highest surface tension of any known liquid, it is expected to be extremely difficult to get it to flow into the pores, nano-tubes, or any patterned nano-features of the super-dielectric matrix material. Additionally, features are also filled with the ionic fluid already, which is held in those nano-pockets by capillary action. In a manner such as described elsewhere herein, special processing may be used to get the ionic fluid into those nano-structures and the ionic fluid will have much lower surface tension than mercury. Accordingly, even if the super-dielectric matrix may have relatively low adhesion to the ionic fluid, once inside the matrix the ionic fluid is expected to be there to stay. The matrix will also have very low adhesion to the mercury, but the mercury has little to no way of penetrating into the matrix given mercury's high surface tension and the fact that the matrix is already occupied by the ionic fluid.

The second condition is the wall surface should have low surface roughness. Due to the methods discussed in the MUM electrode construction, the walls may have nanometer scale surface roughness as a result of the manufacturing processes. This results in an extremely smooth surface. Even the large discs of the MDU can be optically polished to have extremely smooth surfaces and/or the grown or deposited super-dielectric matrix can be made nanometer smooth as well if desired.

The third condition is a high shear rate. This condition is met on multiple levels for the current design. First, it is desirable for the electrodes to be rotating at a high angular speed which results in a high shear rate. Second, it is desirable for the electrodes to be spaced closely in order to get a high packing density which results in a thinner conductive fluid layer which in turn results in a high shear rate. Finally, the electrodes are ideally counter-rotated which further results in an enhanced shear rate as well as providing for counter momentum and shear forces in the fluid velocity profile. The counter-rotation further mitigates what little adhesion there may be between the mercury and the electrode walls.

All of these conditions combined make mercury an example of an ideal choice of slip joint fluid; the mercury does not stick to the rotating electrodes, and thus, the electrodes slip through the mercury as they rotate.

Manipulating the Mercury Fluid

Figure 36:
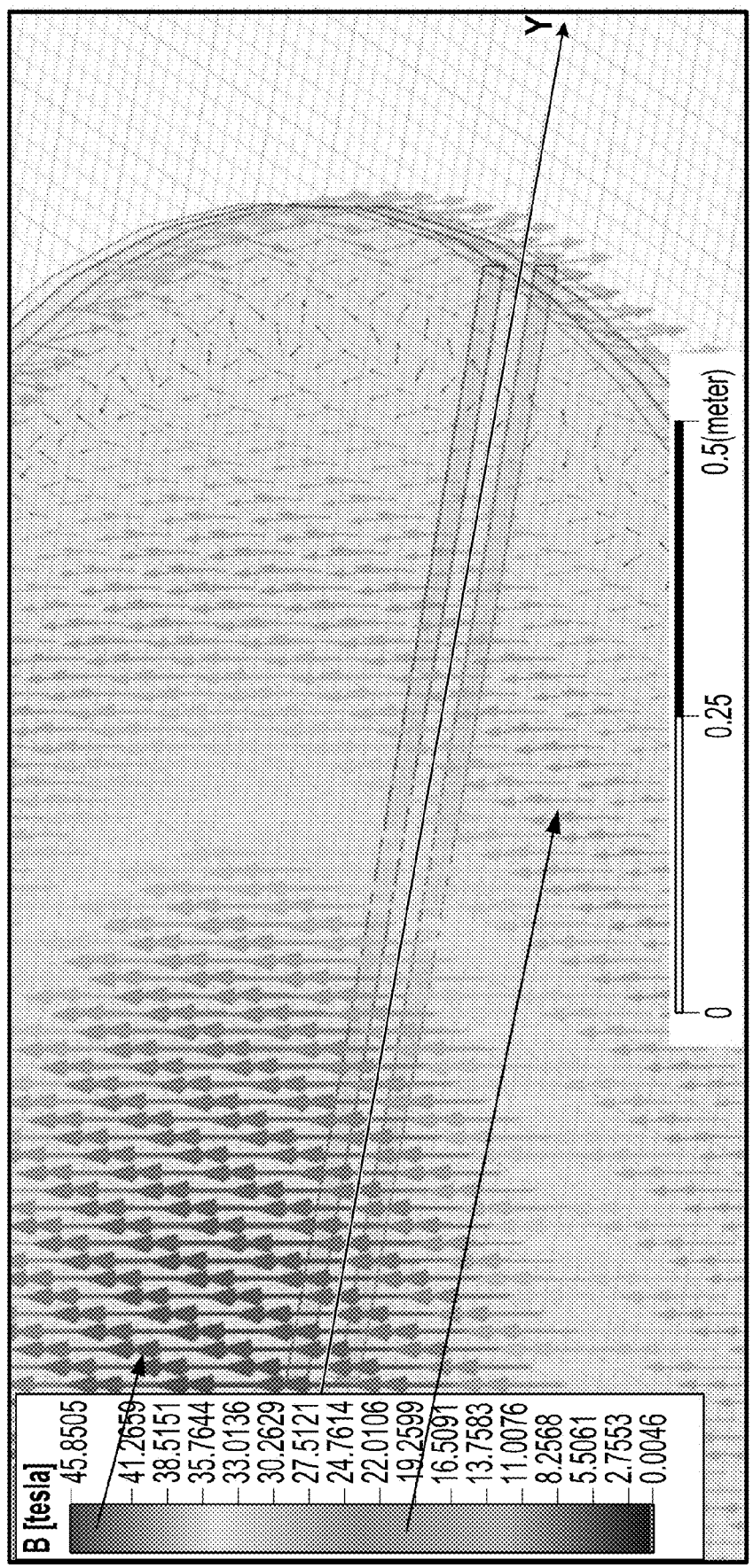
FIG. 36 illustrates the calculated magnetic field vector in a mercury slip-joint layer between two discs in a counter-rotating dynamic superconductor (DSC) design modeled using ANSYS Maxwell3D™.
Figure 37:
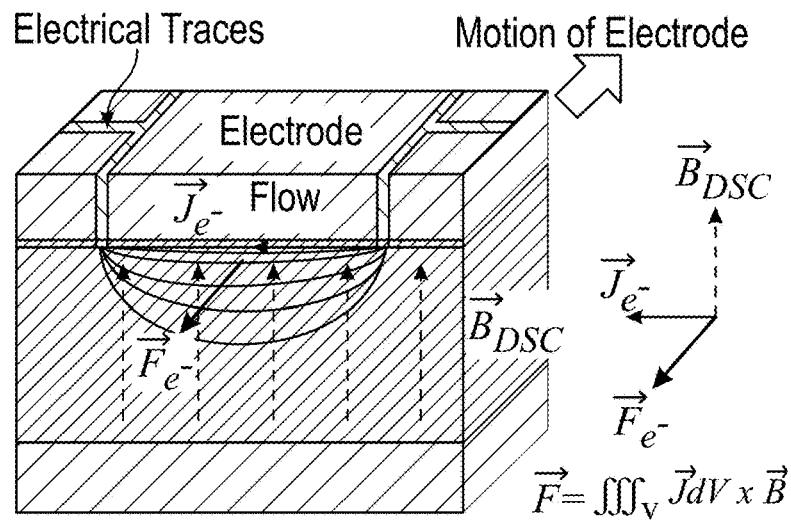
FIG. 37 schematically illustrates a perspective view of a volumetric segment of an electrode and mercury slip layer in a DSC's magnetic field; the electron current, $\vec{J}_{e^-}$, can be configured as to produce a force, and thus motion, in the mercury that is counter to the motion of the electrodes themselves.

Because of its fluidic nature and conductivity, the mercury slip joint fluid can be manipulated in the presence of the magnetic field produced by the dynamic super-capacitor (DSC), in other words the mercury can be made to flow in a desired manner using electromagnetic manipulation. One of the challenges presented so far is preventing or inhibiting the mercury fluid from 'sticking' to the rotating electrodes and being dragged along with the electrode rotation, causing parasitic charge motions. If a conventional electron current is flowed through the mercury, the mercury may experience magnetohydrodynamic forces. The electron currents and corresponding Lorentz forces can be configured to mitigate the drag the mercury may experience at the contact between the super-dielectric layer (SD) on the disc electrode and the mercury, further mitigating charges in the mercury close to the mercury-SD interface from being dragged along with the rotating disc, which would diminish the total effective current, i.e., parasitic charge motion. FIG. 36 shows the simulated magnetic field vector between two counter-rotating oppositely charged plates, i.e., in the mercury slip-joint fluid layer. More specifically, FIG. 36 illustrates the calculated magnetic field vector in a mercury slip-joint layer between two discs in a counter-rotating dynamic superconductor (DSC) design modeled using ANSYS Maxwell3D™. As can be seen, for the most part, the magnetic field vector inside the mercury runs perpendicular to the plane of the discs. The electron current used to exert force on the mercury is a conventional electron current as is commonly encountered in any common electrical circuit, e.g., current in a wire. The flow of the electron current can be configured such that magnetohydrodynamic forces can be exerted on the mercury in a controlled and desirable way. Electrical traces can be patterned on the disc(s) and come into contact with the mercury where desired, allowing current to flow through the mercury in a controlled and patterned way. Due to the Lorentz force, equations 8 and 9, a force is locally exerted on the mercury proportional to the perpendicular component of the local magnetic field and electron current density flow, see FIG. 37. FIG. 37 schematically illustrates a perspective view of a volumetric segment of an electrode and mercury slip layer in a DSC's magnetic field; the electron current, $\vec{J}_{e^-}$, can be configured as to produce a force, and thus motion, in the mercury that is counter to the motion of the electrodes themselves.

The force on moving charged particles in a magnetic field may be expressed as, $$d\vec{F} = dQ\vec{v} \times \vec{B} \tag{8}$$

in differential form, where $d\vec{F}$ is the differential force, dQ is a differential charge element, $\vec{v}$ is the velocity of that charge element, and B is the external magnetic field vector where dQ exists. The total Lorentz force can be written as $$\vec{F} = \iiint_V \vec{J} dV \times \vec{B} \tag{9}$$

in integral form, where V is the volume in which the current is contained and $\vec{J}$ is the electric current density.

The force of equations 8 and 9 is the force exerted on the electrons. The electrons may then transfer their acquired momentum to the fluid through electron-atom collisions. In this way the mercury can be made to experience a force counter to the motion of the rotating disc, or discs if two or more discs are counter-rotated. The mercury fluid can potentially be made to move counter to the rotation of the electrodes or in just about any other motional path desired. In the simulations and calculations of the present disclosure, the charges accumulated in the mercury due to the capacitive nature of the DSC are assumed to be stationary; however, this does not need to be the case as using magnetohydrodynamic forces on the mercury the mercury may be made to move with an angular momentum counter to the rotation of the electrodes.

Energy Losses

The largest frictional energy losses to the system may be expected to come from the frictional drag between the spinning disc electrodes and the mercury fluid. Traditionally, the skin friction drag of a fluid on the walls of the spinning plates would be estimated as $$F_{Hg} = \int_S C_f \frac{\rho v^2}{2} dA, \tag{10}$$

where $C_f$ is the skin friction coefficient, $\rho$ is the fluid density, v is the tangential plate velocity (assumes fluid is stationary far from the plate wall), Sis the area of the electrode (disc) in question to be integrated over. Additionally, $$C_f = \frac{0.664}{\sqrt{Re}}, \text{ for Laminar flows} \quad (11)$$

$$C_f = \frac{0.027}{(Re)^{1/7}}, \text{ for Turbulent flows} \quad (12)$$

where Re is the Reynolds number, $$Re = \frac{\rho v L}{\mu} \quad (13)$$

where $\rho$ is the density of the fluid, L is the characteristic linear dimension of the system, and $\mu$ is the dynamic viscosity of the fluid. For further details, see the following references, the entire contents of each of which are incorporated by reference herein: White, Fluid Mechanics, New York City, NY, McGraw-Hill: pp. 477-485 (2011); and Sommerfeld, "Ein Beitrag zur hydrodynamischen Erklaerung der turbulenten Flüssigkeitsbewegüngen (A Contribution to Hydrodynamic Explanation of Turbulent Fluid Motions)," International Congress of Mathematicians 3:116-124 (1908), Archived from the original (PDF) on 2016 Nov. 15.

The power loss due to the frictional drag of the mercury can be written as $$P_{Hg}(r) = F_{Hg} \omega r \quad (13A)$$

where r is the distance from the axis of rotation. Integrating over the entire disc, spinning at 100,000 RPM, gives nonsensical results of losses of tens of billions of watts whether turbulent or laminar. Unfortunately, the system operates well outside the validity range of these traditional methods and no method exists today to accurately estimate the drag losses the spinning discs would experience in the mercury. At the heart of these calculations and indeed computational fluid dynamics as a whole is the 'no-slip' boundary condition in which the fluid is assumed to stick to the wall boundary. As the field of micro-fluidics has grown, deeper research into the no-slip boundary condition has been undertaken. Research has shown that under certain conditions the no-slip assumption is invalid (see, e.g., Steinberg, Voronov, and Zhu cited above). In fact, the drag from the fluid has been shown to be two to four orders of magnitude less than predicted by the Navier Stokes Dirichlet Boundary Condition (the no-slip boundary condition) (see, e.g., Steinberg, Voronov, and Zhu cited above). The conditions under which the fluid does not obey the no-slip boundary condition are: 1) the fluid does not wet the wall material, 2) the wall surface is smooth, and 3) there is a high shear rate. All three of these conditions are abundantly met in nonlimiting examples of the current implementation. The mercury may be expected not to wet the super-dielectric matrix material, the walls have nanometer scale smoothness, and due to the counter-rotation nature of the design there may be expected to be very high counter-shear rates in the mercury. The discs may readily slip through the mercury and the fluid drag may be greatly reduced. Additionally, adding a counteracting magnetohydrodynamic force to the mercury, as discussed earlier, may cause the mercury to not only not stick to the super-dielectric coated disc walls, but to move against the natural angular momentum that would otherwise be imparted into the mercury fluid. An accurate picture of the mercury's interaction with the electrode wall is complex and not fully known at the time of this application.

Mercury-Less Design

While it is believed the discs may slip through the mercury fluid for the reasons previously stated, due to the uncertainties associated with the mercury-wall interactions, an alternate design is discussed in this disclosure, which eliminates the need for a conductive slip-joint fluid altogether.

One of the major advantages to the use of a liquid conductor, i.e., mercury, as one of the electrodes is the ultra-magnet system components may be constructed and operated with relatively lax tolerances as these tolerances can be taken up in the mercury. If great care is taken with tolerances in the design and operation of the ultra-magnet, the use of mercury may be foregone.

Alternative to the Slip Joint Fluid

While using mercury as a slip joint fluid is expected to be useful in the present devices and methods, it may be desirable to forgo the use of mercury or another conductive slip joint fluid altogether for any number of reasons.

The electrodes, especially those used in the MUMs can be manufactured to exceedingly high tolerances. Concerning the MUMs, the disc electrodes can be manufactured to near nanometer tolerances, including flatness and parallelism, using the techniques described previously.

Figure 38A:
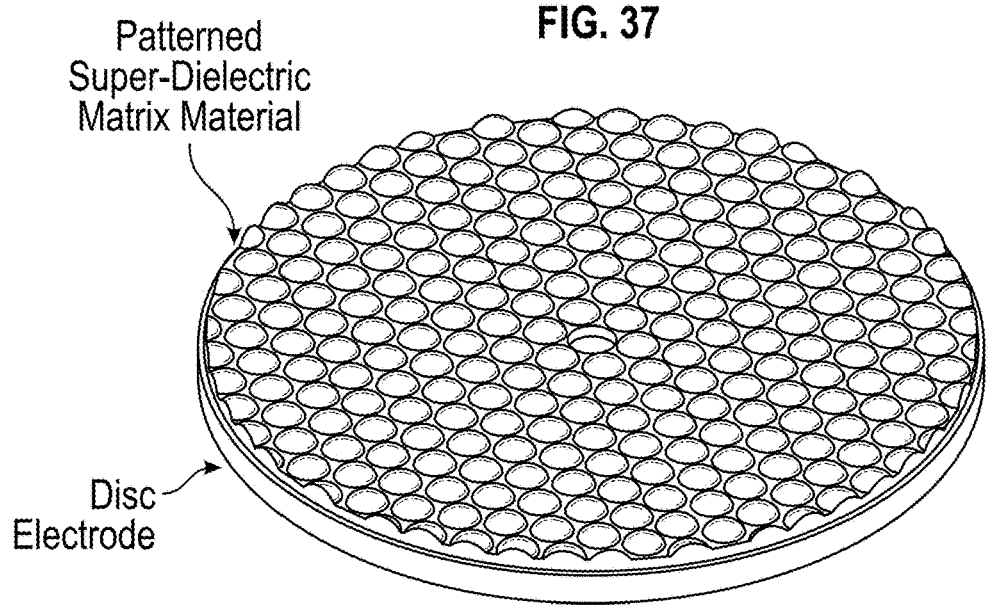
FIGS. 38A and 38B schematically illustrate perspective and cross-sectional views of a patterned dielectric acting as a slip joint; the point contacts slide on the top electrode providing both kinematic alignment spacing and kinematic motion for rotation.
Figure 38B:
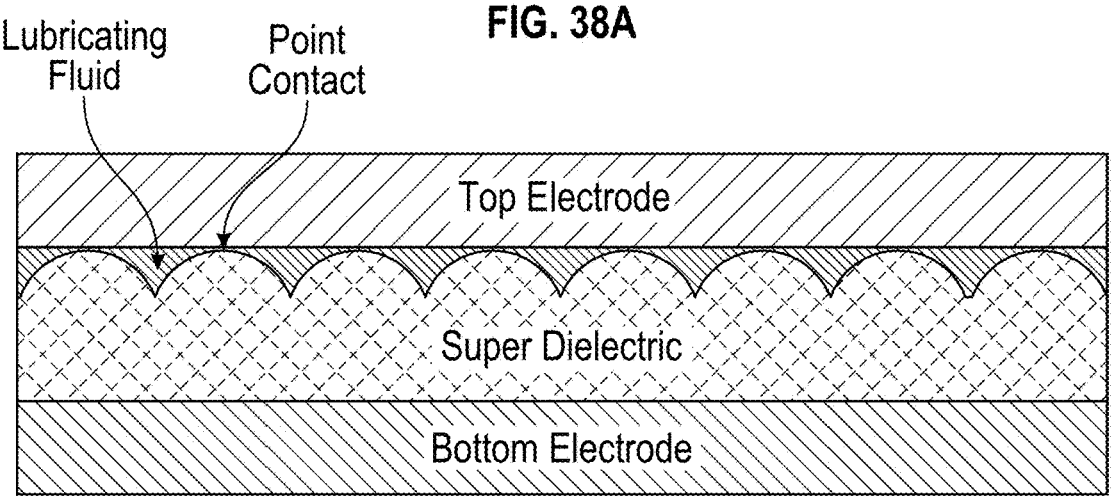

After the disc electrodes are manufactured, the super-dielectric matrix can be deposited onto the electrodes, also in nanometer scale exactness. A technique common in MEMs fabrication is known as grayscale etching. For further details, see Waits et al., "Gray-scale lithography for MEMS applications," Research rept., Army Research Lab Adelpi MD, Accession number ADA447924 (2006), the entire contents of which are incorporated by reference herein. Greyscale etching may be used to etch curved surfaces into the super-dielectric matrix material, as shown in FIGS. 38A and 38B. FIGS. 38A and 38B schematically illustrate perspective and cross-sectional views of a patterned dielectric acting as a slip joint; the point contacts slide on the top electrode providing both kinematic alignment spacing and kinematic motion for rotation. In FIGS. 38A and 38B, these curved surfaces are partial spheres, though nearly any sag profile can be etched into the matrix material. The profiles in FIGS. 38A and 38B are greatly exaggerated to make the concept clear. In reality, the curved surfaces are only slightly raised from the base matrix profile, from 10's to 100's of nanometers. This allows for a point contact between the matrix material and the secondary electrode as shown in FIG. 38B. The super-dielectric matrix material is often made of very hard materials such as metal oxides or ceramics, such as alumina, for example. The strength of these materials can range from common alumina which has a hardness of around 10,000 MPa up to 44,000 MPa for boron carbide. Additionally, these ceramic or ceramic like materials often have low coefficients of friction, with alumina having a kinetic coefficient of friction of around 0.5 down to tungsten disulphide which as a coefficient of kinetic friction as low as 0.03, but is considered a soft ceramic. Boron Carbide provides a good balance being one of the hardest materials known with a good coefficient of kinetic friction as low as 0.24; for further details, see Zhang et al., "Effects of load on tribological properties of $B_4C$ and $B_4C$—SiC ceramics sliding against SiC balls," Journal of Asian Ceramic Societies 8 (3): 586-596 (2020), the entire contents of which are incorporated by reference herein. In this way the super-dielectric matrix material sets the spacing between the oppositely charged electrodes as well as providing for a rotational mechanism. The matrix material is firmly attached to the bottom electrode and the patterned point contacts come into contact with the top electrode. Additionally, a lubricating fluid such as silicone oil or fluorocarbon oils or any number of other lubricating liquids may be applied in the dead space left by the grayscale etching of the matrix material, if desired.

Figure 39A:
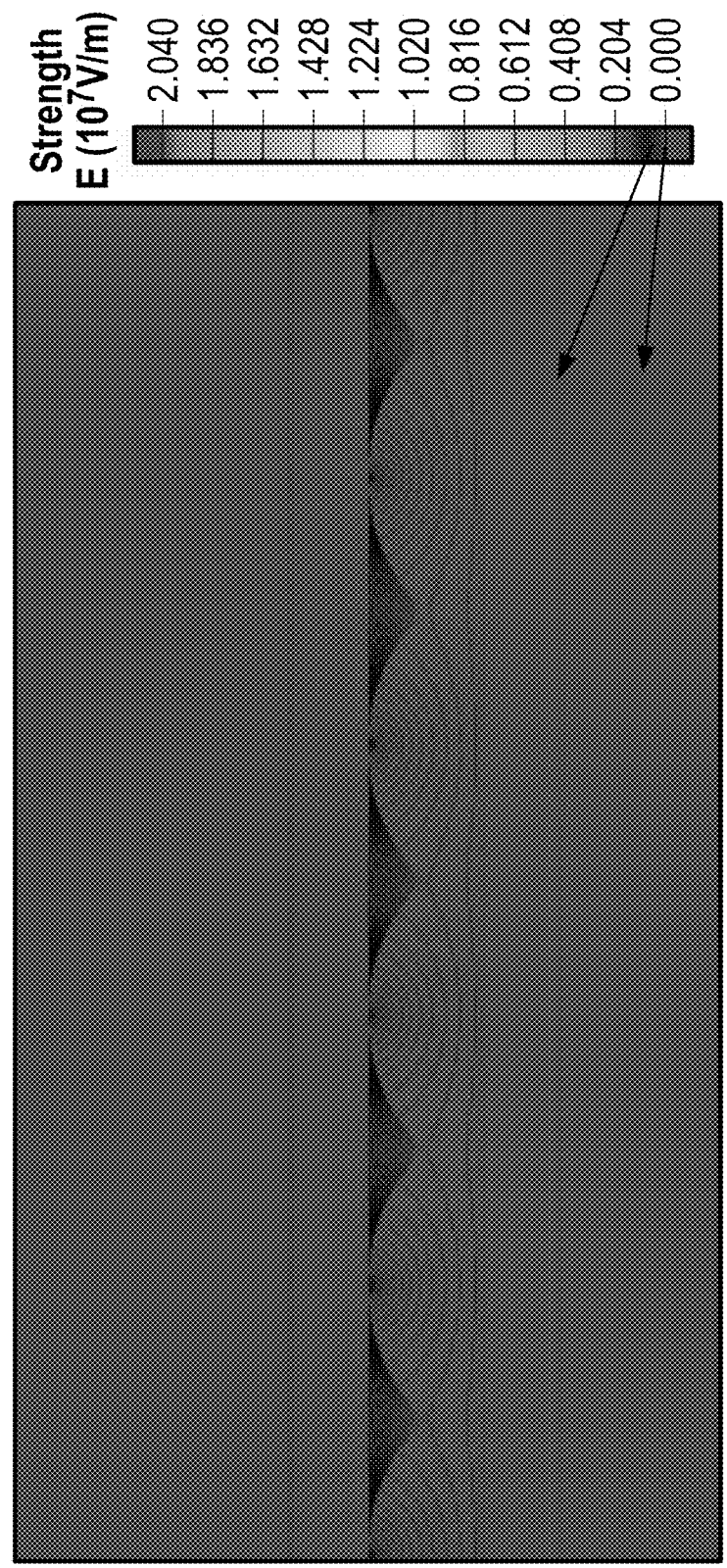
FIG. 39A illustrates an electrostatic simulation of an example DSC having a 1.0 cm disc with a 30 micron thick dielectric patterned layer between and a 2 V potential applied between the electrodes; equipotential lines and field strength are shown; the patterned layer (round profiles) are exaggerated so they can be clearly seen, here a 15 micron sag is shown, however sub-micron sags are achievable. Equipotential lines are shown.
Figure 39B:
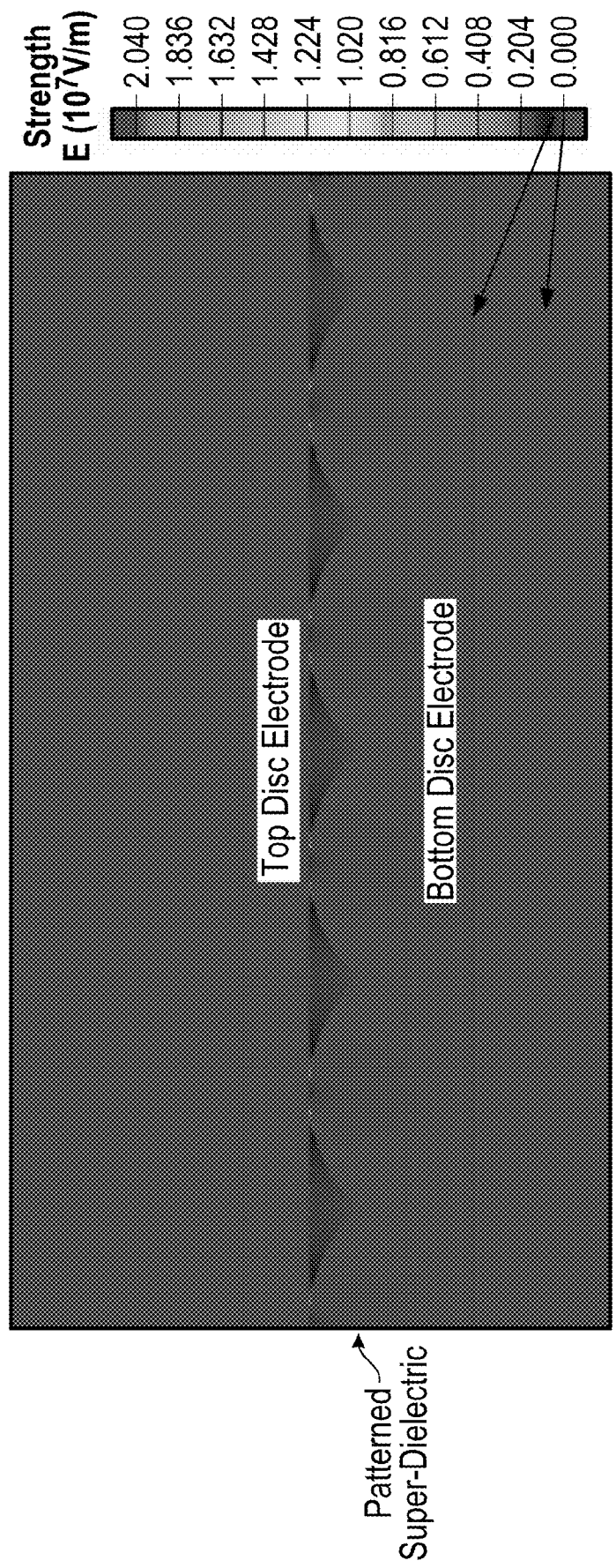
FIG. 39B illustrates the simulation of FIG. 39A and in which example electrode locations are shown.

The disc electrodes can be counter-rotated, or singly rotated, with the point contacts providing the area of slippage between the two electrodes. Comparing at the same rotational speeds, this technique has only nominally less performance than the mercury slip joint fluid method described previously. Simulation shows up to 90% or more of performance of the mercury design is achievable, even with the assumption the mercury experiences full slip at the SD-mercury interface. FIGS. 39A and 39B show an electrostatic simulation of a super-dielectric layer that has undergone patterning. More specifically, FIG. 39A illustrates an electrostatic simulation of an example DSC having a 1.0 cm disc with a 30 micron thick dielectric patterned layer between and a 2 V potential applied between the electrodes; equipotential lines and field strength are shown; the patterned layer (round profiles) are exaggerated so they can be clearly seen, here a 15 micron sag is shown, however sub-micron sags are achievable. Equipotential lines are shown. FIG. 39B illustrates the simulation of FIG. 39A in which electrode locations are shown. Even in this exaggerated profile patterning, the charge storing ability of the patterned design is nearly 30% of the non-pattered, full layer. A 15-micron sag is shown in FIGS. 39A and 39B. However, submicron or even sub-100 nm sags are achievable with grayscale etching methods. As a reminder, the strength of the magnetic field achievable is directly proportional to the charge stored on the electrodes and the rotational speed achievable of those electrodes. Very little performance loss can be achieved with a 'hard' spacing, i.e., forgoing of the conductive fluid slip-joint and using the patterned super-dielectric layer-top electrode interface as the slip surface.

Mercury-Less Design

The friction between two sliding surfaces is known from Amonton's Law of Friction to be $$F_{friction} = \mu_k N \quad (14).$$

where $\mu_k$ is the coefficient of kinetic friction, and N is the normal force between the two surfaces.

The differential torque on the discs due to rotational friction can be stated as, $$d\tau = r F_{friction} = r\mu_k dN = r\mu_k N(r,\varphi) r dr d\varphi.$$

The frictional power loss may be expressed as, $$dP_{friction} = \omega d\tau = \omega\mu_k r^2 N(r,\varphi) dr d\varphi,$$

where $\omega$ is the relative angular velocity between the two discs, $\tau$ is the torque on the discs due to friction. If N varies (non-uniform contact), $$P_{friction} = \omega\mu_k \int_{\varphi_1}^{\varphi_2} \int_{R_1}^{R_2} N(r,\varphi) r^2 dr d\varphi \quad (15).$$

If N is uniform, $$P_{friction} = \frac{2\pi}{3} \omega\mu_k N (R_2^3 - R_1^3). \quad (16)$$

It is well known the friction force is independent of the contact area between the two surfaces, as is evidenced by equation 14. However, equation 14 is an approximation of the true frictional force. Friction is caused by inter-molecular forces. If the surfaces are smooth and flat, to the order of one nanometer, and in close contact, also to the order of one nanometer, the intermolecular forces may cause the two surfaces to strongly adhere to one another, a process known as optical contacting. For further information regarding optical contacting see Myatt et al., "Optical Contacting: Changing the interface of optics," Document #20060101, Precision Photonics, Inc., Boulder CO, Proc. Of SPIE vol. 8600:860021-12 (2013), the entire contents of which are incorporated by reference herein. The dimpling process ensures the optical contacting process does not take place. It should be understood that the super-dielectric may be flat and the converse electrode dimpled, whichever provides for easier implementation and operation. It may not always be necessary to dimple the surfaces as the super-dielectric matrix itself may provide sufficient surface roughness to prevent optical contacting, as the super-dielectric matrix may include porous structures much larger than one nanometer. The dimpling may be accomplished through a MEMs fabrication process known as grayscale etching or grayscale lithography such as disclosed by Waits cited further above. A potential method that negates the need for grayscale patterning, i.e., dimpling, are further discussed herein, though both techniques may be used in tandem.

Stresses on the Discs

Figure 40:
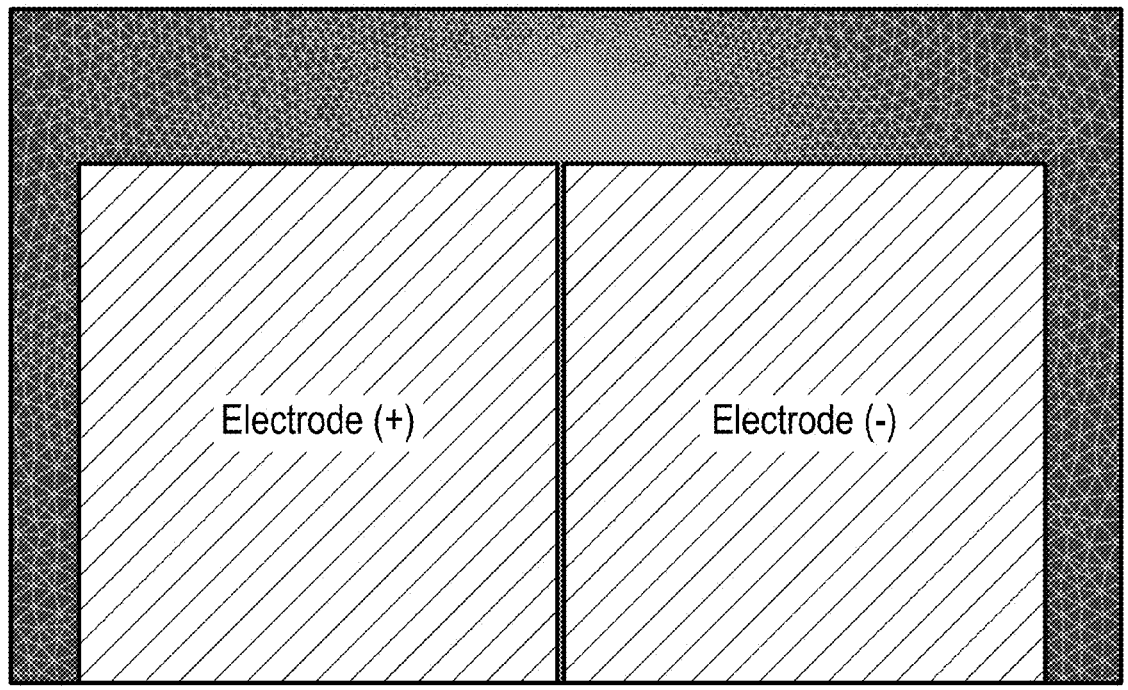
FIG. 40 illustrates a simulation of electrostatic pressure between example DSC plates; d=2 microns, ΔV=2 volts, R=1 meter. Electrostatic pressure=4.4 GPa.

The normal force, N, in equation 14 warrants attention as this is the primary driver for the frictional force the spinning discs may experience during operation. The discs, containing large oppositely polarized electric charges, may experience a large electrostatic attraction, making N large if unmanaged. FIG. 40 illustrates a simulation of electrostatic pressure between example DSC plates; d=2 microns, ΔV=2 volts, R=1 meter; electrostatic pressure=4.4 GPa. More specifically, a Quickfield™ FEM simulation, FIG. 40, of this electrostatic attraction, estimates the electrostatic pressure between the two plates with d=2 microns, ΔV=2 volts to be 4.4 GPa when fully charged. Analytically, the electrostatic force between two charged, flat capacitor plate electrodes is derived to be, ignoring fringe fields, $$F_C = \frac{k\epsilon_0 A(\Delta V)^2}{2d^2} = \frac{k\epsilon_0 \pi R^2 (\Delta V)^2}{2d^2} \quad (17)$$

where A is the area of the plates, which gives an electrostatic pressure of $$P_C = \frac{k\epsilon_0 (\Delta V)^2}{2d^2}. \quad (18)$$

Solving equation 18 for the system described also gives a result of 4.4 GPa, in agreement with simulation. These forces act perpendicular to the plane of the discs, i.e., pulling the discs towards one another.

The electromagnetic stresses at any point in the system can be calculated by the Maxwell Stress Tensor, $$T_{ij} \equiv \epsilon\left(E_i E_j - \frac{1}{2}\delta_{ij} E^2\right) + \frac{1}{\mu}\left(B_i B_j - \frac{1}{2}\delta_{ij} B^2\right) \quad (19)$$

where $T_{ij}$ are the i-th and j-th components of the Maxwell Stress Tensor, $\overleftrightarrow{T}$. Here i and j represent the basis vectors in three-dimensional space, for cartesian coordinates $\hat{x}=1$, $\hat{y}=2$, $\hat{z}=3$. $E_i$ and $E_j$ are the components of the electric field vector in the ith and jth direction, similarly, $B_i$ and $B_j$ are the components of the magnetic field vector in the ith and jth direction. $\delta_{ij}$ is the Kronecker delta function.

The divergence of $\overleftrightarrow{T}$ yields the following equation:

$$\nabla \cdot \overleftrightarrow{T} = \vec{F} + \epsilon\mu\frac{\partial \vec{s}}{\partial t} \tag{20}$$

where $\vec{F}$ is the total force on the system and $\vec{S}$ is the familiar Poynting vector, $\vec{S}=\vec{E}\times\vec{H}$. It is worth noting in the analyses, it is assumed the system is running at steady-state to show the steady state performance of the system, therefore, the time derivative of the Poynting vector term on the right is not expected to contribute to the force calculation. This term would contribute on power up or power down of the system, otherwise the time derivative is zero. Taking the divergence of a tensor lowers its order by one, therefore the long vector equation version of equation can be written as, after solving for the force vector and writing purely in terms of E and B:

$$\vec{F} = \epsilon\left[\left(\nabla \cdot \vec{E}\right)\vec{E} - \left(\vec{E} \cdot \nabla\right)\vec{E}\right] + \frac{1}{\mu}\left[\left(\nabla \cdot \vec{B}\right)\vec{B} - \left(\vec{B} \cdot \nabla\right)\vec{B}\right] - \frac{1}{2}\nabla\left(\epsilon E^2 + \frac{1}{\mu}B^2\right) - \epsilon\frac{\partial\left(\vec{E}\times\vec{B}\right)}{\partial t} \tag{21}$$

Similarly, the surface force density $\vec{F}_s(N/m^2)$ on the disc resulting from the effective current can be expressed as $$\vec{F}_s(r,\varphi) = \vec{K}(r,\varphi)\times\vec{B}_{int}(r,\varphi) \tag{22}$$

where $\vec{K}$ is the effective surface current density resulting from the rotating charges and $\vec{B}_{int}$ is the total magnetic field experienced by the disc, both any external fields and the fields generated by the device, i.e., the total magnetic field inside the device. A surface current density is used because in one example embodiment, a super strong, non-conductive disc material with a thin-film metal coating is used. The electric charge is in a thin layer at the surface of the disc and not throughout the volume of the disc. In the calculation of the magnetic fields, using a current volume density vs a surface current density is inconsequential; however, it is important in the case of calculating electromagnetic stresses on the discs and assembly structure that the forces are applied appropriately, being forces on the surfaces of the discs.

Additionally, the discs will experience mechanical stresses due to centrifugal forces. The centrifugal stress. $\sigma_{cent}$, on a spinning disc is given by:

$$\sigma_{cent} = \frac{R^2\rho}{3}\left(\frac{2\pi RPM}{60}\right)^2. \tag{23}$$

Material Strength Considerations

Gigapascals of pressure is an immense amount of pressure which would likely crush any structure or device made of typical materials such as aluminum or steel. To this end, more exotic materials may be employed in the construction of the ultra-magnet system. Table 10 lists some candidate materials with the necessary strength and are in existence at the time of this application. The list of materials is by no means complete but demonstrates materials are available that can handle the pressures and forces the ultra-magnet system may generate internally. Graphene as well as aluminum and steel are listed for reference. The 2010 Nobel Prize in Physics was awarded to Andre Geim and Konstantin Novoselov for their work with graphene. It is widely believed that graphene will be the wonder material of the 21st century, ushering in new technologies, being highly conductive and stronger than diamond. At the time of this application, lighter, stronger, more resilient materials are being researched by combining graphene with metal(s), epoxie(s), and/or polymer(s). For further information about materials including graphene, see, e.g., the following references, the entire contents of each of which are incorporated by reference herein: Kumar et al., "Processing of graphene/ CNT-metal powder," Powder Technology, Ed. Alberto Adriano Cavalheiro, IntechOpen, DOI: 10.5772/intechopen.76897 (2017); Rekha et al., "First report on high entropy alloy nanoparticle decorated graphene," Scientific Reports 8:8737 (2018), DOI: 10.1038/s41598-018-27096-8 (2018); Zhang et al., "Bioinspired, graphene-enabled Ni composites with high strength and toughness," Science Advances 5 (5): aav5577 (2019), DOI: 10.1126/sciadv.aav5577; Yan et al., "Investigating aluminum alloy reinforced by graphene nanoflakes," Materials Science and Engineering" A 612:440-444 (2014), DOI: 10.1016/j.msea.2014.06.077; Hidalgo-Manrique et al., "Copper/graphene composites: a review," Journal of Materials Science 54:12236-12289 (2019), DOI: 10.1007/s10853-019-03703-5; Güler et al., "A short review on mechanical properties of graphene reinforced metal matrix composites," Journal of Materials Research and Technology 9 (3): 6808-6833 (2020); Shokrieh et al., "Prediction of Young's modulus of graphene sheets and carbon nanotubes using nanoscale continuum mechanics approach," Materials and Design 31 (2): 790-795 (2010); Yoon et al., "Negative Thermal Expansion Coefficient of Graphene Measured by Raman Spectroscopy," Nano Letters 11 (8): 3227-3231 (2011); Mahmood et al., "Prediction of Young's modulus of graphene sheets and carbon nanotubes using nanoscale continuum mechanics approach," Materials and Design 31 (2): 790-795 (2010).

While the current implementation is expected to operate with materials available at the time of this application, the achievable performance of the ultra-magnet system may be limited by the mechanical strength of those materials. As new materials are pioneered with higher compressive and tensile strengths and pushed into new regimes, so may the capabilities of the proposed ultra-magnet system be expanded.

TABLE 10

| Material | Compressive Strength (GPa) | Tensile Strength (GPa) | Young's Modulus (GPa) | Bulk Modulus (GPa) | Poisson Ratio | Thermal Expansion (ppm/deg K) |
|---|---|---|---|---|---|---|
| Synthetic Diamond | 110 | 1.2 | 1220 | 548 | 0.2 | 1.1 |
| Synthetic Sapphire | 2 | 0.4 | 400 | 240 | 0.29 | 4.5-9.0 |
| Alumina | 5.5 | 0.6 | 413 | 324 | 0.3 | 4.5-10.9 |
| Silicon Carbide | 1.4 | 1.6 | 137 | 176 | 0.37 | 7.9-11 |
| Tungsten Carbide | 6.8 | 0.5 | 686 | 680 | 0.22 | 4.4-7.1 |
| Boron Carbide | 5.6 | 0.5 | 472 | 271 | 0.21 | 3.2-9.4 |
| Carbon Fiber | 2.5 | 4.9 | 700 | 500 | 0.27 | −0.38 |
| Nickle-Graphene Matrix | — | 1.1 | — | 222 | — | — |
| Pure Graphene | 500-1000 | 130 | 1040 | 500-1000 | — | −8.0 |
| Aluminum | 0.28 | 0.3 | 88.5 | 88 | 0.36 | 16-24 |
| Stainless Steel (316) | 0.3 | 0.6 | 205 | 205 | 0.27 | 15-18 |

Table 10 is List of super strong materials and some of their properties. Aluminum and stainless steel are included for reference. Dashes indicate data has not yet been published or is unknown. The properties of carbon fiber and graphene can vary considerably based on the manufacturing process. For further details regarding selected materials listed in Table 10, see the following references, the entire contents of each of which are incorporated by reference herein: Krucinska et al., "Direct measurement of the axial poisson's ratio of single carbon fibres," Composites Science and Technology 41 (1): 1-12 (1991); Bray et al., "On the thermal conductivity of diamond under changes to its isotopic character," Z. Phys. B. 84 (1): 51-57 (1991), DOI: 10.1007/BF01453758; and Qiu et al., "Thermal conductivity of natural and synthetic diamonds with differing isotope contents," Thermochimica Acta 218:257-268 (1993). Hexagonal boron nitride (h-BN) deserves special mention. h-BN is a newly created single atomic layer material similar to graphene and its properties are similar to that of graphene with a bulk modulus of 800 GPa, but with a fracture strength ten times that of graphene. For further details regarding h-BN, see Yang et al., "Intrinsic toughening and stable crack propagation in hexagonal boron nitride," Nature 594:57-61 (2021), the entire contents of which are incorporate by reference herein.

Reducing Rotational Friction

Figure 41A:
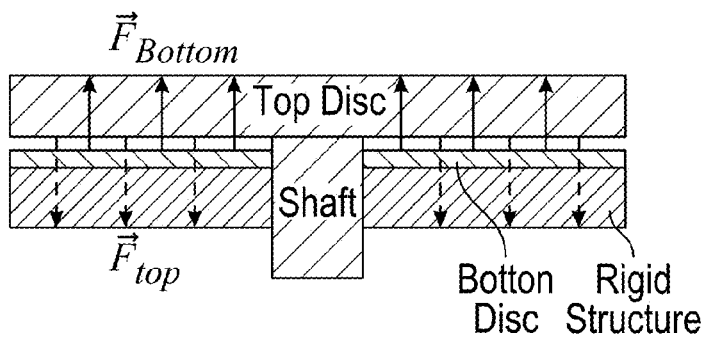
FIG. 41A schematically illustrates an example in which a shaft is put into compressive stress as opposed to tensile stress due to internal electrostatic pressure; top disc rotates, bottom disc is stationary and attached to a rigid support structure (or the disc can be made as thick as appropriate for structural integrity).

Materials are typically stronger under compressive loads than tensile loads. The shafts holding the discs may experience large forces. In one potential embodiment (see FIG. 41A), the top disc shaft passes through the bottom disc. More specifically, FIG. 41A schematically illustrates an example in which a shaft is put into compressive stress as opposed to tensile stress due to internal electrostatic pressure; top disc rotates, bottom disc is stationary and attached to a rigid support structure (or the disc can be made as thick as appropriate for structural integrity). The top disc is attracted to the bottom disc due to electrostatic attraction. The bottom disc is attracted to the top disc through the same electrostatic attraction. The load from the attraction of the top disc to the bottom disc is transferred through the shaft. In this configuration the shaft is now under compressive stress, a stronger state for most materials. The bottom disc being rigid, and stationary can be made as structurally strong as appropriate.

Figure 41B:
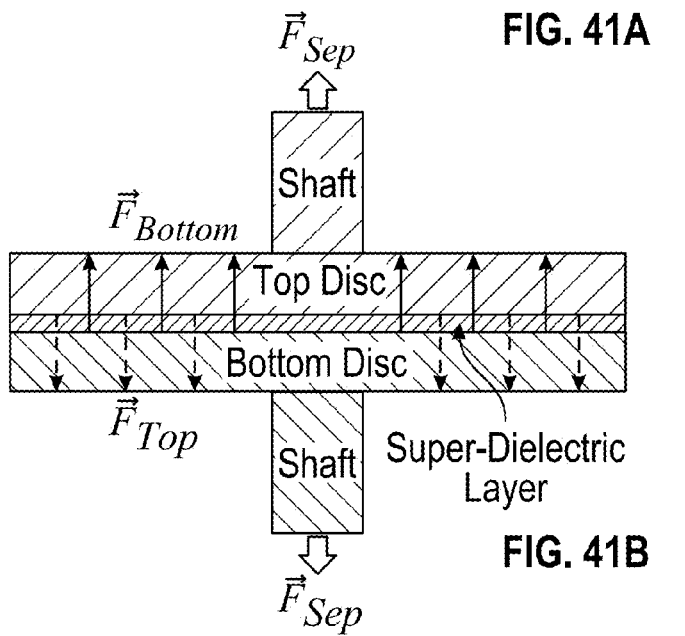
FIG. 41B schematically illustrates force, $F_{sep}$, applied to shafts to counter the normal force created by the forces, $F_{Bottom}$ and $F_{Top}$, generated by the electrostatic pressure between the charged discs; one disc and shaft assembly may be fixed and a force solely exerted on the other disc and shaft assembly alternatively.

It can be ascertained that the frictional force, equation 14, may be minimized or even eliminated by applying a force to the disc that counters the normal force, N, generated by the electromagnetic stresses. As pointed out, super strong materials may be necessary to handle such forces. In order to reduce the kinetic friction between the spinning discs, the normal force in equation 14 should be reduced. A reduction in the normal force can be additionally accomplished by applying a counter force through the shaft or shafts depending on the design of the ultra-magnet system. FIG. 41B shows a two-shaft system in which the shafts are in tensile stress. More specifically, FIG. 41B schematically illustrates force, F'sep, applied to shafts to counter the normal force created by the forces, V Bottom and I'Top, generated by the electrostatic pressure between the charged discs; one disc and shaft assembly may be fixed and a force solely exerted on the other disc and shaft assembly alternatively. It should be clear that an upward force can be applied to the shaft in FIG. 41B to counter the attractive forces caused by the electrostatic pressure. In the latter case, the shaft is in compressive stress.

The separation forces used to reduce the frictional normal force can be very large. One potential way of producing these forces is through the use of thermal expansion/contraction. Platens at the base of the shafts, or the shafts themselves, can be made of super-strong materials, like those listed in Table 10, and heated or cooled as necessary to produce expansion or contraction as appropriate. For example, the shafts in FIG. 41B may be cooled in a controlled way to produce a contraction of the shafts. The shaft in FIG. 41A could similarly be heated to produce the appropriate expansion, assuming positive expansion coefficients. Depending on the materials used and the temperature change induced, the existing strains in the system, i.e., the strains causing the normal force, may be mitigated by exchanging deformation strain at the disc interface to axial deformation strain in the shaft; or the discs may experience a prescribed displacement if the discs are already in separation. These thermal expansions/contractions are capable of producing massive forces depending on the thermo-mechanical properties of the materials used. Another advantage of this method is the forces and displacements can be precisely controlled with accurate temperature controls.

Presented are only two simple example layouts, FIGS. 41A and 41B. A great number of other configurations and mechanical designs can be realized, as would be apparent to one of ordinary skill in the art.

It is instructive to estimate the rotational frictional losses. Equation 16 is only a rough approximation of the power loss due to rotational friction since the contact stresses throughout the discs are likely to be nonuniform. However, to get a rough approximation of the rotational friction power loss, for a 2-meter diameter disc rotating at 100,000 RPM, if the normal force can be reduced to 1000 newtons (225 lbs), and only the outer ⅓ of the discs are used for producing the magnetic field (a ring configuration), and a coefficient of kinetic friction of 0.03 is used, the rotational frictional power losses are estimated to be roughly 0.5 Megawatts. If the normal force can be reduced to 100 newtons, the power loss reduces to 50 kW. This illustrates the importance of reducing the normal force between the discs.

Since the rotational frictional power loss goes as the radius cubed (equation 16), it is worth running an approximation of the MUMs unit since it is a small diameter version of the ultra-magnet system. Due to the smaller diameter, the starting electrostatic force is $1/1,000,000^{th}$ that of the MCU, if the dielectric layer thickness remains the same. If the normal force can be reduced to 100 N between each pair of discs in the MUM (the MUMs consists of a large stack of discs), the sliding frictional power loss is approximately 8 W for the whole MUMs unit described earlier. However, since the MUM's discs are small, resulting in a much smaller starting electrostatic force, and there are many discs, the force can be better distributed. It may be possible to lower the resultant normal force between disc pairs to a lower number, for instance a 10 N normal force per disc pair would result in a MUMs base unit only consuming about 0.8 watt of power to overcome rotational sliding friction losses. The choice of whether to use smaller radii MUMs or larger radii disc electrodes (e.g., MDUs) is a design choice, there are pros and cons to each.

Reducing or Eliminating Sliding Friction

The reduction of the frictional normal force can be taken to the extreme; the discs can be separated. If the discs are separated beyond the range of the Van der Waals forces (~10 nm), the normal force may essentially drop to zero. This is a tricky proposition-first due to keeping such tight tolerances. Secondly, the electric circuit between the discs may be severed before disc separation takes place. If an air gap forms while the discs are still in electrical communication, i.e., part of a closed circuit, the super-capacitor may become a heterogenous capacitor with a super-dielectric layer and an air gap layer as the dielectric gap. The DSC may cease to be a supercapacitor at this point. The discs may be charged and then isolated (electrically disconnected). The discs now may retain their charge during the separation process. The charge on the discs is given by $Q=CV$. The voltage between the electrodes is $V=Q/C$. With Q now fixed, the voltage may rapidly increase as the discs are separated, since the capacitance C may drop rapidly as the discs are separated. The separation may be kept small, for example on the order of nanometers or tens of nanometers, or the voltage may rapidly increase to levels to which coronal discharge or field emission may take place. As a point of reference, if the super-dielectric were to be completely removed after the charge is fixed on the discs, or the discs were separated by an amount equal to the thickness of super-dielectric layer (for $k \gg 1$), the voltage between the disc electrodes would increase by an amount equal to the dielectric constant of the super-dielectric, k. An air gap separation would be easier to achieve in a MUMs unit due to its smaller disc size and expected better tolerances, though still a difficult task. At the time of this application, an example super-dielectric contains ionic fluids, e.g., as described in Fromille, Phillips, and the two Cortes references cited above. In the near future, ionic fluids may not be necessary as graphene, graphene oxide, and other super-dielectric materials make progress. Without ionic fluid, the air in the formed gap may be evacuated, eliminating any potential air molecule drag on the spinning discs in the formed gap as well. Additionally, the ionic fluid may be hermetically sealed in the super-dielectric matrix and its super-dielectric properties retained, so the air could also be evacuated, further reducing dissipative losses.

Manufacture of the Electrodes

Figure 42A:
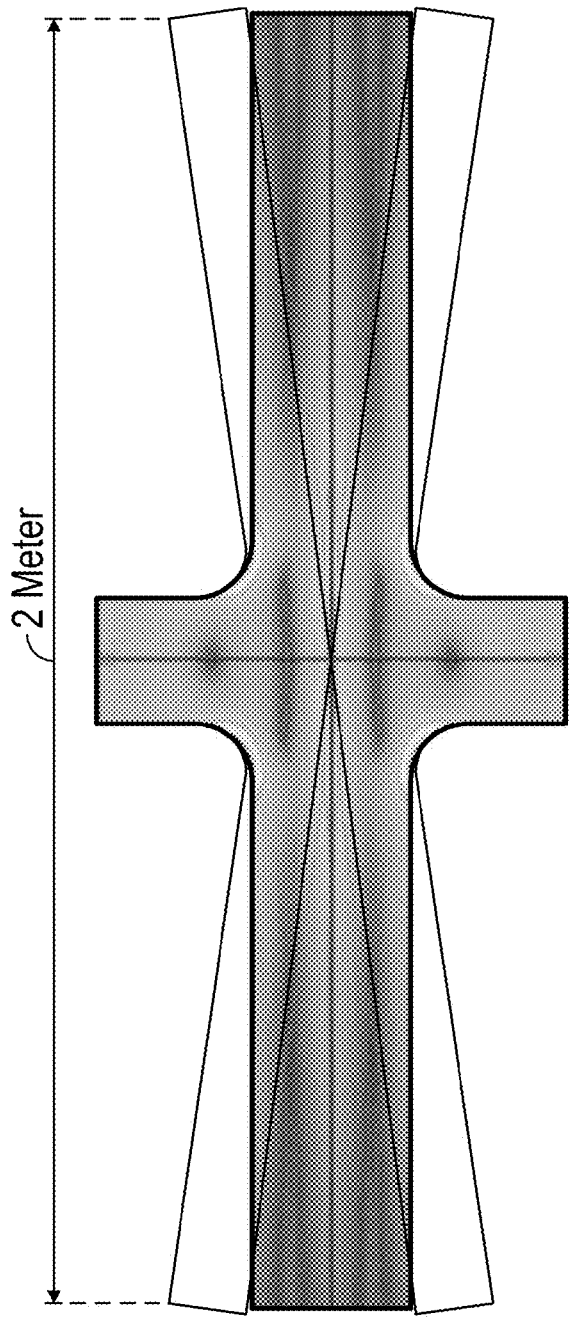
FIGS. 42A and 42B schematically illustrate the simulated pre-manufacture shapes of discs that appropriate to compensate for the intrinsic electromagnetic forces of the system; outlines are profiles of how discs should be manufactured, solids are discs' shape under operation; not to scale.
Figure 42B:
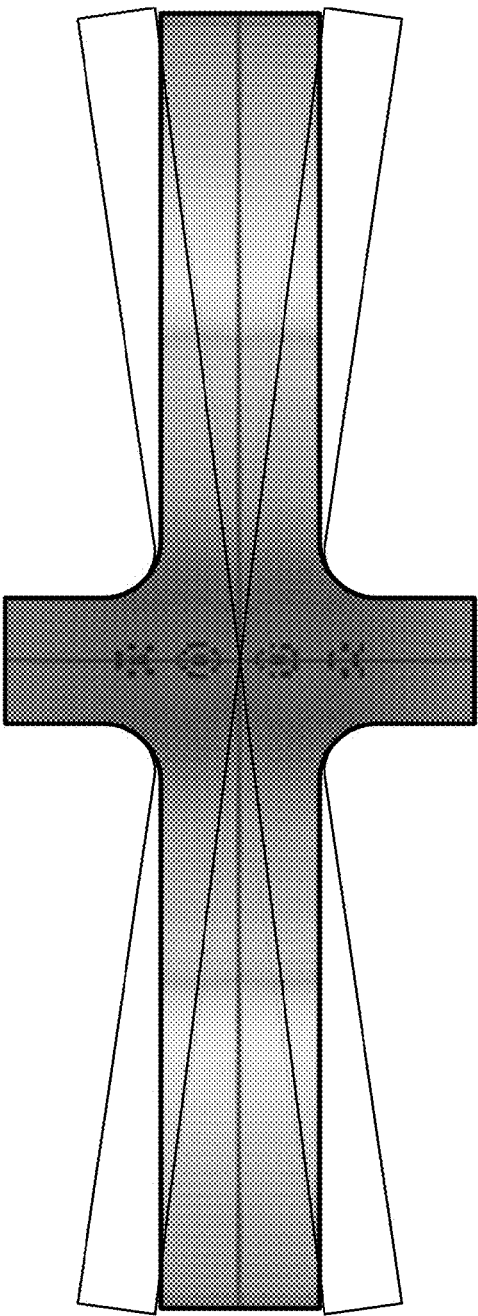

Due to the intrinsic electromagnetic stresses of the system and the centrifugal forces of rotation, the discs may strain under operation. The discs may be premanufactured to compensate for the strain/distortion they may experience when stressed such that they may be as close to flat as possible under operation. This may help in ensuring a more uniform and controllable reduction of the normal force, N. FIGS. 42A and 42B schematically illustrate the simulated pre-manufacture shapes of discs that appropriate to compensate for the intrinsic electromagnetic forces of the system; outlines are profiles of how discs should be manufactured, solids are discs' shape under operation; not to scale; FIG. 42A: stress profile (Tresca) on discs; FIG. 42B: displacement from nominal profile, electrostatic pressure deformation only (FEA). The solid models are as under operation. FIGS. 42A and 42B show a two-electrode system which creates a net moment arm on the electrodes due to the electromagnetic stresses which further creates a bending stress on the discs.

Figure 43A:
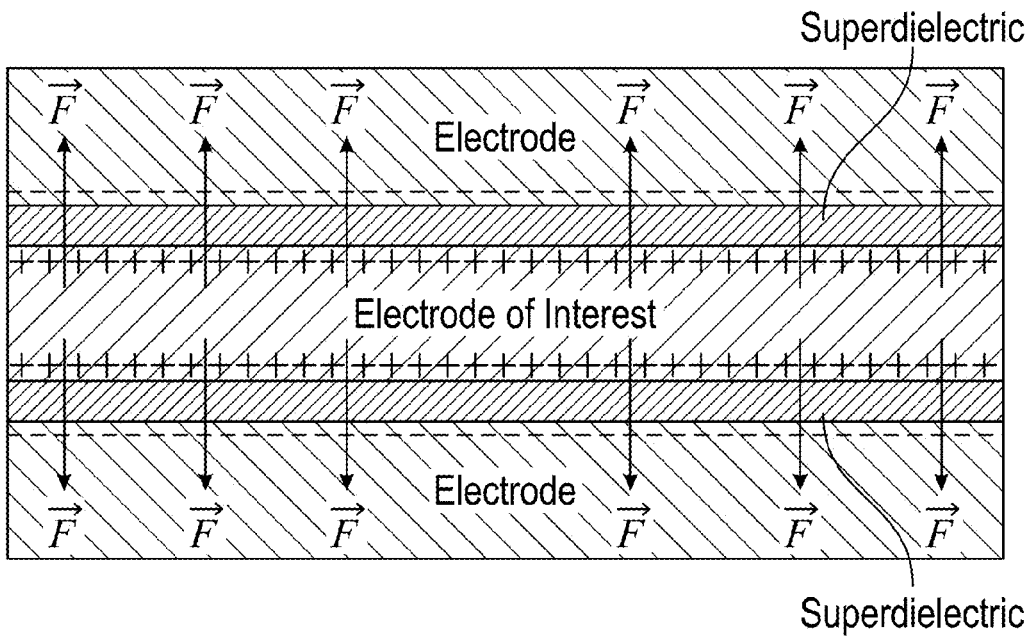
FIG. 43A schematically illustrates a cross-section of an example disc electrode that is charged on both sides and is sandwiched between two oppositely charged electrodes; the electrode of interest experiences a balanced outward electromagnetic force due to the electrostatic pressure.
Figure 43B:
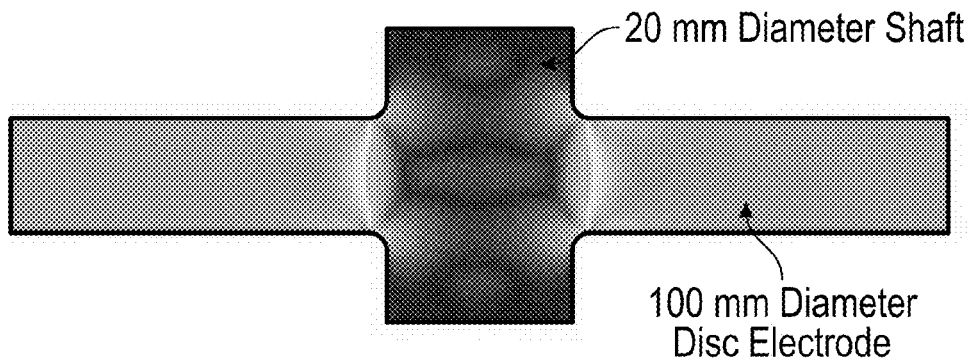
FIG. 43B illustrates a simulated stress profile (Tresca) of the electrode of interest of FIG. 43A under operation.
Figure 43C:
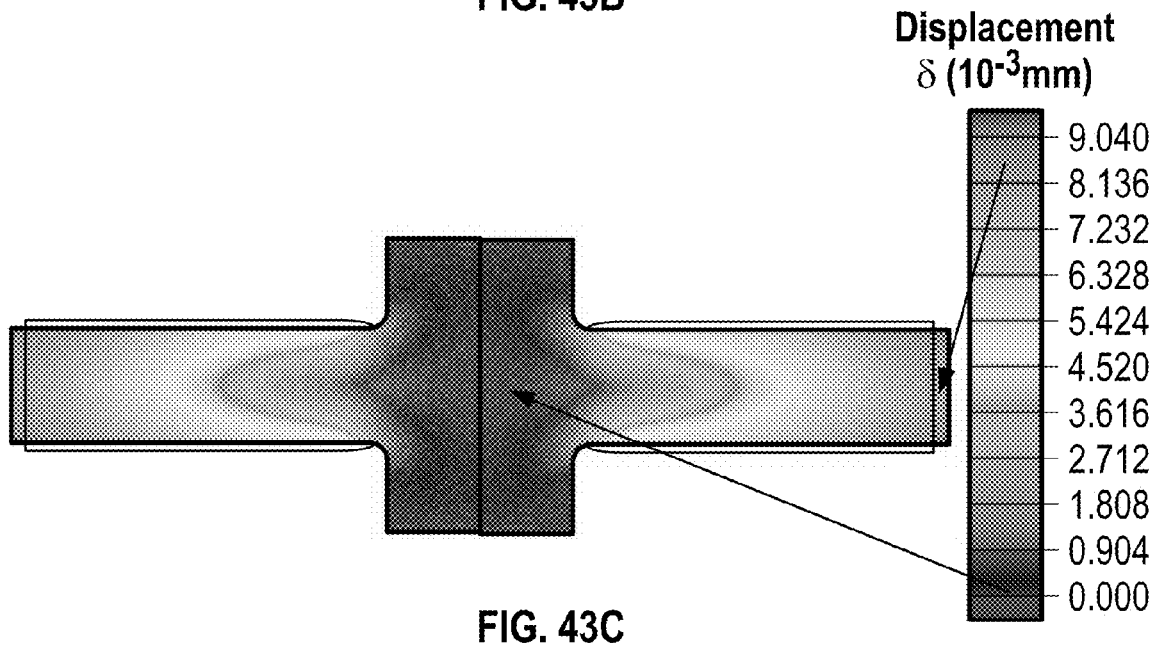
FIG. 43C illustrates simulated displacement for the electrode of interest from FIG. 43A of a modified MUMs device electrode with a 2 cm inner shaft; disc and shaft constructed of synthetic diamond; the outline illustrates the deformation of the disc under operation due to electrostatic pressure; not to scale.

A configuration can also be built where an electrode is charged on both sides much like that of FIG. 17 or the MUMs configuration described with respect to FIGS. 25A and 25B. In this situation, the electrode experiences a balancing force resulting in a net zero electrostatic force from the electrostatic pressure, see FIGS. 43A-43C. FIG. 43A schematically illustrates a cross-section of an example disc electrode that is charged on both sides and is sandwiched between two oppositely charged electrodes; the electrode of interest experiences a balanced outward electromagnetic force due to the electrostatic pressure. FIG. 43B illustrates a simulated stress profile (Tresca) of the electrode of interest of FIG. 43A under operation. FIG. 43C illustrates simulated displacement for the electrode of interest from FIG. 43A of a modified MUMs device electrode with a 2 cm inner shaft; disc and shaft constructed of synthetic diamond; the outline illustrates the deformation of the disc under operation due to electrostatic pressure; not to scale. This configuration eliminates the moment arm which previously created a bending force on the electrodes. The electrode will still experience some deformation from the electrostatic pressure as shown in FIGS. 43A-43C and may be premanufactured so that this deformation is accounted for such that the electrode is flat under operation and at an acceptable thickness. The area of the disc electrode close to the shaft need not be coated and/or participate in the production of the magnetic field. The exclusion of this area will have minimal impact on the strength of the magnetic field produced due to fact that this deformation is close to the inner radius of the disc and the inner radius contributes little to the overall effective current, see FIG. 23B. The final endcap electrodes on either side of the device assembly can be made thick and rigid so as to experience minimal deformation and provide rigidity to the system, such as in FIGS. 25A and 25B where the endcaps are much thicker than the discs themselves, with the endcaps being, e.g., one millimeter in thickness and the discs being in practice tens to a hundred microns in thickness. Also, the endcaps can be made as thick as needed to provide the appropriate rigidity, see termination caps discussed herein.

Because the electrodes are largely naturally flat in this configuration, the lowering of the normal force and/or the separation of the discs discussed herein can also be achieved by thermal expansion or shrinkage of the discs by controlling the temperature of the discs during manufacturing and operation. As can be seen in FIGS. 43A-43C, the electromagnetic attraction between the disc electrodes causes the disc to expand in the axial direction. In an example embodiment of this configuration, the disc electrodes may start out by being close to being in physical contact, but slightly separated. The disc electrodes may then be heated, assuming a positive thermal expansion coefficient material, causing the electrodes to expand, therefore reducing the gap between electrodes. The charge flowing onto the discs may be monitored and when there is a sudden rise in the current flowing onto the discs, this is an indication the system is going from a regular capacitor to a super-capacitor. This transition is an indication the discs are in extremely close proximity, sub-100 nm gap between the dielectric layer and the opposite electrode. The discs will then naturally expand towards one another due to the electric charge they now contain and the resulting electrostatic pressure; the electrodes may come into contact. If the discs come into contact or the normal force is unacceptably high, the discs can then be lowered in temperature to balance this electromagnetic expansion, thus reducing or eliminating the normal force in equation 16. This method, of course, can be used in conjunction with the thermal expansion controls discussed earlier on the shafts and/or a platen. Due to the desire to have a uniform thermal profile on the discs for this process, isotopically pure monocrystalline synthetic $C^{12}$ diamond may be an example of an ideal material, as it has a thermal conductivity of 3320 W/m-K, more than eight times more thermally conductive than copper, ensuring a highly uniform thermal profile. Even isotopically impure synthetic diamond can have thermal conductivities of 2000 W/m-K. Diamond is also mechanically very strong making it an example of an ideal material for construction of the disc electrodes though other materials may be used. For further details regarding synthetic diamond such as described above, see the following references, the entire contents of each of which are incorporated by reference herein: Bray et al., "On the thermal conductivity of diamond under changes to its isotopic character," Z. Phys. B. 84 (1): 51-57 (1991), DOI: 10.1007/BF01453758; and Qiu et al., "Thermal conductivity of natural and synthetic diamonds with differing isotope contents," Thermochimica Acta 218:257-268 (1993).

Electromagnetic-Mechanical Strain of the MUMs

Figure 44A:
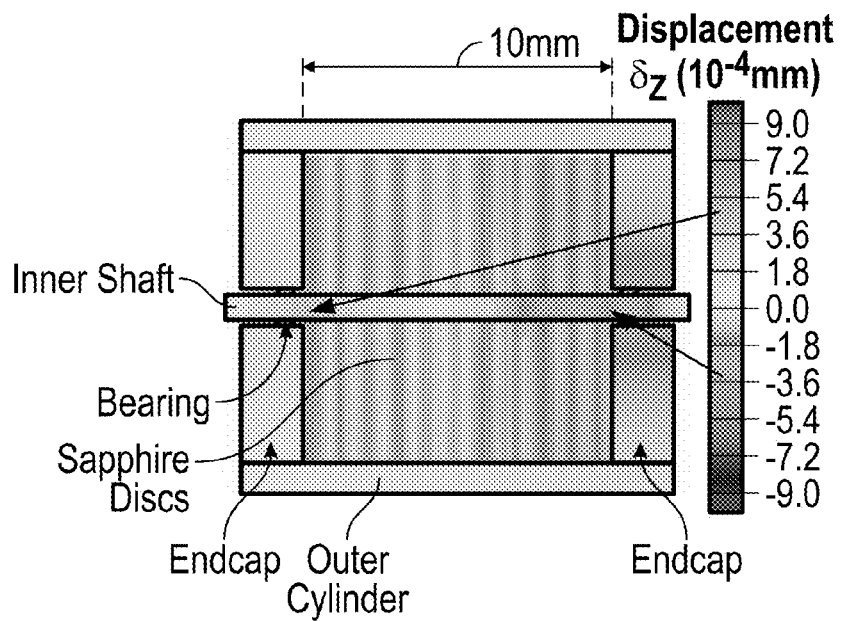
FIGS. 44A-44C illustrate simulation of the strain displacements, in an FEA model of an example MUM device, resulting from electrostatic pressure, internal magnetic stresses, and centrifugal forces; disc diameters=10 mm, disc thickness=50 microns, super-dielectric thickness=2 microns, voltage=2 V, rotation speed=100,000 RPM; only the sapphire discs are shown for clarity; discs are electrically charged from one millimeter radius to their edge at five-millimeter radius.
Figure 44B:
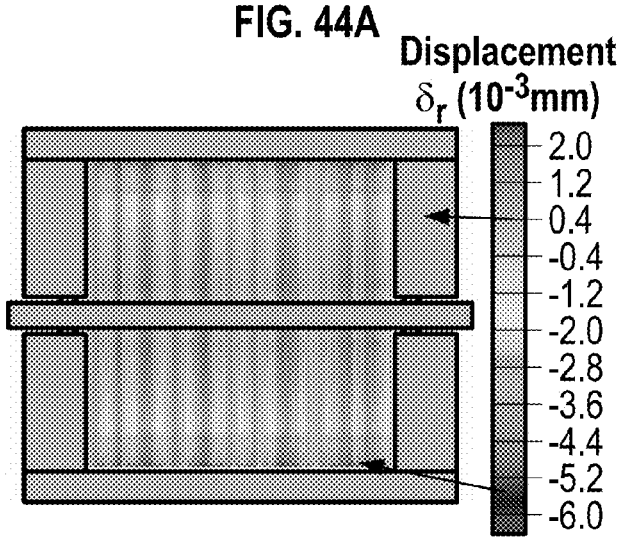
Figure 44C:
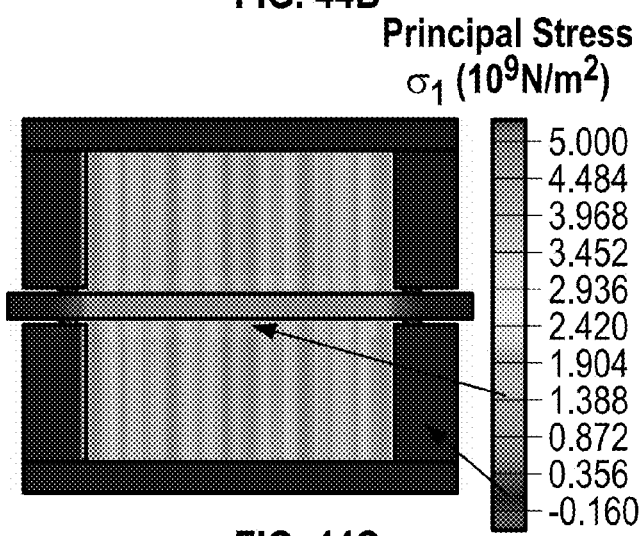

It is instructive to examine the electromagnetic-mechanical strain for a device described herein in more detail. A comprehensive simulation of the stresses and strain on a MUM device was undertaken. FIGS. 44A-44C show the displacement strains experienced by a MUM device similar to FIGS. 25A and 25B, but with the inner and outer shaft configuration of FIG. 17. More specifically, FIGS. 44A-44C illustrate simulation of the strain displacements, in an FEA model of an example MUM device, resulting from electrostatic pressure, internal magnetic stresses, and centrifugal forces; disc diameters=10 mm, disc thickness=50 microns, super-dielectric thickness=2 microns, voltage=2 V, rotation speed=100,000 RPM; only the sapphire discs are shown for clarity; discs are electrically charged from one millimeter radius to their edge at five-millimeter radius; FIG. 44A: axial displacement; FIG. 44B: radial displacement; FIG. 44C: maximum principal component of the mechanical stress tensor. The device includes or consists of 10 mm diameter sapphire inner discs of 50-micron thickness attached to a 1 mm diameter diamond inner shaft with diamond endcaps and a sapphire outside casing, also known as the outer cylinder. The example MUM operates with a $k=1\times10^9$, voltage=2 V, super-dielectric thickness=2 microns, and rotational speed of 100,000 RPM. Simulated is a mercury-less design where the outer discs are 50 μm thick diamond (not shown in FIGS. 44A-44C). The forces simulated in FIGS. 44A-44C include the electrostatic pressure between discs, the internal magnetic stresses on the device (equation 22) and the centrifugal stresses the discs experience due to rotation (equation 23). This configuration produces a magnetic field of approximately 50 Tesla. The discs are not charged until greater than two-millimeter radius, keeping electromagnetic stress deformations of the discs far from their attach point to the shaft which could result in unwanted tip/tilt distortions.

Figure 45:
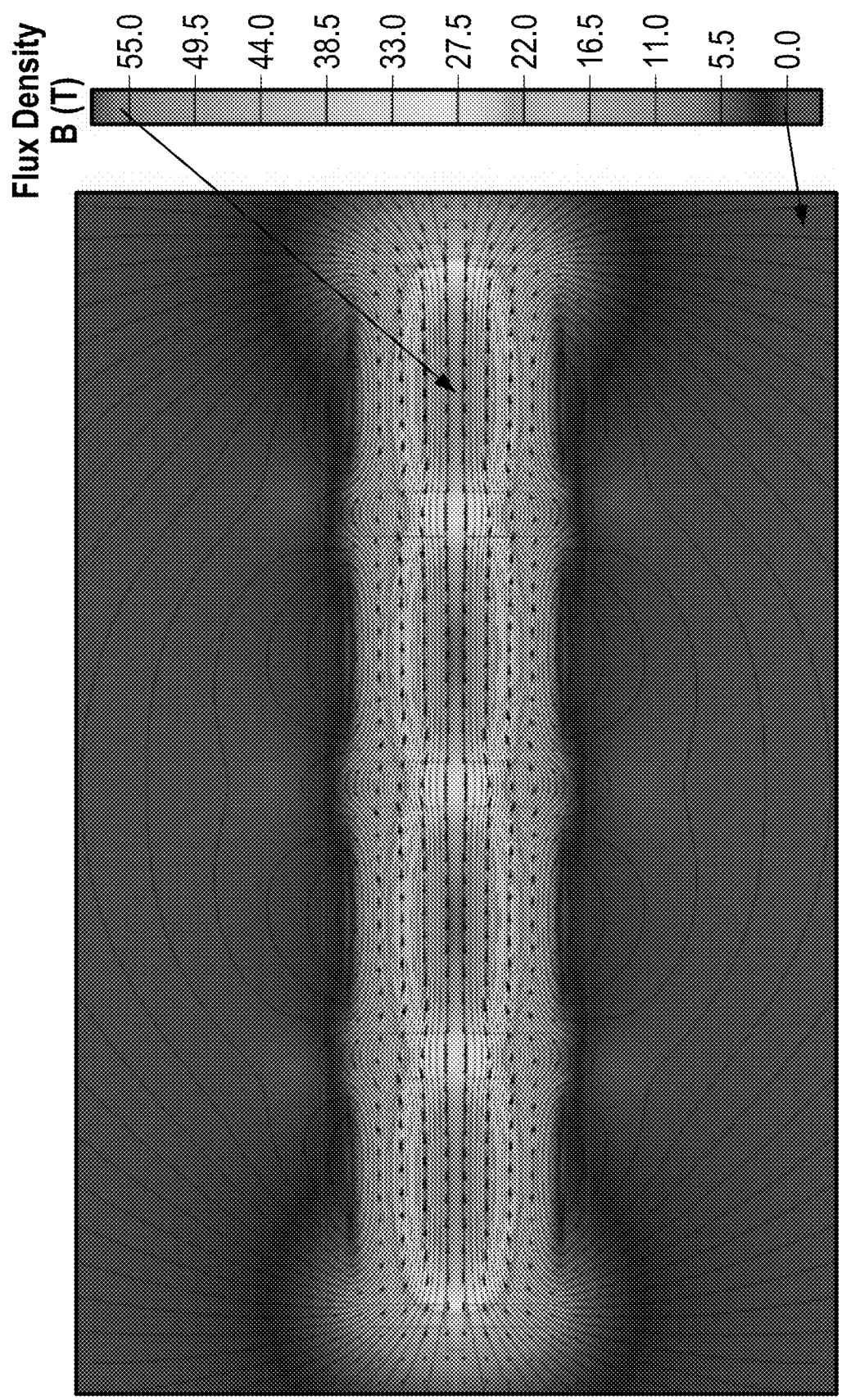
FIG. 45 illustrates the calculated flux density in an FEA model of four example MUM units attached in series; the magnetic field inside the MUM assembly is largely axial in direction.

The electrostatic pressure causes the discs to grow slightly in width which causes the discs to shrink in radius. Due to the largely axial direction of the internal magnetic fields (FIG. 45), the magneto-mechanical forces create a radial stress on the disc (via equation 22), the centrifugal forces also create a radial force on the discs (via equation 22), both causing the discs to increase their radius slightly through radial strain. FIG. 45 illustrates the calculated flux density in an FEA model of four example MUM units attached in series; the magnetic field inside the MUM assembly is largely axial in direction.

The discs themselves experience approximately a 300-nanometer axial deformation. The approximately one-micron axial displacement shown in FIG. 44A is primarily due to a ~350 nanometer flexure of the inner shaft, resulting from magneto-mechanical and centrifugal forces on the discs which then act on the shaft, ultimately resulting in a slight tip of the edge discs, FIG. 44A.

In the stress/strain analysis of FIGS. 44A-44C, the outside of the endcaps did not have a force applied to them. This was to unconfound the strains/displacements experienced by the inner discs and inner shaft from those experienced by the MUM body and outer discs. The only mechanical communication between the inner assembly, i.e., the inner shaft and the inner discs is through the bearings. The bearings are not meant to be a large load bearing member, only to keep the inner shaft centered, therefore the inner assembly and the outer assembly, i.e., endcaps, outer discs, and outer cylinder, largely act independently of one another.

Figure 46A:
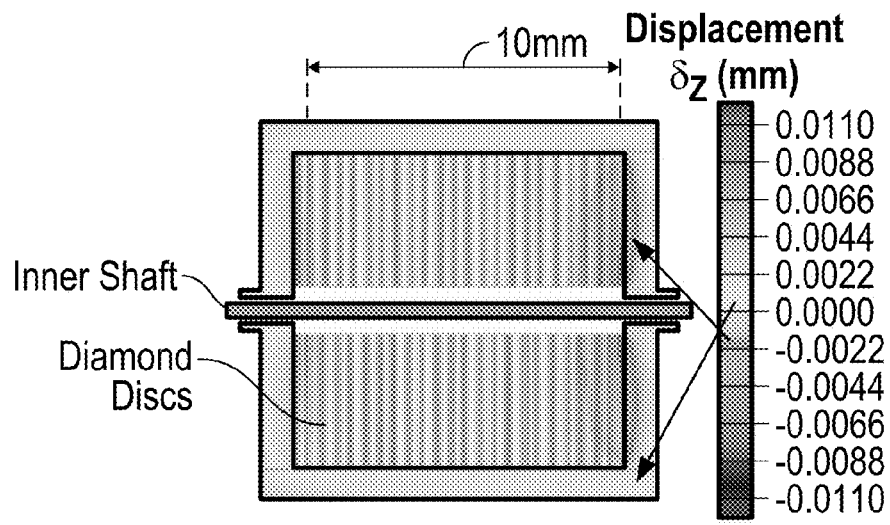
FIGS. 46A-46C illustrate simulation of the body stress and flexure, in an FEA model of an example MUM device in which endcaps hold charge and are assumed to link to another MUM or a termination cap; 10 cm diameter discs, 10 cm stack of discs, dielectric spacing=2 micron, voltage=2 volts, rotation speed=100,000 RPM.
Figure 46B:
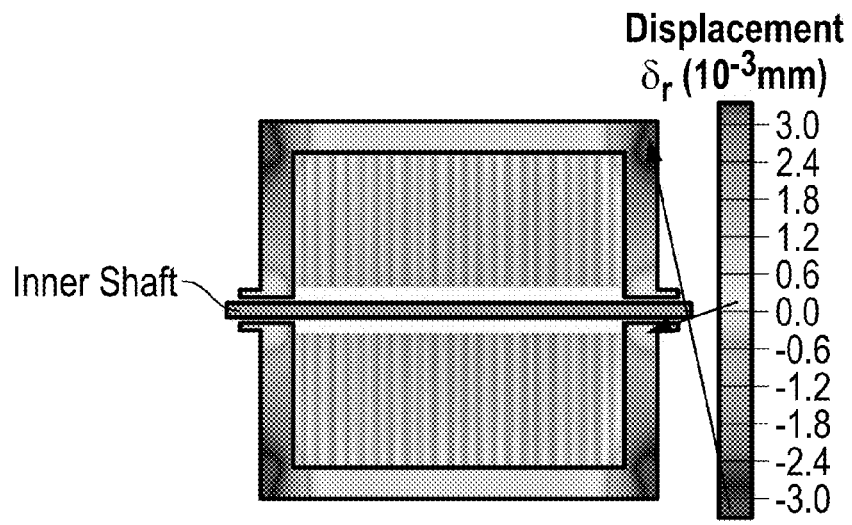
Figure 46C:
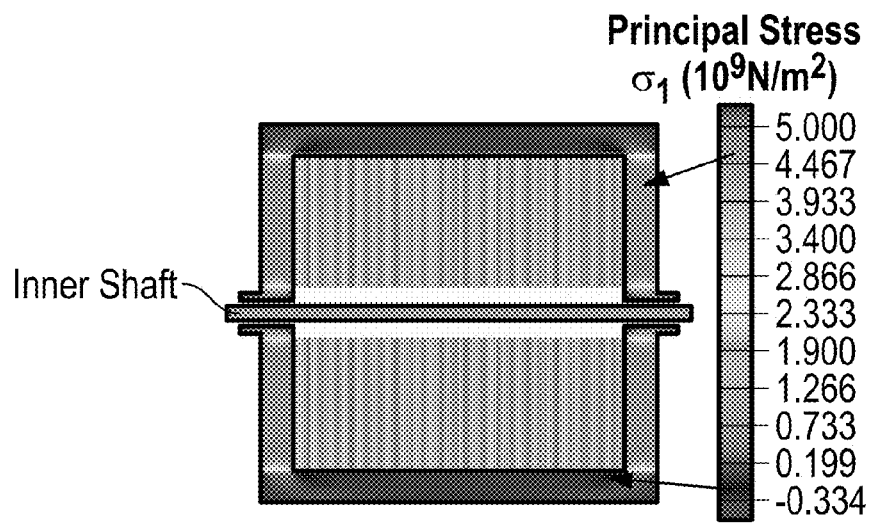

FIGS. 46A-46C show the strain deformations on the outer discs, endcaps, outer shaft, and outer cylinder portion of the MUMs under operation. More specifically, FIGS. 46A-46C illustrate simulation of the body stress and flexure, in an FEA model of an example MUM device in which endcaps hold charge and are assumed to link to another MUM or a termination cap; 10 cm diameter discs, 10 cm stack of discs, dielectric spacing=2 micron, voltage=2 volts, rotation speed=100,000 RPM; FIG. 46A: axial displacement; FIG. 46B: radial displacement; FIG. 46B: maximum principal component of the mechanical stress tensor. QuickField™. The discs themselves experience less than a 300 nm axial distortion and less than a two-micron radial shrinkage due to the electromagnetic stresses and centrifugal forces. The discs are forced outward due to magneto-mechanical forces and to a lesser degree centrifugal forces. These forces cause the outer cylinder to flex slightly which causes the discs close to the ends of the stack to bend inward slightly, the worst case being approximately ten microns from base to tip (FIGS. 46A-46C).

Several actions can be undertaken to mitigate the effects of the flexure of the discs. The discs, both inner and outer, can be premanufactured to account for this flexure so that the discs are flat or parallel when under operation. For this method, the discs may not all be the same which can make assembly more difficult, with having to keep track of which disc goes where in the stack assembly. However, the outer cylinder may be freeform manufactured to be cylindrical when loaded; this allows the discs to all be the same.

Additionally, the conductive slip joint fluid method can be employed which takes up the flexure tolerance of the discs in the fluid. Another alternative is to allow the discs to flex and press against their neighbors. The flexure distortion is localized to the outer discs, FIGS. 46A-46C, and would result in a non-uniform contact in these localized areas. This non-uniform contact would result in wear in those areas and an overall higher friction but would be limited to those localized areas and its severity may be limited and acceptable.

In FIG. 44A, the forces largely act to balance the deformations as long as the disc is sandwiched between two other likewise electrically charged elements. Physically, there must be two end elements that are unbalanced, i.e., only have one neighbor, which results in a large unbalanced force which may lead to large deformations in the device. In order to mitigate this effect, the outside of the endcaps can be coated and electrically charged similarly to the discs. The MUMs can then be linked in series. In this case, the electrostatic pressure will force the MUMs together locking them into place. This transfers the force, due to electrostatic pressure, through the endcap to the next MUMs unit. It is not necessary for the endcaps to rotate relative to one another, in fact, it is desirable to have the endcaps of one MUMs locked to the endcap of the adjacent MUMs device; this is the function of the castellations shown in FIGS. 25A and 25B but can be similarly accomplished by the electrostatic pressure locking the devices together. It should be apparent the castellations shown in FIGS. 25A and 25B can also be used in conjunction with electrostatic locking as well. If there is no electric charge, then the endcaps do not electrostatically lock, and the MUMs may be separated freely in this case.

Figure 47A:
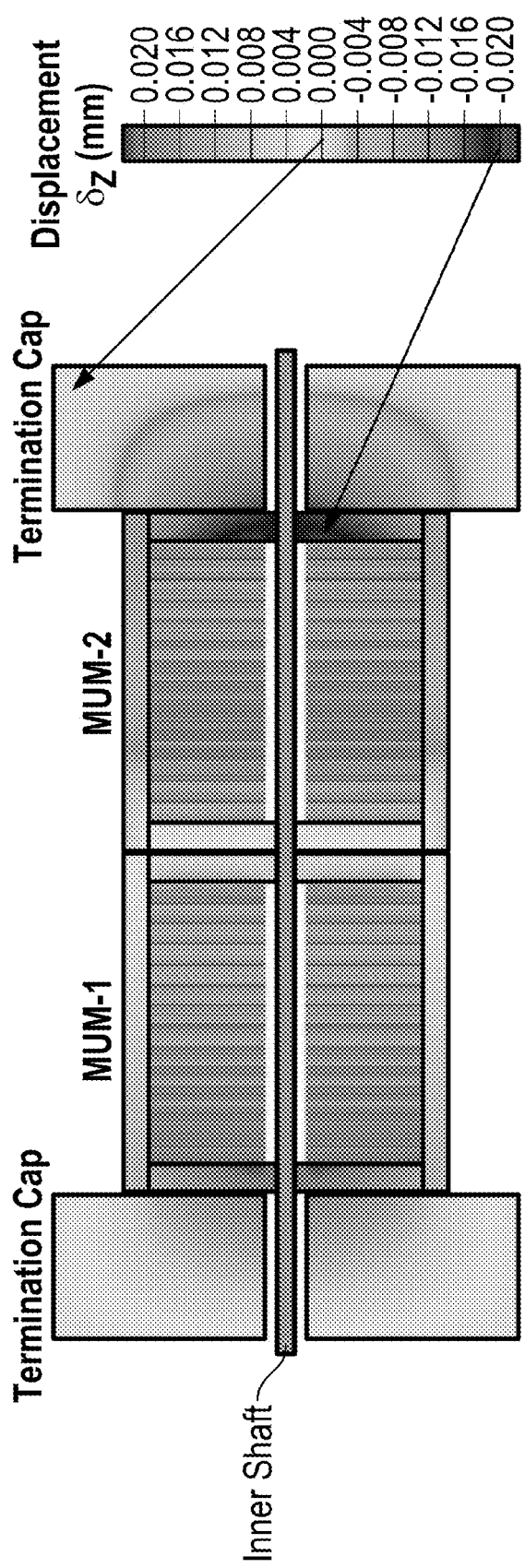
FIGS. 47A and 47B illustrate simulation of the operational deformation, in an FEA model of the multi-MUM assembly with termination caps of FIGS. 44A-44C and 45.
Figure 47B:
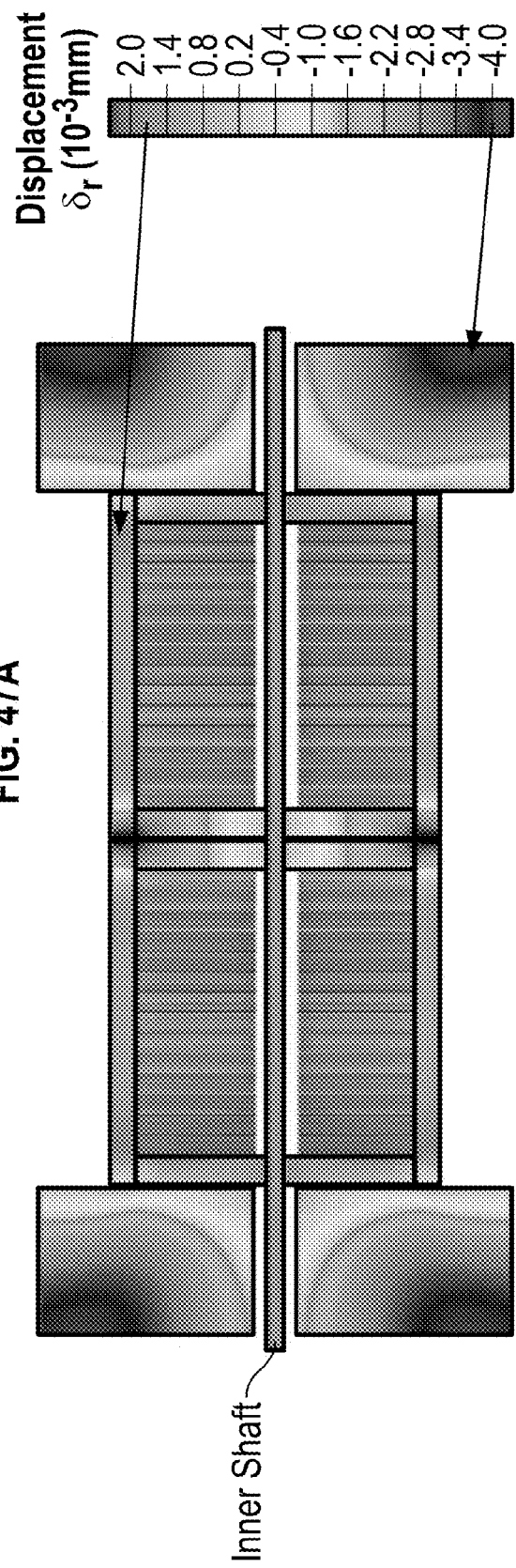

As many MUMs devices as are needed can be linked together in series in this way. The force symmetry is maintained throughout the chain until the end MUMs. The two end MUMs can then be capped with a larger structural element that is more readily able to handle the unbalanced force. This cap is named a termination cap. FIGS. 47A and 47B show a deformation simulation of two MUMs in series with structural termination caps at the end. More specifically, FIGS. 47A and 47B illustrate simulation of the operational deformation, in an FEA model of the multi-MUM assembly with termination caps of FIGS. 44A-44C and 45; FIG. 47A: axial deformation; FIG. 47B: radial deformation. As can be seen, the caps absorb the unbalanced forces, keeping the operational core of the MUMs devices in a low distortion state.

While diamond and sapphire have been used in the construction of the analyzed device, other materials may be used such that mechanical strength requirements are met for the operational needs of the device. The diamond and sapphire order in these designs may also be inverted if in the assembly process, as described earlier, the heating and cooling of the components during assembly are reversed. Presented here is only one example of many possibilities.

The deformation strains on a MUM device have been analyzed with a fixed set of parameters (rotational speed, dielectric thickness, voltage, disc thickness and spacing, etc.). The stresses may be more or less depending on how hard the device is driven and the performance required from the device.

Metallization Considerations

Consideration should be paid to the strength of the adhesion of metal to the electrodes. In most of the examples disclosed herein the electrodes are made of super strong, non-electrically conductive material. To make the electrodes capable of moving and holding electrical charge, the electrodes are coated with thin film metal coatings. In some examples, these metal films are captive, i.e., sandwiched between two rigid structures such as shown in FIG. 44A. The metal films transfer their stresses to the structures captivating them. The electrodes may be very slightly separated in order to reduce or eliminate the normal force in equation 14 and 16 to near zero, thus reducing friction, wear, and dissipative power in the device to minimal values. In a full electrode separation case, the metal may bear the brunt of the electromagnetic stresses and the metal's adhesion becomes important.

Metal adhesion when the delamination force is normal to the thin film can be expressed as $$\gamma = \frac{t}{2K}\sigma_f^2 \tag{24}$$

where $\gamma$ is the work of adhesion, K is the bulk modulus of the metal film material, t is the thickness of the metal film, and $\sigma_f$ is the adhesion strength.

Strong adhesion can be achieved at a chemical level. Diamond is a carbon allotrope, therefore using metals that have high affinities for carbon can provide extreme adhesion strength, such as Aluminum, Copper, or Titanium. It has been shown that titanium can have a work of adhesion to diamond up to 5.77 Joules/meter$^2$. With a 50 nm thick titanium film this translates into an adhesion strength of approximately $5.6 \times 10^9$ N/m$^2$. Similarly, sapphire bonds well with metals that have an affinity for oxygen, such as chromium or aluminum. Since sapphire's chemical composition is $Al_2O_3$ which contains aluminum, it is possible to directly diffusion bond aluminum to sapphire which gives a bonding strength similar to that of the strength of the substrate material itself. Strong metal adhesion bonds can be obtained which allows for operation of the devices even with electrode separation. For further details regarding adhesion at diamond/material interfaces, see the following references, the entire contents of each of which are incorporated by reference herein: Guo et al., "Adhesion at diamond/metal interfaces: a density functional theory study," University of South Carolina Scholar Commons, Faculty Publications, Department of Mechanical Engineering (2010); and Gab et al., "Metal-to-sapphire brazed and diffusion bonded windows for optics, ultra-high vacuum technics and electronics for maintenance at temperatures 77-800 K," Proc. Int. Conf. High Temperature Capillarity, Cracow, Poland, Ed. N. Eustathopoulos et al. (1997).

Additionally, it is worth noting that the super-dielectric layer itself does not hold free charge, but rather holds electric dipoles in the isolated portions of ionic liquid within the super-dielectric matrix, therefore the super-dielectric material experiences zero net electromagnetic forces as it has a net zero electric charge. Technically, from a Drude model perspective the dipoles will expand slightly due to the electric forces, but that expansion can be ignored due to the extremely small amount of that expansion at the molecular level, i.e., sub-angstroms, and in a lattice-less liquid as the example in which the super-dielectric material includes an ionic fluid.

Energy Storage Devices

It should be readily apparent the devices described in the present application are capable of storing energy. Energy can be stored as electrostatic energy; as charge on the electrodes of the devices. Energy in electrostatic fields may be described by $$WE = \frac{1}{2}CV2, \quad (25)$$

where WE is the energy stored in the electrostatic field, C is the capacitance of the device, and V is the voltage applied to the device.

In addition to the electrostatic energy, energy is also stored in the magnetic fields generated by the devices. Energy stored in the magnetostatic fields may be described by $$W_B = \frac{1}{2}LI^2, \quad (26)$$

where $W_B$ is the energy stored in the magnetostatic field, L is the inductance of the device, and I is the effective current of the device. Alternatively, the magnetostatic energy density can be described by $$U_B = \frac{B^2}{2\mu}, \quad (22)$$

where $U_B$ is the magnetostatic energy density, B is the magnetic flux density, and μ is the magnetic permeability of the material the field exists in (in this case μ is assumed to be that of free space). The total magnetic energy stored can be calculated by integrating $U_B$ over all space.

Energy Storage Device

The approximate capacitances are easily calculated using geometrical capacitances. These equations ignore the fringe electric fields but are nonetheless accurate enough to give very good approximations to the energy stored as electric charge on the devices and thus the energy stored in the electric fields of the device.

The magnetic fields have been simulated and the total magnetic energy stored in the fields has been calculated using equation (10) integrated over a 100 meter diameter sphere centered on the devices in question. The magnetic field beyond this range has negligible contribution to the total energy and can be ignored.

Example Energy Storage Devices

MUM

Figure 48:
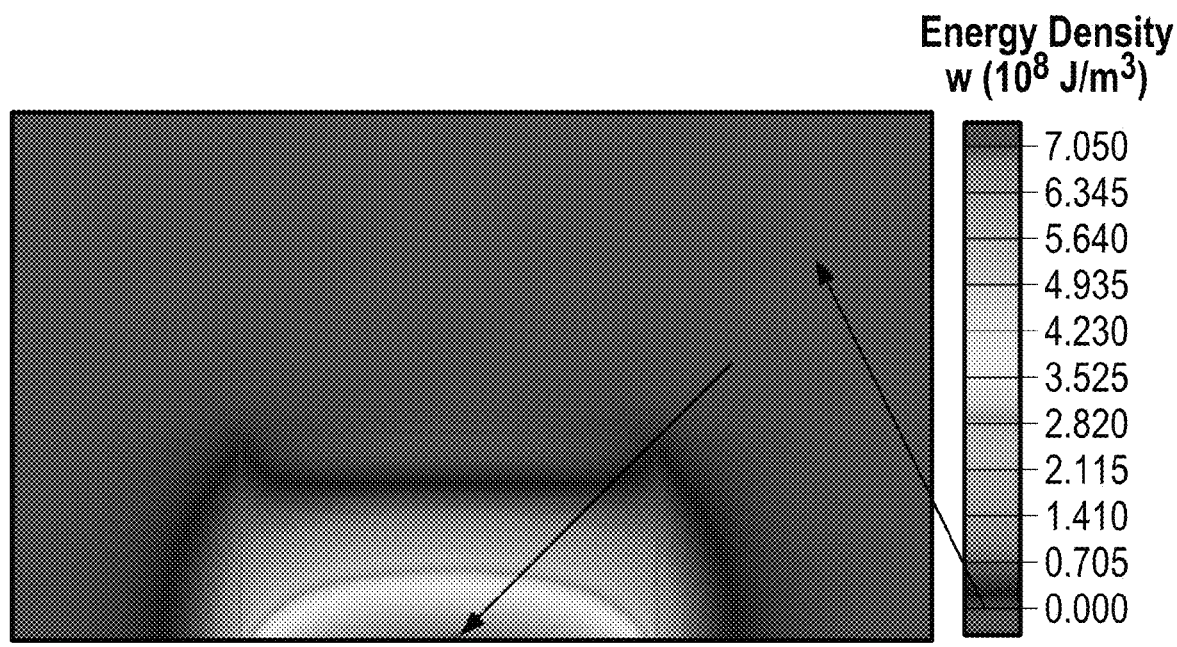
FIG. 48 illustrates the calculated energy density in an FEA model of an example MUM magnetic core that is 1 cm long×1 cm diameter; electrode spacing=60 microns; super-dielectric thickness (SDt)=2 microns; RPM=100,000; dielectric constant k=1×10$^9$, voltage=2 V.

FIG. 48 illustrates the calculated energy density in an FEA model of an example MUM magnetic core that is 1 cm long×1 cm diameter core with a 60 micron electrode spacing, dielectric constant k=1×10⁹, RPM=100,000, super-dielectric layer thickness (SDt)=2 microns, and voltage=2 V. Table 11 shows the energy stored both in the electric field and magnetic field for a number of electrode spacings and dielectric thicknesses, all other parameters being same as in FIG. 48. These values are for a mid-grade MUM base unit; as can be seen in Table 11, these numbers can be improved significantly by using a higher performance MUM.

TABLE 11

| Electrode Spacing (um) | E-SDt (1 micron) | E-SDt (2 microns) | B-SDt (1 micron) | B-SDt (2 microns) |
|---|---|---|---|---|
| 500 | 55.6 | 27.8 | 5.1 | 1.3 |
| 200 | 139.1 | 69.5 | 31.6 | 7.9 |
| 100 | 278.2 | 139.1 | 126.4 | 31.6 |
| 80 | 347.7 | 173.9 | 197.5 | 49.4 |
| 60 | 463.6 | 231.8 | 351.0 | 87.8 |
| 40 | 695.4 | 347.7 | 789.8 | 197.5 |
| 20 | 1390.8 | 695.4 | 3159.2 | 789.8 |
| 10 | 2781.6 | 1390.8 | 12637.0 | 3159.2 |

Table 11 shows Electric and Magnetic energy stored in MUM device (Joules). E-SDt (1 micron) is energy stored in the electric field with a 1 micron super-dielectric thickness layer, E-SDt (2 microns) is energy stored in the electric field with a 2 micron super-dielectric thickness, B-SDt (1 micron) is energy stored in the magnetic field with a 1 micron super-dielectric thickness layer, and B-SDt (2 microns) is energy stored in the magnetic field with a 2 micron super-dielectric thickness layer. The MUM unit described in the example in the text is in the row with 60 micron spacing.

Individually, the MUM device may not be overly impressive for energy storage, however, due to its compact size and stackability, a large number of MUMs can fit into a relatively small volume. For example, without the exostructure, approximately 575,000 MUMs can theoretically fit into a cube one meter on a side, the total MUM size including endcaps and outer casing, being 12 mm×12 mm. Using the device shown in FIG. 48, the combined electric and magnetic field energy storage for a one cubic meter space equates to approximately 185 million joules of energy storage or about enough energy to power the average 2000 sq ft home for about 36 hours. This energy storage grows as the cube of the size of the overall device assembly, as an example a 10 meter×10 meter×10 meter cube of MUMs theoretically can store approximately 185 billion joules of energy or about three minutes of power output by the average nuclear power plant.

MDU

Figure 49:
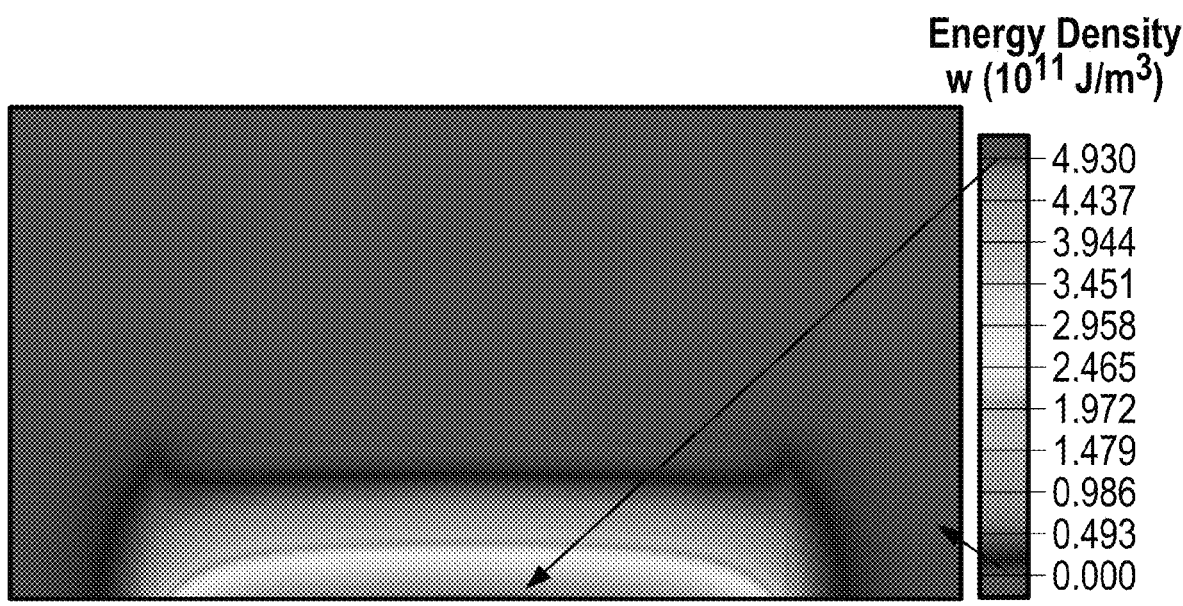
FIG. 49 illustrates the calculated energy density in an FEA model of an example MDU that is 2 meter long×1 meter diameter; electrode spacing=1 cm; super-dielectric thickness (SDt)=5 microns; RPM=100,000; dielectric constant k=1×10$^9$, voltage=2 V.

FIG. 49 illustrates the calculated energy density in an FEA model of an example MDU that is 2 meter long×1 meter diameter with a 1 centimeter electrode spacing, dielectric constant k=1×10⁹, RPM=100,000, super-dielectric layer thickness (SDt)=5 microns, and voltage=2 V. Table 12 shows the energy stored both in the electric field and magnetic field for a number of electrode spacings and dielectric thicknesses, all other parameters being the same as in FIG. 49. Table 12 shows Electric and Magnetic energy stored in MDU device (Joules). E-SDt represents energy stored in the electric field for the super-dielectric thickness indicated in parenthesis. B-SDt is the corresponding energy stored in the magnetic field of the device. The MDU described in the example in the text is included in the row with 1 cm electrode spacing.

TABLE 12

| Electrode Spacing (cm) | E-SDt (1 micron) | E-SDt (2 microns) | E-SDt (5 microns) | E-SDt (10 microns) | B-SDt (1 micron) | B-SDt (2 microns) | B-SDt (5 microns) | B-SDt (10 microns) |
|---|---|---|---|---|---|---|---|---|
| 2 | 2.782E+06 | 1.391E+06 | 5.563E+05 | 2.782E+05 | 7.402E+11 | 1.851E+11 | 2.961E+10 | 7.402E+09 |
| 1.8 | 3.091E+06 | 1.545E+06 | 6.181E+05 | 3.091E+05 | 9.138E+11 | 2.285E+11 | 3.655E+10 | 9.138E+09 |
| 1.6 | 3.477E+06 | 1.739E+06 | 6.954E+05 | 3.477E+05 | 1.157E+12 | 2.891E+11 | 4.626E+10 | 1.157E+10 |
| 1.4 | 3.974E+06 | 1.987E+06 | 7.948E+05 | 3.974E+05 | 1.511E+12 | 3.777E+11 | 6.043E+10 | 1.511E+10 |
| 1.2 | 4.636E+06 | 2.318E+06 | 9.272E+05 | 4.636E+05 | 2.056E+12 | 5.140E+11 | 8.225E+10 | 2.056E+10 |
| 1 | 5.563E+06 | 2.782E+06 | 1.113E+06 | 5.563E+05 | 2.961E+12 | 7.402E+11 | 1.184E+11 | 2.961E+10 |
| 0.8 | 6.954E+06 | 3.477E+06 | 1.391E+06 | 6.954E+05 | 4.626E+12 | 1.157E+12 | 1.851E+11 | 4.626E+10 |
| 0.6 | 9.272E+06 | 4.636E+06 | 1.854E+06 | 9.272E+05 | 8.225E+12 | 2.056E+12 | 3.290E+11 | 8.225E+10 |
| 0.4 | 1.391E+07 | 6.954E+06 | 2.782E+06 | 1.391E+06 | 1.851E+13 | 4.626E+12 | 7.402E+11 | 1.851E+11 |
| 0.3 | 1.854E+07 | 9.272E+06 | 3.709E+06 | 1.854E+06 | 3.290E+13 | 8.225E+12 | 1.316E+12 | 3.290E+11 |
| 0.2 | 2.782E+07 | 1.391E+07 | 5.563E+06 | 2.782E+06 | 7.402E+13 | 1.851E+13 | 2.961E+12 | 7.402E+11 |
| 0.1 | 5.563E+07 | 2.782E+07 | 1.113E+07 | 5.563E+06 | 2.961E+14 | 7.402E+13 | 1.184E+13 | 2.961E+12 |

As can be seen, due to the MDU's larger size and stronger magnetic fields (magnetic energy density goes as the magnetic field strength squared), the MDU devices can store immense energy in their magnetic fields, even more than the multi-MUM assemblies described herein. To wit, the MDU shown in FIG. 49 theoretically can store the energy equivalent to roughly two minutes of energy output of the average nuclear power plant despite its relatively small size. This example is for a relatively mid-tier MDU. In the extreme MDU example, a 1 micron super-dielectric layer thickness, with a 1.0 mm electrode spacing, an MDU 2 meters long×1 meter in diameter can theoretically store 80 hours of energy output from a nuclear power plant; though there are a number of practical considerations for the construction and operation of such an extreme example.

It is also worth noting the energy stored in the magnetic fields dwarfs the energy stored in the electric fields for MDU and MCU units (with MCU units having very similar performance characteristics to the MDUs). Electric field energy storage is the most common and preferred method of energy storage at the time of this application; little to no consideration has been given to using magnetic field energy storage.

The usefulness of such energy storage devices should be apparent; acting as power backup, power black out prevention, energy storage for intermittent power sources (such as wind or solar farms), and potentially remote power sources for vehicles, be they cars, trucks, ships, submarines, planes, trains, construction equipment, spacecraft, etc.).

The strength of the magnetic field is directly proportional to the rotational speed of the electrodes. Since the energy stored in the magnetic fields goes as the square of the magnetic field strength (equation 10), this implies the energy storage goes as the square of the rotational speed of the electrodes. Therefore, great attention to maximizing the rotational speed of the device electrodes is paramount. It should be obvious that relatively slow-moving turbines such as with windmills and the like can be geared to produce high rotational rates in the devices described herein.

While electrostatic energy storage devices, such as super-capacitors, experience bleed off of charge over time, even when not in use, the magnetic energy storage devices presented herein will also lose energy over time due to dissipative forces such as friction of the bearings and fluid drag; or point contact friction if a design like that of FIGS. 38A and 38B is used. These non-conservative force energy losses, i.e., frictional losses, can be made small in comparison to the amount of energy stored in the fields, thus the device can store energy for an extended period of time. The frictional forces will generate heat, this heat can be captured and turned back into rotational mechanical energy through a Stirling engine or similar heat reservoir device or devices that convert heat gradients into mechanical or electrical energy. The point being there will be some losses over time of the stored energy, however, these losses can be mitigated through clever design and energy management, thus, the useful energy storage period can be extended for any of the magnetic devices discussed herein once the original power source has been lost or removed.

Accordingly, it may be understood that in in operation, the present dynamic supercapacitors may store substantial energy both as electrical energy, i.e., charge built up on the plates, and as magnetic energy, the magnetic fields containing energy in their volume, equation 27. The electrical energy may be extracted similarly as in a conventional capacitor, for example by applying an electrical load between the electrodes and allowing the voltage potential between the electrodes to drive current through the load. The magnetic energy may be extracted and used through Faraday's law, equation 30, or in a more practical form for this situation, $$\text{emf} = -\frac{d\varphi_m}{dt}$$

where emf is the electromotive force and om is the magnetic flux. More simply, the rate of change of the magnetic flux produces an emf that may be used to drive current. In this way, conducting coils or windings may be passed through the magnetic field of the DSC and due to the changing magnetic flux these coils or windings experience an emf will exist on their terminals. If those coils or windings are attached to a circuit, they will drive current and thus convert magnetic energy into electrical energy. The rate at which magnetic energy will be converted to electrical energy depends on the geometry of the conductors, the rate at which they pass through the DSC field, and where in the DSC field they are passing. Drives, coupled with a controller such as described with reference to FIG. 103, may be be used to control the speed and path of the conductors, coils, or windings through the DSC field as well as monitor the amount of energy extracted from the fields in real time. In this way, as much or as little energy as desired, or may exist in the field, may be extracted from the magnetic field of the DSC and converted to electrical energy in the form of voltage and current. Alternatively, the conductors, coils, or windings may remain stationary, and the DSC may move around and/or through the geometry of the conductors, coils, or windings (e.g., using an appropriate drive under the control of the controller), producing an emf in the conductors, coils, or windings similarly.

Approximation of the Stated Performances

Tables 1, 2, 3, 4, 5, 6, 8, and 9 show the peak magnetic field simulation results for a number of the designs described in the present application. Similarly, tables 11 and 12 show electrostatic and magnetostatic energy storage potential of the described devices. It should be strongly pointed out that these are approximations and not exact values.

First, where magnetic fields are concerned in the data, these are magnetostatic finite-element method simulation results; which by their nature are approximations, though typically accurate depending on simulation mesh density and model convergence.

Secondly, the charge capacity, capacitance, of the electrodes was calculated using the equations well known in the art. These equations ignore the fringe electric fields that exist outside the electrode gaps, i.e., they only consider the fields between the two electrodes. This approximation was done for computational efficiency. The full charge capacity of the two oppositely polarized electrodes is given by $$C = \frac{1}{(\text{Voltage})^2} \int \int \int_V \vec{E} \cdot \vec{D} dV \qquad (28)$$

where C is the capacitance, Voltage is the voltage potential between the two electrodes, $\vec{E}$ is the electric field strength and $\vec{D}$ is the electric displacement field. The dot product between $\vec{E}$ and $\vec{D}$ is integrated over all space, V. As an example of the difference, the capacitance for a MUM pair of electrodes 1.0 cm in diameter with a 10 micron super-dielectric gap with k=1×10$^9$ is calculated to be about 0.06954 Farads using the approximate equation well known in the art, whereas when the full field is taken into account the capacitance is 0.06955 Farads. The difference is insignificant due to the vast bulk of the energy being stored in the field inside the super-dielectric between the electrodes. In fact, the small difference may just be rounding error. The equations well known in the art are significantly accurate and valid for the results given.

Thirdly, when using a conductive slip-joint fluid, the conductive fluid in the vicinity of the electrodes will hold a charge opposite to that the electrode. This charge will primarily be on the surface of the fluid in contact with the dielectric. While care has been taken to ensure the fluid does not stick to the electrode/super-dielectric, some momentum will inevitably be transferred to the conductive fluid at this boundary which will diminish the total effective current somewhat which in turn will diminish the net magnetic field somewhat. The super-dielectric fluid and fluid layers shown in FIGS. 5A and 5B do not suffer this drawback, nor does the point contact slip design shown in FIGS. 38A and 38B, also known as the mercury-less design. The non-super-dielectric fluid layer and point contact slip design designs may suffer from a small decreased charge capacity due to the gap between the electrodes not being fully filled with super-dielectric material. The super-dielectric fluid layer shown in FIGS. 5A and 5B does not suffer the loss in charge capacity, however, such a fluid does not exist at the time of this application, though it is likely it could be engineered. The bottom line is, the stated results are representative of what can be achieved with the present methods and devices but should be understood to be approximations.

Accordingly, it will be appreciated that some examples herein provide a method for generating a magnetic field. The method may include accumulating positive charges at a first electrode; accumulating negative charges at a second electrode; and rotating the first electrode relative to the second electrode so as to induce a relative angular velocity between the positive charges and the negative charges and thus generate a magnetic field. Nonlimiting examples of such a method are described with reference to FIGS. 4, 5A-5B, 7-9, 12-14, 16-18, 22A-22B, 25A-25B, 26, 33A-33B, 34A-34B, 41A-41B, and/or 43A.

In some examples, a dielectric material is disposed between the first and second electrodes. Nonlimiting examples of dielectric materials are described further above, e.g., with reference to FIGS. 6A-6B and 38A-38B. In some examples, the dielectric material has a dielectric constant greater than 10$^5$. That is, the dielectric material may in some examples be or include a super-dielectric material such as described elsewhere herein. In some examples, the super-dielectric material includes a super-dielectric matrix and an ionic liquid and may be configured in a manner such as described elsewhere herein and as exemplified in the Working Examples. In some examples, the dielectric material includes a plurality of curved surfaces that contact the first electrode or the second electrode at respective points, e.g., in a manner such as described with reference to FIGS. 38A-38B. In some examples, a lubricating fluid occupies dead spaces between the curved surfaces, e.g., in a manner such as described with reference to FIGS. 38A-38B. Nonlimiting examples of lubricating fluids are provided elsewhere herein.

In some examples, the first and second electrodes include parallel plates, e.g., in a manner such as described with reference to FIGS. 13, 14, 17, 18, 25A-25B, 26, 33A-33B, 34A-34B, 41A-41B, and/or 43A.

In some examples, the first and second electrodes include concentric spheres, e.g., in a manner such as described with reference to FIGS. 22A-22B.

In some examples, the first and second electrodes include concentric cylinders, e.g., in a manner such as described with reference to FIGS. 7, 8, 9, and/or 12.

In some examples, the first electrode or the second electrode includes a conductive fluid. In some examples, the conductive fluid includes mercury. Use of mercury as a conductive fluid is described in greater detail elsewhere herein.

Some examples herein provide a device. For example, FIG. 103 schematically illustrates example components of a device 1000 for generating an ultrahigh magnetic field such as provided herein. The device 1000 may include a first electrode and a second electrode (not specifically illustrated). In a manner such as described with reference to FIGS. 4, 5A-5B, 7-9, 12-14, 16-18, 22A-22B, 25A-25B, 26, 33A-33B, 34A-34B, 41A-41B, and/or 43A, the device further may include a dielectric material disposed between the first and second electrodes such that the first electrode can accumulate positive charge and the second electrode can accumulate negative charge. As illustrated in FIG. 103, device 1000 may include a drive mechanism configured to rotate the first electrode relative to the second electrode so as to induce an angular velocity between the positive charges and the negative charges and thus generate a magnetic field. For example, device 1000 may include Drive 1 coupled to a shaft and configured to rotate the shaft in a manner such as described elsewhere herein. Additionally, or alternatively, device 1000 may include Drive 2 coupled to the outer shell and configured to rotate the shell in a manner such as described elsewhere herein. In a manner such as described elsewhere herein, the shaft optionally may be hollow and may include a Working Area within the shaft which is accessible via a shaft inlet in a manner such as illustrated in FIG. 103 and described with reference to FIGS. 23A-23B. Additionally, or alternatively, multiple devices may be coupled together and a space between the devices used as a Working Area in a manner such as described with reference to FIGS. 24 and 35B. Additionally, or alternatively, a space outside of the device may be used as a Working Area.

As illustrated in FIG. 103, the drive(s) (e.g., drive 1 and drive 2) may receive power from a power source and may be controlled by a controller. Nonlimiting examples of the power source may include a combustion engine (e.g., using hydrogen and oxygen or hydrocarbon and oxygen), a nuclear reactor (e.g., fusion or fission), a battery, a hydrogen fuel cell, capacitors, or supercapacitors. The controller may be configured to control the drive(s) so as to cause the shaft and outer shell to have a suitable angular velocity relative to one another as to generate a magnetic field of suitable strength within the Working Area. Optionally, the device 1000 may include one or more sensors which are located inside of the working area and/or outside of the outer shell. The controller may receive signals from the sensors based upon which the controller may adjust operation of drive 1 and/or drive 2. For example, the controller may be used to control the friction and/or separation of the rotating electrodes through a closed loop feedback system, such as with temperature sensors and thermoelectric coolers and/or strain sensors. The controller can be implemented using any suitable combination of hardware and software. In some examples, the functionalities of the controller can be provided by a suitably programmed field-programmable gate array (FPGA) or application-specific integrated circuit (ASIC). FPGAs and ASICs are commercially available, and methods of programming same to achieve desired logical programming are known in the art. In still other embodiments, the functionalities of the controller can be provided by a suitably programmed computer, e.g., a personal computer including a processor and a non-transitory computer-readable medium storing instructions to cause the processor to perform the steps of the present methods or to implement the functionality described herein. Alternatively, the processor can include a digital processor, such as a central processing unit (CPU) or graphics processor unit (GPU), or an analog processor.

Nonlimiting examples of dielectric materials are described further above, e.g., with reference to FIGS. 6A-6B and 38A-38B. In some examples, the dielectric material has a dielectric constant greater than $10^5$. That is, the dielectric material may in some examples be or include a super-dielectric material such as described elsewhere herein. In some examples, the super-dielectric material includes a super-dielectric matrix and an ionic liquid and may be configured in a manner such as described elsewhere herein and as exemplified in the Working Examples. In some examples, the dielectric material includes a plurality of curved surfaces that contact the first electrode or the second electrode at respective points, e.g., in a manner such as described with reference to FIGS. 38A-38B. In some examples, the device further includes a lubricating fluid occupying dead spaces between the curved surfaces, e.g., in a manner such as described with reference to FIGS. 38A-38B.

In some examples, the first and second electrodes include parallel plates, e.g., in a manner such as described with reference to FIGS. 13, 14, 17, 18, 25A-25B, 26, 33A-33B, 34A-34B, 41A-41B, and/or 43A.

In some examples, the first and second electrodes include concentric spheres, e.g., in a manner such as described with reference to FIGS. 22A-22B.

In some examples, the first and second electrodes include concentric cylinders, e.g., in a manner such as described with reference to FIGS. 7, 8, 9, and/or 12.

In some examples, the first electrode or the second electrode includes a conductive fluid. In some examples, the conductive fluid includes mercury. Use of mercury as a conductive fluid is described in greater detail elsewhere herein.

In some examples such as described with reference to FIGS. 13, 14, 17, 18, 25A-25B, 26, 33A-33B, 34A-34B, 41A-41B, and/or 43A, the device may include a cylindrical housing having an interior surface and a longitudinal axis, the cylindrical housing forming a first electrode. The device may include a first plurality of conductive plates that extend inward from, and are electrically coupled to, the interior surface, the first plurality of conductive plates spaced-apart along the longitudinal axis. The device may include a shaft concentrically disposed within the interior of the cylindrical housing, the shaft forming a second electrode. The device may include a second plurality of conductive plates extending from, and electrically coupled to, the shaft, respective ones of the second plurality of conductive plates interdigitated with respective adjacent conductive plates of the first plurality of conductive plates. The device may include a layer of dielectric material disposed on opposing faces of the first and second pluralities of conductive plates. The device may include a drive mechanism coupled to the shaft to rotate the second plurality of conductive plates relative to the first plurality of conductive plates to generate a magnetic field.

In other examples such as described with reference to FIGS. 22A-22B, device 1000 may include a spherical housing having an interior, an interior surface and an axis, the cylindrical housing forming a first electrode. The device may include a shaft disposed within the interior, and disposed along the axis, the shaft forming a second electrode. The device may include a second sphere having an exterior surface, the second sphere disposed concentrically within the interior, and electrically coupled to, the shaft. The device may include a layer of dielectric material disposed on interior surface of the first sphere and the exterior surface of the second sphere. The device may include a drive mechanism coupled to the shaft to rotate the second sphere relative to the first sphere to generate a magnetic field.

In other examples such as described with reference to FIGS. 7, 8, 9, and 12, device 1000 may include a housing including a first solid of revolution having an axis, an interior and an interior surface, the housing forming a first electrode. The device may include a shaft disposed through the interior and disposed along the axis, the shaft forming a second electrode. The device may include a rotor including a second solid of revolution having an exterior surface, the rotor disposed concentrically within the interior, and electrically coupled to, the shaft. The device may include a layer of dielectric material disposed on interior surface of the housing and the exterior surface of the rotor. The device may include a drive mechanism coupled to the shaft to rotate the rotor relative to the housing to generate a magnetic field.

In examples such as described with reference to FIGS. 64A-64B, 65, 66A-66B, 68, an 69, device 1000 may include a first electrode including a first plurality of segments that are electrically insulated from each other, and a second electrode including a second plurality of segments that are electrically insulated from each other. A dielectric material may be disposed between the first and second electrodes such that a first subset of the first plurality of segments are configured to accumulate positive charge, a second subset of the first plurality of segments are configured to accumulate negative charge, a first subset of the second plurality of segments are configured to accumulate negative charge, and a second subset of the second plurality of segments are configured to accumulate positive charge. A drive may be configured to rotate the first electrode relative to the second electrode so as to induce an angular velocity between the positive charges and the negative charges and thus generate a current density profile. A circuit configured to interrupt the current density profile produced by the first and second electrodes by changing respective polarities of the first and second pluralities of segments as the first electrode rotates relative to the second electrode.

Still other examples may be envisioned based on the present teachings.

Propulsion Systems and Methods Utilizing Planetary Magnetic Fields

It will be appreciated that the dynamic super-capacitors (DSCs) and related devices described above with reference to FIGS. 1-49 may be used in a variety of applications. One nonlimiting application is propulsion systems and methods utilizing planetary magnetic fields.

Three types of propulsion are described in the present example embodiments. The first will be referred as Type I, which utilizes the familiar repulsion between two magnets, to which the layperson is likely familiar. The second type of electromagnetic propulsion will be referred to as Type II propulsion which involves the force that a charged particle experiences when moving through a magnetic field. This force is known as the Lorentz force or sometimes the Maxwell force. Type III is similar to Type II, being Lorentzian, differing in the orientation of the force on the electrodes of the DSC.

As was done in the preceding portion of the application, computer simulation will primarily be used to estimate the fields, charges, and forces produced by the proposed implementations. Finite element methods and analysis (FEM or FEA) is the primary tool of choice with QuickField™, Ansys Maxwell™, and MATLAB™ being the software tools primarily used.

Dynamic Super Capacitors

Embodiments herein may use or include a dynamic super-capacitor (DSC), which in some examples may be configured such as described with reference to FIG. 5, FIG. 17, and/or FIG. 25. Other dynamic super-capacitor configurations are also possible as outlined in the present disclosure on ultra-strong magnetic field devices, such as concentric cylinders or spheres.

A rotation rate of 100,000 RPM is used throughout as a reference. Turbo-molecular vacuum pumps operate in the 20-100,000 RPM range. Jet engines operate up to 25,000 RPM and micro-turbines operate up to 500,000 RPM.

The Fundamental Physics

The propulsion methods herein are describable using classical electromagnetics. The foundational equations at the root of the calculations are:

$$\nabla \times \vec{E} = -\frac{\partial \vec{B}}{\partial t} \tag{30}$$

$$\nabla \times \vec{H} = \vec{J} + \frac{\partial \vec{D}}{\partial t} \tag{31}$$

$$\nabla \cdot \vec{D} = \rho_v \tag{32}$$

$$\nabla \cdot \vec{B} = 0 \tag{33}$$

$$\vec{F} = q\vec{E} + q\vec{v} \times B \tag{34}$$

$$\vec{D} = [\epsilon]\vec{E} + [\alpha]\vec{H} \tag{35}$$

$$\vec{B} = [\mu]\vec{H} + [\alpha]\vec{E} \tag{36}$$

Equations 30-33 are the well-known Maxwell equations in differential form. $\vec{E}$ is the electric field, $\vec{B}$ is the magnetic flux density, $\vec{H}$ is the magnetic field strength, $\vec{D}$ is the electric displacement field, $\vec{J}$ is the current density, $\rho_V$ is the volumetric charge density. It should be noted that while $\vec{H}$ is formally the magnetic field strength, it is common practice to informally refer to $\vec{B}$ as the magnetic field strength or simply the magnetic field since $\vec{B}$ is the field that produces the force on charged particles (equation 34).

Equation 34 is the Lorentz force equation for a charged particle travelling in an electric and magnetic field. $\vec{F}$ is the force on the particle, q is the charge of the particle, and v is the velocity of the particle relative to the magnetic field.

Equation 35 and 36 are the constitutive relationships for the fields in matter. $[\epsilon]$ is the electric permittivity tensor, $[\mu]$ is the magnetic permeability tensor, and $[\alpha]$ is the magnetoelectric tensor. In free space and linear, homogenous, isotropic (LHI) media, $[\epsilon]$ and $[\mu]$ reduce to scalars and $[\alpha]$ goes to zero; these will be the assumptions that follow.

Type I Propulsion

Type I propulsion uses the force two magnets experience when in close proximity to one another, either attractive or repulsive.

Figure 50:
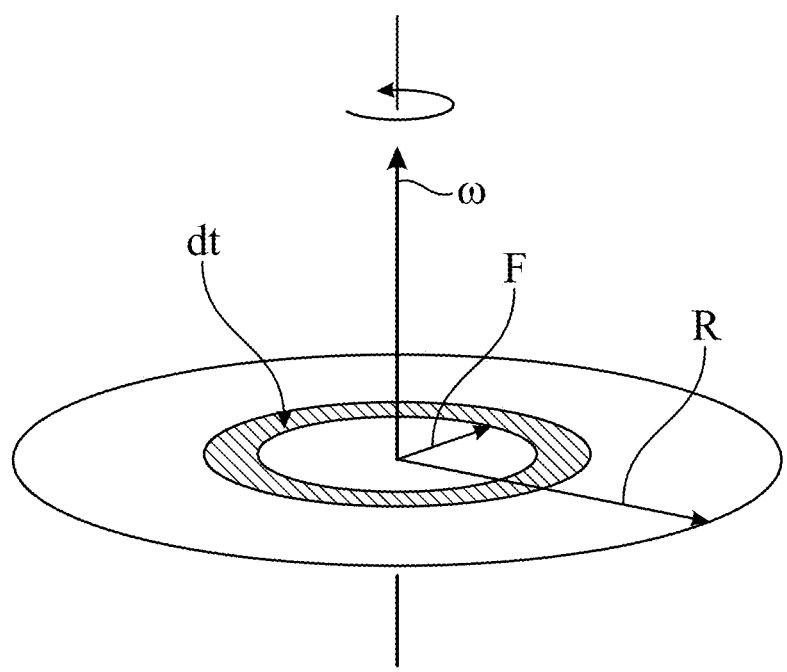
FIG. 50 schematically illustrates a spinning charged disc.

The effective magnetic dipole moment of the Earth is $7.95 \times 10^{22}$ Amp-m². FIG. 50 schematically illustrates a spinning charged disc. The magnetic dipole moment, $\vec{m}$, of a charged spinning disc (such as illustrated in FIG. 50) is given by $$\vec{m} = \frac{1}{4}QR^2\vec{\omega}, \tag{37}$$

where Q is the charge on the disc, R is the radius of the disc and $\vec{\omega}$ is the angular velocity of the disc.

The force between two ideal magnetic dipoles with their moments aligned is given by $$F(r) = \frac{3\mu_0}{2\pi}m_1 m_2 \frac{1}{r^4}, \tag{38}$$

where $\mu_0$ is the permeability of free space, $m_1$ is the magnetic dipole moment of body 1, $m_2$ is the magnetic dipole moment of body 2, and r is the co-axial distance between the two dipoles. For further details regarding such calculation, see Yung et al., "An Analytic Solution for the Force Between Two Magnetic Dipoles," Magnetic and Electrical Separation 9:39-52 (1998), the entire contents of which are incorporated by reference herein.

A single dynamic super-capacitor, i.e., two plates that counter-rotate, illustratively that are ten meters in diameter, with one-micron super-dielectric layers, a dielectric constant k=1×10$^9$, and a two-volt potential can hold a charge of 1.39×10$^6$ Coulombs on one electrode and −1.39×10$^6$ Coulombs on the other electrode. If spun at 100,000 RPM this configuration produces a magnetic moment of 1.83×10$^{11}$ Amp-m$^2$. The radius of the Earth is 6.38×10$^6$ meters. When the axial separation and magnetic dipole moments are used in equation 31, the calculated force is 5.3 Newtons at the magnetic poles of the Earth; not an overly impressive amount of lift, but lift, nonetheless.

This result is the lift for a single disc pair. An assembly like that shown in FIG. 17 can be used to stack multiple discs and increase the net force. A 10-meter-tall assembly with 5 mm disc spacings would produce a lift of 21,200 N (or 4770 pounds), where the disc spacing, D, is that shown in FIG. 17. Twenty-one thousand Newtons is a more impressive lift number, but still unlikely to overcome the weight of the propulsion system itself.

It is worth noting, that because charge on the discs goes as R$^2$ and the magnetic moment goes as R$^2$ as well, the total magnetic dipole force goes as R$^4$; therefore, increasing the radius of the discs helps tremendously with the lift. To wit, a 100 m diameter disc pair produces a 53,000 N (11,900 lbs) lift. A much larger number, but still unlikely to overcome the weight of the propulsion assembly itself. A 10-meter stack of 100-meter discs spaced 5 mm apart produces a force of 211,000,000 N (47,000,000 lbs). These type of lift numbers are much more impressive, but such a large propulsion assembly rotating at such a high rate of speed may be challenging. As improvements are made to super-dielectrics and stronger and lighter materials are developed more charge can be stored more compactly and less lift is needed to overcome the weight of the craft; more lift can be generated by smaller, lighter propulsion systems.

Type II Propulsion

A perhaps more practical thrust/lift can be produced by using the force exerted on the charged particles in motion on the spinning plates, the Lorentz force. Equation 34 is for a single charged particle in motion. For charge distributions/currents this can be rewritten as, ignoring electric fields, $$d\vec{F} = dQ \vec{v} \times \vec{B} \quad (39)$$

in differential form, where $d\vec{F}$ is the differential force, dQ is a differential charge element, v is the velocity of that charge element, and B is the external magnetic field vector where dQ exists. The total Lorentz force can be written as $$\vec{F} = \iiint_V \vec{J} dV \times \vec{B} \quad (40)$$

in integral form, where V is the volume in which the effective current is contained, i.e., the rotating charged discs, $\vec{J}$ is the electric current density, and $\vec{B}$ is the applied external magnetic field, (in an example case, the magnetic field of the Earth). When the current is produced by the charges being on an electrode in motion, J is referred to as the effective current, $\vec{J}_{eff}$. Conventional current would be electrons flowing in a wire for example.

Equations 30-36 can be combined, assuming LHI conditions, and solved to produce the rank two Maxwell stress tensor;

$$T_{ij} \equiv \epsilon\left(E_i E_j - \frac{1}{2}\delta_{ij}E^2\right) + \frac{1}{\mu}\left(B_i B_j - \frac{1}{2}\delta_{ij}B^2\right) \quad (41)$$

where $T_{ij}$ are the i-th and j-th components of the Maxwell Stress Tensor, $\vec{\vec{T}}$. Here i and j represent the basis vectors in three-dimensional space, for cartesian coordinates $\hat{x}=1$, $\hat{y}=2$, $\hat{z}=3$. $E_i$ and $E_j$ are the components of the electric field vector in the ith and jth direction, similarly, $B_i$ and $B_j$ are the components of the magnetic field vector in the ith and jth direction. $\delta_{ij}$ is the Kronecker delta function.

The divergence of $\vec{\vec{T}}$ yields the following equation:

$$\nabla \cdot \vec{\vec{T}} = \vec{F} + \epsilon\mu\frac{\partial \vec{S}}{\partial t} \quad (42)$$

where $\vec{F}$ is the vector force density on the system and $\vec{S}$ is the familiar Poynting vector, $\vec{S}=\vec{E}\times\vec{H}$. It is worth noting in the analyses that follow, it is assumed the system is running at steady-state to show the steady state propulsion force (lift/thrust) of the system, therefore, the time derivative of the Poynting vector term on the right is not expected to contribute to the force calculation. This term would contribute on power up or power down of the system or if one wished to change the amount of thrust the system was producing, otherwise the time derivative is zero. Taking the divergence of a tensor lowers its order by one, therefore the long vector equation version of equation 42 can be written as, after solving for the force vector and writing purely in terms of E and B:

$$\vec{F} = \epsilon\left[(\nabla \cdot \vec{E})\vec{E} + (\vec{E} \cdot \nabla)\vec{E}\right] + \frac{1}{\mu}\left[(\nabla \cdot \vec{B})\vec{B} + (\vec{B} \cdot \nabla)\vec{B}\right] - \frac{1}{2}\nabla\left(\epsilon E^2 + \frac{1}{\mu}B^2\right) - \epsilon\frac{\partial(\vec{E}\times\vec{B})}{\partial t} \quad (43)$$

An advantage to using the Maxwell Stress Tensor is that the overall system force can be calculated. The fields, E and B, are the overall fields, inclusive of the external fields, such as the Earth's magnetic field, and the intrinsic fields, such as the fields generated by the dynamic super-capacitors (DSCs). Internal electromagnetic stresses on the components and structure can be calculated at any point resulting from the external and intrinsic fields combined. Very strong magnets, such as the DSCs, can produce strong electromagnetic stresses on themselves and their surroundings and these stresses should be accounted for in the structural design of the components and system.

As a point of note, the net force in equation 43 does possess electric field as a force generating component and the Earth does possess an electric field that can be used to generate lift. However, electric fields start on charged particles and end on charged particles, therefore the span of the Earth's electric field is limited, not being able to propagate much past the Earth's atmosphere, specifically the ionosphere. The energy density of the Earth's magnetic field is about three to four orders of magnitude larger than the Earth's electric field energy density close to the surface. An additional challenge to electric field lift is the voltages and electric fields that would be needed by the propulsion system to produce appreciable lift would be difficult to maintain due to ionization, arcing, coronal discharge, and field emissions. Magnetic fields do not suffer from these drawbacks and the Earth's magnetic field extends tens of thousands of kilometers into space (40-65,000 km); for reference the international space station orbits at around 420 km and geosynchronous orbit is about 37,000 km. Therefore, the present implementations focus on magnetic propulsion and forgo the electric field terms in equation 43. It is worth noting there is a previously known lift mechanism employed using high voltage that ionizes the atmospheric gases and creates an ionic wind to lift small craft, known as high voltage ionic lifters. These devices may not act on the fields themselves to generate the thrust but depend on using the atmospheric gases as an ionized propellant or have on-board gas storage in the case of ionic propulsion in space. These are touted as all-electric lift/thrust devices; however, these operate on a propellant exhaust principle, i.e., mass ejection, and require a gas supply of some type; using ions as opposed to combusted or pressurized gas molecules.

Type II Propulsion Principles

In order to understand the mechanics of how lift and thrust can be realized utilizing the Earth's magnetic field, it is instructive to start with equation 39 which describes the differential force vector produced by a differential charge element travelling through an external magnetic field, e.g., the Earth's magnetic field.

Figure 51:
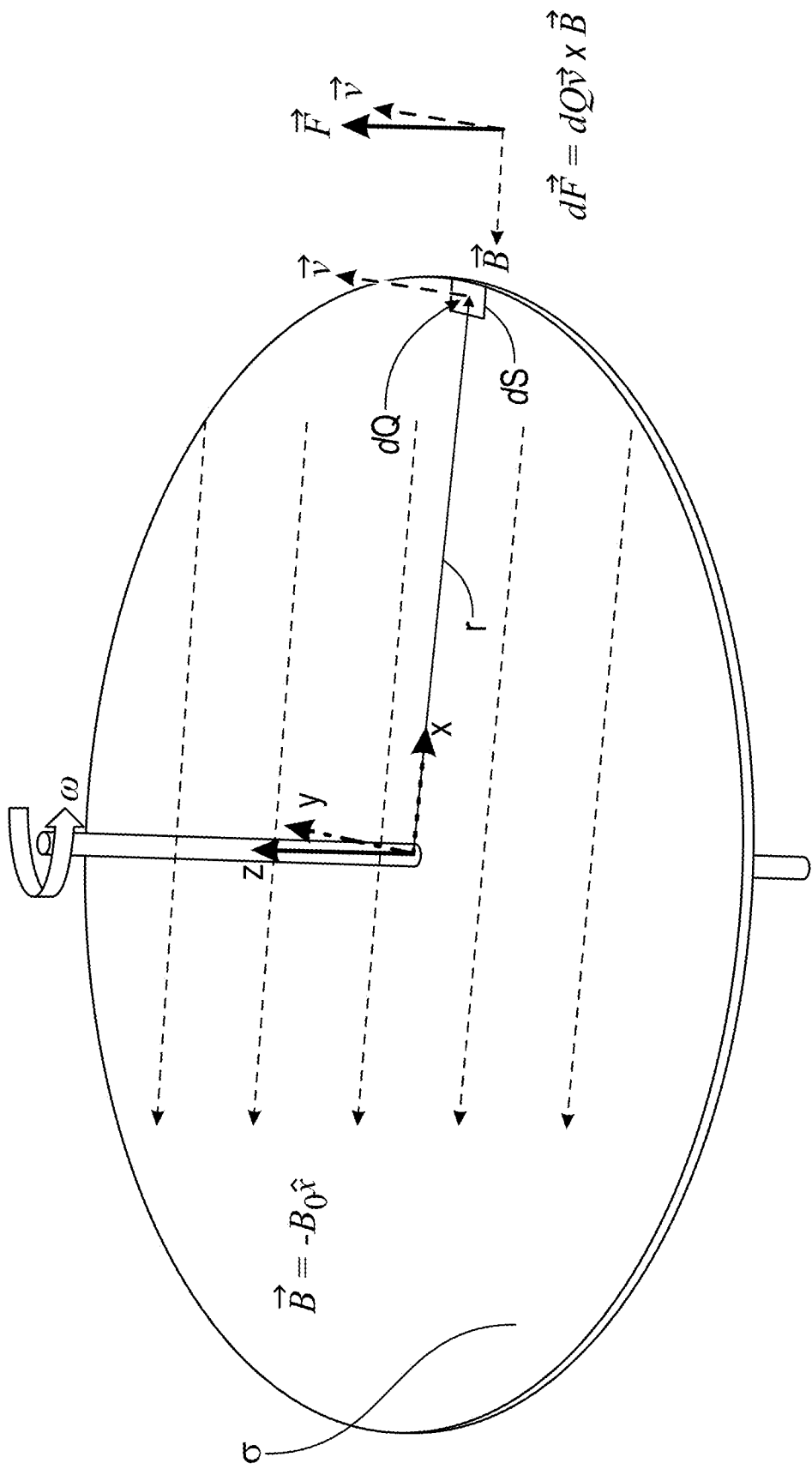
FIG. 51 schematically illustrates a spinning charged disc in a uniform magnetic field.

FIG. 51 schematically illustrates a spinning charged disc in a uniform magnetic field. The disc has a surface charge, $\sigma$, spinning about a central axis at an angular velocity of $\omega$. The x and y axis lie in the plane of the disc. A differential surface area, dS, is shown which contains a differential charge $dQ=\sigma dS$. The magnitude of the tangential velocity for dQ is simply $v=r\omega$. With a magnetic field in the negative x direction and a tangential velocity in the y direction, it is a simple matter of cross product multiplication to show that a force is exerted on the charge, dQ, in the positive z direction. A magnetic field in the x direction would be similar to the tangential magnetic field one would encounter at the equator of the Earth if $\hat{x}$ was pointing towards one of the magnetic poles, i.e., running parallel (north-south) to the surface of the Earth locally. Locally the field would appear uniform (which also may be referred to herein as "substantially symmetrical)." For example, at a local enough scale, e.g., the size of a typical craft and surrounding space, a planetary magnetic field will appear uniform, so the uniform assumption is pretty good. However, the present technology does not require the field be uniform or symmetric, it will work in non-symmetric fields as well. Illustratively, some examples herein use the Earth's magnetic field as the exemplary external field, which is locally uniform and weak. However, strong non-symmetrical fields, such as those in magnetic rail guns or coil guns or a series of magnetic acceleration stations additionally or alternatively may be used to accelerate the magnetically driven craft (or other object) to extreme hypersonic velocities. Such magnetic acceleration stations may be located terrestrially, and/or such magnetic acceleration stations may be located in space to accelerate the craft.

Force on a Spinning Charged Disc

Calculating the force on a spinning charged disc in a uniform magnetic field parallel to the disc, the differential area, dS, in cylindrical coordinates is $$dS=rd\varphi dr.$$

The differential charge is given by $$dQ=\sigma dS=\sigma r d\varphi dr.$$

Plugging dQ and v in terms of the rotational velocity, $v=r\omega$, into equation 39 yields $$d\vec{F}=dQ\vec{v}\times\vec{B}=(\sigma rd\varphi dr)(r\omega)(\vec{v}\times\vec{B}).$$

Since i lies in the x-y plane and B only has an -x component, $\vec{v}\times\vec{B}=B_0\sin(\varphi+\pi/2)\hat{z}$, therefore, $$d\vec{F}=dQ\vec{v}\times\vec{B}=B_0\sigma\omega r^2\cos\varphi d\varphi dr\hat{z} \tag{44}$$

Figure 53:
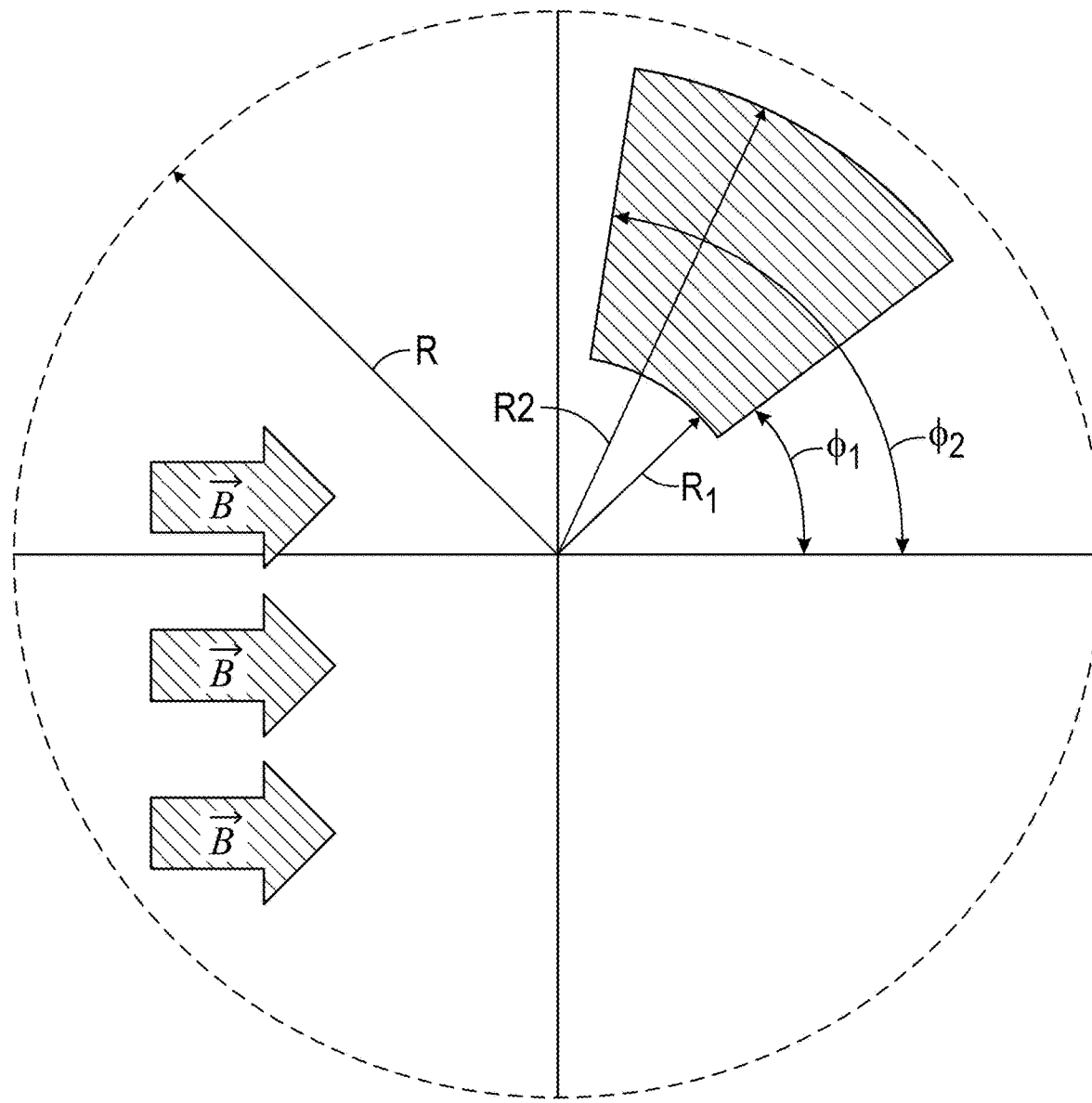
FIG. 53 schematically illustrates example forces on a spinning charged disc in a uniform magnetic field.

The force on a wedge of the disc, caused by the magnetic field, can be calculated as $$\vec{F}=B_0\sigma\omega\int_{\varphi_1}^{\varphi_2}\int_{R_1}^{R_2}r^2\cos\varphi d\varphi dr\hat{z} \tag{45}$$

where $\varphi_1$ is the angular start of the wedge and $\varphi_2$ is the angular ending of the wedge and $R_1$ and $R_2$ are the starting and ending radius of the wedge, see FIG. 53 which schematically illustrates example forces on a spinning charged disc in a uniform magnetic field. Evaluation of equation 45 leads to $$\vec{F}=\frac{1}{3}B_0\sigma\omega(R_2^3-R_1^3)(\sin\varphi_2-\sin\varphi_1)\hat{z} \text{ or} \tag{46}$$

$$\vec{F}=\frac{1}{3}B_0\omega\left(\frac{Q}{\pi R^2}\right)(R_2^3-R_1^3)(\sin\varphi_2-\sin\varphi_1)\hat{z} \tag{47}$$

if written in terms of the total charge on the disc $Q=\sigma(\pi R^2)$.

Figure 52:
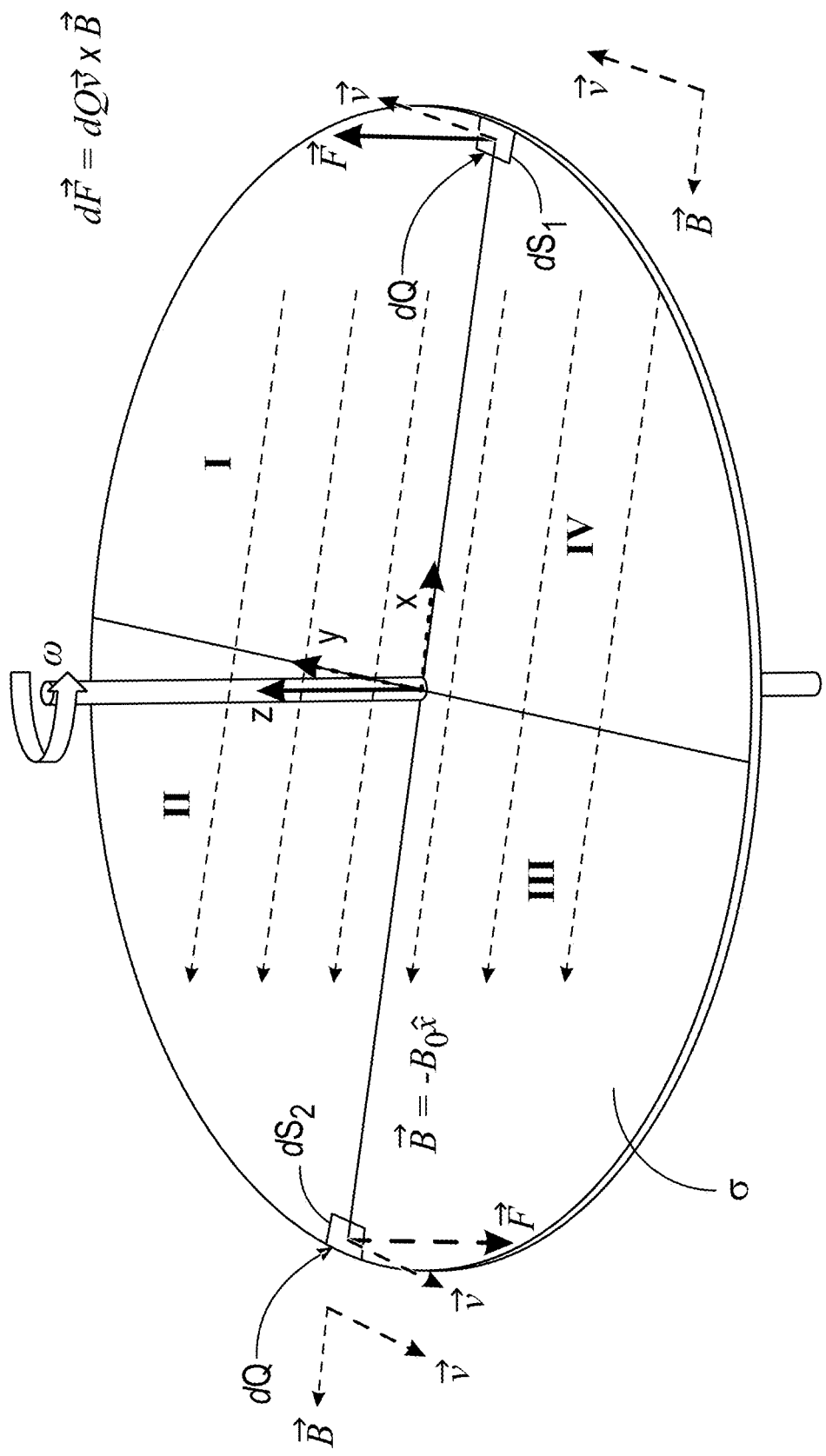
FIG. 52 schematically illustrates a spinning charged disc in a uniform magnetic field, with two differential areas with corresponding charges, dQ, on opposite sides of the disc.

If the discs in FIGS. 51 and 52 were a dynamic super-capacitor with counter rotating electrodes, aka discs, the total charge on each electrode would be $$Q=CV \tag{48}$$

where C is the capacitance of the super-capacitor, given by equation 29, and V is the voltage difference on the super-capacitor plates. If equation 29 is substituted into equation 48 and equation 48 is then substituted into equation 47, one obtains the total force on a single spinning charged disc. However, in examples where there are two discs of opposite charge spinning in opposite directions, the overall force is doubled, thus the calculated force on a wedge area of the counter-rotating electrode super-capacitor is given as (adding a factor of 2)

$$\vec{F}=\frac{2}{3}B_0\omega\left(\frac{CV}{\pi R^2}\right)(R_2^3-R_1^3)(\sin\varphi_2-\sin\varphi_1)\hat{z} \tag{49}$$

$$\vec{F}=\frac{2}{3}B_0\omega\left(\frac{\frac{k\varepsilon_0 A}{d}V}{\pi R^2}\right)(R_2^3-R_1^3)(\sin\varphi_2-\sin\varphi_1)\hat{z}$$

$$\vec{F}=\frac{2}{3}B_0\omega\left(\frac{\frac{k\varepsilon_0 \pi R^2}{d}V}{\pi R^2}\right)(R_2^3-R_1^3)(\sin\varphi_2-\sin\varphi_1)\hat{z}$$

$$\vec{F}=\frac{2}{3}B_0\omega\left(\frac{k\varepsilon_0 V}{d}\right)(R_2^3-R_1^3)(\sin\varphi_2-\sin\varphi_1)\hat{z}$$

For simplicity, the previous calculations assumed a position at the Earths equator where the magnetic field is assumed to be tangential to the Earth and lies in the x-y plane, specifically with x pointing towards the poles and y pointing east-west. It should be clear from the mechanics of the cross product that when the charged disc spins in the plane of the magnetic field (i.e., the angular momentum vector of the disc is perpendicular to the external magnetic field), the force on the disc may point along the axis of the angular momentum vector, i.e., perpendicular to the plane of the disc. In other words, the maximum force experienced by the charged spinning disc is perpendicular to the local magnetic field. In spherical coordinates, as long as the disc is not at the magnetic poles there is expected always to be a radial component to the force, $\hat{R}$, pointing either towards the magnetic center of the Earth or away from it. At the equator there may be expected only to be an $\hat{R}$ component pointing towards or away from the center of the Earth. Away from the equator there may be expected also to be a north-south, or $\hat{\theta}$ component; assuming the Earth is a semi-perfect magnetic dipole with no appreciable $\hat{\phi}$ component to its magnetic field, which in general is a good approximation with some local deviations. This discussion is for the configuration shown in FIGS. 51 and 52, other orientations of the DSC electrodes are possible. For the purpose of illustration of the technology, it will be assumed the propulsion system is operating at a point at the equator or directly above the equator for simplicity of understanding, however, operation at the equator is not required to produce forces in the positive R direction (i.e., lift away from the Earth's surface). Orientation and thrust vector are discussed further herein.

Torque on a Spinning Charged Disc

If equation 46 or 49 is evaluated over the entire disc, one gets a net force of zero. From FIG. 52 this should be somewhat apparent as regions I and IV provide a force in the positive z direction and regions II and III provide an equal and opposite force in the negative z direction; summing up to zero net force. As is commonly known, these equal and opposite forces produce a torque on current loops in magnetic fields, here the current loops being infinitesimal rings of effective current on the spinning charged discs. The torque on a magnetic dipole is given by $$\vec{\tau} = \vec{m} \times \vec{B} \qquad (50),$$

where $\vec{m}$ was given earlier in equation 37. Substituting equation 37 into equation 50, yields a torque of $$\vec{\tau} = \frac{1}{4}QR^2\vec{\omega} \times \vec{B} = \frac{1}{4}QR^2(\omega\hat{z}) \times (-B_0\hat{x}) = -\frac{1}{4}B_0\omega QR^2\hat{y} \qquad (51)$$

Further using Q=CV, and using equation 29 to calculate the capacitance of this parallel plate super-capacitor, equation 51 can be written as $$\vec{\tau} = -\frac{1}{2}B_0\omega \frac{k\varepsilon_0 \pi R^2 V}{d} R^2 \hat{y} \qquad (52)$$

$$\vec{\tau} = -\frac{\pi}{2}B_0\omega R^4 \frac{k\varepsilon_0 V}{d} \hat{y}$$

where a factor of two comes in for the example in which there are two oppositely charged discs that are counter-rotating and both contributing to the torque.

As an example, the Earth's magnetic field at the equator is approximately $30\times10^{-6}$ Tesla running approximately north-south tangent to the Earth's surface. For a parallel dual disc dynamic super-capacitor with the discs counter-spinning at 100,000 RPM ($\omega$=10,472 rad/s), with a super-dielectric constant of k=1×10$^9$, a voltage potential of 2 volts, and a dielectric thickness of 5 microns, all on a one-meter radius disc, the calculated torque from equation 52 is about 1750 N-m (1290 ft-lbs) about the y-axis. This is the equivalent torque of an average sized semi-truck. This is an impressive amount of torque considering this dynamic super-capacitor 'motor' uses the Earth's magnetic field as its permanent magnet component.

Figure 54:
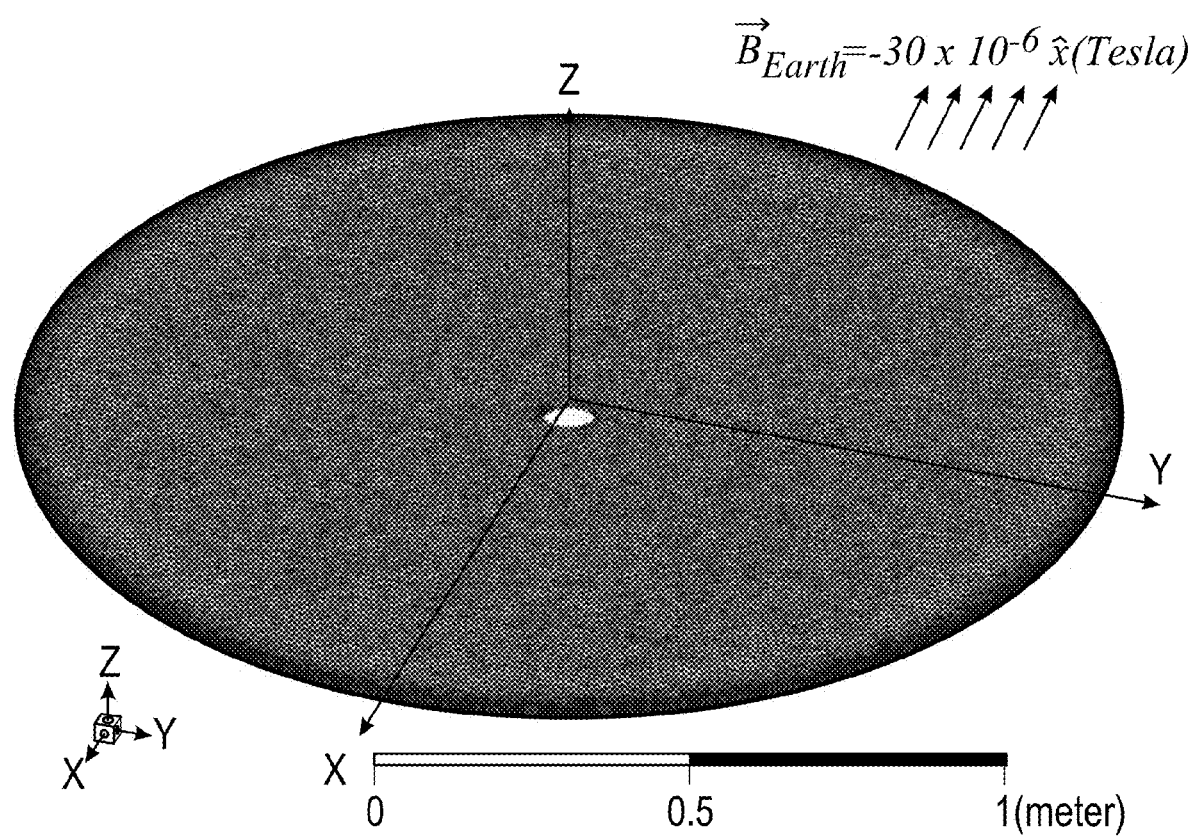
FIG. 54 illustrates a meshed model of the charged spinning disc from FIG. 52.
Figure 55:
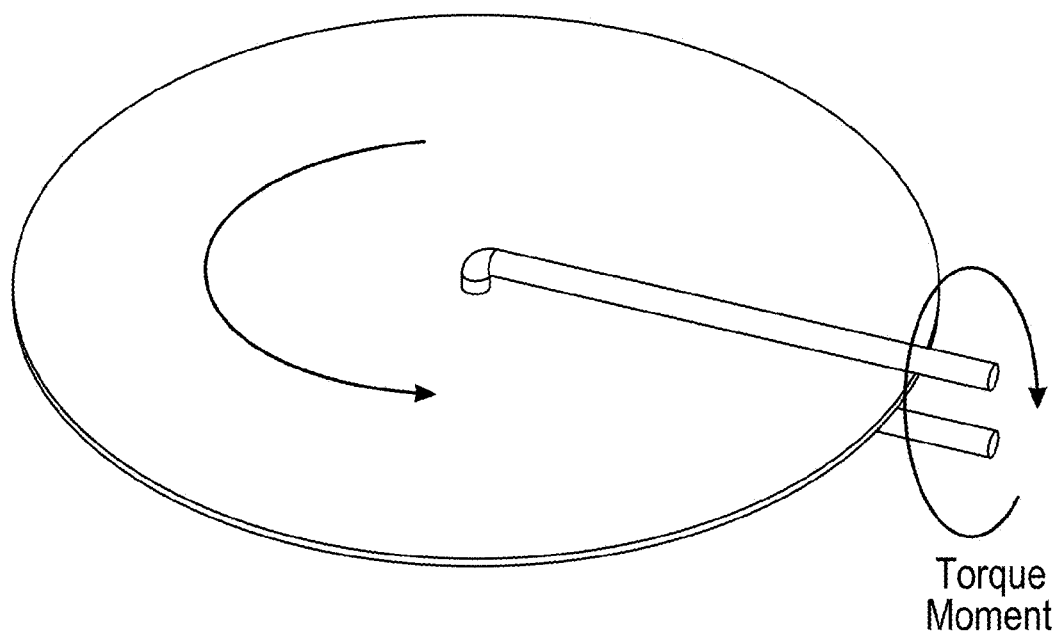
FIG. 55 schematically illustrates an example spinning disc with notional torque transfer shaft.

While it is practical to do analytic calculations for simple geometries such as a single spinning disc or a pair of discs, it can become intractable for complex geometries. Moving forward, magnetic fields, torques, and forces can be closely approximated by the finite element method (FEM or FEA). An ANSYS Maxwell3D™ model predicts the torque on the aforementioned counter-rotating charged disc super-capacitor in the Earth's magnetic field at the equator to be approximately 1746 N-m (1288 ft-lbs), in excellent agreement with the earlier analytical calculation of 1750 N-m. FIG. 54 shows a meshed Maxwell3D disc model of the charged spinning disc from FIG. 52. FIG. 55 shows the spinning disc with a notional torque transfer shaft if one wished to convert the torque to work.

It is worth noting from equation 52 that the torque goes as the radius of the disc(s) to the $4^{th}$ power. This means large diameter discs can generate extremely large torques. As an example, a 10-meter disc with all other parameters the same would generate a torque over 17,000,000 Newton-meters (12,800,000 ft-lbs) at the equator; this is more than twice the torque generated by the Wärtsilä-Sulzer RTA96-C engine, the largest container cargo ship engine in existence at the time of this application. However, it may be challenging to build a disc this size that rotates at 100,000 RPM at the time of this application. Nonetheless, it shows the power and potential of the technology. From equation 52, it can be seen the torque goes linearly with the radial velocity, wo, while going to the fourth power of the radius of the discs; therefore, even a 10-m disc spinning at 1,000 RPM would generate a torque over 174,000 N-m (128,000 ft-lbs); about four times that of the GE AC6000CW locomotive engine, one of the most powerful commercial locomotive engines available at the time of this application.

Lift of a Charged Spinning Disc

Torque does not produce lift or thrust directly, however, the torque calculations and simulations are believed to be good benchmarks for modeling and also demonstrate the magnitude of the forces that can be generated by dynamic super-capacitors using the Earth's magnetic field. Net forces generated from the interaction of the electromagnetic fields, i.e., between the Earth and the dynamic super-capacitor(s), play the central role in the production of lift/thrust capable of propelling a craft.

It can be shown from equation 49 that the net force on a charged spinning disc in a uniform magnetic field is zero. The net zero force is simply due to the axisymmetric nature of the effective current and homogeneity of the external magnetic field. If the symmetry or homogeneity of the system is broken, then the system may be expected to experience a net force (i.e., thrust or lift). The first method of breaking this symmetry is to break the uniformity of the external magnetic field the propulsion system components experiences. If parts of the disc are shielded from the external magnetic field, then the charged particles within those shielded areas may not be expected to experience an externally induced force:

$d\vec{F}=dQ\vec{v}\times\vec{B}_{ext}$ in non-shielded areas, and $d\vec{F}=dQ\vec{v}\times\vec{0}=0$ in shielded areas.

Looking at FIG. 52, if the external magnetic field is shielded in quadrants II and III, and unshielded in quadrants I and IV, then equation 49 reduces to $$\vec{F} = \frac{4}{3}B_0\omega\left(\frac{k\varepsilon_0 V}{d}\right)R^3\hat{z}, \qquad (53)$$

where R is the radius of the disc.

A one-meter radius disc spinning at 100,000 RPM, with $k=1\times10^9$, V=2 volts, and d=2 microns at the Earth's equator yields a force of about 3709 Newtons (834 lbs) in the z-direction, i.e., away from the Earth-lift. Notice in equation 53 that the lift goes linearly as the rotational velocity and as the cube of the radius of the disc. A 10-meter disc spinning at a rotation rate of 1000 RPM produces the same lift of 3709 N (834 lbs) as the one-meter disc spinning at 100,000 RPM. FIG. 56A shows the spinning disc(s) with a magnetic shielding element. More specifically, FIG. 56A illustrates a model of example oppositely charged counter-rotating discs with magnetic shielding element in which the shielding element blocks half of the disc from 'seeing' the external magnetic field (e.g., Earth's magnetic field at the equator ~30×10⁶ Tesla); it is assumed that the positive charged disc is on top and rotates in the counterclockwise direction and the negatively charged disc is on the bottom and rotates in the clockwise direction, though the converse may be expected to work as well; the discs rotate, the shield remains stationary.

In the nonlimiting example shown in FIG. 56A, a central shaft attaches to a top disc and a second shaft (not visible) attaches to the bottom disc. These shafts transfer rotational energy to the discs and subsequently transfer the force generated from the discs to the craft. It is assumed these shafts rotate in opposite directions for the two oppositely charged discs, however, if only one disc is rotated, only a single shaft is needed. However, it is desirable to have counter-rotation such that reactionary torques cancel out. If the discs are not counter rotated, a net-reactionary torque may be expected to be experienced and may be accommodated somewhere else in the craft, such as with a separate balanced flywheel, otherwise, the propulsion system and craft may be expected to experience a net reactionary torque which may build unwanted angular momentum in the system/craft. A simulation of the model shown in FIG. 56A, with a perfect magnetic shield, gives a result of 3340 N (750 lbs) in the positive z-direction. The simulation result is in reasonable agreement with the analytically calculated value of 3709 N (834 lbs).

Figure 57:
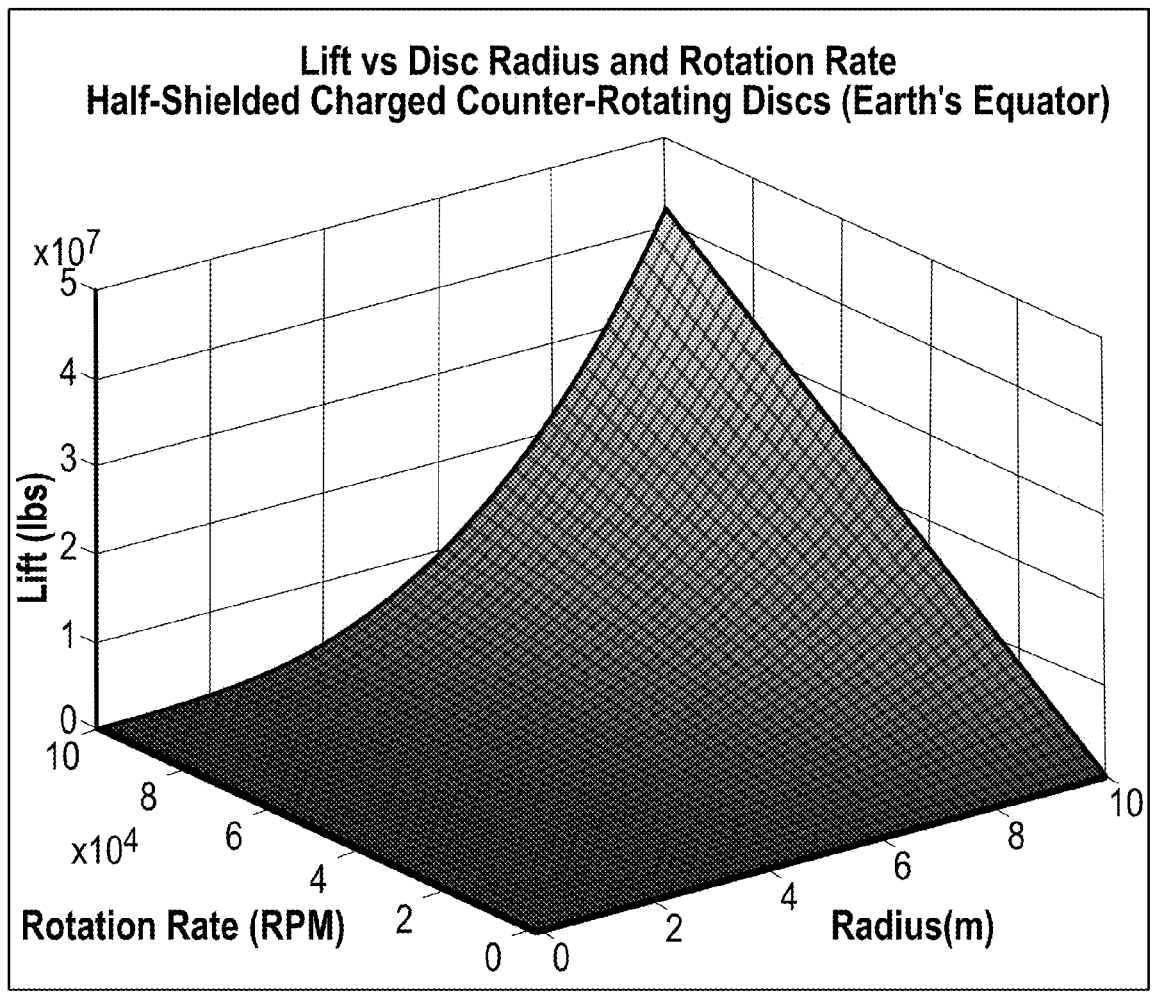
FIG. 57 illustrates the calculated lift as a function of disc radius and rotation rate in an FEA model of an example pair of counter-rotating oppositely charged discs; $k=1\times10^9$, $V=2$ volts, $d=2$ microns.
Figure 59:
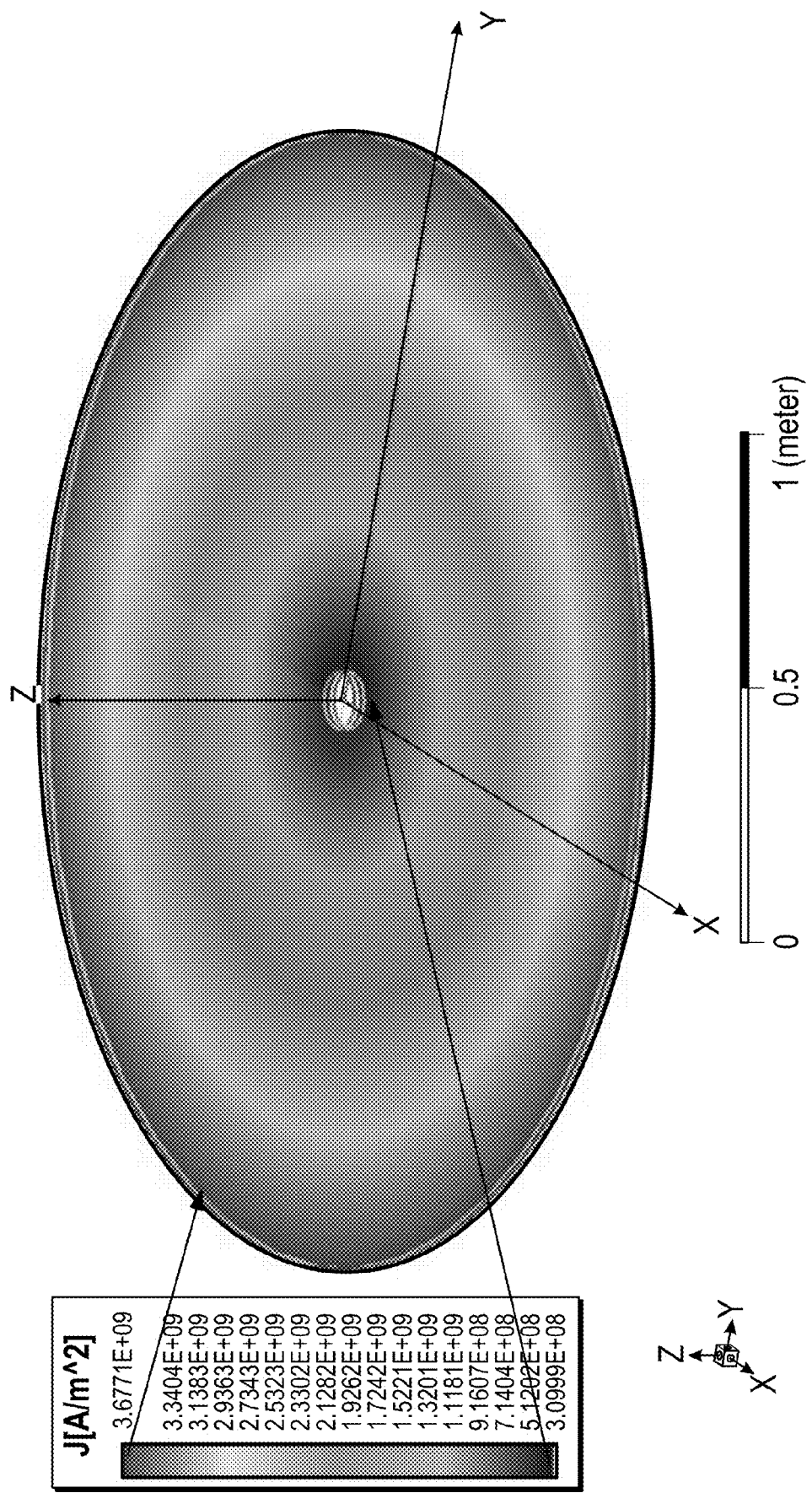
FIG. 59 illustrates the calculated effective current distribution of the spinning discs of FIG. 54; thickness of assembly is 2 cm.

FIG. 59 shows a plot of the relationship between Lift versus Radius of the Discs and Rotational Speed as calculated from equation 49. FIG. 57 illustrates the calculated lift as a function of disc radius and rotation rate in an FEA model of an example pair of counter-rotating oppositely charged discs; $k=1\times10^9$, V=2 volts, d=2 microns. Table 13, illustrated in FIG. 93, shows the calculated relationship between Lift (in lbs) versus Disc Radius and Rotation Speed (rotations per minute) for an example pair of counter-rotating oppositely charged discs; $k=1\times10^\circ$, V=2 volts, d=2 microns. As can be seen, large radii disc spinning at high rotational rates are capable of producing tremendous lifts in the Earth's magnetic field. Of course, building large diameter discs that rotate at such high rates can be an engineering challenge, however, even smaller diameter discs at moderate rotational speeds can generate significant lift.

The magnitude of the electromagnetic stresses produced by the dynamic super-capacitor itself can also be a limiting factor. The intrinsic electromagnetic stresses induced in the dynamic super-capacitor can be calculated using equation 43 and can result in large electromagnetic stresses depending on the diameter and rotational speed of the discs. In some examples, the assemblies described would be constructed of ultra-strong materials such as diamond, sapphire, silicon carbide, strong ceramics, or other ultra-strong materials.

Breaking Symmetry

Figure 56B:
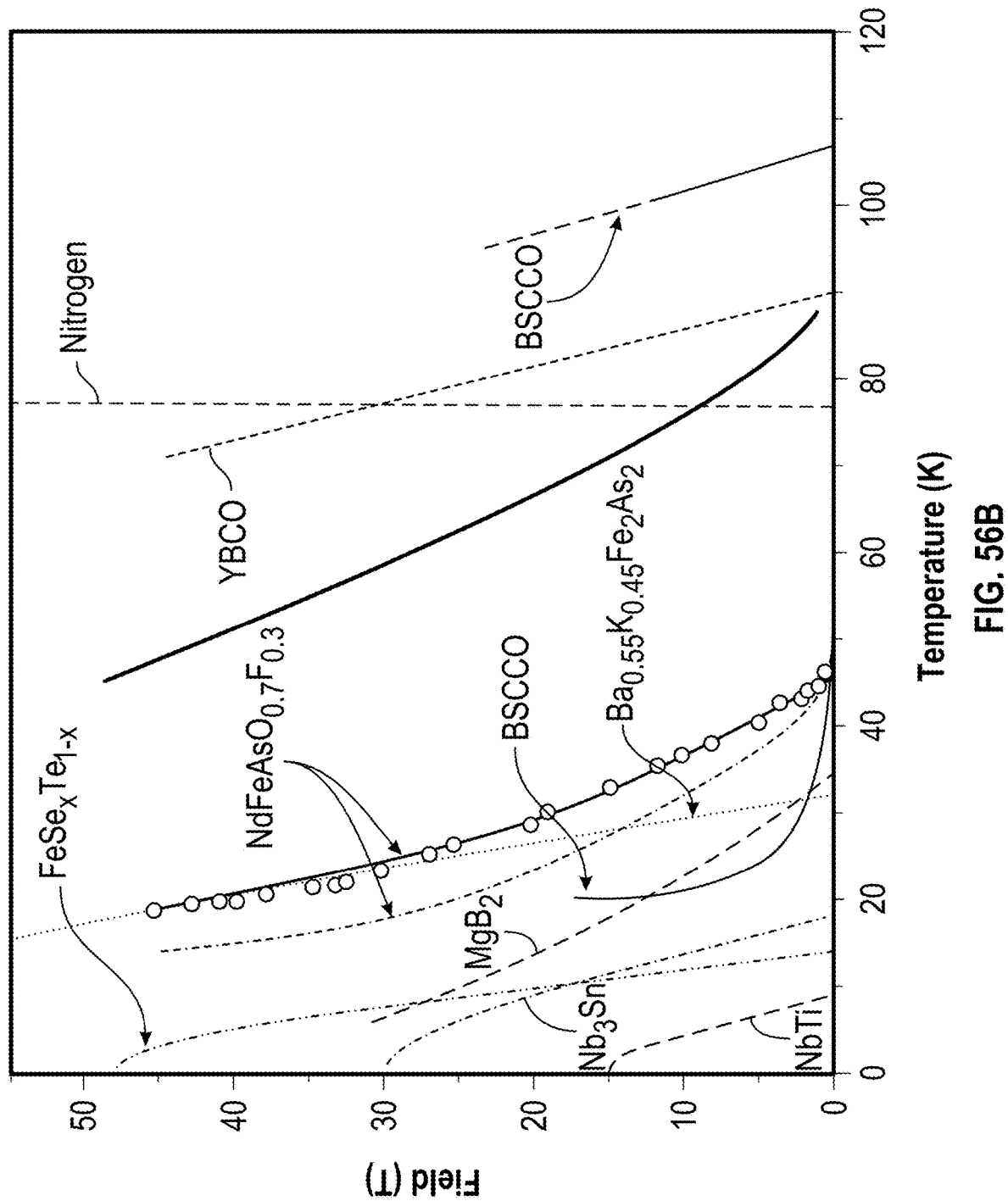
FIG. 56B is a plot illustrating the maximum magnetic fields that different superconductors can withstand, as a function of temperature, before losing their superconductivity.

To break the symmetry of the external uniform field, magnetic shielding may be used. Common magnetic shielding is typically constructed of ferromagnetic materials. However, most ferromagnetic materials saturate on the order of about a tesla. Ferromagnetic materials are also typically thick and heavy. Additionally, ferromagnetic materials may be strongly attracted to the ultra-magnet created by the dynamic super-capacitor. As an alternative, the magnetic shielding element can be constructed of super-conducting material. Super-conductors are capable of repelling large magnetic fields, due to the Meissner effect. A number of superconducting materials and their corresponding breakdown fields (i.e., the maximum magnetic field the superconductor can withstand) are known in the literature and include, but are not limited to, $FeSe_xTe_{1-x}$, $Nb_3Sn$, NbTi, $MgB_2$, $NdFeAsO_{0.7}F_{0.3}$, BSCCO, $Ba_{0.55}K_{0.45}Fe_2As_2$, and YBCO. For example, FIG. 56B is a plot illustrating the maximum magnetic fields that different superconductors such as listed above can withstand, as a function of temperature, before losing their superconductivity; FIG. 56B is adapted from the URL large.stanford.edu/courses/2011/ph240/kumar1/. Superconductors can also be made thin and lightweight, though cryogenic cooling may be required. For further details regarding example superconductors that may be used in the present methods, devices, and systems, see the following references, the entire contents of which are incorporated by reference herein: Larbalestier et al., "High-Tc Superconducting Materials for Electric Power Applications," Nature 414:368-377 (2001); and Gurevich, "To Use or Not to Use Cool Superconductors?," Nature Mat. 10:255-259 (2011).

Figure 58:
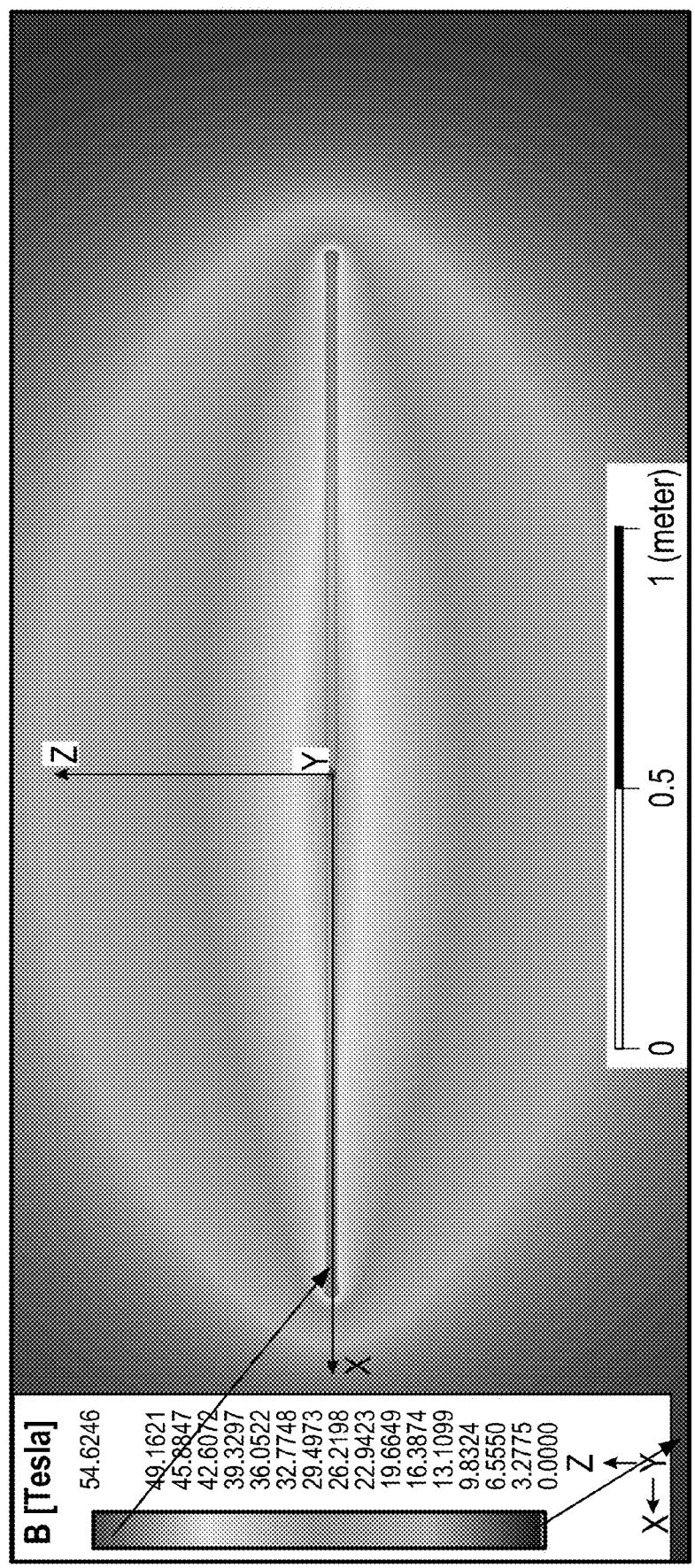
FIG. 58 illustrates the calculated magnetic field strength as a function of disc radius and rotation rate in the model of the spinning charged disc of FIG. 54.

The characteristics of the spinning discs (e.g., spin rate, charge, radius, etc.) and the design and choice of material for the shielding element may be chosen such that the superconductor shield does not experience a magnetic field in excess of its breakdown field at any point, otherwise quenching may occur which causes the superconductor to lose its superconductivity. Avoidance of superconductor magnetic breakdown can be achieved by either limiting the magnetic field strength produced by the dynamic super-capacitor and/or ensuring that the surfaces of the superconductor shield are spaced far enough away from the dynamic super-capacitor such that the field strength from the dynamic super-capacitor has dropped to a safe level before encountering the superconductor shield. FIG. 58 illustrates the calculated magnetic field strength as a function of disc radius and rotation rate in the model of the spinning charged disc of FIG. 54, in an edge on view of the magnetic field strength around the spinning discs described in the prior torque example, FIG. 56A. It can be seen that the field strength drops rapidly as one moves away from the discs, reaching safe magnetic field strength levels for the superconducting materials in relatively short distances. It is also worth noting that the strongest magnetic fields are near the center of the disc. The strongest effective currents, which are responsible for the lift, are towards the outside of the disc. For example, FIG. 59 illustrates the calculated effective current distribution of the spinning discs of FIG. 54; thickness of assembly is 2 cm. In FIG. 59, the magnetic field produced by the discs is least strong and extends the least distance, a favorable outcome.

Figure 60:
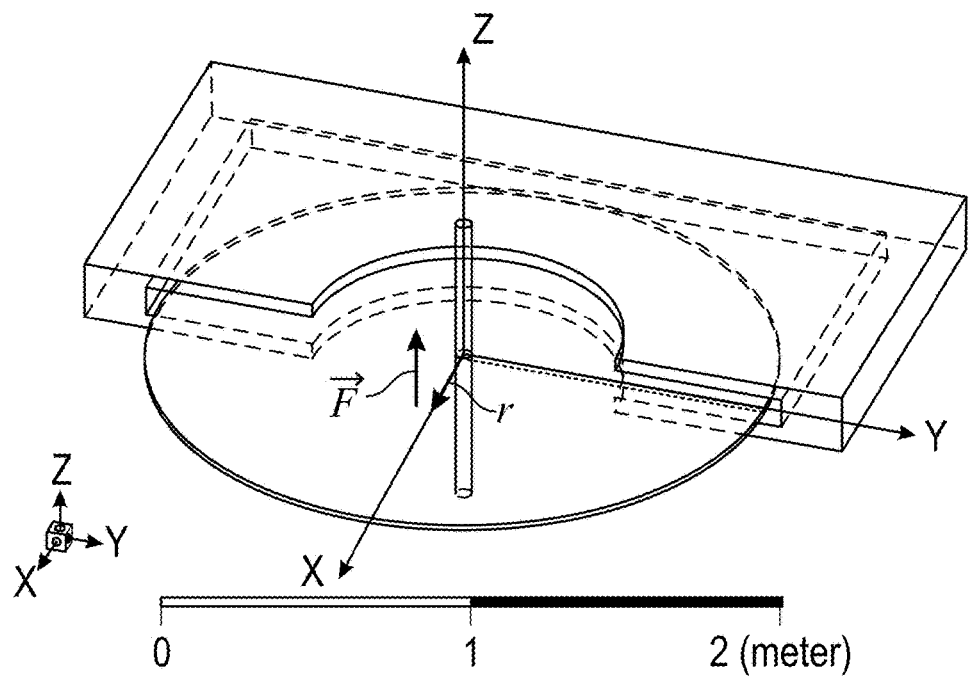
FIG. 60 schematically illustrates an example superconductor magnetic shield reduced in volume where the hazard of magnetic quenching could occur (assuming no magnetic hardening of the superconductor material), e.g., greater than 45 Tesla; one meter radius super-capacitor counter-rotating discs, $k=1\times10^9$, $V=2$ volts, $d=2$ microns, RPM=100,000; also shown the off-axis net lift force creating a moment about the y-axis.

FIG. 60 schematically illustrates an example superconductor magnetic shield reduced in volume where the hazard of magnetic quenching could occur (assuming no magnetic hardening of the superconductor material), e.g., greater than 45 Tesla; one meter radius super-capacitor counter-rotating discs, $k=1 \times 10^9$, V=2 volts, d=2 microns, RPM=100,000; also shown the off-axis net lift force creating a moment about the y-axis. FIG. 60 shows the magnetic shield being removed in the volume where superconductor magnetic quenching would occur; simulation predicts no significant penalty in lift is experienced. The resistance of the superconductor to magnetic quenching may also be enhanced. Research has shown that coating superconductors with nanometer thick layers of gold can increase the superconductor's resistance to magnetic fields by up to an order of magnitude; for further details, see Wu et al., "Spin proximity effect in ultrathin superconducting Be—Au bilayers," Phys. Rev. Lett. 96:127002 (2006), the entire contents of which are incorporated by reference herein. Recent research into atomically thin superconductors has also shown a greatly enhanced resistance to magnetic fields which may be employed in the superconducting magnetic shielding component, multiple atomically thin superconductor stacked layers for instance; for further details, see Yoshizawa et al., "Atomic-layer Rashba-type superconductor protected by dynamic spin-momentum locking," Nature Communications 42: article number 1462 (2021), the entire contents of which are incorporated by reference herein.

Figure 61:
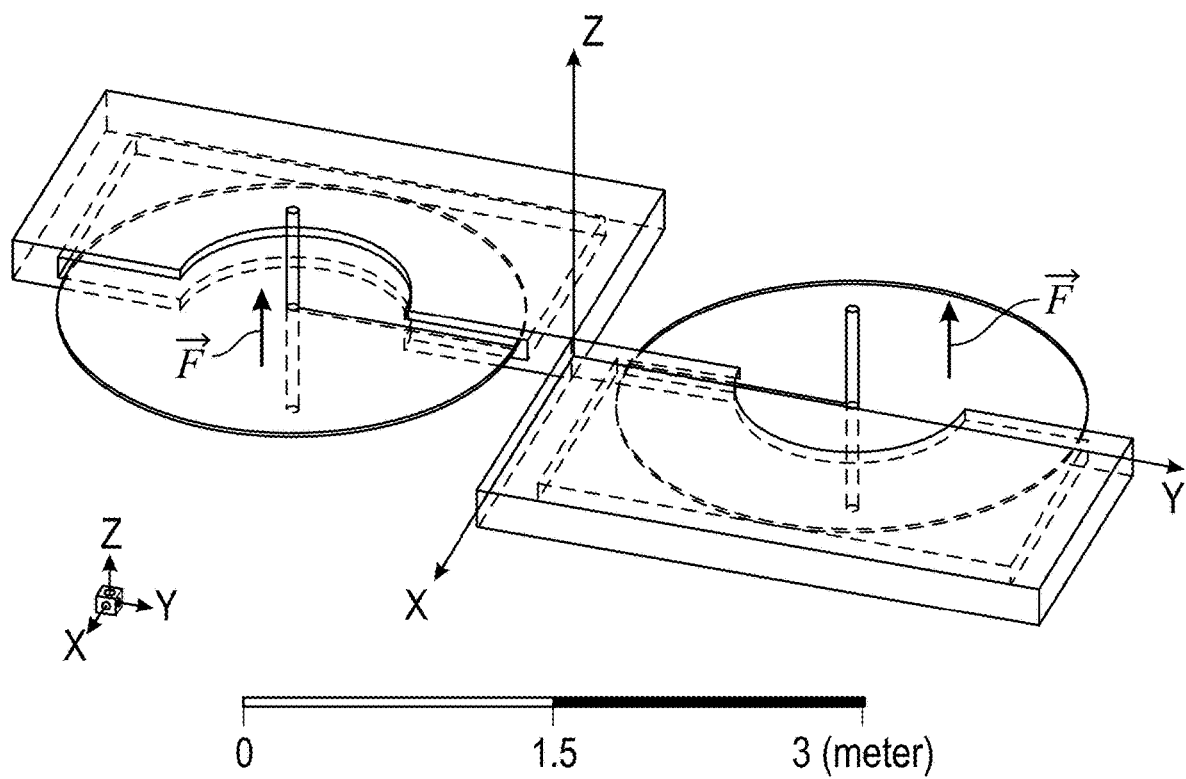
FIG. 61 schematically illustrates example complementary propulsion units to negate the resulting torque moment about the y-axis; in some examples, either the polarity of the discs may be reversed on the second unit or the direction of spin may be reversed.

The net center of force produced from the disc may not be collinear with the axis of rotation of the discs, it may be offset as shown in FIG. 60. This may produce a net torque around the y-axis. A simple solution to keep the net torque at zero on the craft is to have a companion DSC unit that mirrors the base unit. FIG. 61 schematically illustrates example complementary propulsion units to negate the resulting torque moment about the y-axis; in some examples, either the polarity of the discs may be reversed on the second unit or the direction of spin may be reversed. FIG. 61 shows a side-by-side configuration in which either the disc polarities are reversed or the discs spin in opposite directions on the companion unit. Shown is only one of many possible configurations, such as the units could be stacked or back-to-back. The selected unit(s)-companion unit(s) layout depends on the design requirements of the craft; FIG. 61 is only an illustrative example, it serves to highlight the usefulness of a companion (or counter) propulsion unit to counteract potentially unwanted torques in the system. For simplicity this is the only time the counter unit will be mentioned, it will be assumed to be present as a mirror of the base unit under discussion from here on out. The counter-unit need not be in close proximity to the base unit to perform its function. The complementary unit also doubles the lift/thrust force experienced by the overall system.

Throttling the Lift

An example advantage of some examples of the current implementation is the ability to energize the propulsion system before the craft lifts off, e.g., while still on the ground or launch pad. The dynamic super-capacitor can be charged and put into motion, using a terrestrial power source, before the craft is released. This saves on the amount of energy that the craft itself will need to use to achieve orbit. Over time the system may lose energy due to non-conservative forces, but the bulk of energy can be supplied to the propulsion system using a terrestrial power source before lift-off. This means a smaller on-board power source can be used to compensate for non-conservative losses (e.g., frictional/drag elements) and the potential and kinetic energy required to lift the craft into orbit.

Figure 62A:
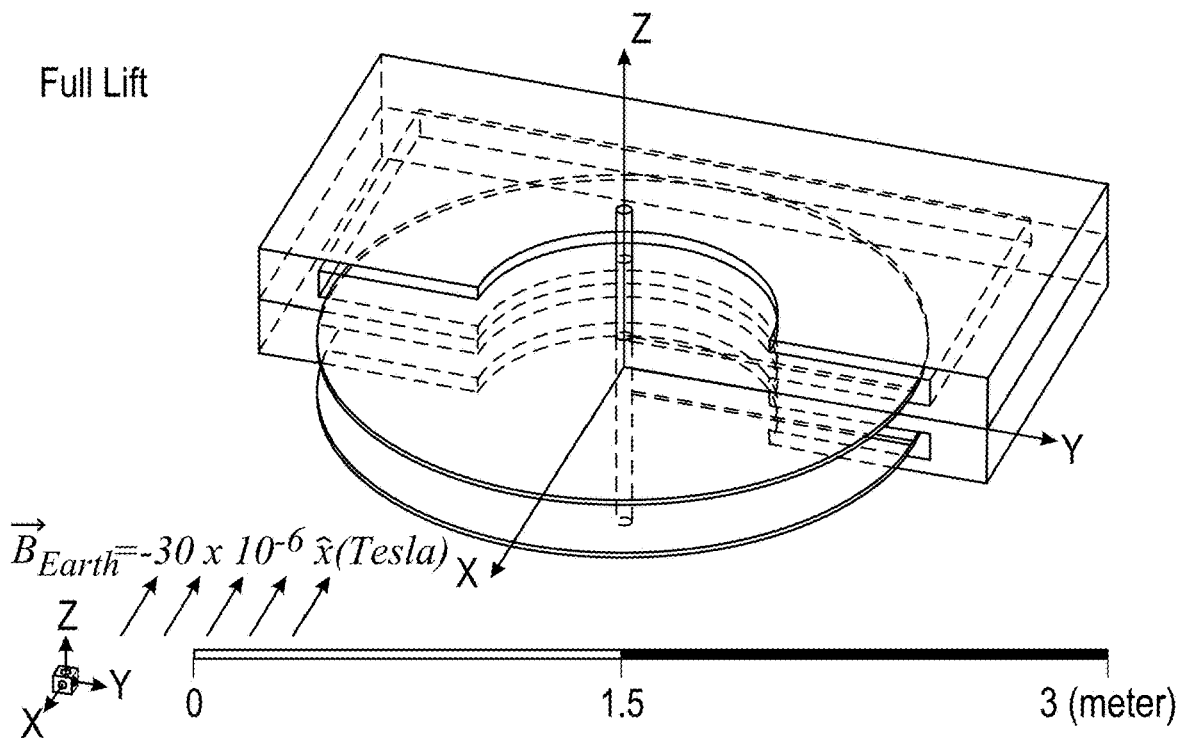
FIGS. 62A and 62B schematically illustrate an example dynamic super-capacitor pair with shielding configured to produce maximum lift (FIG. 62A); configured to produce zero lift (FIG. 62B).
Figure 62B:
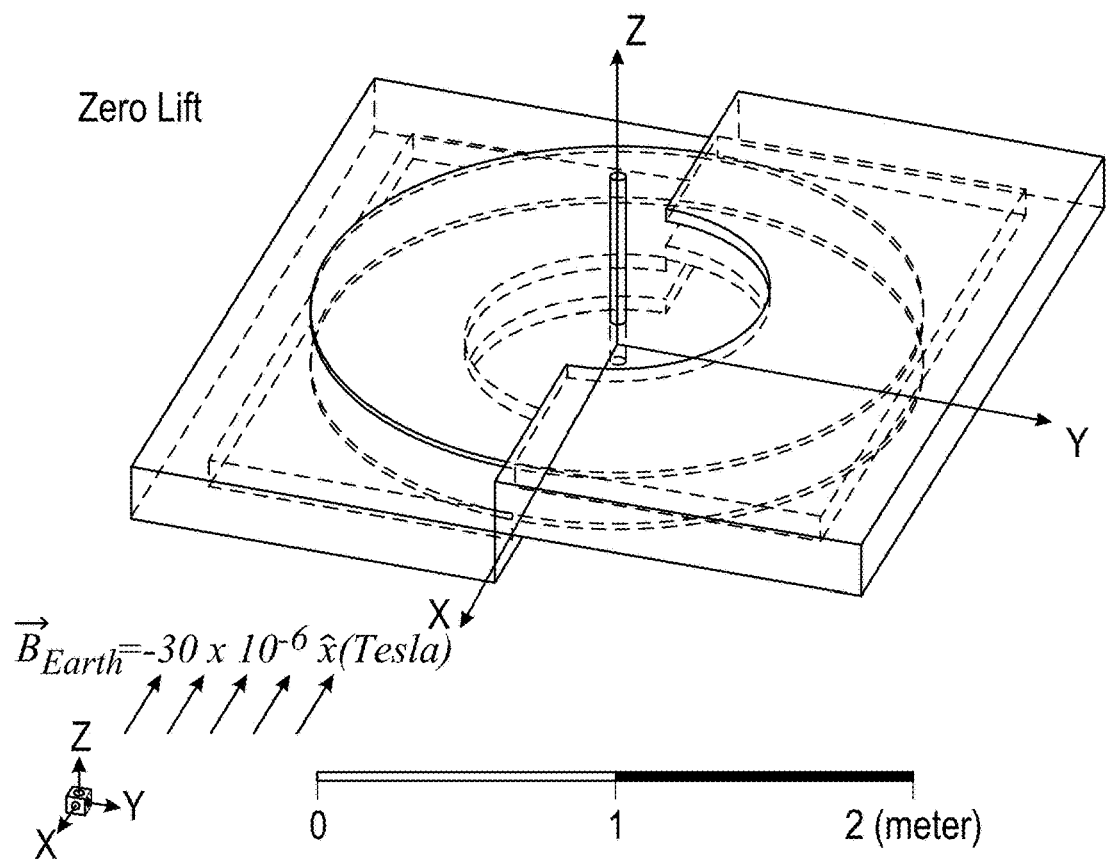

The magnitude of lift the propulsion system produces can be adjusted from zero up to the maximum amount achievable by adjusting the position of the magnetic shielding. In the example shown in FIG. 58, the external magnetic field intersects the front face of the magnetic shielding; in other words, the external magnetic field is perpendicular to the front face of the magnetic shield. This produces the maximum amount of lift; both regions I and IV produce positive z-axis lift, regions II and III produce near zero lift due to shadowing of the external magnetic field by the magnetic shield. If the magnetic shield front face runs parallel to the external magnetic field, rotating the magnetic shield 90 degrees, produces a net zero z-axis force; a positive z-axis force in region I and an equal and opposite, negative, force in region II. This may result in a net torque on the system. To avoid or reduce a net torque on the system a second disc pair may be implemented. FIGS. 62A and 62B schematically illustrate an example dynamic super-capacitor pair with shielding configured to produce maximum lift (FIG. 62A); configured to produce zero lift (FIG. 62B). In FIGS. 62A and 62B, the second magnetic shield is oriented 180 degrees to the first magnetic shield. This may substantially balance the torques, resulting in an approximately net zero torque. Any lift between zero and the maximum achievable can be obtained by rotating the shielding at intermediate angles relative to the external magnetic field. Also note, rotating the shielding in FIG. 56A by 180 degrees may produce the maximum force in the negative z-direction, so it is expected to be equally possible to provide a force towards the Earth as well as away from the Earth. The second unit can also be the complementary-unit as described herein, FIG. 61. Only how the shielding is rotated may change, the complementary unit being rotated 180 degrees to that shown in FIGS. 62A and 62B.

Figure 63A:
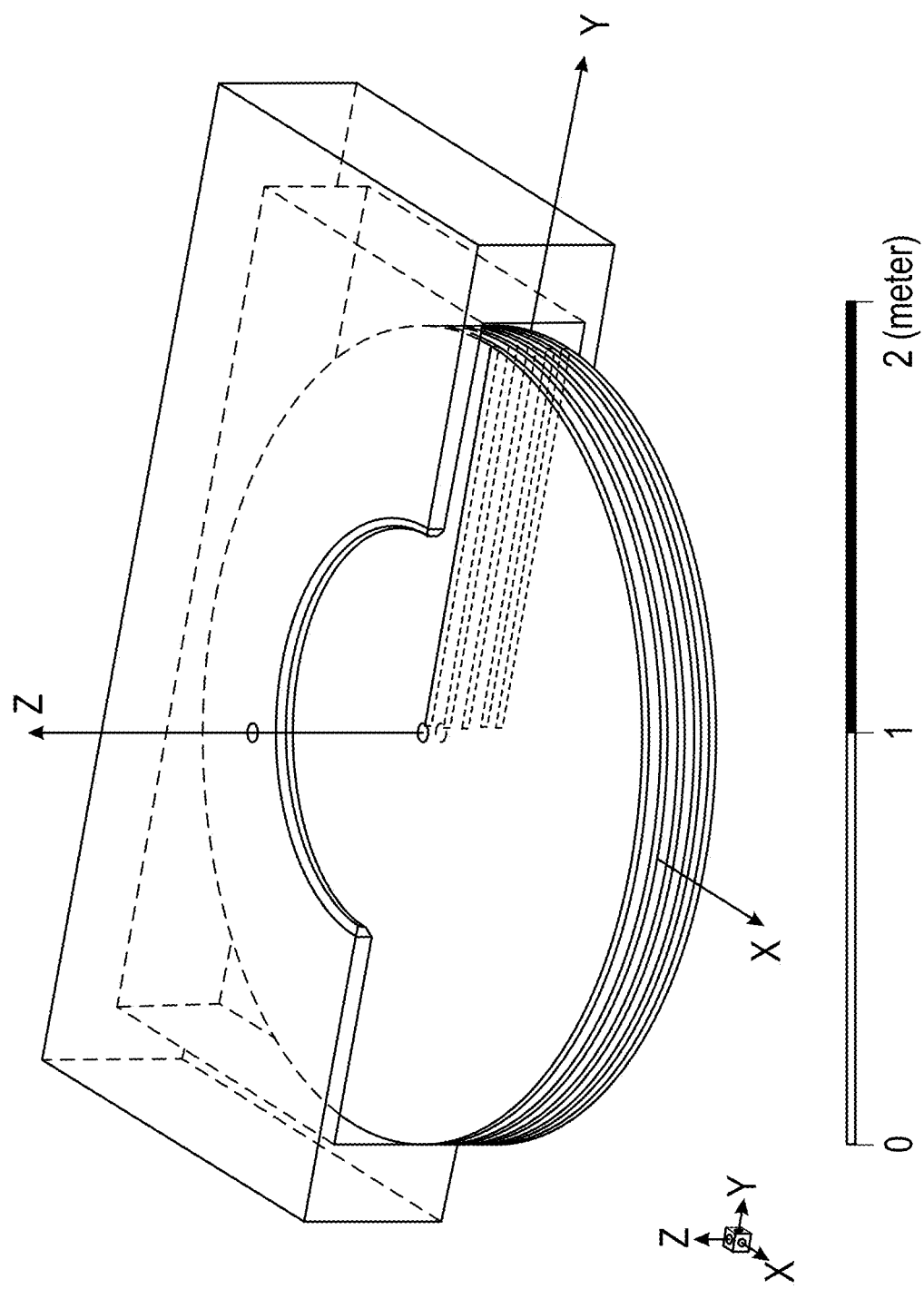
FIG. 63A schematically illustrates five dynamic disc super-capacitors (DSCs) with a single superconductor magnetic shield; based on the multi-electrode disc ultra-magnet (MDU).
Figure 63B:
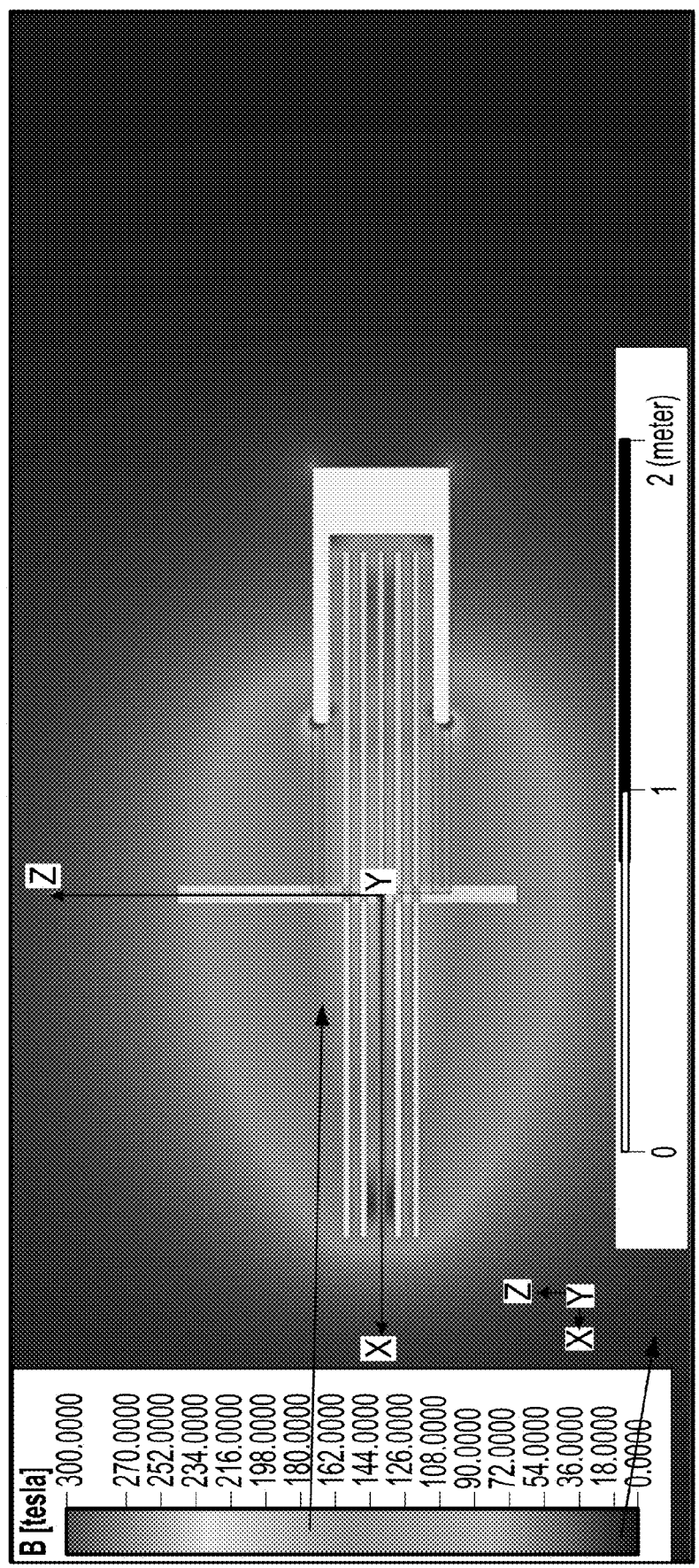
FIG. 63B illustrates the calculated magnetic field distribution for five example DSCs with five-micron thick super-dielectric (d=5 um), center 0.5-meter radius, removed from magnetic shield (ANSYS Maxwell™ simulation).
Figure 63C:
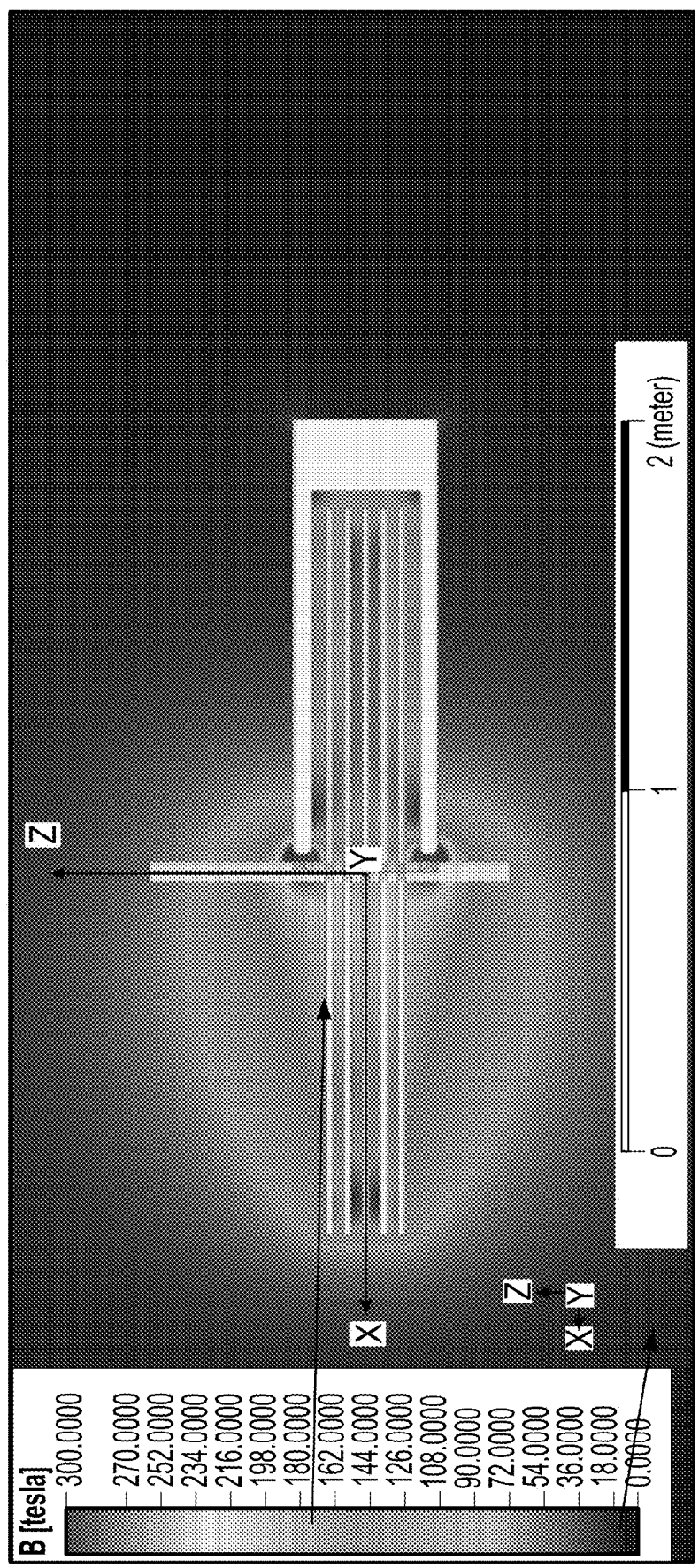
FIG. 63C illustrates the calculated magnetic field distribution for five example DSCs with center 0.05-meter radius removed from magnetic shield; R=1 meter, center r=0.5 meter removed from shield; RPM=100,000; V=2 volts; $k=1\times10^9$ (ANSYS Maxwell™ simulation).

It should be apparent that while a single rotating disc pair DSC has been discussed for instructional purposes, any number of stacked super capacitors can be employed to amplify the total lift the system can produce. For instance, the configuration in FIG. 62A can produce approximately twice the lift of a single dynamic super-capacitor. A system with four dynamic super capacitors would produce approximately four times the lift of a single dynamic super-capacitor and so on. Multiple super-capacitors can be used with a single magnetic shield if the maximum magnetic flux density of the superconductor is not exceeded. For example, FIG. 63A schematically illustrates five dynamic disc super-capacitors (DSCs) with a single superconductor magnetic shield; based on the multi-electrode disc ultra-magnet (MDU) described elsewhere herein. A 0.5-meter radius section removed from the center of the shield. FIG. 63B illustrates the calculated magnetic field distribution for five example DSCs with five-micron thick super-dielectric (d=5 um), center 0.5-meter radius, removed from magnetic shield (ANSYS Maxwell™ simulation). FIG. 63C illustrates the calculated magnetic field distribution for five example DSCs with center 0.05-meter radius removed from magnetic shield; R=1 meter, center r=0.5 meter removed from shield; RPM=100,000; V=2 volts; $k=1 \times 10^9$ (ANSYS Maxwell™ simulation). The simulated lift is 7358 Newtons (1654 lbs)

for a 5-micron thick dielectric (d=5 um) and 18,396 Newtons (4135 lbs) for a 2-micron thick dielectric (d=2 um). Because of the large magnetic fields involved, nanometer layer gold coated superconductors with enhanced magnetic resistance may be used in a manner such as described by Wu cited above, or atomically thick superconductor layers as described by Yoshizawa cited above.

Breaking the Symmetry, Current $\vec{J}$

Breaking the homogeneity of the external magnetic field, in an example case the Earth's locally uniform magnetic field, is one method of breaking the symmetry and producing lift as discussed so far. Another way to break symmetry and produce lift is to break the symmetry of the effective current distribution, $\vec{J}$. This allows the previously described use of magnetic shielding to be omitted.

Figure 64A:
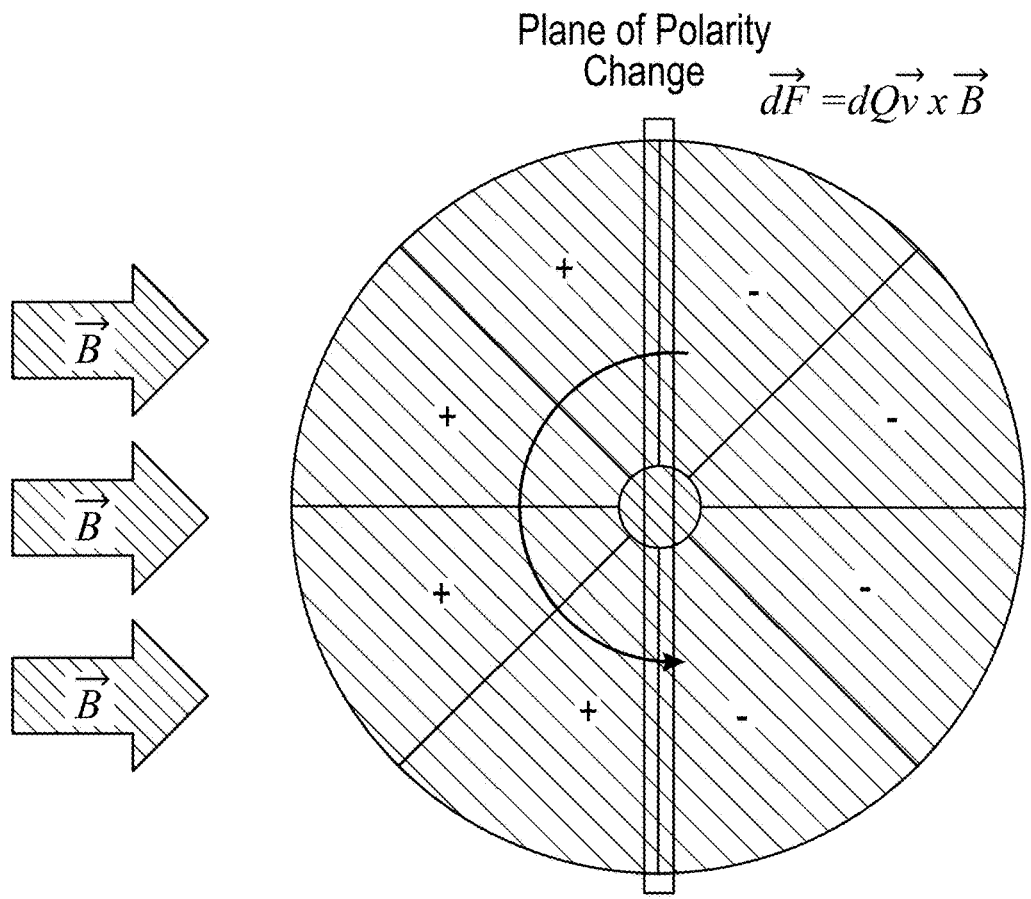
FIG. 64A schematically illustrates a plan view of an example segmented disc DSC; the bottom disc may have the opposite polarity distribution, and spin in the opposite direction or may be stationary if desired).

FIG. 59 shows the current density profile of a uniformly charged disc in axial rotational motion. As can be seen this current density profile is axisymmetric and as discussed produces a net zero force in a uniform magnetic field when unshielded. This effective current density profile can be modified to produce lift in regions I through IV of the disc. This can be achieved by segmenting the super-capacitor into individual regions, electrically isolated from one another, and reversing the polarity of the charge on the regional electrodes as they pass tangent to the external magnetic field, see FIGS. 64A and 64B. FIG. 64A schematically illustrates a plan view of an example segmented disc DSC; the bottom disc may have the opposite polarity distribution, and spin in the opposite direction or may be stationary if desired). For conceptual purposes, the segments are shown as 45-degree wedges. In practice, these segments would likely be much smaller. The top plate electrode is shown. The bottom electrode would have the opposite polarity profile and spin in the opposite direction. It should be noted that, as always, it is not mandatory that both discs spin, spinning both discs simply doubles the effective current and balances the reactionary torque.

It is apparent from equations 39 and 40, and the nature of the right-hand rule for the cross product, that the configuration shown in FIG. 64A produces lift (force out of the page) throughout the entire rotation of the disc. FIG. 65 shows the effective current distribution for the configuration shown in FIG. 64A at that instant in time. FIG. 65 illustrates the calculated effective current density distribution of the modeled DSC shown in FIGS. 64A and 64B; R=1 meter; RPM=100,000; V=2 volts; k=1×10$^9$, d=5 um. It should be apparent there may be a transient period in which the charge polarization of the segment is reversed at the plane of polarity change. In FIG. 64A, the charge has been fully transferred before the edge of the wedge (aka segment) falls on the plane of polarity change.

Figure 64B:
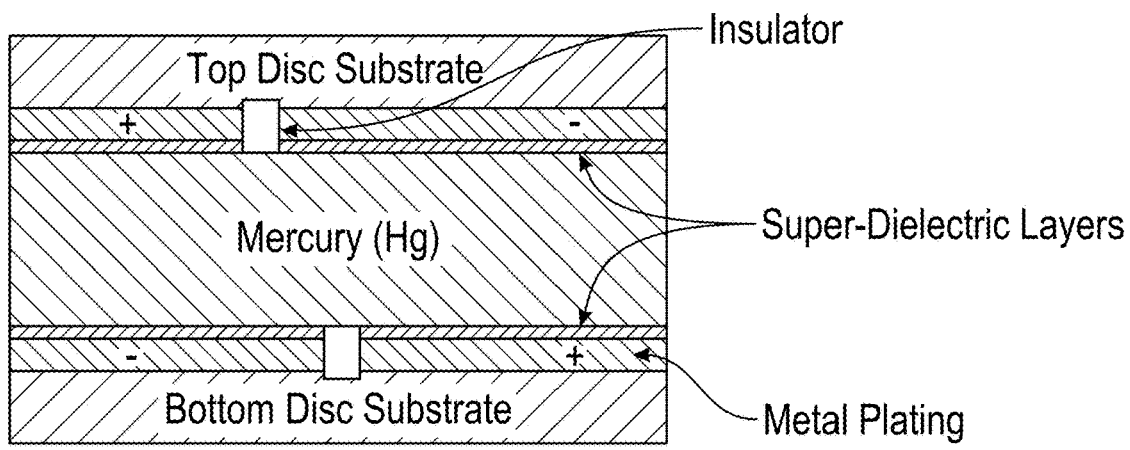
FIG. 64B schematically illustrates a cross-sectional view of an interface in the segmented disc DSC of FIG. 64A.
Figure 65:
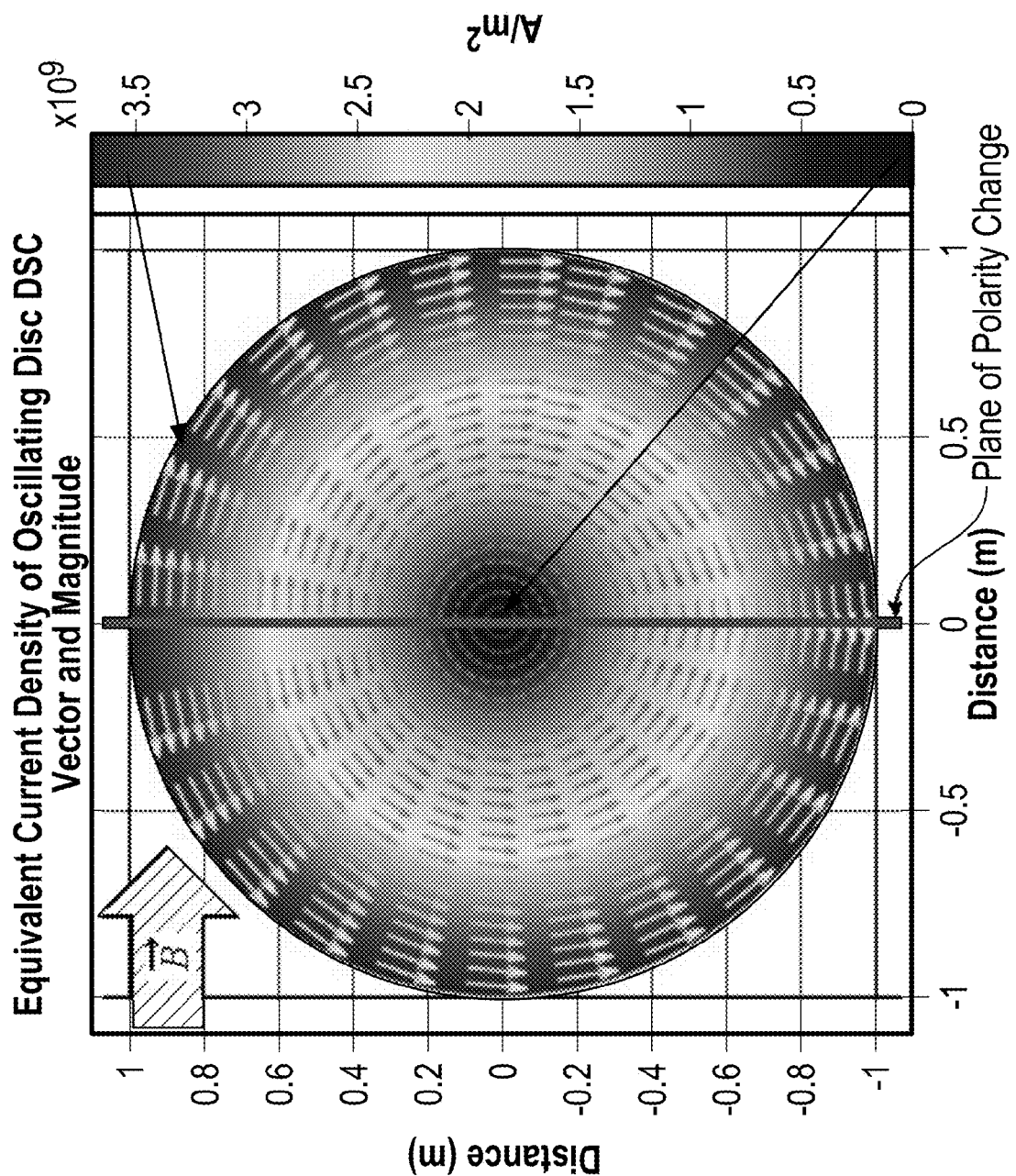
FIG. 65 illustrates the calculated effective current density distribution of the modeled DSC shown in FIGS. 64A and 64B; R=1 meter; RPM=100,000; V=2 volts; $k=1\times10^9$, d=5 um.

FIG. 64B schematically illustrates a cross-sectional view of an interface in the segmented disc DSC of FIG. 64A. FIG. 64B shows a side view schematic of the segmented two-disc electrode configuration with mercury as the conductive slip joint fluid between them. Due to strength and weight considerations and the strong internal electromagnetic stresses on the components very strong materials, such as ceramics, crystals, or composites can be used as the substrate material and can further be made conductive by metal coating/plating in a manner such as described elsewhere herein. The metal plating can be deposited by vapor deposition (e.g., thermal or e-beam evaporation) and electroplating if thicker layers are included. Thicknesses from nanometers to many microns are achievable. The metal can be selectively removed by lithography and etching, not unlike the traces on a printed circuit board (PCB). Anyone familiar in the art of microchip fabrication will readily understand the patterning process. An insulator can be deposited in the etched areas to inhibit or prevent shorting to the conductive slip-joint fluid. In FIG. 64B, the insulating points are shown offset as a reminder the discs are in relative motion to one another. The charges are also shown reversed on top and bottom as a reminder the bottom segments have the opposite polarity to the top segments.

Breaking $\vec{J}$ the Symmetry

Figure 66A:
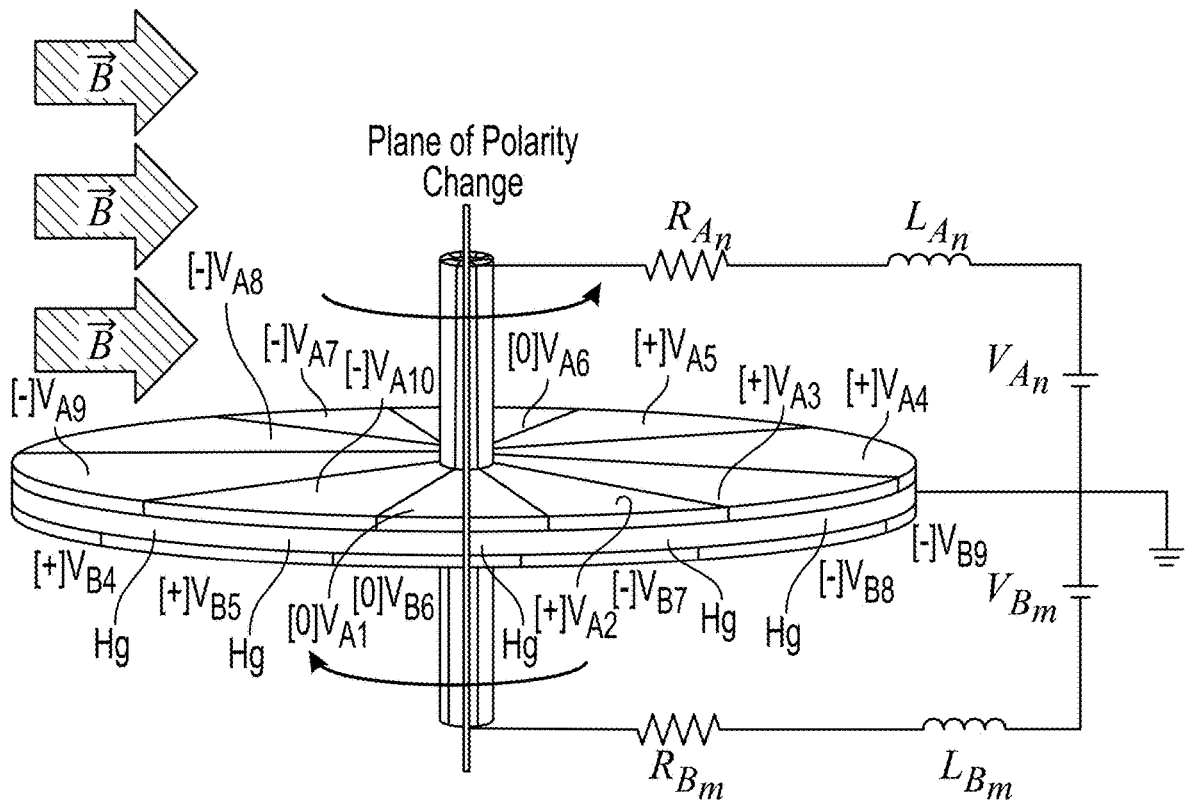
FIG. 66A schematically illustrates an example apparatus in which top and bottom electrodes of a DSC are divided into ten segments and power supplies are used to reverse the polarity on electrode segments; the plane of polarity change is orthogonal to the plane of the page and coincides with the axis of rotation at the center of the shaft; electrodes are counter-rotating with grounded mercury between; [+]-electrode segment is positively charged, [−]-electrode segment is negatively charged, [0]-electrode segment is in process of changing polarity.

There are two ways to change the polarity as the disc segments pass through the plane of polarity change. The first is to have a power supply, or power supplies, which reverse the segment voltage potentials and provide the current drive to reverse the charge polarity. For example, FIG. 66A schematically illustrates an example apparatus in which top and bottom electrodes of a DSC are divided into ten segments and power supplies are used to reverse the polarity on electrode segments; the plane of polarity change is orthogonal to the plane of the page and coincides with the axis of rotation at the center of the shaft; electrodes are counter-rotating with grounded mercury between; [+]-electrode segment is positively charged, [−]-electrode segment is negatively charged, [0]-electrode segment is in process of changing polarity. The voltage and current can be supplied through the shaft, with the shaft being electrically segmented similar to the disc electrode.

Figure 66B:
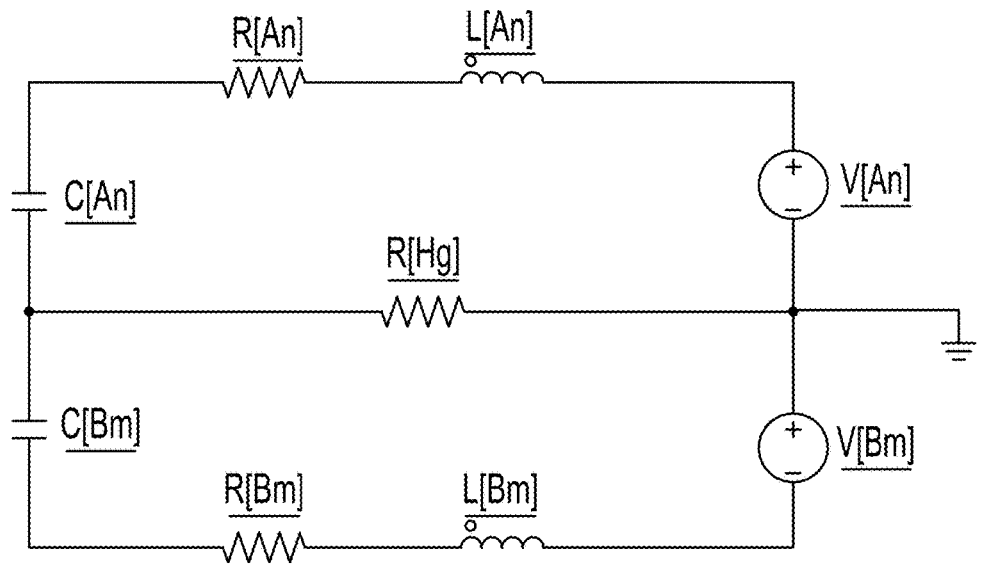
FIG. 66B illustrates equivalent electrical circuit of one of the $A_n$ capacitive segments shown in FIG. 66A.

FIG. 66B illustrates an equivalent circuit of one of the $A_n$ capacitive segments shown in FIG. 66A. R[An] is the combined resistance of the conductive path and internal resistance of the power supply, V[An], for the $n^{th}$ segment of the top disc. R[Hg] is the resistance of the mercury fluid since it is the common conductive ground path. L [An] is the intrinsic inductance of the system. C[An] is the electrical capacitance of the $n^{th}$ segment of the top disc super-capacitor. In the shown figure n=1, 2, . . . , 10, although ten is illustrative and can be more or less than ten. A 'B' subscript denotes the bottom disc super-capacitor with m representing the segment number of the electrically segmented bottom super-capacitor disc. Again m=1, 2, . . . , 10, with ten being only an illustrative example.

The second method of switching polarities at the plane of polarity change is to oscillate the energy stored in the capacitive segments with an inductive element to create an oscillatory LC circuit. The $LC_n$ circuit inductive element can be tuned to have the same oscillation frequency as the rotational frequency of the Dynamic Super-Capacitor (DSC). This configuration allows the charge to oscillate between the lower and bottom electrode segments as appropriate at the appropriate frequency. There may expected to be ohmic losses in the conductive paths so energy may be put back into the system as power is dissipated by any ohmic resistances encountered in the conductive paths. LCR (inductor-capacitor-resistor) circuits are well studied in control systems theory. Only the first method will be discussed in detail.

Controlling the Current Density Distribution

Figure 67:
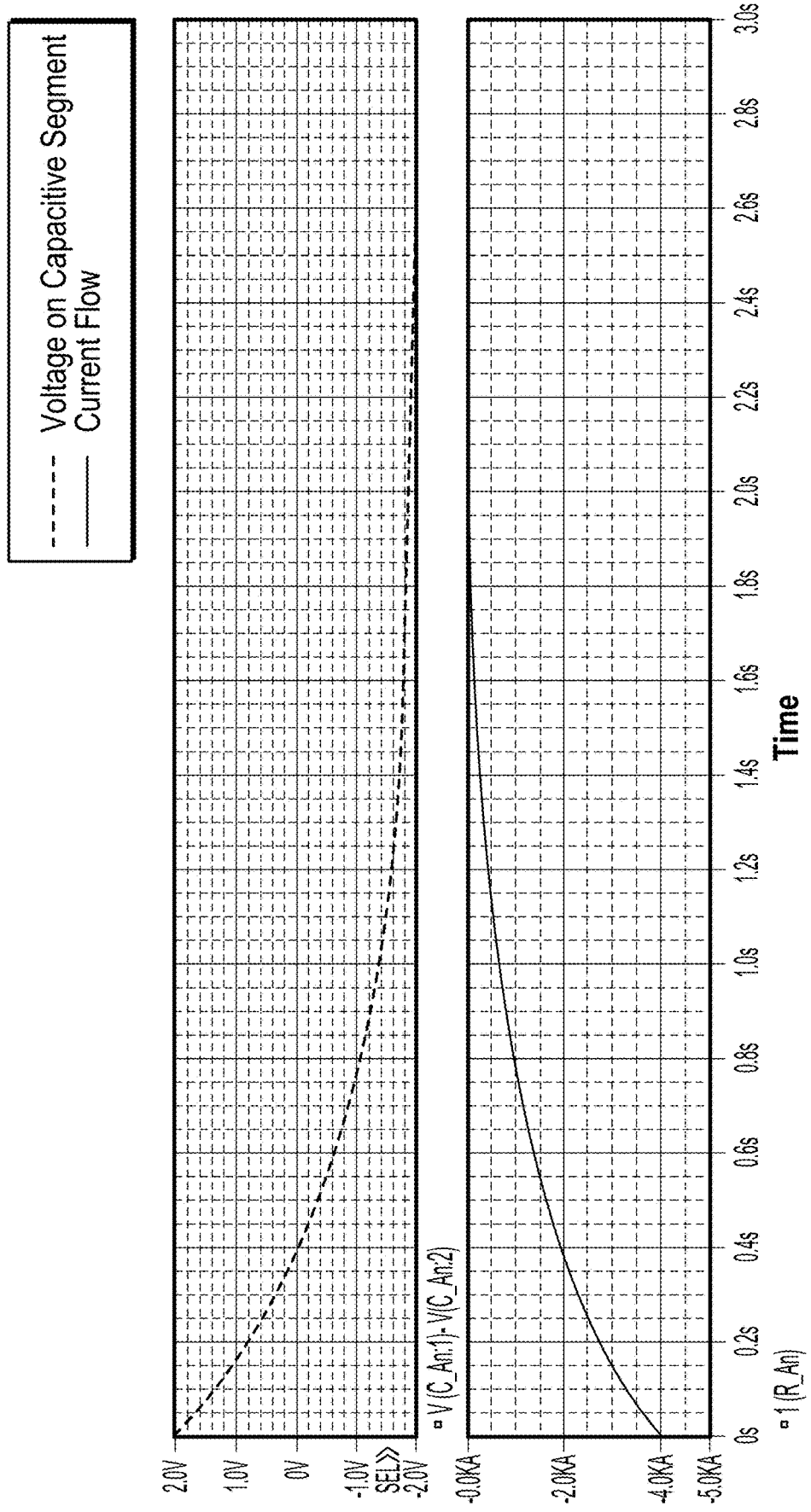
FIG. 67 illustrates results of a PSpice simulation of the equivalent circuit of one of the $A_n$ capacitive segments shown in FIGS. 66A-66B; with a total circuit resistance of 2 milliohm ($R_{Hg}$ plus $R_{An}$) and intrinsic inductance of 100 nH, it may take, for example, about two seconds for the capacitive segment to reverse polarity.

In the case with a dynamic super-capacitor with k=1×10$^9$, V=2 volts, R=1 meter, d=5 microns as an example, CA is about 5563 Farads for the entire disc, i.e., all segments of FIG. 66A-66B. Even dividing the disc into ten segments as shown in FIG. 66A leaves each segment with a capacitance of about 556 Farads. The fastest the polarity of the disc segment can be switched is limited by the well-known RC time constant. FIG. 67 illustrates results of a PSpice simulation of the equivalent circuit of one of the $A_n$ capacitive segments shown in FIGS. 66A-66B; with a total circuit resistance of 2 milliohm ($R_{Hg}$ plus $R_{An}$) and intrinsic inductance of 100 nH. Even with a low intrinsic resistance $R_{An}$ of one milliohm for the power supply and non-mercury part of the circuit, and one milliohm for the mercury resistance, $R_{Hg}$, it takes a little over two seconds for the polarity to reverse on a DSC segment. The disc may be divided into much smaller segments such that the capacitance of any individual segment is much lower.

Figure 68:
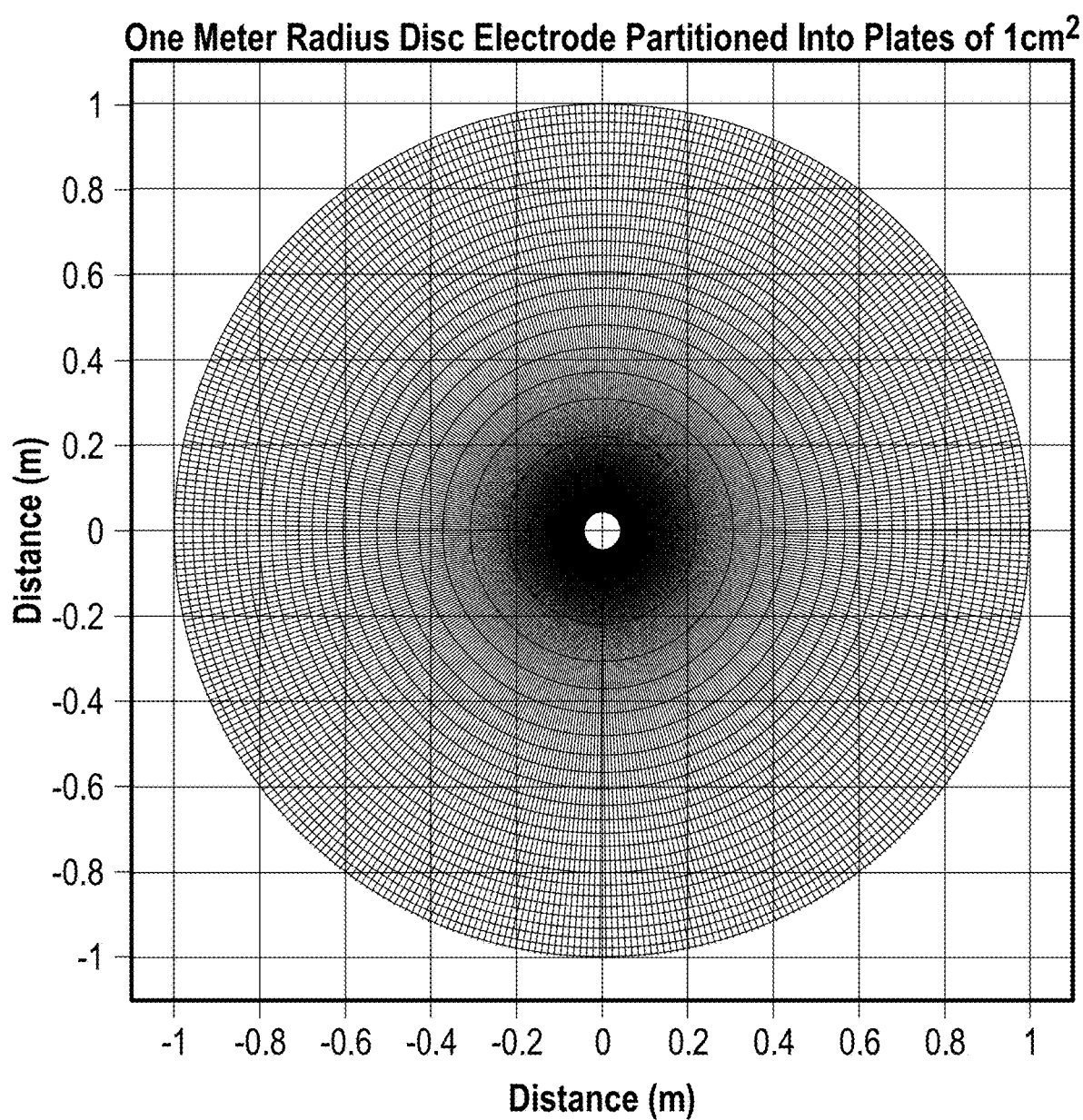
FIG. 68 schematically illustrates a plan view of a one-meter radius disc electrode partitioned into 1 $cm^2$ capacitive segments; the outer radial segments are truncated by the one-meter radial disc limit.
Figure 69:
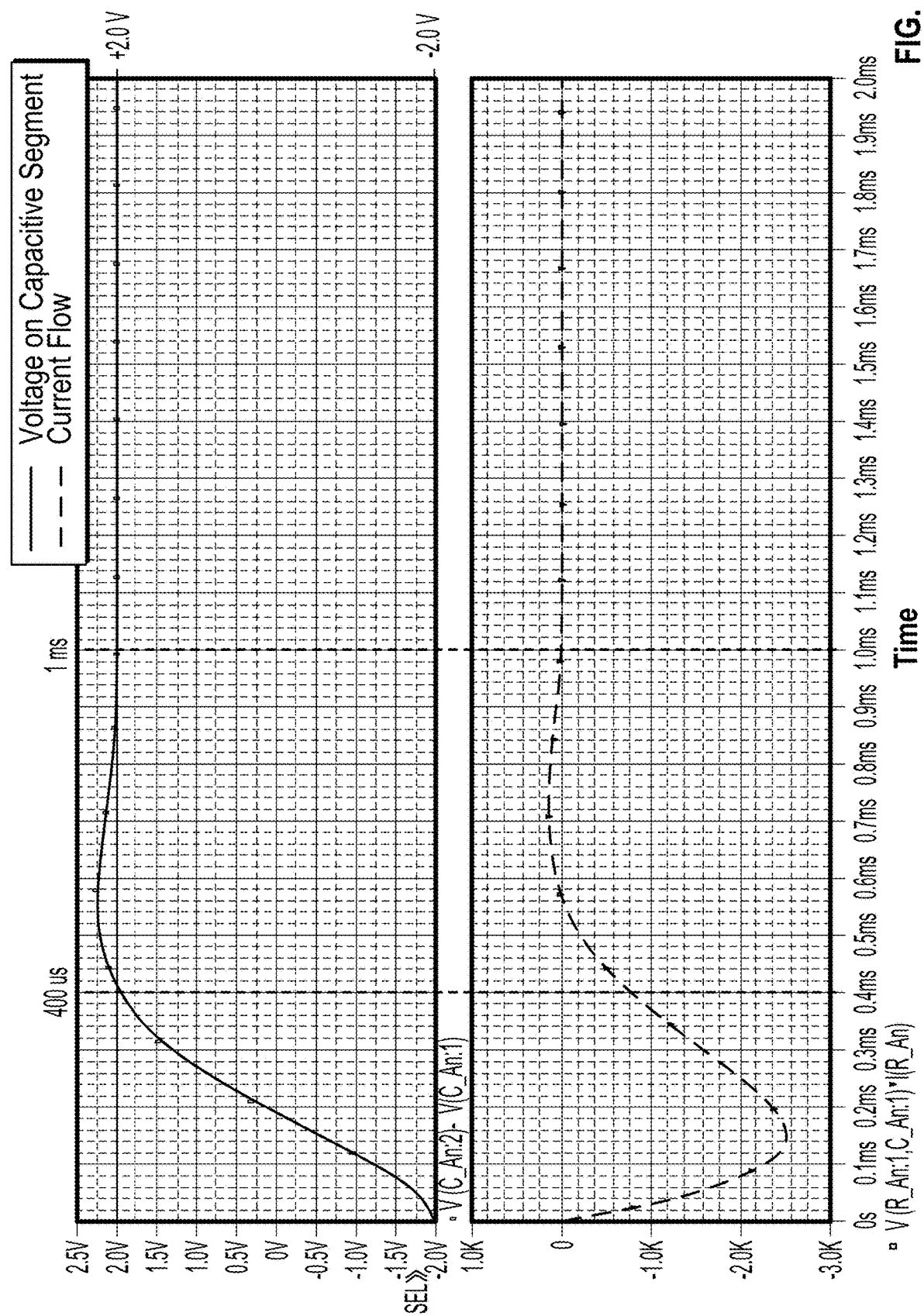
FIG. 69 illustrates results of PSpice simulation of the equivalent circuit of one of the $A_n$ capacitive segments shown in FIG. 68; with a total circuit resistance of 2 milliohm ($R_{Hg}$ plus $R_{An}$) and intrinsic inductance of 100 nH per segment, it may take, for example, about 400 microseconds for the capacitive segment to reverse polarity.

For example, FIG. 68 schematically illustrates a plan view of a one-meter radius disc electrode partitioned into 1 cm² capacitive segments; the outer radial segments are truncated by the one-meter radial disc limit. FIG. 69 illustrates results of PSpice simulation of the equivalent circuit of one of the $A_n$ capacitive segments shown in FIG. 68; with a total circuit resistance of 2 milliohm ($R_{Hg}$ plus $R_{An}$) and intrinsic inductance of 100 nH per segment. As can be seen in FIG. 69, the capacitive segment polarities are now able to be switched in approximately 400 micro-seconds.

An example benefit of the described design is the exclusion of a superconducting magnetic shield. The tradeoff is the need for circuitry for handling the large currents used to reverse the polarity at the high spin rates that may be used to produce significant lift, for example using reversal at least twice the frequency of rotation. The traces that supply charge to the plate segments through the central shaft can be made of high-conductivity materials such as graphene or in some cases superconductors. However, the current necessarily flows through the mercury (unless the point contact slip method described elsewhere herein is implemented). While resistances can be reduced or minimized, there may expected to be a certain amount of resistance and ohmic loss. Equation 54 and 55 describe electrical resistance and ohmic power loss respectively, $$R = \frac{\rho L}{A} \quad (54)$$

$$P_{ohmic} = I^2 R \quad (55)$$

where R is the resistance of the conductor in question, ρ is the resistivity of the material the current is flowing through, L is the path length through the conductor, A is the cross-sectional area of the conductor, I is the current in the conductor, and $P_{ohmic}$ is the ohmic power loss. The conductors here may include the traces supplying the currents on the disc and shaft, the capacitive segment resistance, and the current path through the mercury.

The capacitive segments can be appropriately sized in order to compensate for circuit resistance, and/or inductance, in order to get charging time constants consistent with reversing the polarity at least two times per rotation. In order to produce maximum lift, the segments may be maximally charged as the tangential velocity of the capacitive segment's velocity vector runs perpendicular to the external magnetic field vector. A controller that operates the power supplies and ensures the plates are polarized and reverse-polarized in the correct timing sequence may be incorporated and can be external to the shaft and disc electrode system, though the signals may be transmitted on traces along the shaft and discs.

Manipulating the Mercury Fluid

Because of its fluidic nature and conductivity, the mercury slip joint fluid can be manipulated in the presence of the magnetic field produced by the DSC, in other words the mercury can be made to flow in a desired manner using electromagnetic manipulation. As discussed elsewhere herein, it may be desirable to inhibit the mercury fluid from 'sticking' to the rotating electrodes and being dragged along with the electrode rotation, causing parasitic charge motions. In the breaking effective current, J, symmetry design just discussed, because there is conventional electrical current flowing through the mercury in the presence of magnetic fields produced by the DSC, the mercury may experience magnetohydrodynamic forces. The electron currents and corresponding Lorentz forces can be configured to mitigate the drag the mercury may experience at the contact between the super-dielectric layer (SD) on the disc electrode and the mercury; further mitigating charges in the mercury close to the mercury-SD interface from being dragged along with the rotating disc—which would diminish the total effective current, i.e., parasitic charge motion.

For example, FIG. 36 described above shows the simulated magnetic field vector between the two plates, i.e., in the mercury slip-joint fluid layer. As can be seen, for the most part, the magnetic field vector inside the mercury runs perpendicular to the plane of the discs. As a reminder, the effective current is the current produced by the charges on the electrodes being in mechanical motion. The electron current used to exert force on the mercury is a conventional electron current as is commonly encountered in any common electrical circuit, e.g., current in a wire. The flow of the electron current can be configured such that magnetohydrodynamic forces can be exerted on the mercury in a controlled and desirable way. Electrical traces can be patterned on the disc(s) and come into contact with the mercury where desired, allowing current to flow through the mercury in a controlled and patterned way. Due to the Lorentz force, equation 34 and 40, a force is locally exerted on the mercury proportional to the perpendicular component of the local magnetic field and electron current density flow, FIG. 37. The force of equations 34 and 40 is the force exerted on the electrons, the electrons may then transfer their acquired momentum to the fluid through electron-atom collisions. In this way the mercury can be made to experience a force counter to the motion of the rotating disc, or discs if two or more discs are counter-rotated. The mercury fluid can potentially be made to move counter to the rotation of the electrodes or in just about any other motional path desired. In the simulations and calculations of the present disclosure, the charges accumulated in the mercury due to the capacitive nature of the DSC are assumed to be stationary. While it is clear that the conventional current used to reverse the polarity of the capacitive segments in the symmetry breaking method described prior can be used in this way to manipulate the motion of the mercury, an electron current can be applied as described to control mercury movement and mitigate movement of charge accumulation in the mercury close to the SD-mercury interface for any design, e.g., the previously described superconductor shielded design as well.

As an additional way to throttle the lift of the propulsion system, the mercury can be made to rotate with the electrodes using these magnetohydrodynamic forces. In this way, the charge stored in the mercury may move along with its oppositely charged counterpart charge on the electrode thus reducing the overall net charge in motion, thus reducing the effective current and thusly the experienced lift in the external magnetic field. For example, an electron and proton closely spaced moving along together in space may produce no net magnetic field at a distance. If that same electron and proton were moving with opposite velocity vectors they may be expected to produce twice the magnetic field as would have been experienced by a single charged particle moving by itself. If the charged mercury layer at the SD-mercury interface and the charged electrode were moving in perfect unison, the $\vec{J}_{eff}$ in equation 40 would equal zero and no lift would be experienced. This is another method of potentially throttling the lift/thrust electrically as opposed to the mechanical methods described previously, e.g., rotating the magnetic superconductor shields.

While tailoring the $\vec{J}_{eff}$ vector to produce lift is a technical possibility, it presents some challenges; large conventional currents may oscillate which introduce ohmic losses. These ohmic losses may be dealt with from a power loss perspective and heat management perspective. Additionally, Faraday's law (equation 30) dictates that changing magnetic fields may induce an electromotive force which may induce eddy currents within conducting volumes in the propulsion system and surrounding structures. While ohmic losses and eddy currents may be mitigated, due to the static field nature of the superconductor magnetic shielding method, the shielding method remains an example of a useful embodiment.

Type III Propulsion

Type I propulsion generates lift close to the magnetic poles of the Earth through the magnetic force generated by two magnetic dipoles-repelling or attracting one another. Type II propulsion utilizes the magnetic Lorentz force generated by charged spinning discs in a uniform magnetic field with the plane of the discs oriented parallel to the magnetic field, such as close to the equator of the Earth; with the symmetry of the external magnetic field or the effective current on the discs being broken as previously described. Type III propulsion uses charged spinning electrodes that are oriented perpendicular to the locally uniform magnetic field; symmetry breaking is still used to generate net lift/thrust. A difference between Type II and Type III propulsion is the force vector component is directed perpendicular to the plane of the disc in Type II and the force vector component lies in the plane of the disc with Type III propulsion; both types work on the principle of magnetic Lorentz forces acting on moving charges in an external magnetic field, in the example case of the Earth's magnetic field.

Force on a Spinning Charged Disc II

Figure 70:
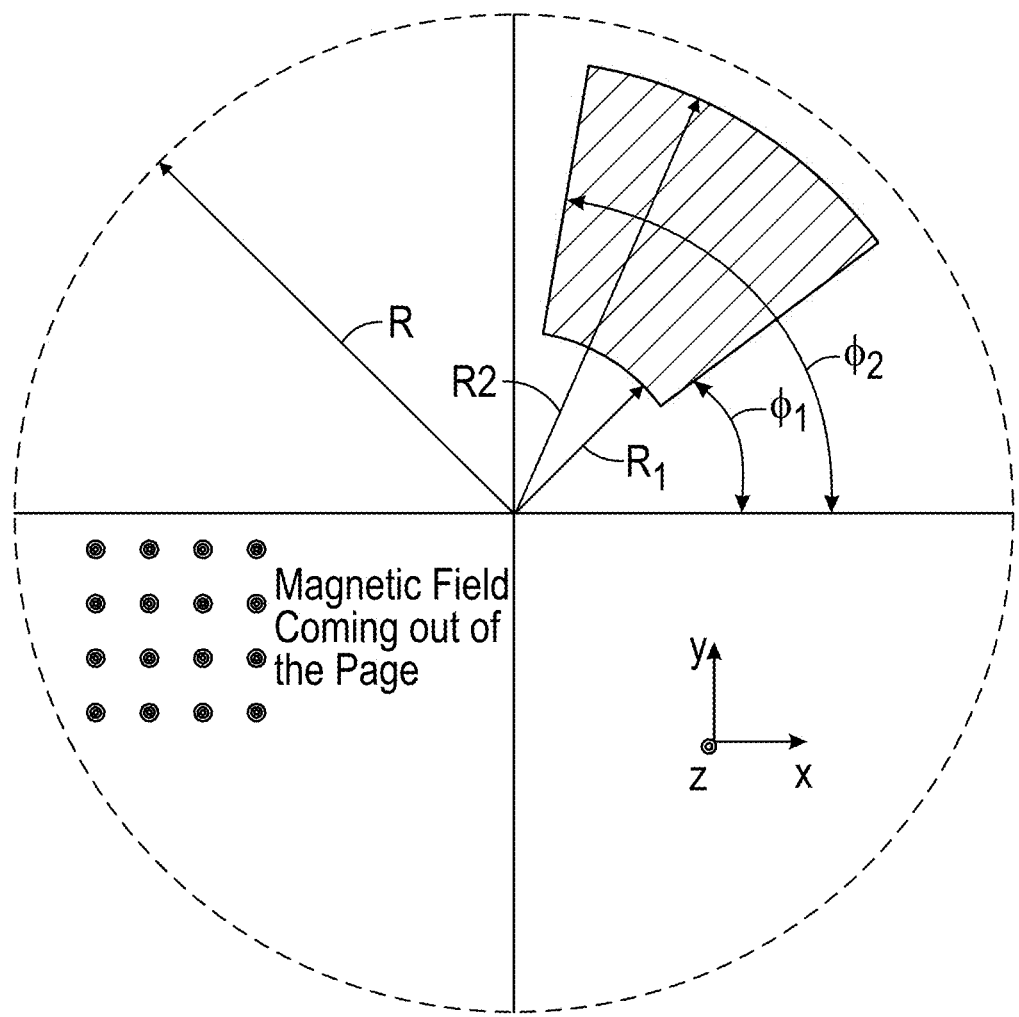
FIG. 70 schematically illustrates example forces on a spinning charged disc in another uniform magnetic field.

FIG. 70 schematically illustrates example forces on a spinning charged disc in another uniform magnetic field, with the magnetic field being perpendicular to the plane of the disc. The differential area, dS, in cylindrical coordinates is $$dS = rd\varphi dr.$$

The differential charge is given by $$dQ = \sigma dS = \sigma rd\varphi dr.$$

Plugging dQ and v in terms of the rotational velocity, $v = r\omega$, into equation 39 yields $$d\vec{F} = dQ\vec{v} \times \vec{B} = (\sigma r d\varphi dr)(r\omega)(\hat{v} \times \vec{B}) = (\omega \sigma r^2 d\varphi dr)(\hat{\varphi} \times B_0\hat{z})$$

$$d\vec{F} = dQ\vec{v} \times \vec{B} = B_0\sigma\omega r^2 d\varphi dr \hat{r} \quad (56)$$

or written in Cartesian coordinates, $$d\vec{F} = dQ\vec{v} \times \vec{B} = B_0\sigma\omega r^2 d\varphi dr(\cos\varphi \hat{x} + \sin\varphi \hat{y}) \quad (56)$$

The force on a wedge of the disc, caused by the magnetic field, can be calculated as $$\vec{F} = B_0\sigma\omega\int_{\varphi_1}^{\varphi_2}\int_{R_1}^{R_2} r^2(\cos\varphi \hat{x} + \sin\varphi \hat{y})d\varphi dr \quad (57)$$

where $\varphi_1$ is the angular start of the wedge and $\varphi_2$ is the angular ending of the wedge and $R_1$ and $R_2$ are the starting and ending radius of the wedge, see FIG. 70. Evaluation of equation 57 leads to $$\vec{F} = \frac{1}{3}B_0\sigma\omega(R_2^3 - R_1^3)[(\sin\varphi_2 - \sin\varphi_1)\hat{x} + (\cos\varphi_1 - \cos\varphi_2)\hat{y}], \text{ or} \quad (58)$$

$$\vec{F} = \frac{1}{3}B_0\omega\left(\frac{Q}{\pi R^2}\right)(R_2^3 - R_1^3)[(\sin\varphi_2 - \sin\varphi_1)\hat{x} + (\cos\varphi_1 - \cos\varphi_2)\hat{y}] \quad (59)$$

if written in terms of the total charge on the disc $Q = \sigma(\pi R^2)$.

Figure 71:
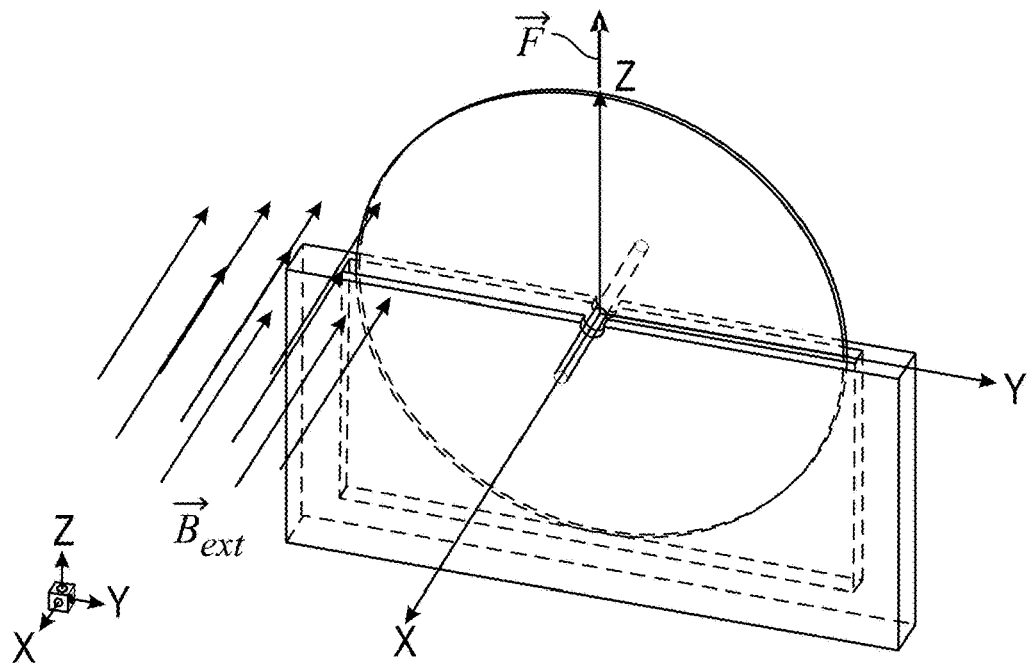
FIG. 71 illustrates a model of an example shielded DSC system with magnetic field perpendicular to the disc electrode.

Examining equation 59, it can be discerned that the force vector can be directed in any desired direction in the plane of the disc when there is a magnetic field component perpendicular to the plane of the disc; using any of the symmetry breaking techniques discussed previously. Note, equation 59 has a very similar form to equation 47. The Lift/Thrust vs RPM vs Disc Radius results of FIG. 57 apply to Type III propulsion similarly. With quadrants I and IV exposed to the external magnetic field, a one-meter radius disc spinning at 100,000 RPM, with $k=1\times 10^9$, V=2 volts, and d=2 microns at the Earth's equator yields a force of about 3700 Newtons (835 lbs) in the positive z-direction. FIG. 71 illustrates a model of an example shielded DSC system with magnetic field perpendicular to the disc electrode. An ANSYS Maxwell™ simulation of the FIG. 71 system using a superconductor magnetic shield predicts 3880 Newtons (870 lbs) in the z-direction, in reasonable agreement.

With Type III propulsion, the forces are directed along the radial plane of the discs as can be seen from equation 56. Mobile charges may have the tendency to migrate to the edges of the discs, the Hall effect. Unwanted voltage potentials may be produced, i.e., the degradation voltage potential of the super-dielectric may be reached or exceeded. In order to hinder the migration of charges and mitigate the Hall effect and limit potential eddy currents as well, the electrode may be electrically segmented similar to that shown in FIG. 68 to limit charge mobility and eddy current path lengths. Conversely, the charges have their maximum tangential velocity at the rim of the disc. Forcing the charge distribution to the outer rim of the discs would enhance thrust/lift over the uniform charge distribution assumed. Super-dielectrics with higher breakdown/degradation voltage potentials are expected to benefit from the Hall effect.

Figure 72A:
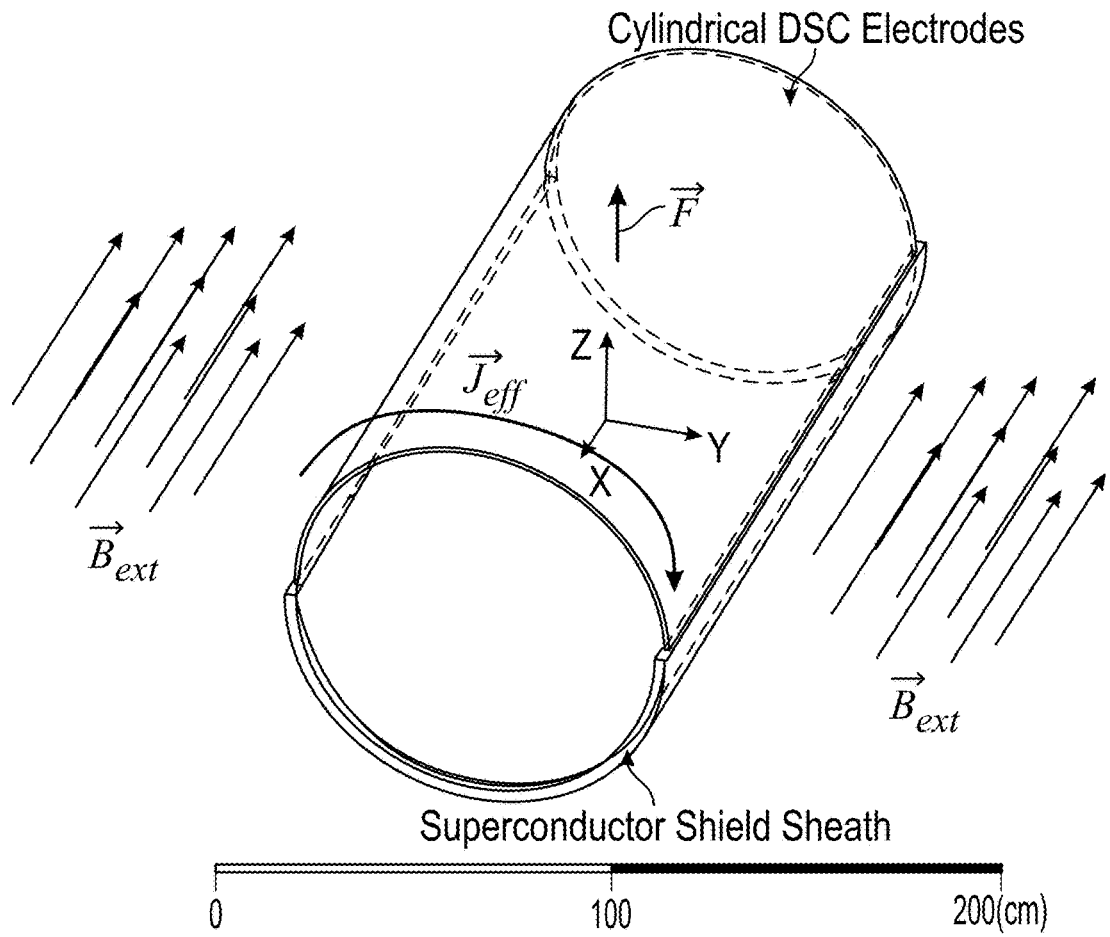
FIG. 72A illustrates a model of an example shielded, cylindrical DSC with external magnetic field direction shown ($B_{ext}$~30 micro-Tesla at Earth's equator).
Figure 72B:
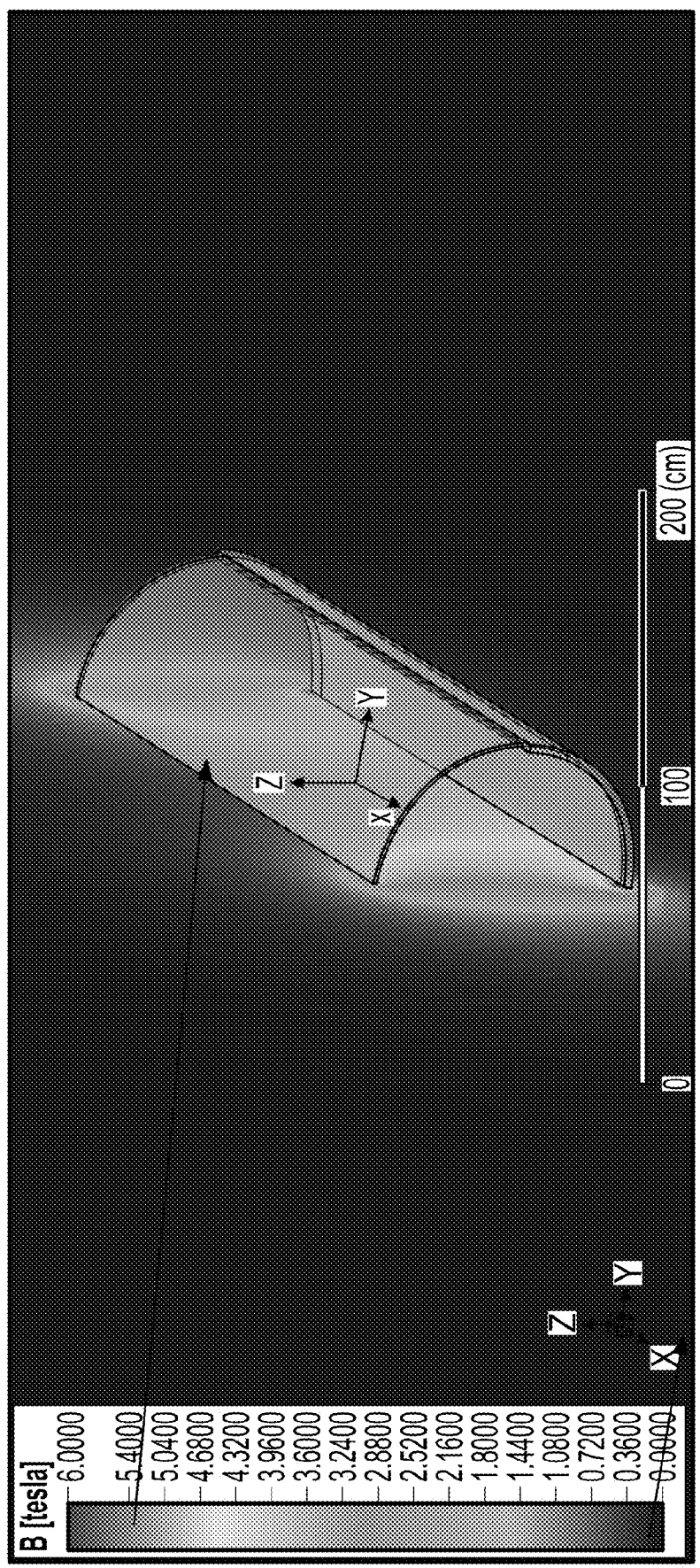
FIG. 72B illustrates the calculated magnetic field intensity profile generated by the cylindrical DSC of FIG. 72A; Length=2 meters, Diameter=1 meter, $k=1\times10^9$, d=2 microns, RPM=100,000, Voltage=2 V; counter-rotating electrodes assumed (ANSYS Maxwell™).

While disc electrodes for the DSCs may be used, any rotationally symmetric electrodes may be used, such as cylinders or spheres. FIG. 72A illustrates a model of an example shielded, cylindrical DSC with external magnetic field direction shown ($B_{ext}\sim 30$ micro-Tesla at Earth's equator). In one example, FIG. 72A shows a cylindrical DSC superconductor shielded model of length=2 meters, diameter=1 meter, d=2 microns, $k=1\times 10^9$, RPM=100,000, V=2 volts, with counter-rotating electrodes. Simulated lift is 256 Newtons (60 lbs). FIG. 72B illustrates the calculated magnetic field intensity profile generated by the cylindrical DSC of FIG. 72A; Length=2 meters, Diameter=1 meter, $k=1\times 10^9$, d=2 microns, RPM=100,000, Voltage=2 V; counter-rotating electrodes assumed (ANSYS Maxwell™). This is for a single cylinder configuration, of course several concentric cylindrical DSCs could be used to amplify the performance in a manner such as described elsewhere herein.

Magnetic Field Orientation and Thrust

Figure 73A:
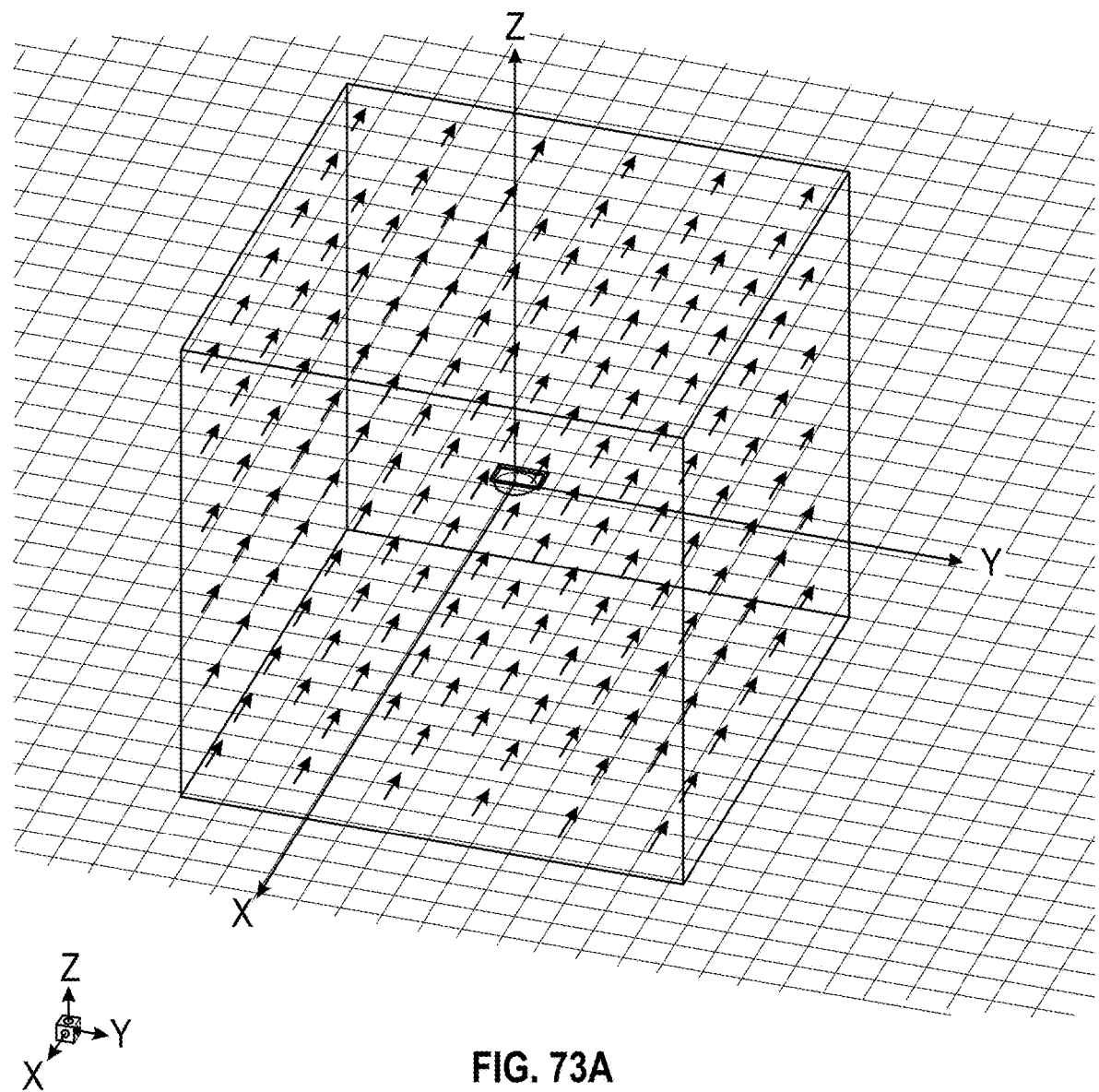
FIG. 73A schematically illustrates an aid in visualizing magnetic field orientation thrust simulations; reference external magnetic field (0 deg, 0 deg, 0 deg).
Figure 73B:
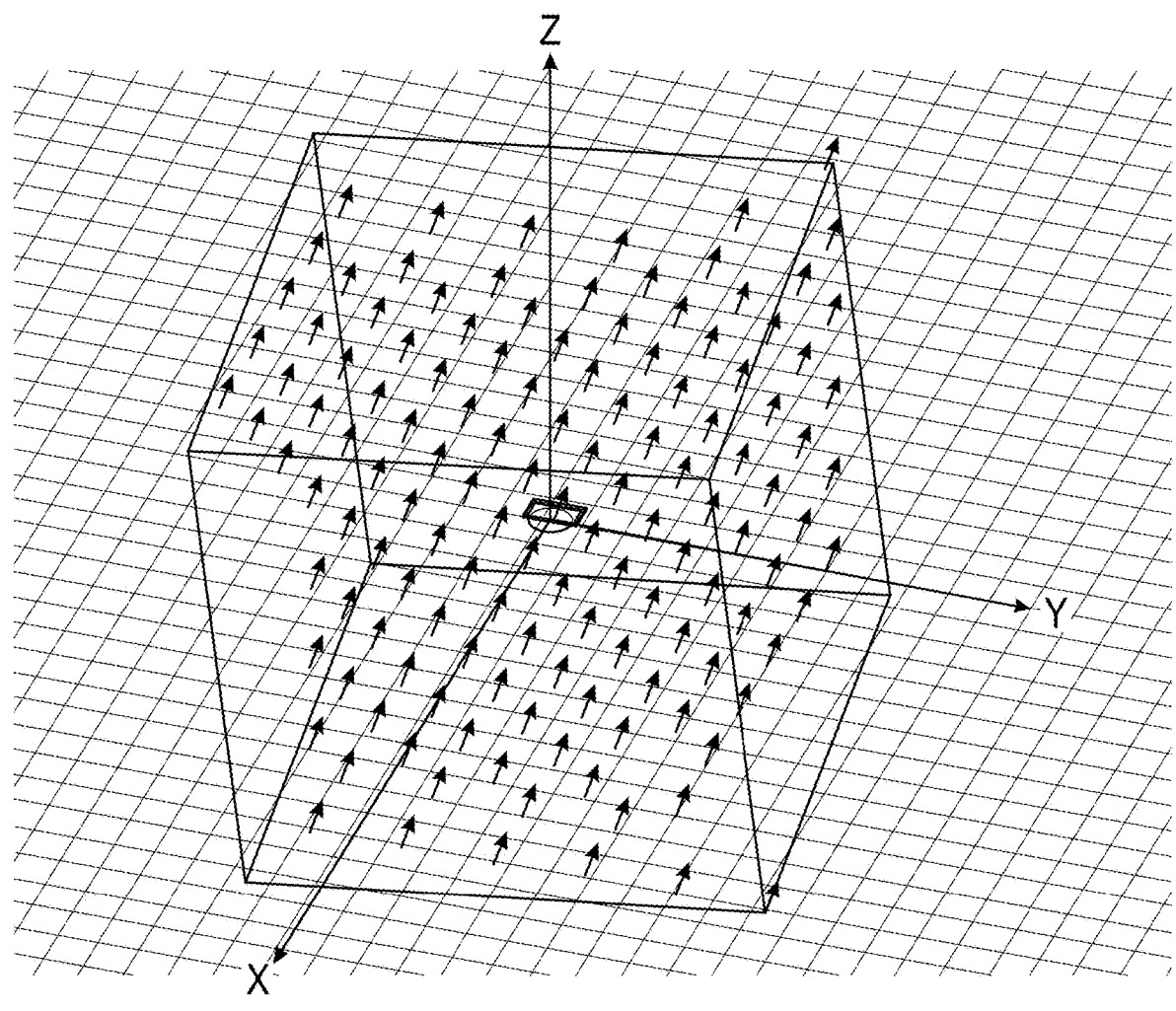
FIG. 73B schematically illustrates another aid in visualizing magnetic field orientation thrust simulations; external magnetic field tilted by 5 degrees (x), 5 degrees (y), and 5 degrees (z).
Figure 73B:
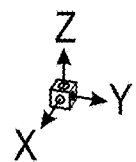
Figure 74A:
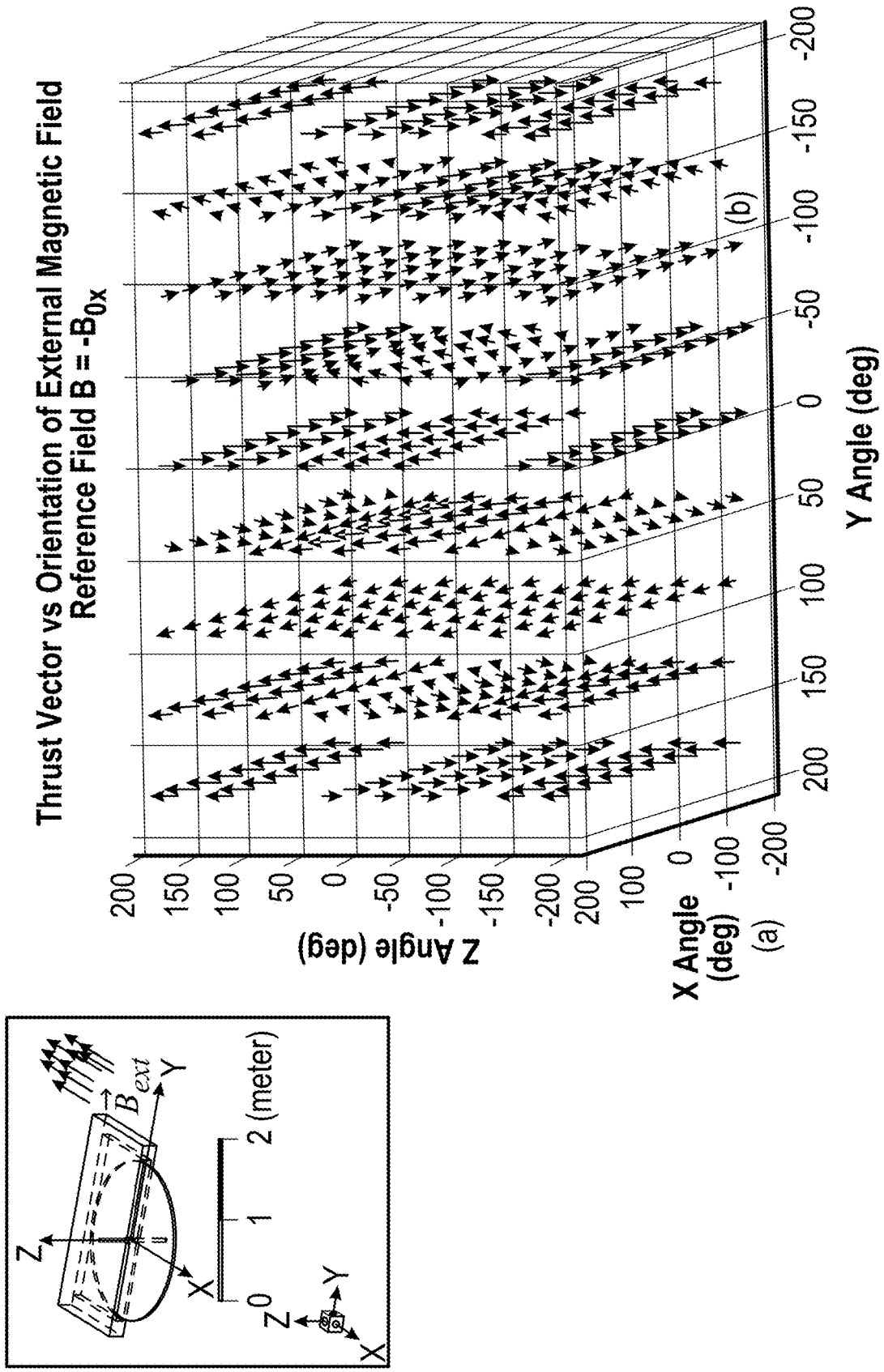
FIG. 74A schematically illustrates the simulated force vector vs orientation of the external magnetic field for an example propulsion system, referenced to a $\vec{B}=-B_0\hat{x}$ magnetic field; force is for the set up shown in FIG. 56A; disc radius=1 meter, $k=1\times10^9$, Voltage=2 V, RPM=100,000, d=2 microns; simulations at 45-degree increments from −180 degrees to 180 degrees on all axis.
Figure 74B:
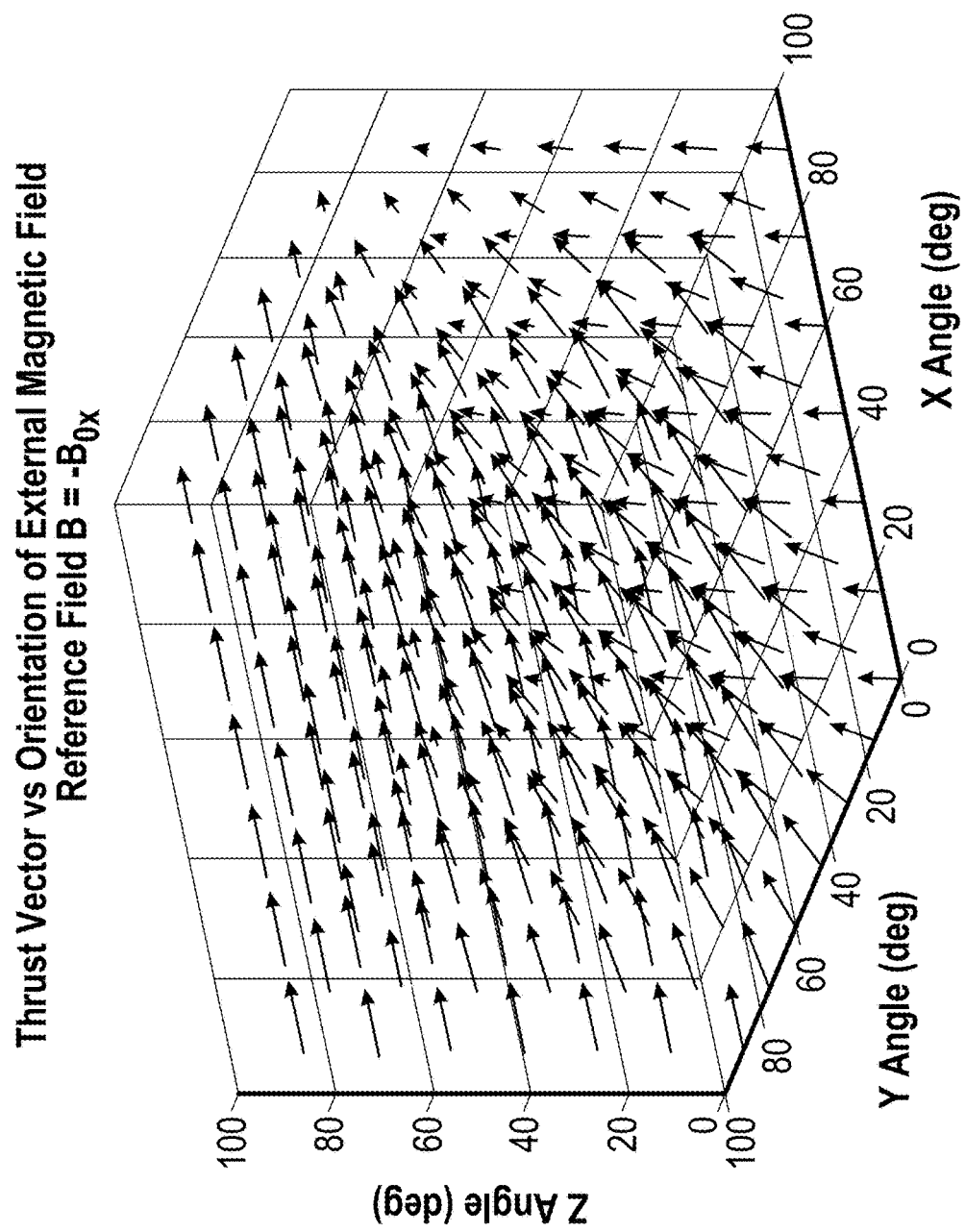
FIG. 74B schematically illustrates the simulated force vector vs orientation of the external magnetic field, referenced to a $\vec{B}=B_0\hat{x}$ magnetic field; force is for the set up shown in FIG. 56A; disc radius=1 meter, $k=1\times10^9$, Voltage=2 V, RPM=100,000, d=2 microns; simulations at 15-degree increments from 0 to 90 degrees.
Figure 74B:
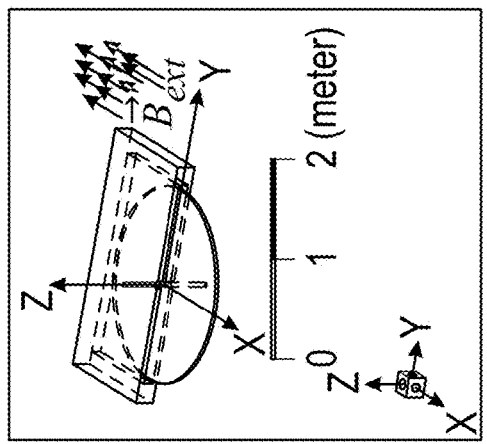

Type II and Type III propulsion work on the principle of magnetic Lorentz forces. Due to the nature of the cross-product operation in the Lorentz force equation (equation 34), neither Type II nor Type III propulsion can produce thrust components parallel to the external magnetic field lines. However, using Type II and/or Type III propulsion, thrust can be generated in any direction perpendicular to the lines of the magnetic field. Table 14 illustrated in FIGS. 94A-94F shows the results of a large number of simulations in which the external magnetic field vector direction is varied; the magnitude remains at ~30 uTesla. Table 14 shows Simulated force vector vs orientation of the external magnetic field, referenced to a $\vec{B}=B_0\hat{x}$ magnetic field. The reference configuration is as shown in FIG. 56A with the −x field direction. The magnetic field vector is first rotated about the x-axis, followed by a rotation about the y-axis, finally followed by a rotation about the z-axis. FIG. 73A schematically illustrates an aid in visualizing magnetic field orientation thrust simulations; reference external magnetic field (0 deg, 0 deg, 0 deg). FIG. 73B schematically illustrates another aid in visualizing magnetic field orientation thrust simulations; external magnetic field tilted by 5 degrees (x), 5 degrees (y), and 5 degrees (z). The resultant force (thrust) vector is referenced to a local x, y, z cartesian frame of reference sitting on the surface of the planet; x-north/south, y-east/west, z-up/down. This can be thought of as sitting in a craft on the surface of the planet with a planetary magnetic field penetrating the surface of the planet at that point at a certain azimuthal and polar angle. Of course, this may also be interpreted as the relative inclination of the magnetic field to a magnetic propulsion system in arbitrary orientation, though the prior interpretation is easier to visualize and understand. FIGS. 74A and 74B show a force field vector plot of Table 14. More specifically, FIG. 74A schematically illustrates the simulated force vector vs orientation of the external magnetic field for an example propulsion system, referenced to a $\vec{B}=B_0\hat{x}$ magnetic field; force is for the set up shown in FIG. 56A; disc radius=1 meter, k=1×10$^9$, Voltage=2 V, RPM=100,000, d=2 microns; simulations at 45-degree increments from −180 degrees to 180 degrees on all axis. FIG. 74B schematically illustrates the simulated force vector vs orientation of the external magnetic field, referenced to a $\vec{B}=B_0\hat{x}$ magnetic field; force is for the set up shown in FIG. 56A; disc radius=1 meter, k=1×10$^9$, Voltage=2 V, RPM=100,000, d=2 microns; simulations at 15-degree increments from 0 to 90 degrees.

Figure 75A:
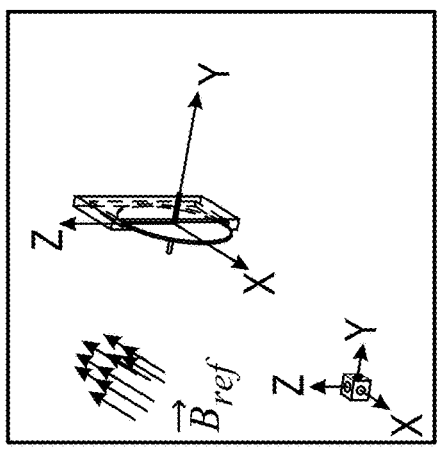
FIG. 75A schematically illustrates the simulated force vector vs orientation of the external magnetic field for an alternative orientation of the system of FIG. 74A, referenced to a $\vec{B}=B_0\hat{x}$ magnetic field; simulations at 45-degree increments from −180 degrees to 180 degrees on all axis.
Figure 75A:
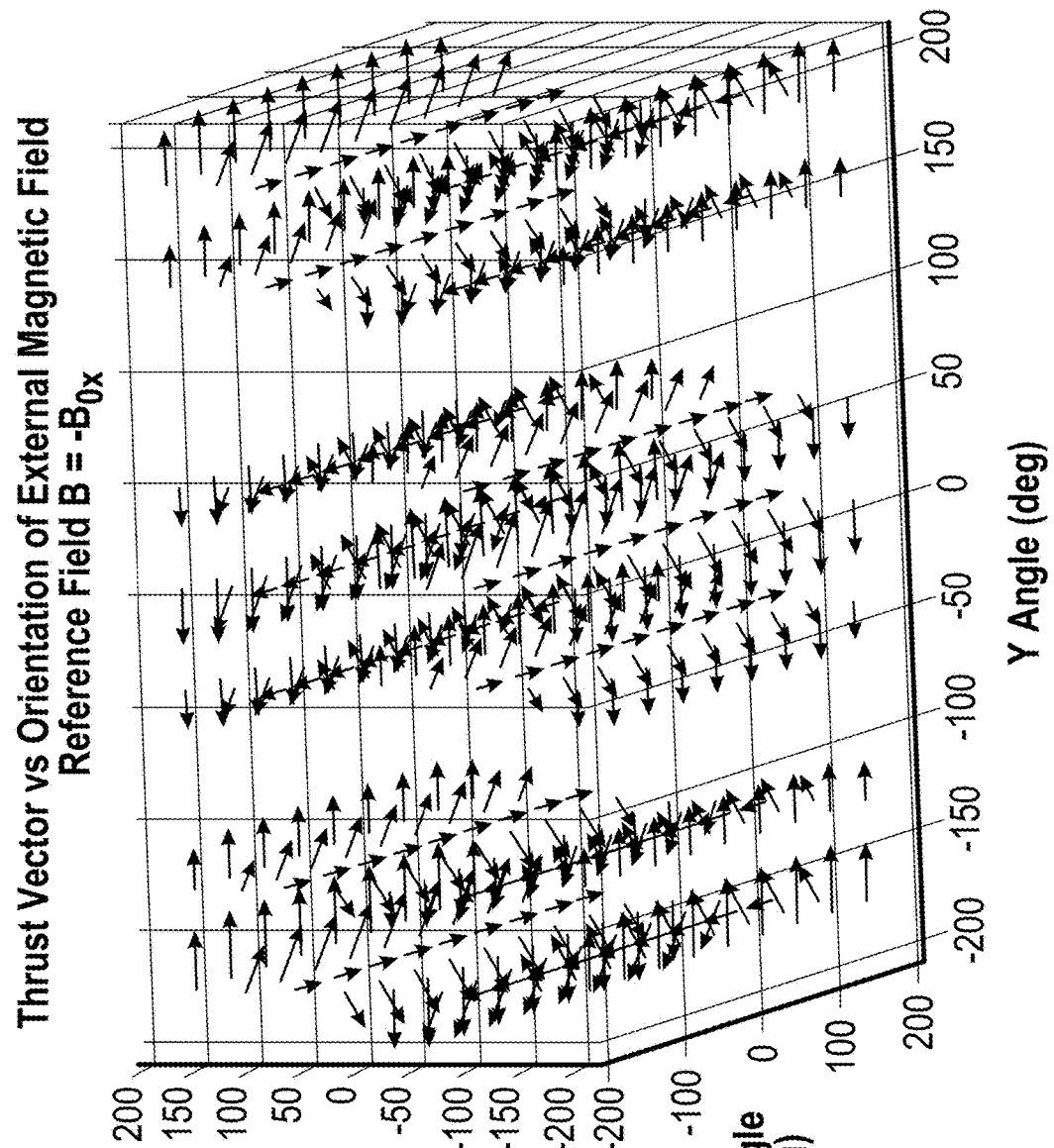
Figure 75B:
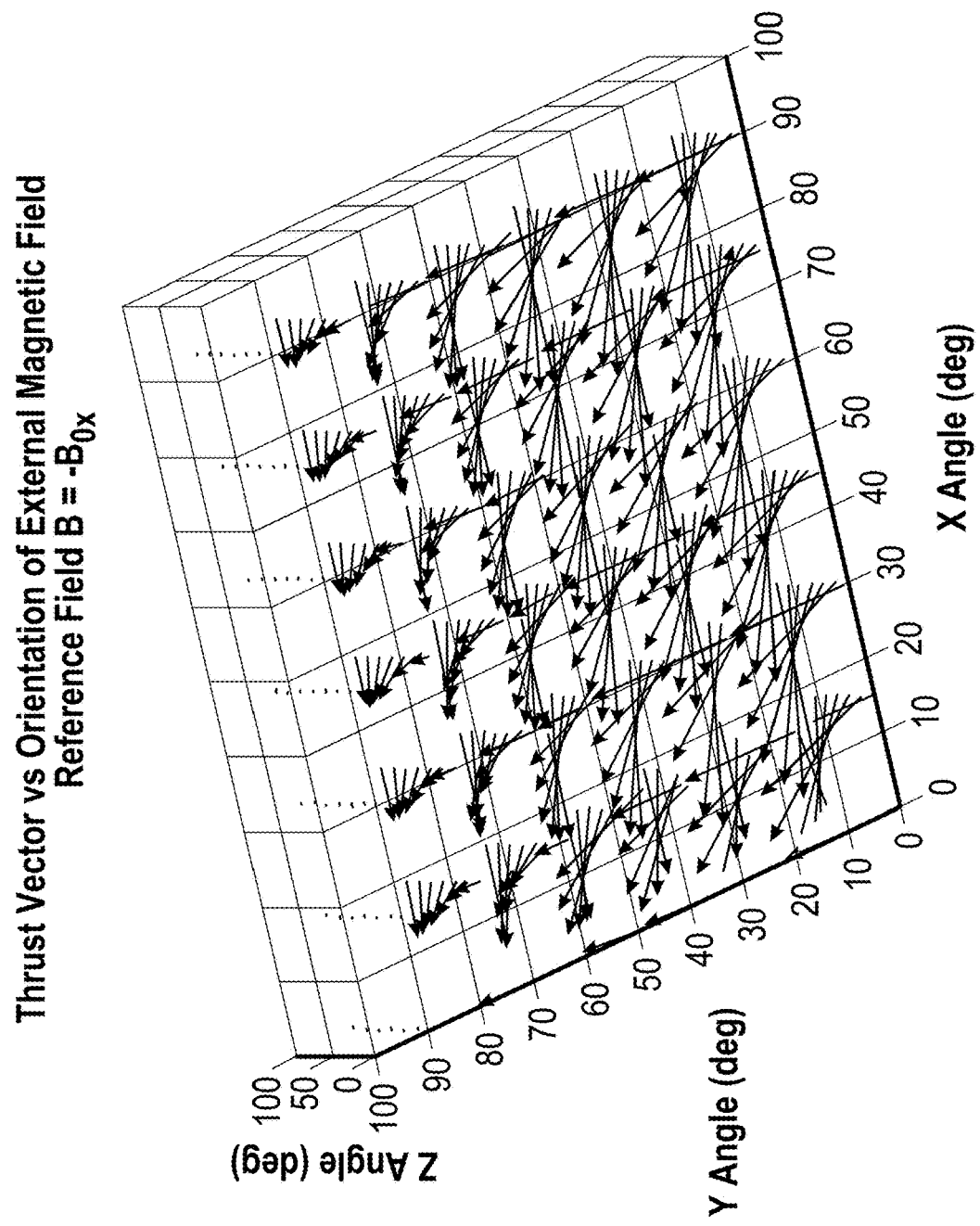
FIG. 75B schematically illustrates the simulated force vector vs orientation of the external magnetic field for an alternative orientation of the system of FIG. 74A, referenced to a $\vec{B}=B_0\hat{x}$ magnetic field; simulations at 15-degree increments from 0 degrees to 90 degrees on all axis.
Figure 75B:
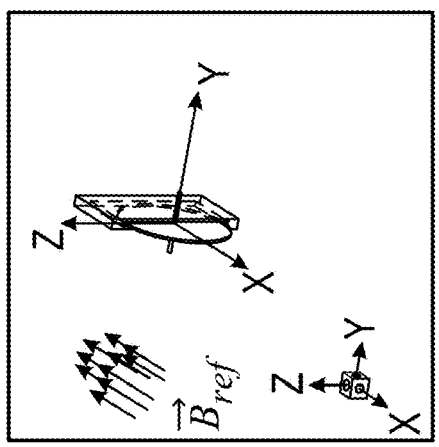

For clarity of understanding and comparison of propulsion system orientation, the same force field vector plot with the propulsion system rotated 90 degrees around the x-axis is shown in FIGS. 75A and 75B. More specifically, FIG. 75A schematically illustrates the simulated force vector vs orientation of the external magnetic field for an alternative orientation of the system of FIG. 74A, referenced to a $\vec{B}=B_0\hat{x}$ magnetic field; simulations at 45-degree increments from −180 degrees to 180 degrees on all axis. FIG. 75B schematically illustrates the simulated force vector vs orientation of the external magnetic field for an alternative orientation of the system of FIG. 74A, referenced to a $\vec{B}=B_0\hat{x}$ magnetic field; simulations at 15-degree increments from 0 degrees to 90 degrees on all axis.

Micro-Ultra Magnet (MUM) System

To this point in the description of the current systems and methods, relatively large dynamic supercapacitors (DSC) on the order of a meter to meters have been discussed. However, elsewhere herein a small device abbreviated Micro Ultra-magnet (MUM) is described, e.g., with reference to FIGS. 25A-25B. The MUM design allows for a high density of discs to be packed into a small diameter design giving a very high charge per unit volume which translates to a high thrust per unit volume when combined with the symmetry breaking methods described within the current implementations. Additionally, the smaller size allows for a number of manufacturing and operational advantages as outlined elsewhere herein, e.g., very good tolerances, mass production of a modular base unit, availability of exotic materials in smaller sizes, use of micro-fabrication technology, higher achievable rotation rates, and the like. As noted in equation 53, the thrust goes as the radius of the discs to the third power; as such, a 1-cm MUM design may not necessarily produce great lift (as measured on the Earth), however it will be appreciated that the MUM may be scaled up, e.g., to include discs such as presently commercial available (illustratively, about 10-cm discs to about 45-cm discs) which can provide lift well in excess of the modified MUM's intrinsic weight. Illustratively, about ten centimeters is a size that still provides many of the manufacturing and operational benefits as described with reference to a 1-cm MUM as is discussed in detail herein.

Figure 76:
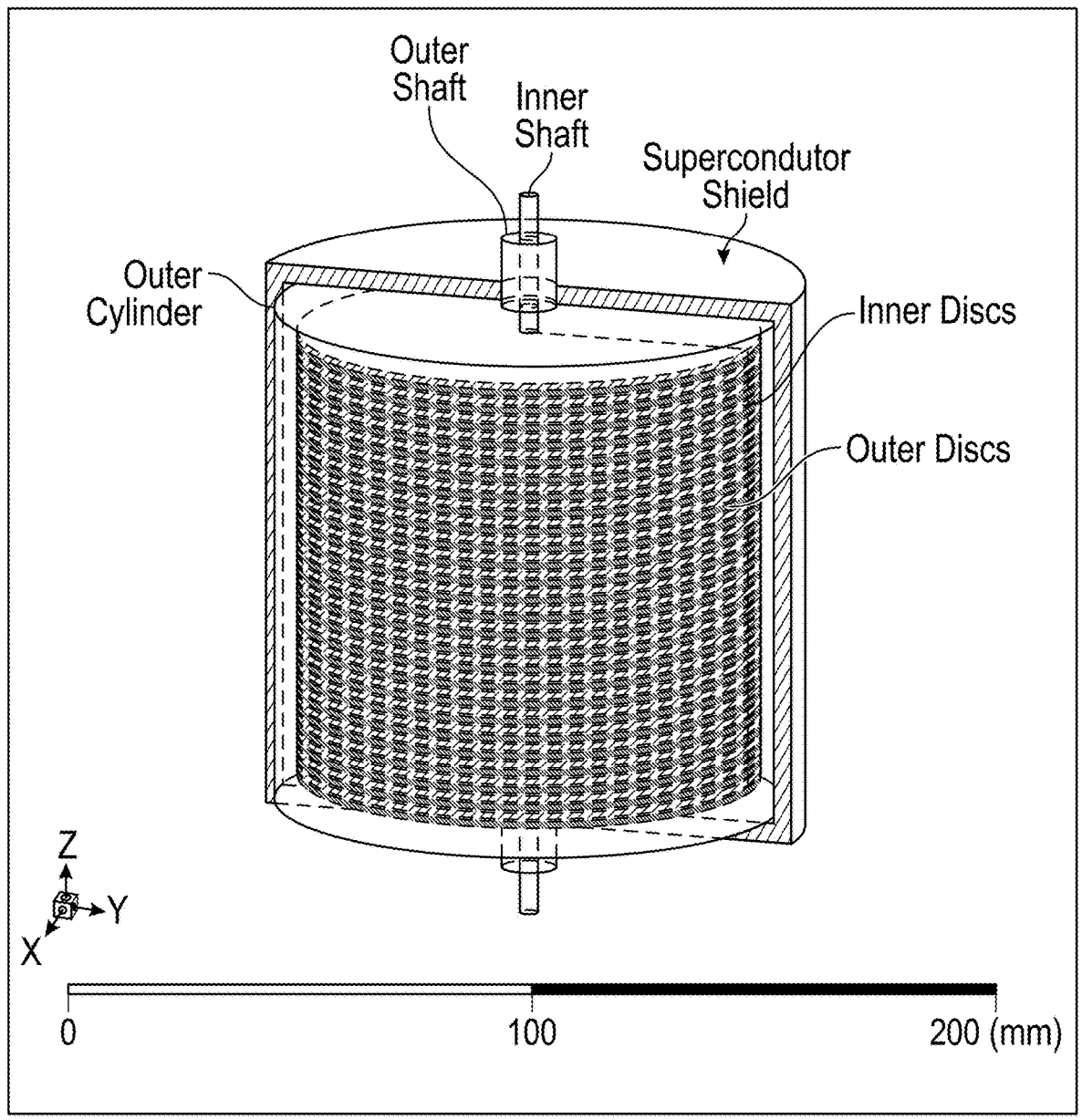
FIG. 76 schematically illustrates a perspective view of an example modified, shielded MUM configured to provide lift in an external magnetic field; discs are 10 cm in diameter.

FIG. 76 schematically illustrates a perspective view of an example modified, shielded MUM configured to provide lift in an external magnetic field; discs are 10 cm in diameter. In the nonlimiting example shown in FIG. 76, the 10-cm diameter discs stacked to a 10-cm height. The inner discs are attached to the inner shaft. The outer discs are attached to the outer cylinder which is attached to the outer shaft. In this way, the inner and outer discs can be counter rotated independently, each having opposite charge polarity. The discs may also be made of extremely strong materials such as diamond, sapphire, silicon carbide, etc. to resist the high centrifugal forces as well as the internal electromagnetic stresses the device may experience during operation. A number of additional MUM construction details can be found elsewhere herein.

MUM Propulsion Unit

With the large disc DSCs (MDU based) described so far (e.g., FIG. 56A), the solid angle of the opening for the superconductor shielding is relatively small and is efficient at shadowing the external magnetic field from reaching portions of the DSC disc which would diminish the lift of the system. The MUM shown in FIGS. 25A-25B has a relatively large solid angle and may be relatively inefficient at shadowing the external magnetic field from unwanted portions of the disc. The superconductor shield shadowing is most efficient when the rotational axis of the discs is aligned with the magnetic field, for example as shown in FIG. 77 which schematically illustrates a perspective view of an example modified MUM core illustrating force directions throughout the rotation process; maximum lift ($F_z$) is at the apex of rotation.

Figure 77:
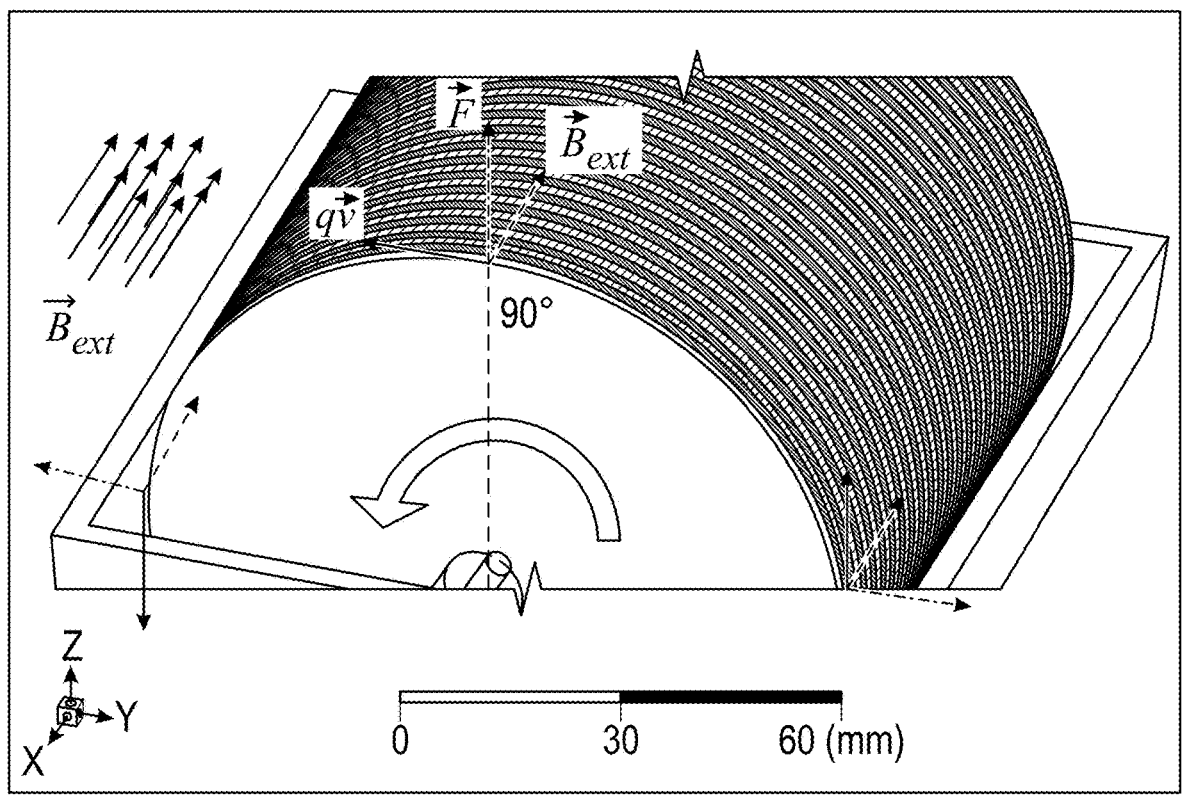
FIG. 77 schematically illustrates a perspective view of an example modified MUM core illustrating force directions throughout the rotation process; maximum lift ($F_z$) is at the apex of rotation.

There is a balance between the effective current exposed to the external magnetic field and the shadowing of the field reaching unwanted parts of the system (i.e., the lower part of the discs shown in FIG. 77). The maximum effective current runs at the outer portion of the rotating discs, see FIG. 59. The maximal force is exerted at the apex of the rotation, i.e., where the cross product of the tangential velocity vector and the external magnetic field produce the maximal z-directional force, shown on FIG. 82. This point is at 90 degrees from the x-axis on the configuration shown in FIG. 77. As one deviates from the 90-degree line, the contribution to the force in the z-axis diminishes; the magnitude of the force vector remains the same, but components of force are directed into the ±y-direction which cancel due to the symmetry of the disc, manifesting as an internal tensile stress on the disc. At 0 and 180 degrees the force vector is fully in the y-direction; positive for 0 degrees and negative for 180 degrees which sum to a zero net force contribution overall.

Figure 79:
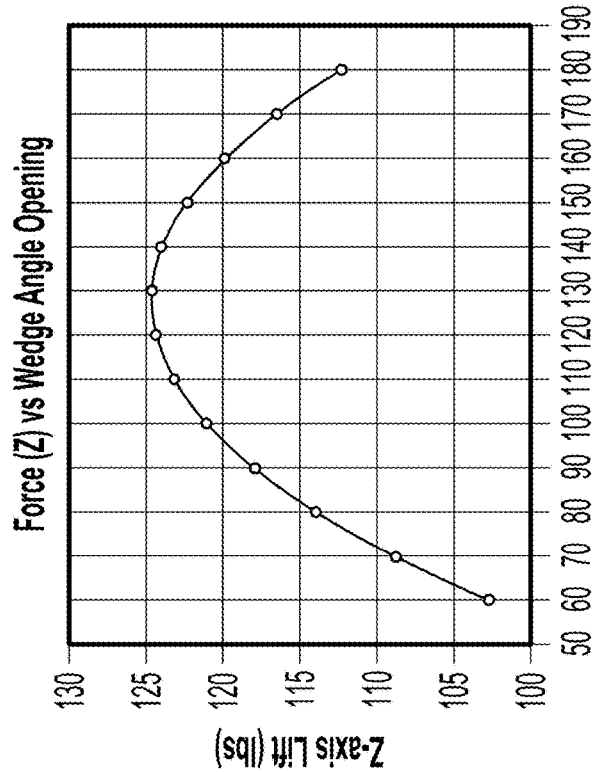
FIG. 79 is a plot of calculated force $F_z$ as a function of angle of exposure for example magnetic shields such as described with reference to FIGS. 78A-78C.

FIGS. 78A-78C schematically illustrate example superconductor shields for use with a modified MUM to balance between occluding the external magnetic field from reaching the −z region of the rotating discs and exposing the effective current to produce optimal lift from a modified MUM; FIG. 78A: default configuration, with a 180-degree exposure, 10-cm diameter discs (~4 inches) with a 10-cm height, disc spacings of D=0.1 mm, dielectric thickness d=1 micron, k=1×10$^9$, V=2 volts, RPM=100,000. This default configuration produces a lift ($F_z$) of approximately 113 pounds at the Earth's equator. FIG. 78B shows a modified configuration with 130-degree exposure which may provide an optimal balance between external field shadowing and exposed effective current; this configuration produces a lift of approximately 124 pounds. FIG. 78C: different geometry method of occluding the external field-produces similar optimum as FIG. 78B. FIG. 79 is a plot of calculated force $F_z$ as a function of angle of exposure for example magnetic shields such as described with reference to FIGS. 78A-78C. FIG. 79 shows a maximum around 130 degrees; the angle shown in FIG. 78B.

In nonlimiting examples, modified MUMs such as described with reference to FIGS. 78A-79C, excluding the cryofluids to cool the superconductor, weigh approximately 2 lbs, less if a mercury-less design is used as described later. This gives the example MUM propulsion unit a net lift of about 120 lbs. A dielectric thickness of 2 microns would give a net lift of approximately 60 lbs.

Craft Design Considerations

When designing a craft around the propulsion technology described herein there are some considerations that should be taken into account. Firstly, the DSCs produce strong magnetic fields that can be dangerous to living organisms as well as electronic and electrical components. Fortunately, the magnetic fields drop off quickly, to the third power of distance for a magnetic dipole:

$$\vec{B}_{dip} = \frac{\mu |\vec{m}|}{4\pi R^3}(2\cos\theta \hat{R} + \sin\theta \hat{\theta}). \tag{60}$$

Figure 80A:
FIG. 80A illustrates the calculated magnetic field strength distribution generated by the modified MUM propulsion unit of FIG. 78B, at a first scale.
Figure 80B:
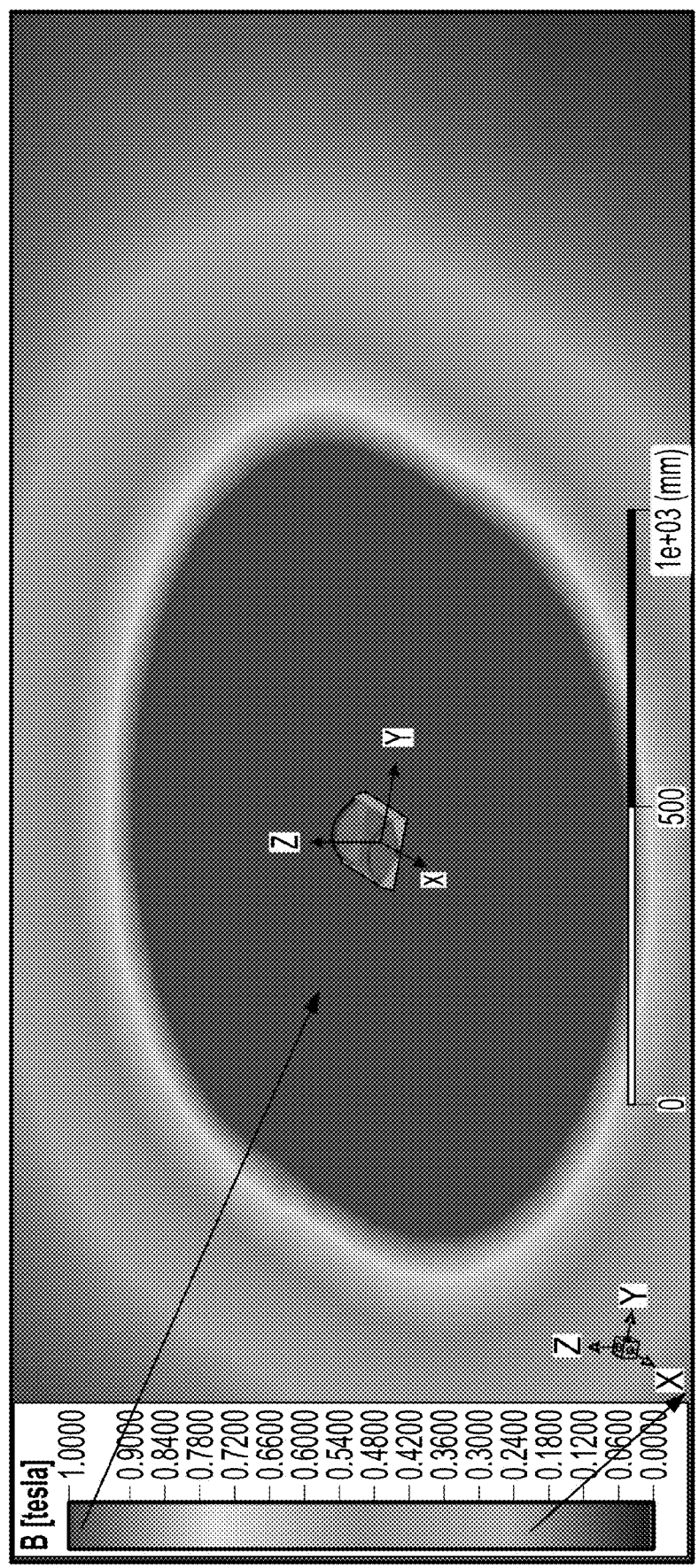
FIG. 80B illustrates the calculated magnetic field strength distribution generated by the modified MUM propulsion unit of FIG. 78B; the dark area surrounding the MUM is greater than one Tesla, all other areas are less than one Tesla.

Once the field drops to an acceptable level, conventional magnetic shielding can be used to shield people or equipment from the magnetic fields produced by the DSCs. FIG. 80A illustrates the calculated magnetic field strength distribution generated by the modified MUM propulsion unit of FIG. 78B, at a first scale. FIG. 80B illustrates the calculated magnetic field strength distribution generated by the modified MUM propulsion unit of FIG. 78B, in which the dark area surrounding the MUM is greater than one Tesla, all other areas are less than one Tesla. The field drops to one tesla within a distance of 60 centimeters. Accordingly, although the magnetic fields generated by the present MUMs may be so strong as to potentially be dangerous to humans and equipment that are too close to the MUMs, a shield may be used at a suitable distance from the MUMs to protect the humans or equipment. For example, conventional magnetic shielding (such as iron, or MuMETAL® shielding alloy from Magnetic Shield Corporation, Bensenville, Illinois) can operate on the order of one Tesla, and therefore illustratively may be placed at a distance of about 60 centimeters from the MUMs to safely reduce the magnetic field at locations beyond that distance. For example, a pilot may sit in a cockpit surrounded by a bubble of shielding. If shielding is used in stronger fields, superconductor shielding may be used.

Space travel requires energy, especially to get into orbit or to escape the gravity well of a planet such as the Earth. A kilogram of mass in low Earth orbit (LEO), at the same altitude as the International Space Station in this case, has a total energy (kinetic plus gravitational potential) of about 33 megajoules, and a one-kilogram object in geosynchronous orbit (GSO) has a total energy of about 58 megajoules; both values above what they would have referenced to sitting stationary on the ground at the Earth's equator. A great deal of energy can be infused into the propulsion unit before launch. A single MUM propulsion unit previously described can be charged and set into motion before leaving the launch pad. At 100,000 RPM, the previously described MUM unit can store approximately 1.2 gigajoules of electromagnetic energy. The propulsion unit may not necessarily be ideal as the main source of power as it may lose energy over time to dissipative forces such as friction and fluid drag on the electrodes in motion. This loss may occur even when the propulsion unit is not under load. Additionally, as the MUM propulsion unit loses stored energy, its thrust potential may diminish. However, the proposed propulsion systems herein operate on electricity instead of chemical fuel and can take advantage of any high-density, efficient, electrical power source, such as a nuclear reactor as an example, to restore lost energy to the system. Static high energy storage devices such as high-energy density batteries and super-capacitors are an active area of advancement and conceivably can be used as a power source for shorter missions. As a reference, a gallon of regular unleaded gasoline contains about 120 megajoules of energy. In the end, it becomes a matter of how efficiently one can utilize the energy sources at hand to go from the Earth's surface to orbit. In a system with efficiency approaching one hundred percent, surprisingly little energy may be needed to achieve orbit.

The propulsive efficiency of the current systems and methods is not yet known; however, it is likely the proposed propulsion system is significantly more efficient than a rocket engine which depends on mass ejection to generate thrust. Due to conservation of momentum, a great deal of kinetic energy is lost to the exhaust of the rocket. Additionally, combustion of the reactants creates high thermal energy molecular gases. These hot gas molecules experience significant excitation of vibrational and rotational molecular modes which diminishes their translational energy. Translational energy is the energetic mode necessary to provide the needed thrust. Overall, rocket engines are inefficient in converting chemical energy into mechanical, i.e. kinetic, energy of the craft. The current implementations need not utilize any type of exhaust or mass ejection to achieve thrust. Additionally, rockets experience a great deal of aerodynamic drag due to the high velocities needed to escape the Earth's atmosphere and achieve orbit. The current implementations need not require high velocities to rise out of the atmosphere, therefore, aerodynamic drag can be reduced or minimized; the craft can be accelerated to the translational velocity needed for orbit once the craft is above the drag of the atmosphere.

Specific Impulse, $I_{sp}$, is a relative measure commonly used by rocket and jet engine manufacturers to compare propulsion system performances. Fundamentally, Specific Impulse measures how effectively a propulsion system can convert fuel to thrust. The larger the specific impulse the more effective the propulsion system is converting a given mass of fuel into thrust. Specific Impulse is defined as $$F_{thrust} = g \dot{m} I_{sp}$$

where $F_{thrust}$ is the thrust produced by the propulsion system, g is the gravitational acceleration at the Earth's surface, and m is the mass of fuel used per unit time.

In the current case, the mass of fuel consumed by the propulsion system can be calculated by $$\dot{m} = \frac{P_L}{\eta_C E_F}$$

where $P_L$ is the power losses in the propulsion system, $E_F$ is the energy per unit mass of the fuel, and $\eta_c$ is the cycle efficiency of the motor that turns the discs.

Conventionally, the thrust is partially or wholly produced by expulsion of mass from the propulsion system. Because the present invention does not expel exhaust as part of its thrust mechanism, the calculation herein can be thought of as an Effective Specific Impulse.

A number of different types of fuel can be used to power the current invention; for instance, a nuclear-powered craft, be it fission or fusion, would produce much larger numbers than those shown below. However, to keep it simple and to help provide direct comparisons the example power source will be assumed to be the simple combustion of hydrogen and oxygen, a common rocket fuel source. This combustion powers a mechanical motor that rotates the discs. Each kilogram of the hydrogen-oxygen fuel contains 13.4 megajoules of energy. It is assumed the thermal to mechanical conversion efficiency of the motor is 30 percent; a typical value of efficiency for a combustion engine. For the exemplary example, the 10-cm MUM as shown in FIG. 78B will be used. The default example MUM produces a thrust of 124 lbs (551.6 N) as discussed earlier. The design values used for the example MUM are disc diameters=10 cm, $k=1\times10^9$, V=2 Volts, electrode spacing=0.1 mm, dielectric thickness=1 micron, and RPM=100,000, number of discs=100. The power consumption of the propulsion system primarily comes from the rotational friction that each disc experiences inside the MUM; rotational bearing friction was also taken into account though is typically small compared to disc friction. As described herein, the power consumption, and thus the needed fuel consumption, is primarily driven by the friction of the discs inside the DSC devices. For the given example, the calculated Specific Impulse vs Friction per Disc for the 10 cm MUM is shown in FIG. 102A. For reference, the Specific Impulse value for the space shuttle solid rocket booster is 250. As can be seen, the propulsion performance of the 10 cm MUM is many orders of magnitude better than the solid rocket booster of the space shuttle. FIG. 102A also illustrates the importance of mitigating the disc friction of a DSC propulsion system. The frictional power loss is directly proportional to the rotational velocity of the disc. As will be shown later, it may be possible to produce much higher k values than $1\times10^9$. For instance, if a k value of $k=1\times10^{12}$ can be achieved, the same thrust can be achieved with a rotation rate of only 100 RPM versus 100,000 RPM.

FIG. 102B shows the Specific Impulse values vs Friction per Disc for $k=1\times10^9$, $k=1\times10^{12}$, as well as for the space shuttle solid rocket booster for reference; log scale. As a point of reference, for a $k=1\times10^9$ and a per disc friction of 100 N, the 10 cm MUMs propulsion system has roughly one thousand times the performance of the space shuttle solid rocket booster, for a $k=1\times10^{12}$ and a per disc friction of 100 N, the 10 cm MUMs propulsion system has roughly one million times the performance of the solid rocket booster. While combustion of hydrogen and oxygen was used in this example, other forms of power can be used to power the propulsion system be it nuclear, electric, combustion, or fuel cells. This list being in no way exhaustive. Each fuel source having its own energy per unit mass value will yield its own Effective Specific Impulse value.

Figure 81A:
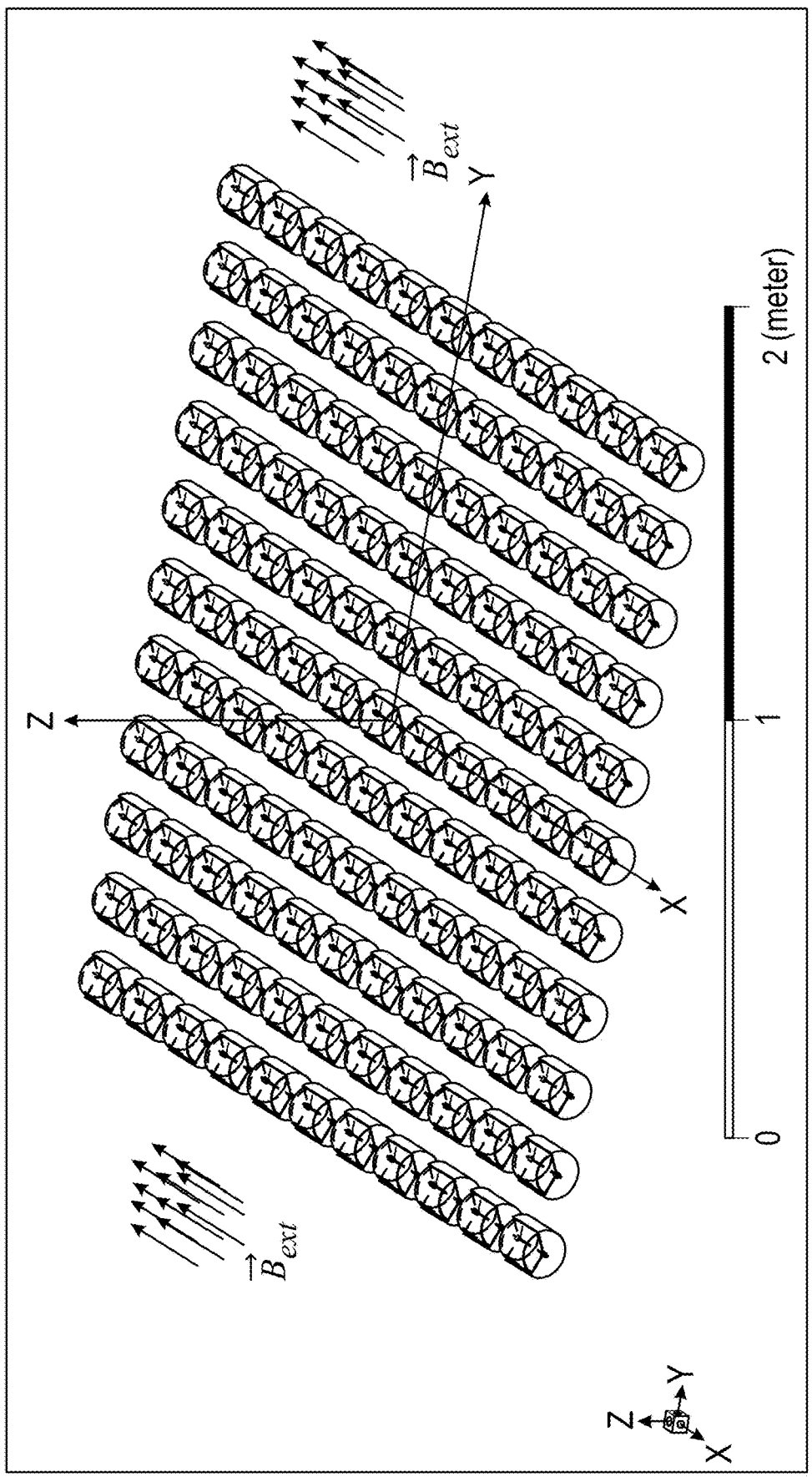
FIG. 81A schematically illustrates an example expanded propulsion system built using individual base propulsion units, here including 121 modified MUM units in a four-square meter planar layout (super-dielectric thickness=1 micron).
Figure 81B:
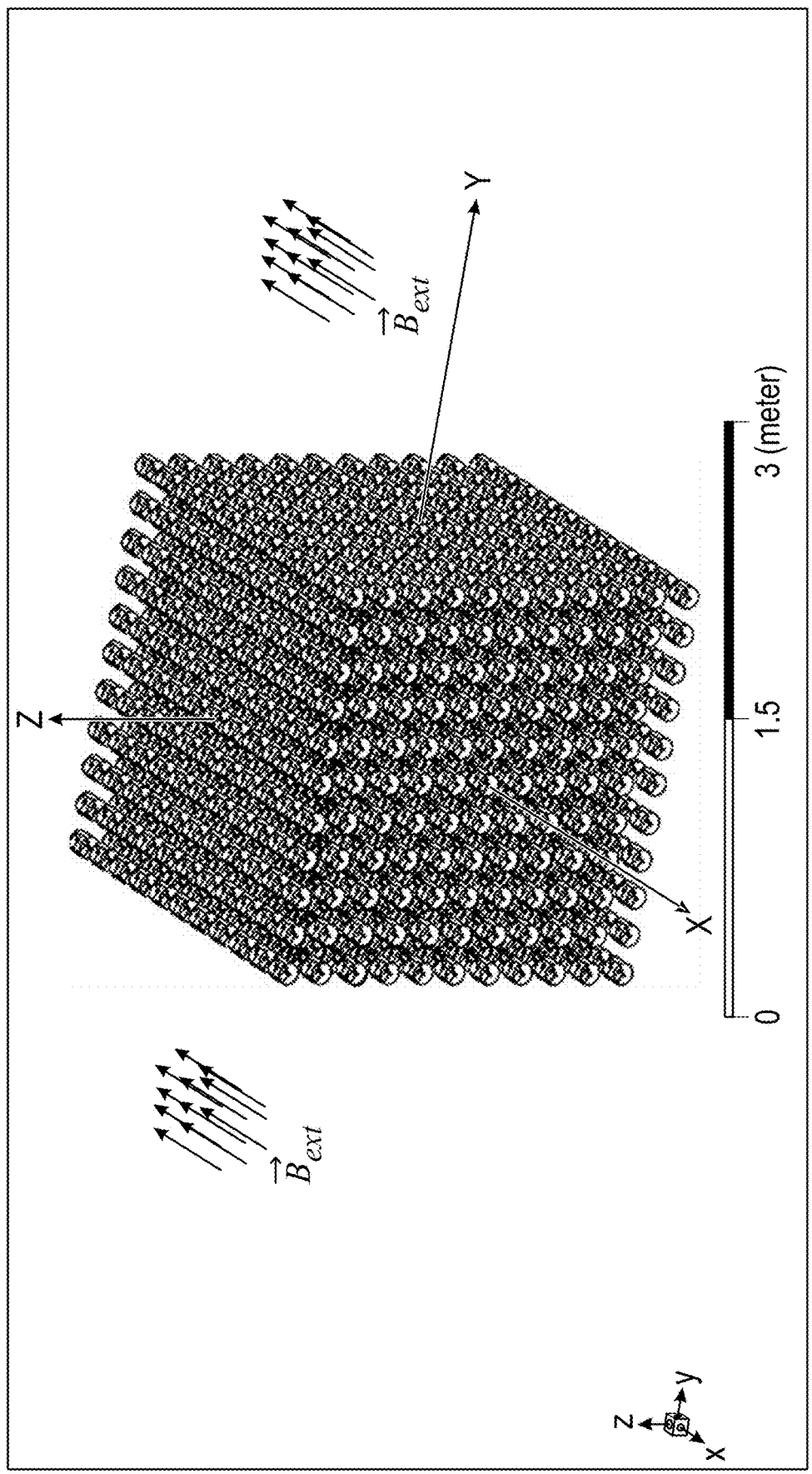
FIG. 81B schematically illustrates another example expanded propulsion system built using individual base propulsion units, here including 1331 modified MUM units in a 2 m×2 m×2 m volumetric layout (super-dielectric thickness=1 micron).
Figure 81C:
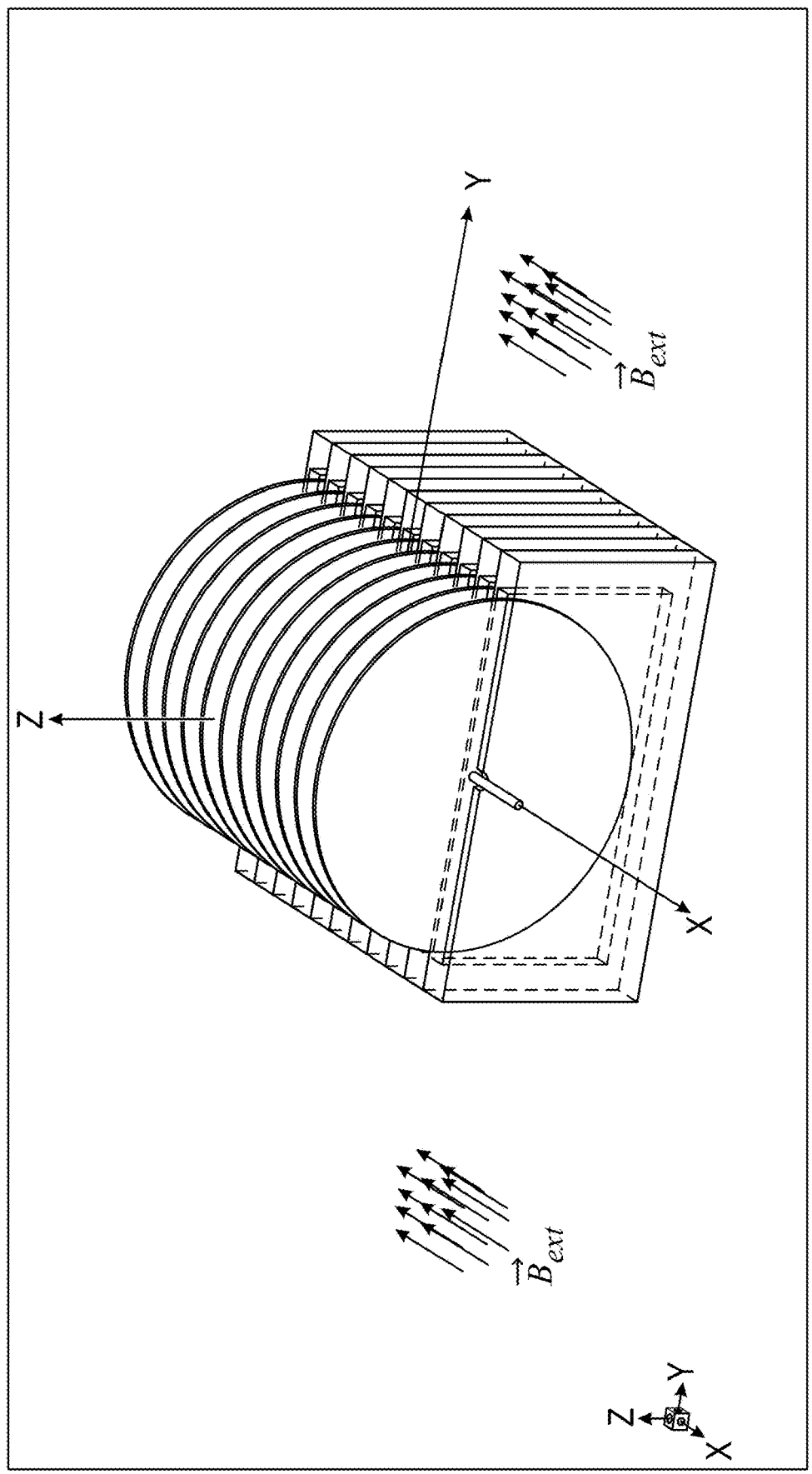
FIG. 81C schematically illustrates another example expanded propulsion system built using individual base propulsion units, here including 11 base propulsion unit assembly based on MDU units (d=2 microns).

A single propulsion unit may not necessarily be sufficient to provide the desired lift and thrust forces. The base units described so far are designed to be modular such that a great number of individual base units can be assembled to provide greater overall performance. 81A-81C show three such configurations. FIG. 81A schematically illustrates an example expanded propulsion system built using individual base propulsion units, here including 121 modified MUM units in a four-square meter planar layout (super-dielectric thickness=1 micron). In one nonlimiting implementation, FIG. 81A illustrates a 2 m×2 m planar layout of modified MUMs which, at the Earth's equator, produces a simulated lift of 74,180 Newtons (16,670 lbs). FIG. 81B schematically illustrates another example expanded propulsion system built using individual base propulsion units, here including 1331 modified MUM units in a 2 m×2 m×2 m volumetric layout (super-dielectric thickness=1 micron). In one non-limiting implementation FIG. 81B illustrates a 2 m×2 m×2 m cubic volume which produces an estimated lift of approximately 810,000 Newtons (183,000 lbs) at the Earth's equator; about the weight of a fully loaded 737-800 commercial jet. FIG. 81C schematically illustrates another example expanded propulsion system built using individual base propulsion units, here including 11 base propulsion unit assembly based on MDU units (d=2 microns). FIG. 81C is based on the stacking of propulsion units based on the multi-electrode disc ultra-magnet (MDU). As shown, the assembly in FIG. 81C produces a simulated lift of 34,300 Newtons (7700 lbs). This lift is not as impressive as the MUMs unit assemblies; however, this configuration may provide implementation advantages. Additionally, the MDUs shown are only two counter-rotating discs per MDU base unit; more densely packed electrodes per base unit may be implemented to produce magnified lift (a factor of 10 to 20) as was described in MDU technology from the prior disclosures.

It is worth noting, due to the fields diminishing quickly from their source, the base propulsion units can be assembled and spaced such that the total magnetic field strength can be controlled as to not exceed the critical magnetic point of the superconductor shielding to avoid quenching, i.e., loss of superconductivity. In all regards, it may be desirable to magnetically harden the superconductor shield to provide maximum lift per unit volume in a manner such as described further above and in Yoshizawa (cited above). The individual base propulsion units may also experience attractive and repulsive magnetic forces with the other base propulsion units as they are each a powerful magnet. The geometry of the configurations shown are only examples; any number of geometrical configurations can be realized. The geometry and spacing of the propulsion system assemblies can be configured to control inter-unit field exposure from other units, e.g., to inhibit or prevent magnetic superconductor quenching or exceeding mechanical structural limits. Ultimately, it is a matter of packing density vs superconductor magnetic quenching threshold and mechanical stress integrity that limits the lift/thrust density achievable in any design.

Additionally, it should be apparent that it is advantageous to build the craft out of materials with very high weight to strength ratios; making the craft as light as possible while meeting mission or operational requirements. It is not necessary for the craft to travel at supersonic or hypersonic speeds inside the atmosphere in order to obtain orbit; liftoff and reentry can be accomplished in a highly controlled manner if desired. The skin and frame of the craft can be constructed of ceramics, polymers, composites, magnesium alloys, newer biomimetic ceramics, or any of the myriad of materials artificial satellites and space probes are constructed from at the time of this application. All these materials provide good strength to weight ratios. For further details regarding selected ones of such materials, see the following references, the entire contents of which are incorporated by reference: Bourzac, "Ceramics that won't shatter: a biomimetic ceramic that is strong and tough could be used to make lightweight vehicles," MIT Technology Review (Dec. 4, 2008); Chapline et al., "Materials and Manufacturing," Wings In Orbit: Scientific and Engineering Legacies of the Space Shuttle (National Aeronautics and Space Administration, Ed. Wayne Hale): 200-225 (2011); and Rawal, "Materials and structures technology insertion into spacecraft systems: successes and challenges," Acta Astronautica 146:151-160 (2018).

Of course, if the craft is to be used outside of Earth's atmosphere, the materials may be selected so as to capable of withstanding the harshness of space-meteorites, radiation, thermal cycles, vacuum, etc. The same or similar environmental considerations should be adhered to if the craft is to operate underwater as well. Structural components for which extreme strength may be appropriate are the mechanical components of the extended propulsion system, e.g., the superstructure that holds the MUM units shown in FIGS. 81A-81C for example, the shafts that transfer the lift from the propulsion units to the body/frame of the craft, and the constituent components of the DSCs. In some examples, the materials used may be non-magnetic, as to not create unwanted forces, and largely non-conductive to minimize the potential of magnetically induced eddy currents. If conductors are to be used in the area of strong magnetic fields, such as the traces that supply charging to the DSCs and the electrodes of the DSCs, the conductor should be made as thin as is practically possible, such as vapor deposited thin metal films, and segmented and/or labyrinthine to break up potential eddy currents.

Lift Mechanism at the Quantum Level

So far, lift/thrust has been described at the macroscopic level. In some regards, however, the lift and thrust described is a quantum phenomenon. For example, the positive charges are part of the material structure. The magnetic force for positive charges is imparted to the structure through the material's atomic lattice. The electrons however are free to move throughout the conductive materials of the DSC electrodes. As the electrons move, they may collide with the atoms in the conductors and impart some of their momentum to the atoms, however, the migrating electrons may reach the boundary edge of the conductor. Here the electrons may encounter the Schottky-Nordheim quantum barrier: the potential barrier between inside the metal and the outside world. Because the electrons have energy and are under the influence of strong Lorentz forces, they exert 'pressure' on this barrier, which provides aforementioned lift and thrust via pressure on the conductor's Schottky-Nordheim barrier. Due to this, the electrons have a probability of quantum tunneling through the quantum barrier potential and escaping as field emission electrons. For further details regarding the theory of electron emission from metals, see Christov, "General theory of electron emission from metals," Phys. Stat. Sol. 17 (1): 11-17 (1966), the entire contents of which are incorporated by reference herein.

Building on the work of Christov and cold field emission of electrons for electron microscopes, adding a term for an electron moving in a magnetic field describes the probability of the electron escaping, i.e., quantum tunneling through the quantum barrier, is $$P = \exp\left[-\frac{4\sqrt{2m_e}}{h} \int_0^{\frac{W}{e(E+|v||B_\parallel|)}} \sqrt{W - ex(E + |v||B_\parallel|)}\, dx\right] \quad (61)$$

where h is the reduced Planck's constant, $m_e$ is mass of the electron, e is the charge of the electron, W is the work function of the conductor, E is the electric field at the barrier, v is the velocity of the electron, and $B_\parallel$ is the component of the magnetic field parallel to the barrier.

Using a somewhat extreme example, a system with a two-micron disc spacing with a two-volt potential with a $k=1\times10^9$ super-dielectric, an electron in a one-meter radius disc coated in silver (W=4.74 eV) spinning at 100,000 RPM, with an internal B field of 5000 Tesla, at the edge of the disc, i.e., where the highest tangential velocity may be found, the electron has a $2.49\times10^{-37}$ probability of escaping the conductor by quantum tunneling. It can be stated the lift/thrust can be generated by the propulsion system without worry of the atomic and particle scale lift components escaping their quantum confinement potential wells.

Energy Chain Considerations

As is well known, energy cannot be created or destroyed (conservation of energy and the first law of thermodynamics). To this end, it may be instructive to describe how the internal energy, U, of the propulsion system is affected by a change in the potential or translational kinetic energy of the system, i.e., the craft changing altitude (potential energy) or changing velocity (translational kinetic energy).

The energy stored in the propulsion system may be described as $$U = \text{Mechanical} + \text{Magnetic} + \text{Electrical} \quad (62)$$

$$U = \frac{1}{2}\sum_i \left(I_i\omega_i^2 + \int_V \frac{1}{2\mu}B_i^2 dV + Q_i V_i\right) \quad (63)$$

where $I_i$ is the moment of inertia of the i-th rotating element, $\omega_i$ is the rotational velocity of the i-th rotating element, $B_i$ is the magnetic field produced by the i-th rotating electrode, $\mu$ is the magnetic permeability of the material in which the field exists, $Q_i$ is the electrical charge stored on the i-th rotating electrode, $V_i$ is the voltage potential between the i-th rotating electrode and its charge polarity counterpart electrode, i.e. slip joint fluid or other electrode. The magnetic field, $B_i$, is integrated over all space to obtain the total magnetic energy stored in the magnetic field of the i-th element.

For illustrative purposes, a single spinning disc will be considered; one electrode being the spinning disc, the other electrode being the conductive slip-joint fluid in an example case. More complex systems can be extrapolated and understood from this base example. When the potential or translational kinetic energy of the craft changes, the energy flow used to affect those changes may come from the internal energy of the propulsion system. The primary question becomes how will the energy flow from the propulsion system to the potential and translational kinetic energy of the craft manifest itself. The magnetic field strength is directly proportional the rotational velocity of the disc. For a single spinning disc as described, equation 63 can be rewritten as $$U = \frac{1}{2}I\omega^2 + \frac{1}{2}\omega^2 \int_V \frac{K_B^2}{\mu} dV + \frac{1}{2}QV \tag{64}$$

$$K_T = \left(I + \int_V \frac{K_B^2}{\mu} dV\right)$$

$$U = \frac{1}{2}K_T\omega^2 + \frac{1}{2}QV \tag{65}$$

where $\vec{K}_B$ is an intermediate resultant field after the rotational velocity variable has been factored out of the magnetic field, $\vec{B}$. It is assumed w is constant with respect to spatial coordinates and can be factored out of the integral, as is the case for a rigid rotating disc.

The system can be closed to charge transfer, i.e., the charge magnitude on the electrodes can be fixed. In this case, the term on the right in equation 65 is a constant and does not contribute to energy flow. The effective current for a charged spinning disc can be derived as $$\vec{J}_{eff}(r) = \frac{Q\omega r}{\pi h R^2} \hat{\varphi} \tag{66}$$

where h is the thickness of the conducting part of the disc. The charge used in the $J_{eff}$ calculations is a constant, leaving only the ω term as a changeable variable under energy flow. Since B, $K_B$, and Kr are proportional to $J_{eff}$, the only variable term in energy flow is w. This means that without external energy being supplied into the propulsion system (from a power supply for example), the energy that flows from the internal energy of the propulsion system to do work on the craft, i.e., affect a change in potential or kinetic energy of the craft, may come from a change in the rotational velocity of the charged discs. To get a change in rotational velocity there may be a reactionary torque on the spinning disc that acts to either speed up or slow down the rotation speed of the disc.

Figure 82:
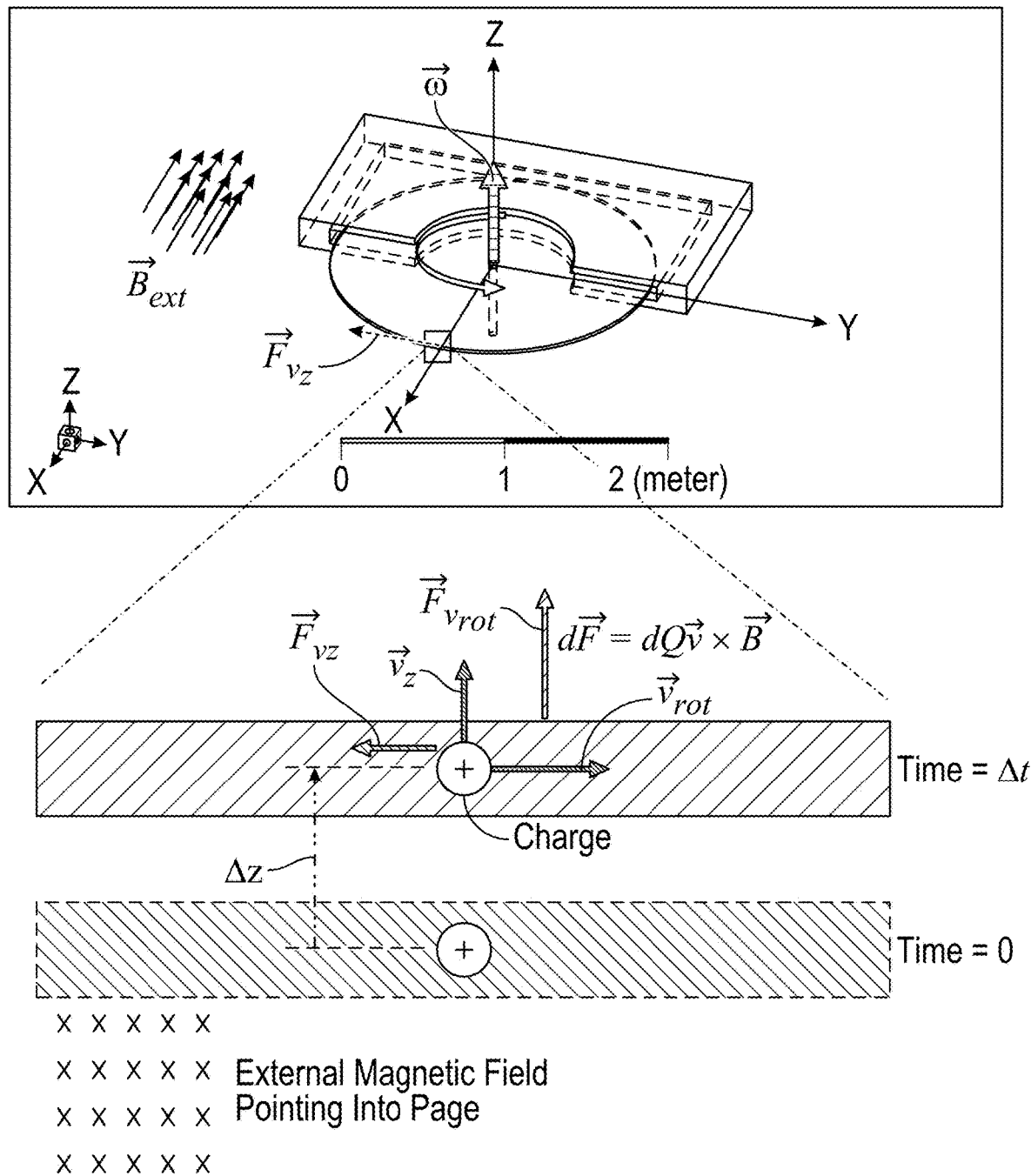
FIG. 82 schematically illustrates an example manner in which reactionary torque is produced on spinning charged disc due to the propulsion system rising in altitude, i.e., increase in potential energy.

The microscopic source of this reactionary torque can be understood as follows, in the case of a potential energy increase, i.e., an increase in altitude. FIG. 82 schematically illustrates an example manner in which reactionary torque is produced on spinning charged disc due to the propulsion system rising in altitude, i.e., increase in potential energy. Referring to FIG. 82, the disc contains a large number of charges, in this case positive charges are shown in the disc. The disc sits at a position at time, 1=0. In a time Δt the disc moves higher in altitude by an amount Az. As the charges pass through the external magnetic field, they experience a force in the z-direction due to the rotational motion of the disc in the external magnetic field, as has already been explained in detail. Additionally, as the craft moves in the z-direction and gains altitude, the charges on the disc now experience a velocity component in the z-direction as well. From equation 34, it can be seen that the charges now experience a force, $\vec{F}_{v_z}$, in the plane of the disc that, in the case of an increase in altitude (i.e., positive z velocity), results in a force that acts in the direction opposite to that of the tangential velocity of the charges in the rotating disc. Along the x-axis this force points in the negative y direction.

As one moves away from the axis of rotation, a moment arm is produced by these forces and a torque, $\vec{\tau} = \vec{r} \times \vec{F}$, is exerted on the disc that is opposite to the rotational velocity, $\vec{\omega}$. Reactionary torque due to an increase in craft translational kinetic energy is similar to potential energy and is shown in FIG. 83 which schematically illustrates an example manner in which reactionary torque is produced on spinning charged disc due to the propulsion system acquiring translational kinetic energy in the y (eastwardly) direction.

Figure 83:
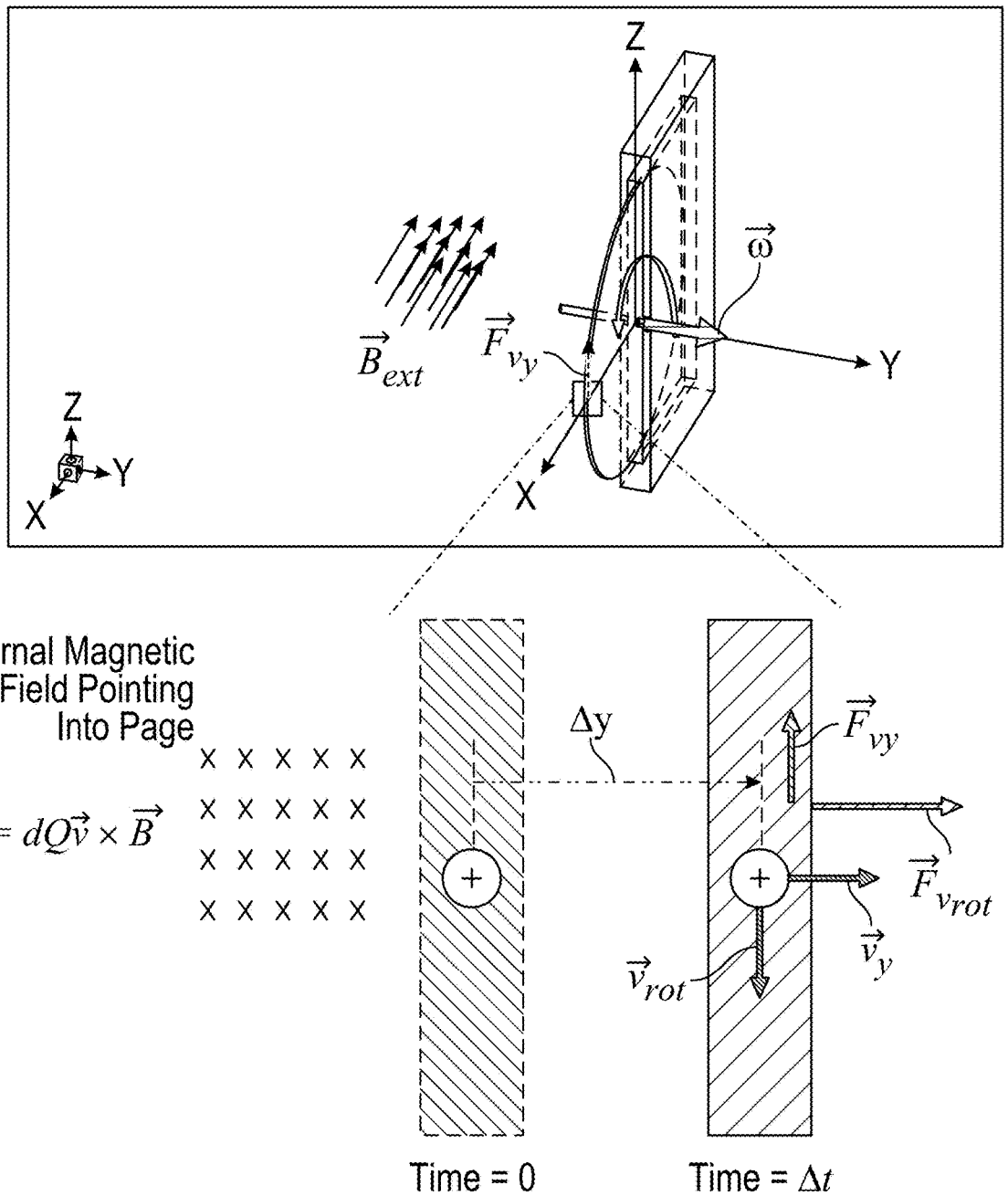
FIG. 83 schematically illustrates an example manner in which reactionary torque is produced on spinning charged disc due to the propulsion system acquiring translational kinetic energy in the y (eastwardly) direction.

FIGS. 82 and 83 show how the reactionary torque is generated due to energy flow from the point at the edge of disc at r=(R, 0). A full torque calculation may involve consideration across the entire disc or set of discs in the case of assemblies. The net reactionary torque may be calculated using energy methods.

To get an approximation on the magnitude of the reactionary torque, the differential work is the force times the differential displacement for the craft and the torque times the differential angular displacement for the propulsion system. Returning to the situation in FIG. 82, $$dW=(F_{v_{rot}}-F_{grav})dz=\tau_{react}\, d\varphi \tag{67}$$

Taking the time derivative, $$\frac{dW}{dt} = (F_{v_{rot}})\frac{dz}{dt} = \frac{d\varphi}{dt}$$

$$P=(F_{v_{rot}})v_z=\tau_{react}\omega \tag{68}$$

Because there are forces and torques present, $v_z$ and ω are time dependent. Assuming the forces and torques do not change significantly on the time scales we are interested in, the Galilean equations of motion may be substituted for $v_z$ and ω, $$P = (F_{v_{rot}} - F_{grav})\left(v_0 + \frac{(F_{v_{rot}} - F_{grav})}{M}t\right) = \tau_{react}\left(\omega_0 + \frac{\tau_{react}}{I}t\right) \tag{69}$$

Taking the time derivative again to eliminate non-time dependent terms and solving for the reactionary torque, $$\frac{dP}{dt} = \frac{(F_{v_{rot}} - F_{grav})^2}{M} = \frac{(\tau_{react})^2}{I} = \frac{(\tau_{react})^2}{\frac{1}{2}mR^2} \tag{70}$$

$$\tau_{react} = \pm(F_{v_{rot}} - F_{grav})R\sqrt{\frac{m}{2M}} \tag{71}$$

where $\tau_{react}$ is the reactionary torque produced by the energy flow, m is the mass of the disc, I is the moment of inertia of the disc, M is the mass of the entire craft, R is the radius of the disc, $F_{grav}$ is the force on the craft due to gravity, W is work, and P is instantaneous power. As an example, using the system in FIG. 56A ($F_{rot}$=3709 N), if the craft has a mass of 200 kg and the discs have a mass of 50 kg, and all other parameters (k, d, V, RPM) are as stated and the acceleration due to gravity is assumed to be 9.8 m/s², the reactionary torque on the propulsion unit is approximated to be 620 N-m (456 ft-lbs), about the torque of a Corvette C3 sportscar. It should be clear from equation 71 that the reactionary torque is directly proportional to the acceleration (a=F/M) desired from the craft; a faster acceleration may require more torque.

In order to hover at one altitude, from equation 71, $F_{v_{rot}} = F_{grav}$, which suggests zero reactionary torque is experienced. The equation for reactionary torque for translational kinetic energy changes is similar to equation 71 without the gravity term:

$$\tau_{react} = \pm (F_{v_{rot}}) R \sqrt{\frac{m}{2M}}. \tag{72}$$

It should be noted that there may be other forces such as aerodynamic drag on the craft, for example if the craft is in motion in a fluid such as water or the atmosphere. Those forces are not shown here but are easily added.

Energy Losses

Since power expended may be expressed as $$P = (\tau_{react}) \omega \tag{73},$$

from equation 71, theoretically a craft hovering in place may have zero reactionary torque which from equation 73 suggests it would expend no power to hover. This, of course, is only possible if the system in question is frictionless and lossless. In reality, there may be frictional losses from the rotary components (bearings and/or rotary seals). There may be ohmic losses where conventional currents flow. There may also be losses due to drag of the mercury, if mercury is used, or sliding contact friction, if the alternate point contact super-dielectric method is used. These energy losses may need to be replenished to keep the propulsion system operating. Many of these losses are difficult to approximate, therefore, what follows are only rough approximations.

Bearing and seal losses are complex; depending on construction material, bearing size, bearing design, rotational speed, and lubrication. High speed rotary bearings can lose tens of watts to thousands of watts (joules/second) of power due to friction. For further details, see the following references, the entire contents of which are incorporated by reference herein: Nelias et al., "Power loss prediction in high-speed roller bearings," Tribology Series 27:465-478 (1994); Ianu et al., "Power loss in grease lubricated ball bearings," IOP Conf. Ser.: Mater. Sci. Eng. 724:012009 (2020); and Söndgen et al., "Power loss and axial load carrying capacity of radial cylindrical ball bearings," Power Transmission Engineering: 42-47 (June 2013). Such losses may have relatively small values compared to other potential sources of power loss in the system. Regarding ohmic losses, if the current breaking symmetry method is used, massive currents may be circulated. These currents can reach on the order of a million amps or more. Even if the resistance is a small value of one milliohm, with one million amps of current the ohmic power loss would be on the order of ten gigawatts. This suggests that using the electrical current oscillation method of breaking symmetry may not be a preferred way of producing lift/thrust unless superconductors are used to bring the resistance close to zero. However, superconductors undergoing large time varying currents do not always behave as perfect superconductors but are nonetheless an improvement over typical resistive elements. For further details regarding alternating current losses in superconductors, see Figgins et al., "Alternating current losses in superconductors," Nature 202:890 (1964), the entire contents of which are incorporated by reference herein.

Figure 84:
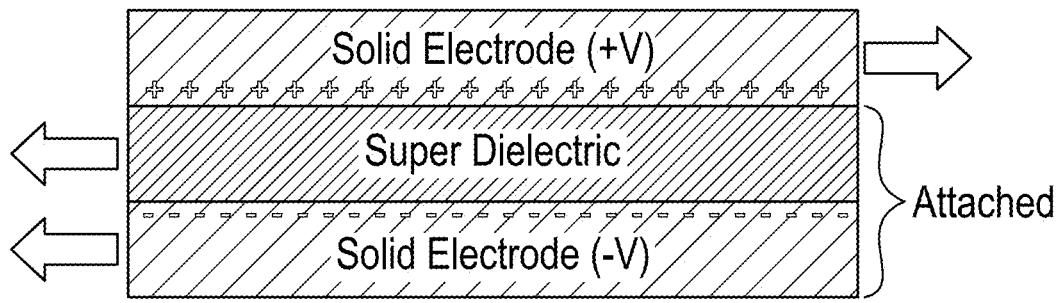
FIG. 84 schematically illustrates an example interface geometry of a mercury-less design, in which the super-dielectric is attached to the bottom electrode and the top electrode slides on the super-dielectric.

In the case of the superconductor shield used to shield part of the spinning charged discs(s) from the external magnetic field, the propulsion unit does not need conventional electrical current for its fundamental operation and does not experience ohmic losses. The exception to this may be if electron current is injected into the mercury in order to create magnetohydrodynamic forces on the mercury and put the mercury into a desired motion. These currents may be in the hundreds to thousands of amps and result in ohmic losses on the order of tens of kilowatts. Another possible ohmic power loss may occur due to eddy currents. Equation 30 says that changing magnetic fields induce circulating electric fields. These circulating electric fields can induce eddy currents in conductive elements in the propulsion system and craft structure. These eddy currents experience ohmic losses similar to conventional currents. Strong eddy currents only occur in rapidly time varying magnetic fields. The magnetic fields need not be rapidly varying, and suitably may be varied in order to change lift/thrust force which may be done gradually in most cases. Additionally, mitigating eddy currents through system design is a well-known art in the design of transformers and motors where strong fluctuating magnetic fields are common. With proper design considerations, eddy currents are not likely to be a leading contributor to energy loss of the propulsion system. For further discussion of frictional losses to the system, such as arising from the use of mercury, see the discussion surrounding equations (10)-(13A) above. In some examples, mercury-less designs also may be used. For example, FIG. 84 schematically illustrates an example interface geometry of a mercury-less design, in which the super-dielectric is attached to the bottom electrode and the top electrode slides on the super-dielectric. Further discussion of a mercury-less design is provided elsewhere herein, such as with reference to FIGS. 38A-38B, 39, and 40 and equations (14)-(23).

The normal force, N, in equation 14 warrants attention as this is the primary driver for the frictional force the spinning discs may experience during operation. The discs, containing large oppositely polarized electric charges, may experience a large electrostatic attraction, making N large if unmanaged. A Quickfield™ FEM simulation of this electrostatic attraction, FIG. 40 described above, estimates the electrostatic pressure between the two plates of the system shown in FIG. 56A (d=2 microns, ΔV=2 volts) to be 4.4 GPa at full lift; full lift being 3709 Newtons (834 lbs) for a 1-meter radius disc. Analytically, the electrostatic force between two charged, flat capacitor plate electrodes is derived to be, ignoring fringe fields, $$F_C = \frac{k\epsilon_0 A (\Delta V)^2}{2d^2} = \frac{k\epsilon_0 \pi R^2 (\Delta V)^2}{2d^2} \tag{74}$$

where A is the area of the plates, which gives an electrostatic pressure of $$P_C = \frac{k\epsilon_0 (\Delta V)^2}{2d^2}. \tag{75}$$

Solving equation 75 for the system described in FIG. 56A also gives a result of 4.4 GPa, in exact agreement with simulation.

Figure 85A:
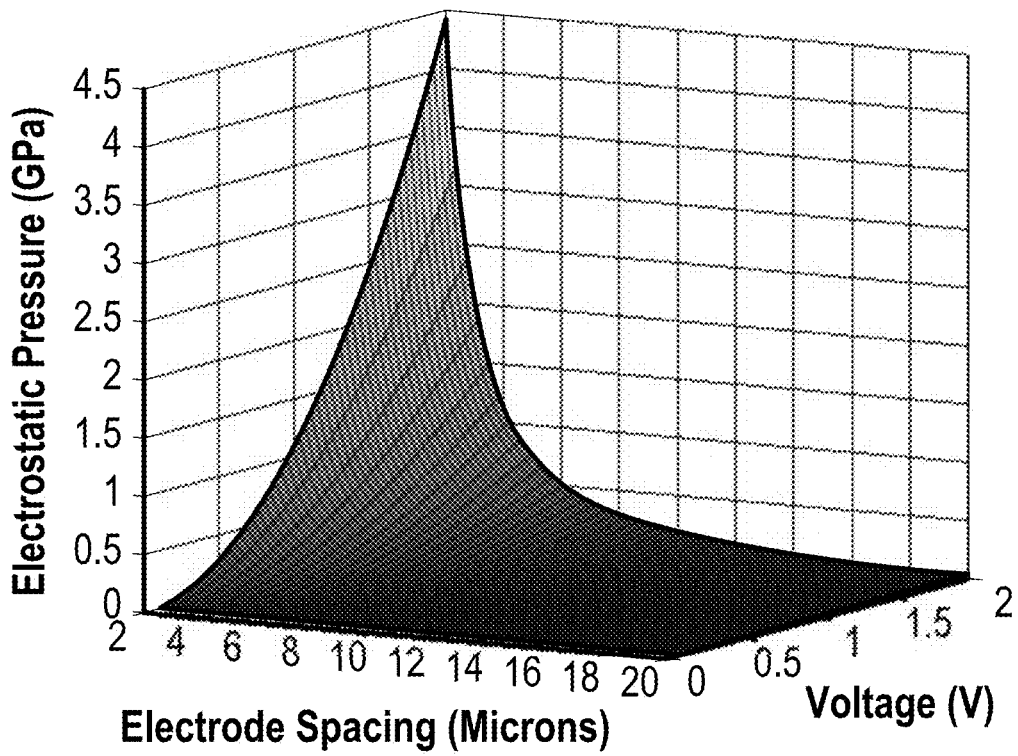
FIG. 85A illustrates the calculated electrostatic pressure as a function of electrode spacing and voltage for the example configuration shown in FIG. 56A; RPM=100,000, discs oriented in x-y plane.
Figure 85B:
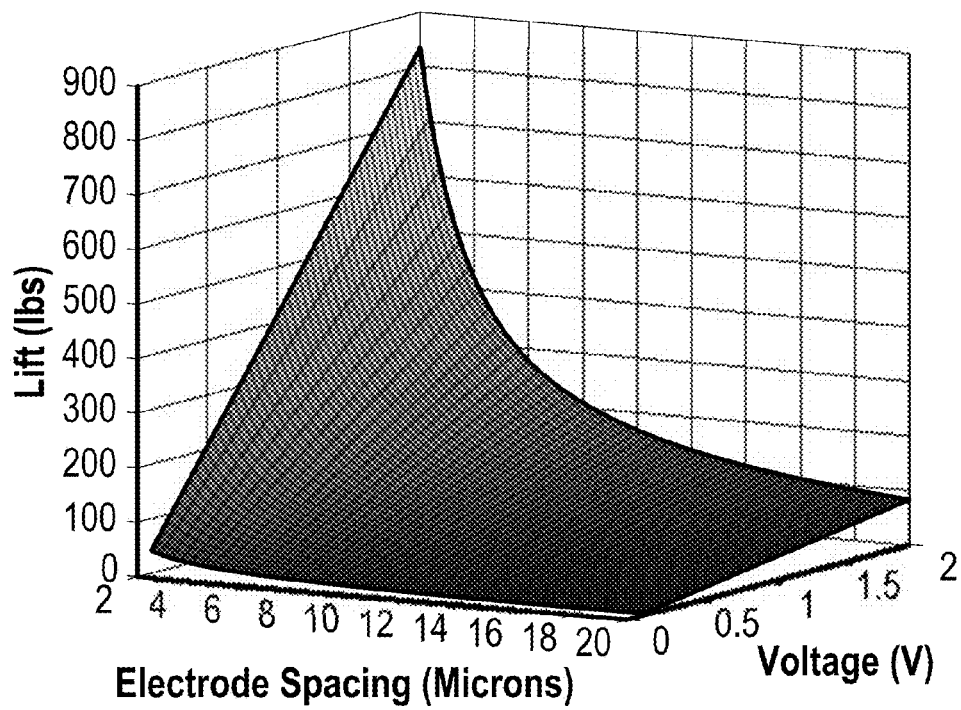
FIG. 85B illustrates the calculated lift as a function of electrode spacing and voltage for the example configuration shown in FIG. 56A; RPM=100,000, discs oriented in x-y plane.
Figure 85C:
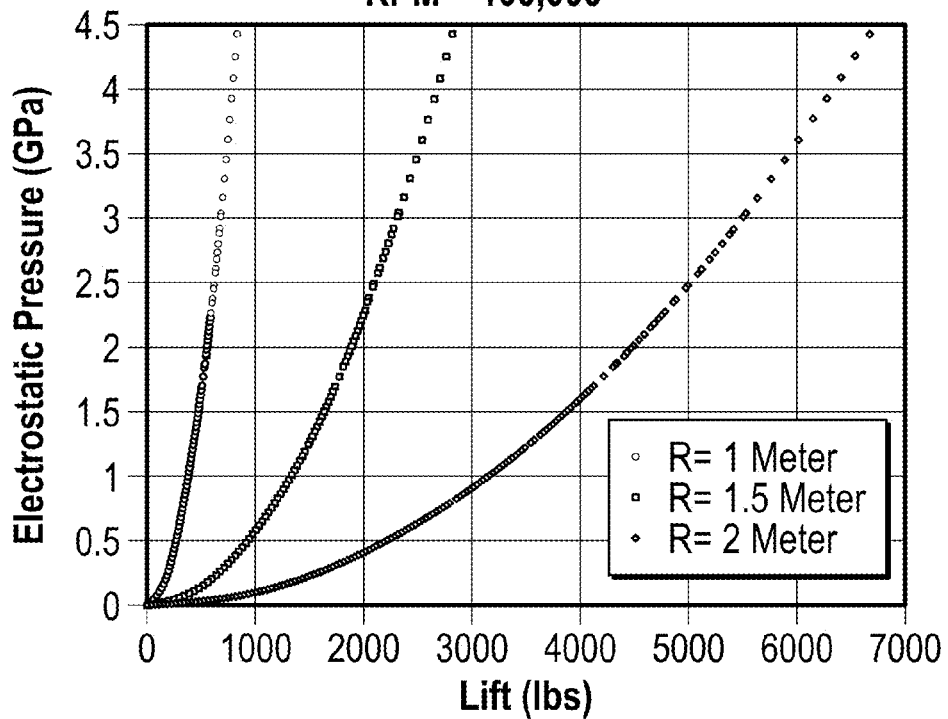
FIG. 85C illustrates the calculated electrostatic pressure as a function of lift for discs of different radii for the example configuration shown in FIG. 56A; RPM=100,000, discs oriented in x-y plane.
Figure 85D:
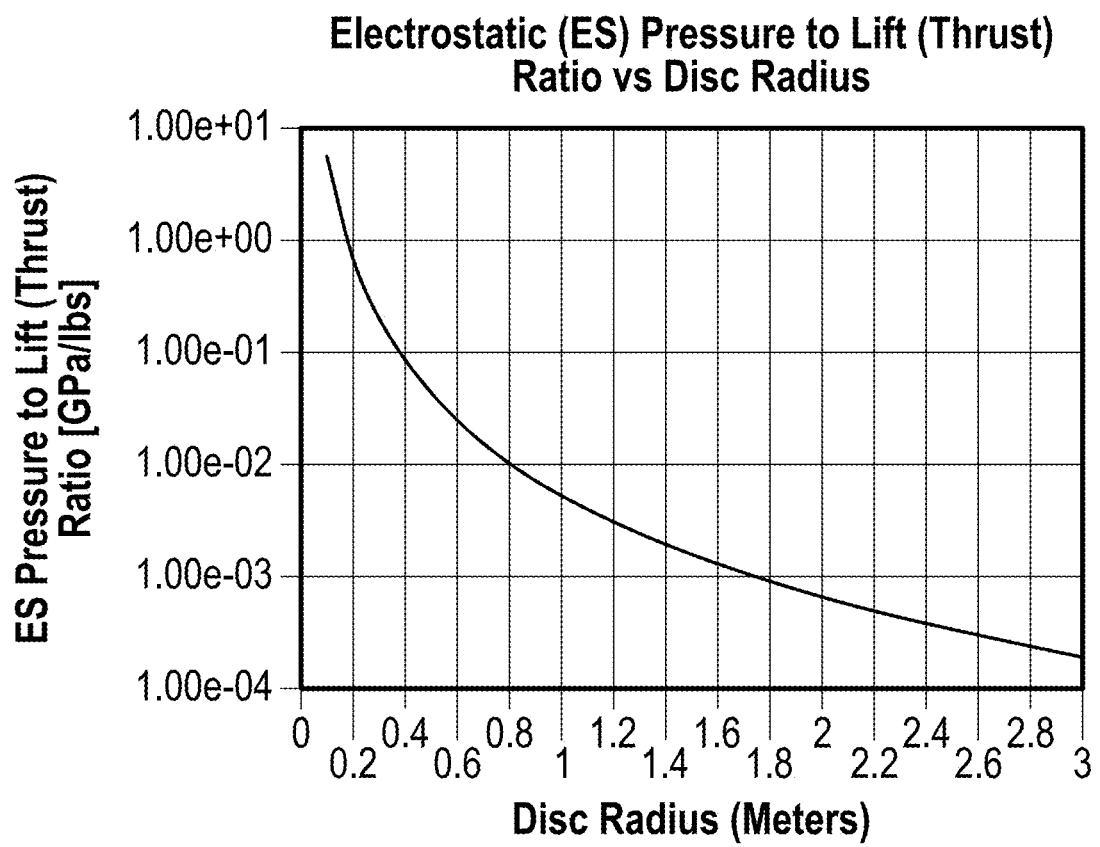
FIG. 85D illustrates the calculated electrostatic pressure to lift ratio as a function of disc radius for the example configuration shown in FIG. 56A; RPM=100,000, discs oriented in x-y plane.

The lift goes proportionally with the voltage, equation 53, and the electrostatic pressure goes as the square of the voltage, equation 75. A similar relationship exists for the electrode spacing (i.e., super-dielectric thickness). A tradeoff can be made between lift/thrust force and electrostatic pressure. FIGS. 85A-85D graphically illustrate these tradeoffs. More specifically, FIG. 85A illustrates the calculated electrostatic pressure as a function of electrode spacing and voltage for the example configuration shown in FIG. 56A; RPM=100,000, discs oriented in x-y plane. FIG. 85B illustrates the calculated lift as a function of electrode spacing and voltage for the example configuration shown in FIG. 56A; RPM=100,000, discs oriented in x-y plane. FIG. 85C illustrates the calculated electrostatic pressure as a function of lift for discs of different radii for the example configuration shown in FIG. 56A; RPM=100,000, discs oriented in x-y plane. FIG. 85D illustrates the calculated electrostatic pressure to lift ratio as a function of disc radius for the example configuration shown in FIG. 56A; RPM=100,000, discs oriented in x-y plane. As can be seen, this is a non-linear relationship, thus, it is possible to sacrifice some lift for a significant reduction in electrostatic pressure. The lift goes to the cube of the radius and electrostatic pressure does not depend on the radius of the disc, equation 75. Counterintuitively, if the discs can be made large enough, the electrostatic pressure to lift (thrust) ratio can be made small, FIG. 85D.

Material Strength Considerations

Nonlimiting examples of materials that may be used in the present devices are described elsewhere herein, e.g., with reference to Table 10. The materials may include, e.g., graphene (optionally combined with metal(s), epoxie(s) s, and/or polymer(s); hexagonal boron nitride (h-BN); synthetic diamond; synthetic sapphire; alumina; silicon carbide; tungsten carbide; boron carbide; carbon fiber; and/or nickel-graphene matrix.

Reducing Rotational Friction

Materials are typically stronger under compressive loads than tensile loads. The shafts holding the discs may experience large forces. In examples such as described above with reference to FIG. 41A, the top disc shaft passes through the bottom disc. The top disc is attracted to the bottom disc due to electrostatic attraction. The bottom disc is affixed to a rigid, fixed support structure and does not rotate. The bottom disc is attracted to the top disc through the same electrostatic attraction. The load from the attraction of the top disc to the bottom disc is transferred through the shaft. In this configuration the shaft is now under compressive stress, a stronger state for most materials. The bottom disc being rigid and stationary can be made as structurally strong as appropriate. Since only one disc rotates, the disc in the complementary propulsion unit (described elsewhere herein) may be configured to rotate oppositely to the base unit so that no unwanted angular momentum is imparted into the craft.

Figure 87:
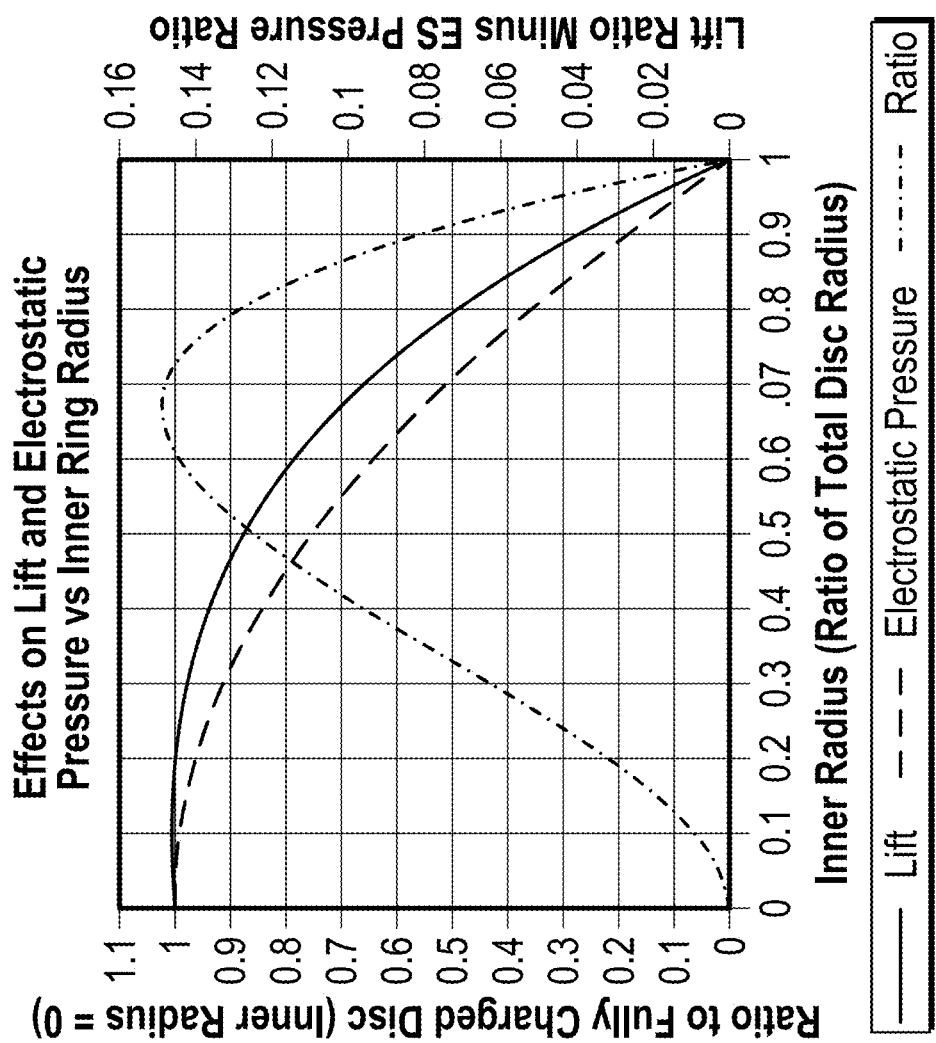
FIG. 87 is a plot of the calculated effects on lift and electrostatic pressure as a function of the inner radius of the disc of FIG. 86; a favorable tradeoff can be made between lift and forces generated by the electrostatic pressure between the discs by not electrically charging the entire disc.
Figure 86:
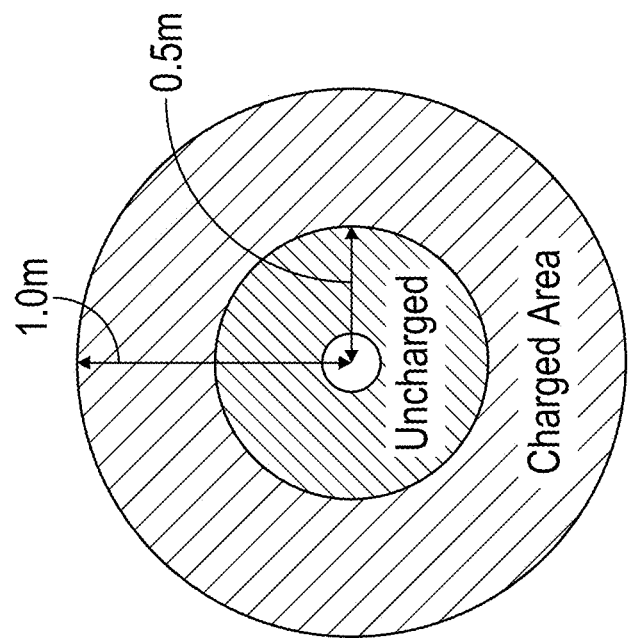
FIG. 86 schematically illustrates an example partially charged disc (ring configuration).

Returning to reducing the frictional losses between the two rotating discs; in order to reduce the force between the discs resulting from the electrostatic pressure, it may not be necessary to charge the entire disc. The lift/thrust force contribution on the disc is small near the center of the disc and large at the outer portions of the disc, as can be ascertained from looking at the $\vec{J}_{eff}$ distribution in FIG. 59. This relationship can also be directly understood by looking at equation 49, where $R^2$ is the radius of the outside radius of the ring and $R_1$ is the inner radius of the ring. This radial dependence is a cubic relationship. The electrostatic force between the discs goes as the square of the radius, equation 74. Since the lift goes as the cube and the electrostatic force goes as the square of the radii, if a significant portion of the disc is not charged this can result in a reduction in electrostatic force with a minor loss in overall lift/thrust performance. FIG. 86 schematically illustrates an example partially charged disc (ring configuration). FIG. 87 is a plot of the calculated effects on lift and electrostatic pressure as a function of the inner radius of the disc of FIG. 86; a favorable tradeoff can be made between lift and forces generated by the electrostatic pressure between the discs by not electrically charging the entire disc. As an example, FIG. 94, for a 1-meter radius disc, if the center 0.5 meters of the disc is not charged, the lift is reduced by 12.5% as calculated using equation 49 but reduces the electrostatic force caused by the electrostatic pressure by 25%, a favorable result.

Additionally, examining equation 15, having part of the discs out of contact may also reduce the frictional power loss, here the uncharged parts of the discs. The frictional reduction with the central 0.5 meters out of contact may reduce the frictional power losses by 12.5%, in addition to the reduction in electrostatic pressure.

It can be ascertained that the frictional force, equation 14, may be minimized or even eliminated by applying a force to the disc that counters the normal force, N, generated by the electromagnetic stresses. As pointed out, super strong materials may be necessary to handle such forces. In order to reduce the kinetic friction between the spinning discs, the normal force in equation 14 should be reduced. Reducing N by not charging the entire disc has been discussed, FIG. 87. A reduction in the normal force can be additionally accomplished by applying a counter force through the shaft or shafts depending on the design of the propulsion system. FIG. 41B shows a two-shaft system in which the shafts are in tensile stress. It should be clear that an upward force can be applied to the shaft in FIG. 41A to counter the attractive forces caused by the electrostatic pressure. In the latter case, the shaft is in compressive stress.

The separation forces used to reduce the frictional normal force can be very large. One potential way of producing these forces is through the use of thermal expansion/contraction. Platens at the base of the shafts, or the shafts themselves, can be made of super-strong materials, like those described with reference to table 10, and heated or cooled as necessary to produce expansion or contraction as appropriate. For instance, the shafts in FIG. 41B could be cooled in a controlled way to produce a contraction of the shafts. The shaft in FIG. 41A could similarly be heated to produce the appropriate expansion, assuming positive expansion coefficients. Depending on the materials used and the temperature change induced, the existing strains in the system, i.e., the strains causing the normal force, may be mitigated by exchanging deformation strain at the disc interface to axial deformation strain in the shaft; or the discs may experience a prescribed displacement if the discs are already in separation. These thermal expansions/contractions are capable of producing massive forces depending on the thermo-mechanical properties of the materials used. Another advantage of this method is the forces and displacements can be precisely controlled with accurate temperature controls.

Presented are only two simple example layouts, FIGS. 41A and 41B. A great number of other configurations and mechanical designs can be realized. Indeed, the details of the many potential mechanical designs can no doubt be a source for future disclosures.

It is instructive to estimate the rotational frictional losses. Equation 16 is only a rough approximation of the power loss due to rotational friction since the contact stresses throughout the discs are likely to be nonuniform. To get a rough approximation of the rotational friction power loss, if the net normal force can be reduced to 1000 newtons (225 lbs), and only the outer ⅓ of the discs are used for lift (a ring configuration-reducing the lift to 2630 N [592 lbs]), and a coefficient of kinetic friction of 0.03 is used, the rotational frictional power losses are estimated to be roughly 0.5 Megawatts. If the normal force can be reduced to 100 newtons, the power loss reduces to 50 kW. This illustrates the importance of reducing the normal force between the discs.

Since the rotational frictional power loss goes as the radius cubed, equation 16, it is worth running an approximation of the modified MUMs unit since it is a small diameter version of the propulsion system, $1/20^{th}$ the diameter of the example embodiment. Due to the small diameter, the starting electrostatic force is $1/800^{th}$ that of the example embodiment, if the dielectric layer thickness remains the same. If the normal force can be reduced to 100 N between each pair of discs in the MUM (the MUMs consists of a large stack of discs), the sliding frictional power loss is approximately 50 kW for the whole MUMs unit described earlier. However, since the MUM's discs are small, resulting in a much smaller starting electrostatic force, and there are many discs, the force can be better distributed. It may be possible to lower the resultant normal force between disc pairs to a lower number, for instance a 10 N normal force per disc pair would result in a MUMs base unit only consuming 5 kilowatts of power to overcome rotational sliding friction losses.

Figure 88:
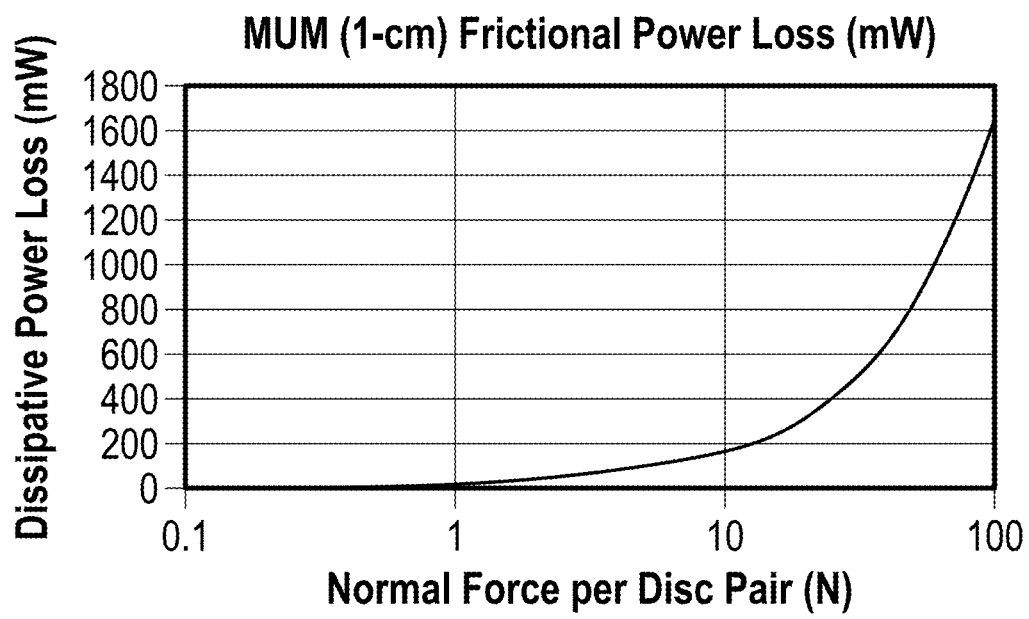

The base 1-cm diameter core MUM unit has a starting electrostatic force $1/800,000,000^{th}$ that of the example design of FIG. 56A. For a 1-cm diameter core MUM with super-dielectric thickness of 2 microns, electrode spacing of 50 microns, k=1×10$^9$, ΔV=2 volts, and rotational rate of 100,000 RPM; if the normal force per disc pair is 10 N the frictional power loss is about 165 milliwatts for the entire MUM device. For example, see FIG. 88 which illustrates the calculated dissipative power losses of a 1-cm MUM vs the average normal force per disc pair in the MUM device. There are approximately 200-disc interfaces in this example MUM device.

The choice of whether to use smaller radii MUMs or larger radii disc electrodes is a design choice, there are pros and cons to both.

Reducing or Eliminating Sliding Friction

Design considerations for reducing or eliminating sliding friction are provided elsewhere herein. Controlled separation of the discs may be a challenging engineering task but is possible, and the benefits may be well worth the effort since near elimination of the disc interface sliding friction would make the craft extremely energetically efficient, allowing orbit to be achieved with very little energy. For example, the system may use tens of kilowatts of power to overcome intrinsic losses (bearings, dynamic seals, and ohmic losses, if any). Plus, the energy needed to achieve orbit, which as described earlier may be about 58 megajoules per kilogram to achieve geosynchronous orbit in some examples, about half the total energy contained in a gallon of gasoline. A calculated balance should be struck between time to achieve orbit, as energy is being expended to overcome intrinsic dissipative losses, $E_{loss}=P_{loss}\Delta t$, and aerodynamic energy losses. A shorter time to orbit may mean higher velocities inside the atmosphere which may increase aerodynamic drag energy losses; aerodynamic drag above the critical velocity goes as the velocity squared—a very doable orbital mechanics efficiency optimization problem. However, this is not a disclosure on orbital mechanics, only the propulsion system that enables new and novel orbital mechanics possibilities.

Manufacture of the Electrodes, Stresses on the Discs, Electromagnetic-Mechanical Strain of the MUMs, and Metallization Considerations Considerations for the manufacture of the electrodes, stresses on the discs, and electromagnetic-mechanical strain of the MUMs are described above, e.g., with reference to equations 43 and 22-24 and FIGS. 42A-42B, 43A-43C, 44A-44C, 45, 46A-46C, and 47A-47B.

1-cm MUMs Used for Propulsion

Large rotating discs and 10-cm modified MUMs have been discussed as devices for producing lift and thrust in external magnetic fields, with the Earth's magnetic field being the example magnetic field. There are some advantages to using the 1-cm MUMs such as described with reference to FIGS. 25A-25B. The advantages include 1. the manufacturability of these devices, being able to manufacture these devices to exacting tolerances using semi-conductor and MEMs manufacturing technology in mass quantities; 2. the ability to spin the discs of these devices at very large rotational rates, as mechanical rotational limits are often a function of the size of the rotating structure; 3. the magnetic fields produced are on the order of or below the critical magnetic fields of many superconductors as discussed earlier; and 4. the electromagnetic-mechanical stresses may be smaller and more manageable than in larger devices.

Given these advantages, it is worthwhile to take a more detailed look at the simulated lift in the example 1-cm MUM device, being the device described with reference to 44A-44B, 45, 46A-46C, and 47A-47B. A 1-cm mercury fluid design MUMs weighs approximately 54.7 millinewtons (5.6 grams with acceleration of gravity given by g=9.8 m/s$^2$), a mercury-less 1-cm MUMs weighs approximately 35.8 millinewtons (3.7 grams).

It is believed that a Zero-Field-Cool (ZFC) superconductor may do a better job than a standard superconductor shield of blocking the external field from penetrating the exposed cavity of the MUM device, as a ZFC superconductor shield will attempt to expel any magnetic flux that enters the cavity. FIGS. 89A and 89B show a simulation of how the external magnetic field (e.g., the Earth's magnetic field) penetrates into the MUM cavity for a standard superconductor shield and one that becomes superconducting in the absence of any magnetic fields, ZFC. More specifically, FIGS. 89A and 89B illustrate the calculated flux density in an FEA model of an example 1-cm MUM including a superconductor shield blocking an external magnetic field, here assumed to be Earth's magnetic field at the equator, ~30 uTesla; FIG. 89A: standard superconductor shield; FIG. 89B: superconductor shield in the Zero-Field Cooled (ZFC) condition. On close inspection it can be ascertained the ZFC superconductor does a slightly better job of shadowing the discs of the MUM in the superconductor shield cavity. The ZFC condition can be achieved in practice by magnetically shielding the superconductor as it is cooled to its superconducting temperature such that it is experiencing zero net electric and magnetic fields as it reaches its critical temperature, and then removing the magnetic shielding once the superconductor has reached its superconducting state. Since only the external magnetic field need be blocked to begin with, conventional magnetic shielding may be used to achieve the ZFC condition as the external magnetic fields in question are usually quite small. The propulsion device would not be powered during the cool down process, i.e., producing no magnetic fields.

With the assumption the external magnetic field is perfectly shadowed by the superconductor shield, i.e., only the top half of the disc(s) experience the field (quadrants I and IV from FIG. 56A), equation 53 or 59 can be used to approximate the lift or thrust of the 1-cm MUM, as described with reference to FIGS. 25A, 25B, 44A-44B, 45, 46A-46C, and 47A-47B, would experience in the Earth's magnetic field (or any other external magnetic field). This calculation yields a result of 92.7 millinewtons (9.49 grams) in the Earth's magnetic field at the equator (~30 micro-tesla).

QuickField™ is capable of simulating the ZFC condition directly, but only in two-dimensions, thus the wedged shield modification of FIG. 78B is not simulated. Due to the asymmetry introduced by the magnetic shield, the simulation must also be planar as opposed to axisymmetric. Being a 2D planar simulation, the shapes are assumed to have a rectangular form into the page, here one centimeter. This simulated configuration gives an estimated propulsion that may be slightly higher than what a true circular device may have. Two simulations were run, one with a standard superconductor and one in the ZFC condition. The first simulation yields a simulated 1-cm MUM lift of 97.4 millinewtons and the latter a simulated 1-cm MUM lift of 134 millinewtons (13.7 grams). As conjectured, the ZFC superconductor shield is capable of producing a stronger thrust or lift than the standard superconductor shield.

ANSYS Maxwell™ is capable of simulating the superconductor in its standard state with a full 3D model, including the wedged superconductor shield as was discussed in FIG. 78B. In this configuration the lift is simulated to be 86.6 millinewtons (8.84 grams).

In the previous lift and thrust simulations described herein, the simulations were magnetostatic simulations, in which assumptions were made about how the superconducting shielding element operates in equilibrium, e.g., the superconductor Zero-Field Cooled condition (ZFC) vs standard condition. However, ANSYS Maxwell™ is not capable of directly simulating a superconductor in the ZFC state using magnetostatics. To this end a special model was built to model the ZFC condition in ANSYS Maxwell™

More specifically, the example 1-cm MUM was simulated using a high-density mesh magneto-transient simulation in which the ZFC condition is simulated by no electromagnetic fields initially being present when the superconductor becomes superconducting, including the Earth's magnetic field. The eddy currents inside the superconductor shield are then simulated in a time transient manner, as first the Earth's magnetic field is allowed into the chamber, and then the MUM device is powered up and the MUM device's magnetic fields act upon the superconductor shield and induce additional eddy currents. Equation 43 is then integrated over the simulated fields, once transients have reached steady-state, over the entire device, giving the net force experienced by the device. The net forces upon the entire device, including induced eddy currents on the superconductor, is simulated and calculated as part of the transient solution; giving a complete and accurate measure of the behavior of the device under operation. In the Earth's magnetic field (~30 micro-tesla), the magneto-transient method simulates a lift or thrust of 94.6 (9.65 grams) millinewtons. Transient simulations are computationally intensive, take extended periods of time, and require substantial hardware capabilities to complete, thus the use of magneto-static simulations, which are relatively fast, are used throughout most of this disclosure. It is believed that all simulations, magneto-static or magneto-transient, are representative of the expected lift and thrust performances of the devices described. A magneto-transient simulation was only used here to simulate the ZFC condition for a full three-dimensional MUM device.

Table 15 summarizes the results of the described simulations on the example 1-cm MUM device. Disc radii=5 mm; k=1×10$^9$; ΔV=2 Volts; super-dielectric thickness=2 microns; disc spacing=50 microns; RPM=100,000. Net lift/thrust is calculated from ANSYS Maxwell™ results and the weight of a mercury-less device.

TABLE 15

| Superconductor Shield State | QuickField (mN) | ANSYS (mN) | Analytical Calculation (mN) | Weight of MUM (mN) | Net Lift (Thrust) (mN) |
| --- | --- | --- | --- | --- | --- |
| Standard | 97.4 | 86.6 | 92.7 | 35.8 | 50.8 |
| Zero Field Condition | 134.0 | 94.2 | 92.7 | 35.8 | 58.4 |

FIGS. 90A-90B and 91A-91B show the layout of the described 1-cm example MUMs' simulations. More specifically, FIGS. 90A and 90B illustrate the calculated flux density in an FEA model of an example 1-cm MUM including a superconductor shield blocking an external magnetic field, here assumed to be Earth's magnetic field at the equator, ~30 uTesla; FIG. 90A: standard superconductor shield; FIG. 90B: superconductor shield in the Zero-Field Cooled (ZFC) condition. FIGS. 91A-91B illustrate an ANSYS Maxwell™ magneto-static simulation of the standard condition superconductor shield of FIG. 90A; FIG. 91A: the effective current density of the MUM device is shown; FIG. 91B: mesh on shield and discs is shown. From FIG. 90B, the ZFC case, it may be understood that the device's generated magnetic field is more concentrated above the device than below, giving a better asymmetric interaction with the external magnetic field.

As discussed herein, the lift potential goes as the radius of the charged discs to the third power, equation 59. Because of the MUM's small size (see FIG. 92 which schematically illustrates a size comparison between an example 1-cm MUM with a superconductor shield as compared to a United States quarter dollar coin), the 1-cm MUM does not produce a large amount of lift, tens of millinewtons, see table 15. However, the MUM does produce 2-3× the lift or thrust of the weight of the device itself. It should also be pointed out that the lift is linearly proportional to the rotation speed of the disc electrodes as well. An increase to an RPM equal to 200,000 revolutions per minute may double the estimated lift amount. While the lift or thrust of the 1-cm MUM is not overly impressive, due to the MUM's small size, FIG. 92, a very large number of MUMs devices may be incorporated into a relatively small area. Theoretically over 500,000 1-cm MUMs may fit into one cubic meter of volume. Being conservative, to allow room for support structure and cryo-cooling of the superconductor shields, reducing the number to 100,000 MUMs in a one-meter cube volume would produce a thrust of approximately 9400 N (2100 lbs) in the Earth's magnetic field at the equator.

While the 1-cm MUM does not produce as much thrust as some other embodiments discussed herein, the MUM device does have some advantages over the other embodiments as reiterated here: 1. the manufacturability of 1-cm MUM devices, being able to manufacture these devices to exacting tolerances in mass quantities; 2. the ability to spin the discs of these devices at very large rotational rates, as mechanical rotational limits are often a function of the size of the rotating structure; 3. the magnetic fields produced are on the order of or below the critical magnetic fields of many superconductors as discussed earlier; and 4. the electromagnetic-mechanical stresses may be smaller and more manageable than in larger devices. It will be appreciated that other sizes of MUMs, and other configurations of DSCs, are encompassed within the present disclosure.

Additional Information

A one-meter radius dual disc dynamic super capacitor spinning at 100,000 RPM has been used as a nonlimiting example. This base configuration is an instructional example as there are many parameters that can be varied appropriately with the design requirements and engineering tradeoffs. For instance, smaller diameter electrodes provide higher packing densities, higher maximum electrode rotational speeds, and manufacturing advantages; the MUMs being another nonlimiting example. On the other side of the spectrum, larger diameter electrode DSC's can provide the equivalent lift/thrust at much lower rotational speeds. While there is a wide parameter design space that can be realized, as appropriate for the design requirements and engineering tradeoffs, the present systems and methods may utilize the interaction of dynamic supercapacitors (DSCs) with external magnetic fields to generate usable torque and force, for example to provide propulsion for craft that can operate underwater, on water, in the atmosphere, and in outer space. These torques and forces may find other applications other than for craft propulsion alone.

The systems and methods provided herein describe a new and novel propulsion system which provides lift and thrust by the interaction of dynamic super capacitors (DSCs) with external magnetic fields. The example external magnetic field used throughout this disclosure is the Earth's magnetic field, however, it should be clear the propulsion system described may operate in any external magnetic field. For instance, Jupiter's magnetosphere is approximately twenty times stronger than that of the Earth's and has a volume about a million times that of the Earth's. Propulsion within the vicinity of Jupiter and its moons is highly feasible. Any planet possessing a magnetic field, or celestial body such as the sun, can be used as the source of the external magnetic field.

Additionally, the solar system possesses an interplanetary magnetic field (IMF). Our solar system's heliospheric current sheet generated by the sun plays a major role in generating the IMF. The IMF extends past the outer planets; however, the strength and distribution of the IMF is not well understood other than its strength is known to follow the rotation of the sun and varies with space weather. The Advanced Composition Explorer (ACE) satellite monitors the IMF near Earth's orbital radial position from the sun. ACE has measured an average IMF strength of 6 nanotesla (37 nT at its peak). The MUM propulsion cube assembly described with reference to FIG. 81B would produce a thrust of approximately 162 Newtons (36 lbs) in a 6 nT IMF. While 162 N is not a large amount of thrust in terms of achieving Earth orbit, 162 N is a considerable amount of thrust in interplanetary (or interstellar) space where gravity is weaker. For comparison, state of the art ion thrusters used by NASA produce about 0.5 Newtons (0.1 lbs) of force. As a point of reference, if 162 N of force could be maintained continuously for 764 days, a craft with a mass of 100 kg would reach a velocity of 100,000 km/sec (one-third the speed of light) in flat gravity space, i.e., far from large mass bodies such as planets—Minkowski space. At this speed, on a direct course, it would take approximately 12 days to go from Earth to Neptune, and 12 and a half years to go from Earth to Proxima Centauri, our closest stellar neighbor. Of course, this is just a theoretical example as the craft would require the presence of an external magnetic field source during the acceleration period and a substantial power source. More practically, magnetically driven craft could use the powerful magnetic fields of bodies like Jupiter or the Sun to gain velocity in the vicinity of the magnetic body and then sling shot away from those bodies at high velocities, not unlike the gravity assist technique used at the time of this application for space probes. However, this is not an invention about orbital mechanics, it is an invention about the propulsion systems that make those orbital mechanics more feasible and attractive for achieving Earth orbit and reaching out into the solar system in an efficient and practical way, and ultra-magnets that may be used in such propulsion systems or other suitable applications.

Interestingly, galaxies like our Milky Way do possess strong, ordered magnetic fields throughout their volumes, potentially providing the appropriate external magnetic field source to drive magnetic propulsion craft through interstellar space and explore neighboring star systems on a more attractive timescale than what can be achieved at the time of this application. The example implementations presented herein are well within the scope of technology achievable at the time of this application.

As an additional note, the proposed invention herein may be combined with nuclear fusion propulsion systems that are under development and rapidly approaching practical implementation at the time of this application, such as NASA's Fusion Driven Rocket or Princeton Fusion System's PFRC compact fusion reactor. The magnetic and fusion propulsion technologies are highly complementary. The fusion reactor may provide long term power to the magnetic propulsion system. The magnetic propulsion system in turn can work in tandem with the thrust of the nuclear fusion propulsion system, providing a greatly enhanced overall thrust approach for interplanetary and interstellar transit in an efficient and timely manner. The nuclear fusion propulsion system still relies on mass ejection, so whether to use the fusion reactor for power only or to have a two-prong propulsion approach is a design and mission objective choice.

Accordingly, it will be understood that some examples herein provide a propulsion system for use in an external magnetic field. FIG. 104 schematically illustrates example components of a propulsion system 2000 such as provided herein. The propulsion system 2000 may include a first electrode and a second electrode (not specifically illustrated in FIG. 104). The propulsion system may include a dielectric material disposed between the first and second electrodes such that the first electrode is configured to accumulate positive charge and the second electrode is configured to accumulate negative charge. The propulsion system 2000 may include a drive configured to rotate the first electrode relative to the second electrode so as to induce an angular velocity between the first electrode and the second electrode to generate a magnetic field. For example, propulsion system 2000 may include Drive 1 coupled to a shaft and configured to rotate the shaft in a manner such as described elsewhere herein. Additionally, or alternatively, propulsion system 2000 may include Drive 2 coupled to the outer shell and configured to rotate the shell in a manner such as described elsewhere herein. Propulsion system 2000 may include a magnetic shield configured to generate lift. The magnetic shield may be configured to enclose only a portion of each of the first and second electrodes so as to interrupt the external magnetic field between the first and second electrodes. Nonlimiting examples of such a propulsion system are described with reference to FIGS. 56, 60, 61, 62A-62B, 63A, 64A-64B, 66A-66B, 68, 71, 72A, 74A-74B, 75A-75B, 76, 77, 78A-78C, 81A-81C, 82, and 83. Nonlimiting examples of electrode and dielectric configurations suitable for use in such a propulsion system are described with reference to FIG. 103 and the figures referred to in the discussion of FIG. 103.

Optionally, propulsion system 2000 includes Drive 3 coupled to magnetic shield(s) and configured to move the magnetic shield(s) so as to provide steering capabilities. As illustrated in FIG. 104, the drive(s) (e.g., drive 1, drive 2, drive 3) may receive power from an onboard power source and may be controlled by a controller. In a manner similar to that described with reference to FIG. 103, the controller may be configured to control drives 1 and 2 so as to cause the shaft and outer shell to have a suitable angular velocity relative to one another as to generate a magnetic field of suitable strength to generate lift, and may control drive 3 so as to rotate the magnetic shield(s) relative to an external magnetic field to orient the lift in a desired direction and with a desired magnitude in that direction. Optionally, the propulsion system 2000 may include one or more sensors which are located outside of the magnetic shields and/or outside of the outer shell. Additionally, the controller may include a navigation subsystem (e.g., GPSS receiver, Glonass receiver, or the like) which provides the controller with feedback regarding the position and orientation of the propulsion system. The controller may receive signals from the sensor(s) and from the navigation subsystem based upon which the controller may adjust operation of drive 1, drive 2, and/or drive 3. For example, the controller may be used to control the friction and/or separation of the rotating electrodes through a closed loop feedback system, such as with temperature sensors and thermoelectric coolers and/or strain sensors. The controller may also work in conjunction with gyroscopic sensor systems to control the orientation of the craft.

The controller can be implemented using any suitable combination of hardware and software. In some examples, the functionalities of the controller can be provided by a suitably programmed field-programmable gate array (FPGA) or application-specific integrated circuit (ASIC). FPGAs and ASICs are commercially available, and methods of programming same to achieve desired logical programming are known in the art. In still other embodiments, the functionalities of the controller can be provided by a suitably programmed computer, e.g., a personal computer including a processor and a non-transitory computer-readable medium storing instructions to cause the processor to perform the steps of the present methods or to implement the functionality described herein. Alternatively, the processor can include a digital processor, such as a central processing unit (CPU) or graphics processor unit (GPU), or an analog processor.

Nonlimiting examples of dielectric materials are described further above, e.g., with reference to FIGS. 6A-6B and 38A-38B. In some examples, the dielectric material has a dielectric constant greater than $10^5$. That is, the dielectric material may in some examples be or include a super-dielectric material such as described elsewhere herein. In some examples, the super-dielectric material includes a super-dielectric matrix and an ionic liquid and may be configured in a manner such as described elsewhere herein and as exemplified in the Working Examples.

In some examples, the magnetic shield includes a superconductor. Nonlimiting examples of superconductors suitable for use in magnetic shields are described elsewhere herein, e.g., with reference to FIG. 56B.

In some examples, the magnetic shield is configured to enclose approximately half of each of the first and second electrodes, for example in a manner such as described with reference to FIGS. 56, 60, 61, 62A-62B, 63A, 71, 72A, 74A-74B, 75A-75B, 76, 77, 78A-78C, 81C, 82, 83.

In some examples, the external magnetic field extends in an x direction, the first and second electrodes lie in an x-y plane, and the lift is generated in a z direction, for example in a manner such as described with reference to FIGS. 60, 61, 62A-62B, 63A, 64A-64B, 66A-66B, and 68.

In some examples, the external magnetic field is in an x direction, the first and second electrodes lie in a y-z plane, and the lift is generated in a z direction, for example in a manner such as described with reference to FIG. 71.

In some examples, the external magnetic field is in an x direction, the first and second electrodes lie in an x-z plane, and the lift is generated in a y direction, for example in a manner such as described with reference to FIG. 75A.

In some examples, the magnetic shield is configured to move relative to the first and second electrodes to adjust a magnitude of the lift.

In some examples, the external magnetic field is substantially symmetrical.

In some examples, the first electrode or the second electrode includes a conductive fluid. In some examples, the conductive fluid includes mercury. Use of mercury and other conductive fluids is described elsewhere herein.

In some examples, the dielectric material includes a plurality of curved surfaces that contact the first electrode or the second electrode at respective points, e.g., in a manner such as described with reference to FIGS. 38A-38B. In some examples, the propulsion system includes a lubricating fluid occupying dead spaces between the curved surfaces, e.g., in a manner such as described with reference to FIGS. 38A-38B.

In some examples, the dielectric material includes a sufficient surface structure to define points that contact the first electrode or the second electrode and inhibit optical contacting with the first electrode or the second electrode, e.g., in a manner such as described elsewhere herein.

In some examples, propulsion system 2000 illustrated in FIG. 104 may include a first electrode including a first plurality of segments that are electrically insulated from each other. The propulsion system may include a second electrode including a second plurality of segments that are electrically insulated from each other. The propulsion system may include a dielectric material disposed between the first and second electrodes such that a first subset of the first plurality of segments are configured to accumulate positive charge, a second subset of the first plurality of segments are configured to accumulate negative charge, a first subset of the second plurality of segments are configured to accumulate negative charge, and a second subset of the second plurality of segments are configured to accumulate positive charge. The propulsion system may include a drive configured to rotate the first electrode relative to the second electrode so as to induce an angular velocity between the positive charges and the negative charges and thus generate a current density profile. The propulsion system may include a circuit configured to generate lift. The circuit may be configured to interrupt the current density profile produced by the first and second electrodes by changing respective polarities of the first and second pluralities of segments as the first electrode rotates relative to the second electrode. Nonlimiting examples of such a propulsion system are described with reference to FIGS. 64A-64B, 66A-66B, and 68, as well as further above still with reference to FIG. 104.

Nonlimiting examples of electrode and dielectric configurations suitable for use in such a propulsion system are described with reference to FIG. 103 and the figures referred to in the discussion of FIG. 103.

In some examples, propulsion system 2000 includes a conductive fluid disposed between the first and second electrodes and in electrical contact with at least one segment of the first plurality of segments and with at least one segment of the second plurality of segments. In some examples, the conductive fluid includes mercury. In some examples, the angular velocity between the positive charges and the negative charges generates a magnetic field through the mercury, and wherein the magnetic field and the flow of current through the mercury between at least one segment of the first plurality of segments and least one segment of the second plurality of segments induces a magnetohydrodynamic force. Generation of such magnetohydrodynamic force using segments is described in greater detail above in the section regarding Type II propulsion.

In some examples, the external magnetic field is substantially symmetrical.

In some examples, the dielectric material includes a plurality of curved surfaces that contact the first electrode or the second electrode at respective points, e.g., in a manner such as described with reference to FIGS. 38A-38B. In some examples, the propulsion system includes a lubricating fluid occupying dead spaces between the curved surfaces, e.g., in a manner such as described with reference to FIGS. 38A-38B.

In some examples, the dielectric material includes a sufficient surface structure to define points that contact the first electrode or the second electrode and inhibit optical contacting with the first electrode or the second electrode, e.g., in a manner such as described elsewhere herein.

In a manner such as described elsewhere herein, propulsion system 2000 may be located in any suitable craft 2500 and may be used to generate lift which may be used to move that craft in any desired direction and without the need for conventional propellants. The craft 2500 may be couplable to a detachable power source, such as a terrestrial power source. As described elsewhere herein, this power source may be used to bring the shielded ultramagnet up to operational speed, and then may be detached and the propulsion system 2000 powered by its onboard power source.

Working Examples

The following examples are intended to be purely illustrative, and not limiting of the present invention.

The super-dielectric is an integral component in the performance of the present ultra-magnets and the corresponding magnetic propulsion systems as described herein. Throughout the current disclosure, a super-dielectric constant of $1\times10^9$ has been used as the baseline value of the dielectric constant for calculation and simulation. It is important to empirically validate the achievability of such a colossal dielectric constant value.

To this end, several super-capacitors of the type of geometry described herein were built and tested using the example embodiment of the super-dielectric material mentioned herein. As described, a super-dielectric matrix material is used as the container of an ionic fluid and includes pores or apertures within which electric dipoles may form inside the super-dielectric matrix. In the present examples, a super-dielectric material was created using alumina powders (super-dielectric matrix) which were saturated with a sodium chloride aqueous solution (ionic fluid) in a manner such as described in greater detail below, and in a similar manner to that described in Phillips, cited above. Because the aqueous solution (or other ionic fluid) is partially conductive it is important to fill the pores in the matrix with solution without excess solution overfilling the matrix and making the super-dielectric matrix 'wet'. If excess solution is added, this can create an unwanted ohmic loss between the electrodes and inhibit the formation of dipoles.

Three different commercially purchased alumina powders were used to create the super-dielectric matrix for the supercapacitors. FIGS. 95A-95B are scanning electron microscopy (SEM) micrographs of a first example super-dielectric matrix (sample A). FIG. 96 is an SEM micrograph of a second example super-dielectric matrix (sample B). FIG. 97 is an SEM micrograph of a third example super-dielectric matrix (sample C). FIGS. 98A-98B are SEM micrographs of a fourth example super-dielectric matrix (sample D). The powders were commercially purchased from Alfa Aesar. The first powder (associated with Sample A) was advertised as a high surface area (100-200 m$^2$/g) nano-powder with an average 20 nm grain size. The second powder (associated with Sample B and Sample C) was advertised as a high effective surface area (80-120 m$^2$/g) powder with an average 3-micron grain size. The third powder was advertised as a high surface area (100-150 m$^2$/g) powder with an average 2.5-micron grain size. The super-dielectric matrices shown in FIGS. 95A-95B, 96, 97, and 98A-98B were formed by mixing the powders with a sodium chloride aqueous solution of concentration 0.1 g/ml, though other concentrations may work as well. More specifically, the NaCl solution was prepared and then a fixed mass of powder measured (1 g powder: 1 mL solution). NaCl solution was slowly added to the powder while being stirred. At a critical point, when enough solution had been added, the volume of the powder would suddenly decrease by about a factor 10. The powder's consistency would also go from that of a dry powder to a thick paste. This is the point at which the super-dielectric was wetted, but not too wet. As described in the super-dielectric section earlier, once applied to the electrodes, voltage optionally may be applied to 'activate' the super-dielectric by getting the NaCl solution to enter the nano-pores more fully.

In general, the electric displacement field, D', is described as $$\vec{D} = \varepsilon_0 \vec{E} + \vec{P} \quad (76),$$

where $\varepsilon_0$ is the free space permittivity and $\vec{P}$ is the polarizability of the material the $\vec{E}$ field exists in, here the super-dielectric material. $\vec{P}$ is measured as the dipole moment per unit volume and in linear media can be expressed as $$\vec{P} = (\overleftrightarrow{\varepsilon}_r - \overleftrightarrow{I})\varepsilon_0 \vec{E} \quad (77),$$

where $\overleftrightarrow{\varepsilon}_r$ is the electric permittivity tensor and $\overleftrightarrow{I}$ is the unit tensor. In isotropic media, $\overleftrightarrow{\varepsilon}_r$ reduces to a scalar value equal to the dielectric constant, k, k=$\varepsilon_r$. The electric dipole moment, $\vec{p}$, of two equal and opposite electric charges of charge magnitude, q, and distance of separation, d, is given by $$\vec{p} = q\vec{d} \quad (78).$$

In a conventional dielectric, the molecules of the media are stretched in the applied electric field. In this case, the molecular stretch may be on the order of angstroms or fractions of an angstrom. In addition, the electrons are shared within the molecule, so the magnitude of q in equation 78 is typically a fraction of a single electronic charge. Therefore, in a conventional dielectric, both the magnitude of q and d in equation 78 are small and since $\vec{P}$ is the electric dipole moment per unit volume, this results in Because it may take several days for a supercapacitor to discharge through a 10 kΩ resistance, the supercapacitor was sealed with epoxy before testing to inhibit or prevent loss of the ionic fluid during the test cycle. The resulting supercapacitors were labeled Sample A, Sample B, Sample C, and Sample D. Table 16 shows the various configurations.

TABLE 16

| Supercapacitor | Electrode material | Superdielectric thickness | Matrix material | Matrix average grain size | Effective surface area |
|---|---|---|---|---|---|
| SAMPLE A | Graphite | 1.0 mm | Alumina | 20 nm | 100-200 m²/g |
| SAMPLE B | Graphite | 1.0 mm | Alumina | 3 um | 80-120 m²/g |
| SAMPLE C | Aluminum | 1.0 mm | Alumina | 3 um | 80-120 m²/g |
| SAMPLE D | Graphite | 1.0 mm | Alumina | 2.5 um | 100-150 m²/g | relatively tiny dielectric constants. For example, the electric dipole moment of a water molecule is $6.2 \times 10^{-30}$ C-m. The colossal super-dielectric constants described herein can be partially explained by the fact that electric dipoles can form in the pores and cavities formed via the ionic fluid in the super-dielectric matrix. The pores and cavities can be many tens of nanometers or larger and the ions carry a substantial electronic charge. For instance, a sodium and chlorine ion separated by 100 nanometers of pores and cavities will have a dipole moment of approximately $1.6 \times 10^{-26}$ C-m, about four orders of magnitude larger than a water molecule. Note that any solvated ions in the ionic liquid are in an external electric field and interacting with that external electric field. The only free charge as far as the electric field is concerned is the ions. There may be groups of water molecules that form around those ions at the microscopic level, but as far as the electric field is concerned, at a macro-level it still just looks like a free charge. The ions' interaction with the electric field at the macro-level is believed to provide the super-dielectric behavior described elsewhere herein and in the Fromille, Phillips, and two Cortes references cited elsewhere herein. Water has a k of about 80, which is higher than that of many dielectric materials (some of which have k in the single digits), and therefore may be considered herein to be a high dielectric constant material.

Four super-capacitors were prepared with a flat, smooth parallel plate geometry as described in the ultra-magnet embodiments described herein and in a manner similar to that described in Phillips. More specifically, the graphite was 4.0 mm thick and the aluminum electrodes were 2.0 mm thick. The super-dielectric material was applied by dipping a glass cylinder into the alumina-salt water paste and then rolling the glass cylinder slowly over the electrodes, transferring a portion of the super-dielectric material from the glass cylinder to the electrode. The electrodes were then pressed together until the electrode spacings bottomed out onto the ball bearings. Excess paste at the edges of the electrodes, i.e. that protruding along the seams between the electrodes, was removed with a razor while the paste was still green.

FIG. 99A is a photographic image of graphite electrodes used in an example supercapacitor (100.7 mm×21.0 mm×4.0 mm). The spacing between the electrodes was precisely controlled by the use of 1.0 mm diameter silicon nitride precision ball bearings inserted with periodic spacing between the electrodes. FIG. 99B is a photographic image of an example finished supercapacitor before encapsulation.

Each supercapacitor was charged through a 1 kΩ resistor with a 5.2 volt drive voltage. The supercapacitors where then discharged through a 10 kΩ resistor. The voltage on the supercapacitor electrodes was monitored using a National Instruments DAQ6289 18-bit data acquisition system. The capacitance was determined by examining the total remaining charge on the electrodes at each voltage, C=Q/V. The dielectric constant as a function of voltage was then calculated using the parallel plate capacitor equation, $$k = \frac{Cd}{\varepsilon_0 A} \tag{89}$$

where C is the capacitance, d is the spacing between the electrodes, and A is the area of the plates.

As an example of the charge and discharge dynamics, FIGS. 100A and 100B are plots respectively illustrating charge discharge profiles of an example supercapacitor using the fourth example super-dielectric matrix (sample D); charging voltage of 5.2 volt through a 1 kΩ resistance, and discharging through a 10 kΩ resistance. FIGS. 101A and 101B are plots of the measured dielectric constants k of the tested super-capacitors (samples A, B, C, and D) as a function of voltage; FIG. 101A: linear scale; FIG. 101B: log scale for each of the four supercapacitor samples. The base value of $k=1 \times 10^9$ is shown for reference on the plots. As can be seen, in every case, the super-dielectric far exceeds the base value of $1 \times 10^9$, reaching dielectric values of $6 \times 10^{11}$ in Supercapacitor Sample D.

The already colossal super-dielectric constants measured can be further improved. Firstly, electrolytes using higher ionic charge ions, such as MgCl2 as an example, can be used in the ionic liquid to increase the ion density and thus dipole moment formation in the super-dielectric material, and thus increase the potential charge capacity on the electrodes. Additionally, or alternatively, the pores and cavities of the super-dielectric matrix (such as described in the present examples) may have a relatively a large variance in size, volume, and orientation (e.g., due to the manufacturing process). Additionally, or alternatively, the pores and/or apertures of the super-dielectric matrix can be precisely manufactured with precise optimal geometries and orientations using micro-chip, nano-technology, and MEMs manufacturing methods-masking, lithography, deposition, etching, liftoff, and so forth as is well understood to anyone in the art. See also FIGS. 6A-6B and the related description thereof herein.

It is believed that dielectric constant values in excess of $10^{12}$ can likely be attained with improvements to the manufacturing process and materials used. Throughout the current disclosure, a dielectric constant value k of $1\times10^9$ has been used as the baseline to determine the strength of the magnetic fields produced and/or the thrust/lift a magnetic propulsion system would produce. In the analyses within, a rotation rate on the electrodes of 100,000 RPM has been used as the baseline rotation rate. With a k value of $10^{12}$, the same magnetic field strengths and same propulsion forces as described may be achieved with an electrode rotation rate of 100 RPM (1.67 Hz), a significantly slower rotation rate. Likewise, the 100,000 RPM rotation rate may be maintained with all other parameters kept the same, except to increase the k value to $10^{12}$. In this example, the magnetic fields and propulsion forces would be expected to increase a thousand-fold. As described herein, the limits of the magnetic fields that can be produced and the propulsion forces that can be achieved are primarily limited by the strength of the materials used to construct the devices. As an example of another tradeoff, the thickness of the super-dielectric may be increased to get the same performance as a thinner super-dielectric layer with a lower k value, if a thicker dielectric layer thickness were desired. There are many engineering tradeoffs and a wide parameter space to choose from to tailor the desired performance of the magnetic and propulsion devices described herein. The higher the k value, the more choices and tradeoffs are available in the design parameter space.

Additional Comments

All publications, patents, and patent applications mentioned in this specification are herein incorporated by reference to the same extent as if each individual publication, patent, or patent application was specifically and individually indicated to be incorporated by reference.

While various illustrative examples are described above, it will be apparent to one skilled in the art that various changes and modifications may be made therein without departing from the invention. The appended claims are intended to cover all such changes and modifications that fall within the true spirit and scope of the invention.

It is to be understood that any respective features/examples of each of the aspects of the disclosure as described herein may be implemented together in any appropriate combination, and that any features/examples from any one or more of these aspects may be implemented together with any of the features of the other aspect(s) as described herein in any appropriate combination to achieve the benefits as described herein.

What is claimed is:

1. A propulsion system for use in an external magnetic field, the propulsion system comprising:
a first electrode comprising a first plate;
a second electrode comprising a second plate that is parallel to the first plate;
a dielectric material disposed between the first and second electrodes such that the first electrode can accumulate positive charge and the second electrode can accumulate negative charge;
a drive mechanism configured to rotate the first electrode relative to the second electrode so as to induce an angular velocity between the positive charges and the negative charges and thus generate a magnetic field; and
a magnetic shield configured to generate lift, the magnetic shield configured to enclose only a portion of each of the first and second electrodes so as to interrupt the external magnetic field between the first and second electrodes.

2. The device of claim 1, wherein the dielectric material has a dielectric constant greater than $10^5$.

3. The device of claim 2, wherein the dielectric material comprises a plurality of curved surfaces that contact the first electrode or the second electrode at respective points.

4. The device of claim 3, further comprising a lubricating fluid occupying dead spaces between the curved surfaces.

5. The device of claim 1, further comprising a conductive fluid between the first electrode and the second electrode.

6. The device of claim 5, wherein the conductive fluid comprises mercury.

7. The device of claim 1, further comprising:
a cylindrical housing having an interior surface and a longitudinal axis, the cylindrical housing forming an outer electrode;
a first plurality of conductive plates that extend inward from, and are electrically coupled to, the interior surface, the first plurality of conductive plates spaced-apart along the longitudinal axis;
a shaft concentrically disposed within the interior of the cylindrical housing, the shaft forming an inner electrode;
a second plurality of conductive plates extending from, and electrically coupled to, the shaft, respective ones of the second plurality of conductive plates interdigitated with respective adjacent conductive plates of the first plurality of conductive plates,
wherein the first electrode comprises a conductive plate of one of the first plurality of conductive plates or the second plurality of conductive plates, and wherein the second electrode comprises a conductive plate of the other of the first plurality of conductive plates or the second plurality of conductive plates;
the dielectric material being disposed on opposing faces of the first and second pluralities of conductive plates; and
the drive mechanism being coupled to the shaft to rotate the second plurality of conductive plates relative to the first plurality of conductive plates to generate the magnetic field.

8. The propulsion system of claim 1, wherein the magnetic shield comprises a superconductor.

9. The propulsion system of claim 1, wherein the magnetic shield is configured to enclose approximately half of each of the first and second electrodes.

10. The propulsion system of claim 1, wherein the external magnetic field extends in an x direction, the first and second electrodes lie in an x-y plane, and the lift is generated in a z direction.

11. The propulsion system of claim 1, wherein the external magnetic field is in an x direction, the first and second electrodes lie in a y-z plane, and the lift is generated in a z direction.

12. The propulsion system of claim 1, wherein the external magnetic field is in an x direction, the first and second electrodes lie in an x-y plane, and the lift is generated in a y direction.

13. The propulsion system of claim 1, wherein the magnetic shield is configured to move relative to the first and second electrodes to adjust a magnitude of the lift.

14. The propulsion system of claim 1, wherein the external magnetic field is substantially symmetrical.

15. The propulsion system of claim 1, further comprising a conductive fluid disposed between the first electrode and the second electrode.

16. The propulsion system of claim 15, wherein the conductive fluid comprises mercury.

17. The propulsion system of claim 1, wherein the dielectric material comprises a plurality of curved surfaces that contact the first electrode or the second electrode at respective points.

18. The propulsion system of claim 17, further comprising a lubricating fluid occupying dead spaces between the curved surfaces.

19. The propulsion system of claim 1, wherein the dielectric material comprises a sufficient surface structure to define points that contact the first electrode or the second electrode and inhibit optical contacting with the first electrode or the second electrode.

20. A method for generating propulsion in an external magnetic field, the method comprising:
- accumulating positive charges at a first electrode comprising a first plate;
- accumulating negative charges at a second electrode comprising a second plate that is parallel to the first plate;
- rotating the first electrode relative to the second electrode so as to induce a relative angular velocity between the positive charges and the negative charges and thus generate a magnetic field,
- wherein a dielectric material is disposed between the first and second electrodes; and
- generating lift using a magnetic shield that encloses only a portion of each of the first and second electrodes so as to interrupt the external magnetic field between the first and second electrodes.

21. The method of claim 20, wherein the dielectric material has a dielectric constant greater than $10^5$.

22. The method of claim 20, wherein the dielectric material comprises a plurality of curved surfaces that contact the first electrode or the second electrode at respective points.

23. The method of claim 22, wherein a lubricating fluid occupies dead spaces between the curved surfaces.

24. The method of claim 20, wherein a conductive fluid is disposed between the first electrode and the second electrode.

25. The method of claim 24, wherein the conductive fluid comprises mercury.

26. The method of claim 20, wherein the magnetic shield comprises a superconductor.

27. The method of claim 20, wherein the magnetic shield encloses approximately half of each of the first and second electrodes.

28. The method of claim 20, wherein the external magnetic field extends in an x direction, the first and second electrodes lie in an x-y plane, and the lift is generated in a z direction.

29. The method of claim 20, wherein the external magnetic field is in an x direction, the first and second electrodes lie in a y-z plane, and the lift is generated in a z direction.

30. The method of claim 20, wherein the external magnetic field is in an x direction, the first and second electrodes lie in an x-y plane, and the lift is generated in a y direction.

31. The method of claim 20, further comprising moving the magnetic shield relative to the first and second electrodes to adjust a magnitude of the lift.

32. The method of claim 20, wherein the external magnetic field is substantially symmetrical.

33. The method of claim 20, wherein the dielectric material comprises a sufficient surface structure to define points that contact the first electrode or the second electrode and inhibit optical contacting with the first electrode or the second electrode.

34. The method of claim 20, wherein the method is performed using a device which includes:
- a cylindrical housing having an interior surface and a longitudinal axis, the cylindrical housing forming an outer electrode;
- a first plurality of conductive plates that extend inward from, and are electrically coupled to, the interior surface, the first plurality of conductive plates spaced-apart along the longitudinal axis;
- a shaft concentrically disposed within the interior of the cylindrical housing, the shaft forming an inner electrode;
- a second plurality of conductive plates extending from, and electrically coupled to, the shaft, respective ones of the second plurality of conductive plates interdigitated with respective adjacent conductive plates of the first plurality of conductive plates,
- wherein the first electrode comprises a conductive plate of one of the first plurality of conductive plates or the second plurality of conductive plates, and wherein the second electrode comprises a conductive plate of the other of the first plurality of conductive plates or the second plurality of conductive plates;
- the layer of dielectric material being disposed on opposing faces of the first and second pluralities of conductive plates; and
- a drive mechanism coupled to the shaft to rotate the second plurality of conductive plates relative to the first plurality of conductive plates to generate the magnetic field.

* * * * *